(12) United States Patent
Lee et al.

(10) Patent No.: US 11,562,678 B2
(45) Date of Patent: *Jan. 24, 2023

(54) DISPLAY APPARATUS

(71) Applicant: Samsung Electronics Co., Ltd., Yeongtong-gu (KR)

(72) Inventors: Sangyoon Lee, Seoul (KR); Sunghun Lee, Hwaseong-si (KR); Shinae Jun, Seongnam-si (KR); Chilhee Chung, Seoul (KR); Byoungki Choi, Hwaseong-si (KR); Intaek Han, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,693

(22) Filed: Apr. 24, 2020

(65) Prior Publication Data

US 2020/0251040 A1    Aug. 6, 2020

Related U.S. Application Data

(63) Continuation of application No. 16/015,359, filed on Jun. 22, 2018, now Pat. No. 10,692,417.

(30) Foreign Application Priority Data

Jun. 23, 2017 (KR) .................. 10-2017-0079958
Sep. 12, 2017 (KR) .................. 10-2017-0116255

(51) Int. Cl.
 *G09G 3/20* (2006.01)
 *G09G 3/3225* (2016.01)
(Continued)

(52) U.S. Cl.
 CPC ......... *G09G 3/2003* (2013.01); *G09G 3/3225* (2013.01); *H01L 27/322* (2013.01);
(Continued)

(58) Field of Classification Search
 CPC .............. G09G 3/2003; G09G 3/3225; G09G 2300/0452; G09G 2320/0666;
(Continued)

(56) References Cited

U.S. PATENT DOCUMENTS 9,046,227 B2   6/2015 David et al.
9,064,822 B2   6/2015 Park et al.
(Continued)

FOREIGN PATENT DOCUMENTS

CN    102076702 A  *  5/2011  ............ C07F 15/006
JP    2015062194 A     4/2015
(Continued)

OTHER PUBLICATIONS

English Translation of Office Action issued in KR Patent Application No. 10-2017-0116255, dated Mar. 3, 2022, 4 pp.
(Continued)

*Primary Examiner* — Ricardo Osorio
(74) *Attorney, Agent, or Firm* — Cantor Colburn LLP

(57) ABSTRACT

A display apparatus that includes an OLED (organic light-emitting device) substrate including a first blue light-emitting unit, a green light-emitting unit, and a second blue light-emitting unit which are stacked; and a color controller provided on the OLED substrate to adjust color of a light generated from the OLED substrate.

29 Claims, 11 Drawing Sheets

(51) Int. Cl.
  *H01L 27/32* (2006.01)
  *H01L 51/50* (2006.01)
  *H01L 51/52* (2006.01)
  *H01L 51/00* (2006.01)

(52) U.S. Cl.
  CPC ...... *H01L 27/3209* (2013.01); *H01L 27/3244* (2013.01); *H01L 51/504* (2013.01); *H01L 51/5016* (2013.01); *G09G 2300/0452* (2013.01); *G09G 2320/0666* (2013.01); *H01L 51/0085* (2013.01); *H01L 51/0087* (2013.01); *H01L 51/5268* (2013.01); *H01L 51/5271* (2013.01); *H01L 51/5278* (2013.01); *H01L 2251/5369* (2013.01); *H01L 2251/552* (2013.01)

(58) Field of Classification Search
  CPC ............... H01L 27/3209; H01L 27/322; H01L 27/3244; H01L 51/5016; H01L 51/504; H01L 51/0085; H01L 51/0087; H01L 51/5268; H01L 51/5271; H01L 51/5278; H01L 2251/5369; H01L 2251/552
  See application file for complete search history.

(56) References Cited

U.S. PATENT DOCUMENTS

| | | | |
|---|---|---|---|
| 10,692,417 B2 * | 6/2020 | Lee | ............... H01L 27/322 |
| 2004/0251821 A1 | 12/2004 | Cok | |
| 2006/0221021 A1 | 10/2006 | Hajjar et al. | |
| 2007/0014318 A1 | 1/2007 | Hajjar et al. | |
| 2008/0171226 A1 | 7/2008 | Noh et al. | |
| 2010/0149815 A1 | 6/2010 | Erchak | |
| 2012/0287148 A1 | 11/2012 | Brown Elliott | |
| 2013/0215360 A1 | 8/2013 | Pollack et al. | |
| 2015/0185381 A1 | 7/2015 | Wu et al. | |
| 2015/0228697 A1 | 8/2015 | Liu et al. | |
| 2015/0318506 A1 | 11/2015 | Zhou et al. | |
| 2016/0056393 A1 | 2/2016 | Oikawa et al. | |
| 2017/0017123 A1 | 1/2017 | Lee | |
| 2017/0110043 A1 | 4/2017 | Liu et al. | |
| 2017/0352714 A1 | 12/2017 | Choi et al. | |
| 2018/0019371 A1 | 1/2018 | Steckel et al. | |
| 2018/0188599 A1 | 7/2018 | Wang et al. | |

FOREIGN PATENT DOCUMENTS

| | | | | |
|---|---|---|---|---|
| JP | 2016122606 A | | 7/2016 | |
| KR | 1020080066470 A | | 7/2014 | |
| KR | 1020150126381 A | | 11/2015 | |
| KR | 1020160000811 A | | 1/2016 | |
| KR | 20180058032 A | * | 11/2016 | |
| KR | 101686715 B1 | | 12/2016 | |
| KR | 1020170008591 A | | 1/2017 | |
| TW | 593625 B | * | 6/2004 | |
| WO | WO-2015147073 A1 | * | 10/2015 | ......... H01L 51/0096 |

OTHER PUBLICATIONS

Office Action issued in KR Patent Application No. 10-2017-0116255, dated Mar. 3, 2022, 5 pp.

* cited by examiner

DISPLAY APPARATUS

CROSS-REFERENCE TO RELATED APPLICATIONS

This application is a continuation of U.S. patent application Ser. No. 16/015,359, filed Jun. 22, 2018, which claims priority to and the benefit of Korean Patent Application No. 10-2017-0079958, filed on Jun. 23, 2017, and Korean Patent Application No. 10-2017-0116255, filed on Sep. 12, 2017, in the Korean Intellectual Property Office, the contents of each of the foregoing being incorporated herein in their entireties by reference.

BACKGROUND

1. Field

The present disclosure relates to display apparatuses.

2. Description of the Related Art

Organic light-emitting devices (OLED) are self-light-emitting type devices having a wide viewing angle, excellent contrast, high response speed, superior characteristics in terms of a driving voltage, luminance, etc., which are capable of generating multiple colors.

An OLED may include an anode, a cathode, and an emission layer (organic material-containing emission layer) interposed therebetween. A hole transport area may be provided between the anode and the emission layer, and an electron transport area may be provided between the emission layer and the cathode. Holes injected from the anode may be transferred to the emission layer by passing through the hole transport area, and electrons injected from the cathode may be transferred to the emission layer by passing through the electron transport area. As carriers such as the holes and the electrons are recombined in the emission layer, excitons may be generated. As the excitons are shifted from an excited state to a ground state, light may be generated.

In an OLED type display including a plurality of quantum-dot color-converters, a blue OLED substrate or a white OLED substrate is mainly used as a light source.

Various types of organic light emitting devices are known. However, there still remains a need in OLEDs having low driving voltage, high efficiency, high brightness, and long lifespan.

SUMMARY

Provided are display apparatuses having excellent performance.

Provided are display apparatuses high efficiency and excellent color characteristics.

Provided are display apparatuses including an OLED light source that emits green light.

Provided are display apparatuses including an OLED light source that emits green light and a blue light, a plurality of quantum-dot color-converters, and a plurality of color filter elements.

Additional aspects will be set forth in part in the description which follows and, in part, will be apparent from the description, or may be learned by practice of the presented embodiments.

According to an embodiment, a display apparatus includes:

an OLED (organic light-emitting device) substrate comprising a structure in which at least one blue light-emitting unit and at least one green light-emitting unit are stacked, wherein the OLED substrate generates a mixed light of a blue light and a green light; and a color controller provided on the OLED substrate to adjust color of a light generated from the OLED substrate, wherein the color controller includes:

a first color control element including a plurality of first quantum dots for green conversion;

a second color control element including a plurality of second quantum dots for red conversion;

a third color control element for presenting a blue color;

a first color filter provided on the first color control element; and a second color filter provided on the second color control element.

The OLED substrate may include a tandem structure.

The OLED substrate may include:

a first blue light-emitting unit, a green light-emitting unit, and a second blue light-emitting unit which are sequentially stacked, and the green light-emitting unit may be arranged between the first and second blue light-emitting units.

The display apparatus may further include:

a first charge generation layer provided between the first blue light-emitting unit and the green light-emitting unit; and a second charge generation layer provided between the green light-emitting unit and the second blue light-emitting unit.

The green light-emitting unit may include a green emission layer including an organic material, and the green emission layer may include a thermally activated delayed fluorescence (TADF) dopant.

The green light-emitting unit may include a green emission layer including an organic material, the green emission layer may include a phosphorescent dopant, and the phosphorescent dopant may satisfy T1 (dopant)≤S1 (dopant)≤T1 (dopant)+0.5 electron Volts, wherein the T1 (dopant) is a triplet energy level (expressed in electron Volts) of the dopant and the S1 (dopant) is a singlet energy level (expressed in electron Volts) of the dopant.

The dopant may be an organic metal compound containing iridium (Ir).

The dopant may be an organic metal compound containing at least one of platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), and gold (Au).

The dopant may be an organic metal compound having a square-planar coordination structure.

The dopant may include a metal M and an organic ligand, and the metal M and the organic ligand form one, two, or three cyclometallated rings.

The dopant may include a metal M and a four-coordinate organic ligand that forms three or four cyclometallated rings, and the metal M may include platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au), and the four-coordinate organic ligand may include a benzimidazole group or a pyridine group.

The first color filter may be a blue cut filter, and the second color filter may be a blue and green cut filter.

The first color filter may be an absorption type green color filter, and the second color filter may be an absorption type red color filter.

The third color control element may include a blue color filter, and the display apparatus may further include a light scattering element provided between the blue color filter and the OLED substrate.

The third color control element may include a color converter comprising third quantum dots for blue conversion, and the display apparatus may further include a third color filter provided on the third color control element.

The third color filter may be a green cut filter or an absorption type blue color filter.

A core part of the second quantum dot may have a size greater than a core part of the first quantum dot.

The first color control element may correspond to a first sub-pixel area, the second color control element may correspond to a second sub-pixel area, and the third color control element may correspond to a third sub-pixel area, and the display apparatus may further include a fourth sub-pixel area, wherein the fourth sub-pixel area produces a color other than colors of the first to third sub-pixel areas.

The fourth sub-pixel area may be a blank area on the OLED substrate without a color control element, or may include a light scattering element provided on the OLED substrate.

The display apparatus may further include a selective reflection film provided between the OLED substrate and the color controller.

The selective reflection film may be configured to transmit a blue light and a green light and to reflect a red light.

The display apparatus may further include a thin film transistor (TFT) array substrate having a plurality of thin film transistors to drive pixel areas of the OLED substrate.

According to an aspect of another embodiment, a variety of electronic apparatuses including the above-described display apparatuses are provided.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
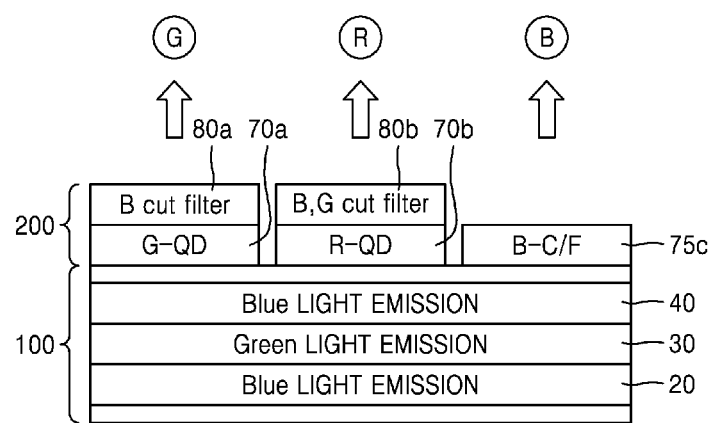
FIG. 1 is a cross-sectional view of a display apparatus according to an embodiment.

Various exemplary embodiments will now be described more fully with reference to the accompanying drawings in which exemplary embodiments are shown. In this regard, the exemplary embodiments may have different forms and should not be construed as being limited to the descriptions set forth herein. Accordingly, the embodiments are merely described below, by referring to the figures, to explain aspects of the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer or section discussed below could be termed a second element, component, region, layer, or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, display apparatuses according to embodiments of the present disclosure will now be described in detail with reference to the accompanying drawings. Also, the width and thickness of the layers or areas illustrated in the drawings may be rather exaggerated for convenience of explanation and clarity. Like references indicate like constituent elements in the drawings.

FIG. 1 is a cross-sectional view of a display apparatus according to an embodiment.

Referring to FIG. 1, the display apparatus may include an organic light-emitting device (OLED) substrate 100 and a color controller 200 for controlling color of a light generated from the OLED substrate 100.

The OLED substrate 100 may be referred to as an OLED light source. The OLED substrate 100 may have a structure in which at least one blue light-emitting unit and at least one green light-emitting unit are stacked. The blue light-emitting unit may emit a blue light having a peak wavelength range of about 440 nanometers (nm) to about 500 nm or about 450 nm to about 480 nm, and the green light-emitting unit may emit a green light having a peak wavelength range of about 500 nm to about 550 nm or about 510 nm to about 540 nm. Accordingly, the OLED substrate 100 may emit a mixed light of a blue light and a green light. The blue light-emitting unit may include a blue fluorescent material and/or a blue phosphorescent material. The green light-emitting unit may include a green phosphorescent material and/or a green fluorescent material.

According to an example embodiment, the OLED substrate 100 may include a first blue light-emitting unit 20, a green light-emitting unit 30, and a second blue light-emitting unit 40. The green light-emitting unit 30 may be arranged between the first blue light-emitting unit 20 and the second blue light-emitting unit 40. The green light-emitting unit 30 and the second blue light-emitting unit 40 may be sequentially stacked over the first blue light-emitting unit 20. Since the lifespan of each of the first and second blue light-emitting units 20 and 40 may be shorter than that of the green light-emitting unit 30, it may be advantageous to use two or more blue light-emitting units, that is, the first and second blue light-emitting units 20 and 40, and a less number of green light-emitting units, that is, the green light-emitting unit 30. Considering emission efficiency, lifespan, performance, etc., the single green light-emitting unit 30 may be used between the two first and second blue light-emitting units 20 and 40. However, the configuration of the OLED substrate 100 may be changed in various ways.

The OLED substrate 100 may have a tandem structure. In this state, a first charge generation layer (not shown) may be provided between the first blue light-emitting unit 20 and the green light-emitting unit 30. Furthermore, a second charge generation layer (not shown) may be provided between the green light-emitting unit 30 and the second blue light-emitting unit 40. The above-described tandem structure and the first and second charge generation layers are described below in detail with reference to FIGS. 9 and 10. In addition, the OLED substrate 100 may further include a lower layer under the first blue light-emitting unit 20 and an upper layer over the second blue light-emitting unit 40. Although in FIG. 1 no separate reference numerals are assigned to the lower layer and upper layer, these elements may be regarded as the elements included in the OLED substrate 100. The lower layer and upper layer are described below in detail with reference to FIGS. 9 and 11.

The color controller 200 may be provided on one surface of the OLED substrate 100. The color controller 200 may include a first color control element 70a including a plurality of first quantum dots (QDs) for green conversion, a second color control element 70b including a plurality of second QDs for red conversion, and a third color control element 75c including a plurality of third quantum dots for presenting a blue color. Furthermore, the color controller 200 may further include a first color filter 80a provided on the first color control element 70a and a second color filter 80b provided on the second color control element 70b.

The first color control element 70a may be a Green-QD containing layer and may convert the light generated from the OLED substrate 100 into a green G light. The second color control element 70b may be a Red-QD containing layer and may convert the light generated from the OLED substrate 100 into a red R light. Accordingly, the first color control element 70a may be referred to as the first color converter (or color conversion element), and the second color control element 70b may be referred to as the second color converter (or color conversion element). The color converter may be formed by mixing a resin material, QDs, and a light scattering agent. The resin material may include, for example, a photoresist (PR) material. The third color control element 75c may be a color filter that selectively passes a blue B wavelength range of the light generated from the OLED substrate 100. In other words, the third color control element 75c may be a Blue-color filter (C/F). In this case, the third color control element 75c may be an absorption type color filter including a pigment or dye, or QDs. The absorption type color filter may absorb a light of a wavelength range other than a light of a target wavelength range.

The first color filter 80a may cut a remaining wavelength of a blue range of the light passing through the first color control element 70a. The second color filter 80b may cut a remaining wavelength of blue and green ranges of the light passing through the second color control element 70b. The first color filter 80a may be referred to as the Blue-cut filter, and the second color filter 80b may be referred to as the Blue and Green-cut filter. Accordingly, the first and second color filters 80a and 80b may improve color control/filtering characteristics. Although it is not illustrated, a separate optical film may be further provided on the third color control element 75c. An RGB full color may be implemented by the color controller 200. The arrangement order or method of RGB sub-pixels are exemplary and may be changed in various ways.

The first QDs included in the first color control element 70a may be Green-QDs, and the second QDs included in the second color control element 70b may be Red-QDs. A QD signifies a semiconductor particle having a fine ball or a similar shape in a nanometer (nm) size, and may have a size (diameter) of about several nanometers to about tens of nanometers. The QD may have a monolithic structure or a core-shell structure. The core-shell structure may include a single shell or multi-shell structure. In an example, the core-shell structure may include a core part (central part) formed of a first semiconductor and an outer part (shell part) formed of a second semiconductor. For a core part (central part) material, cadmium selenide (CdSe), cadmium telluride (CdTe), cadmium sulfide (CdS), etc. may be used. For an outer part (shell part) material, zinc sulfide (ZnS), etc. may be used, and furthermore, a non-cadmium based QD may be used therefor. In other words, various materials not including cadmium (Cd) may be applied to the QD. However, the materials presented herein are exemplary, and other various materials may be applied to the QD. For example, the QD may include at least one of II-VI group semiconductor, III-V group semiconductor, IV-VI group semiconductor, and IV group semiconductor.

Since the size of a QD is very small, a quantum confinement effect may be achieved. When a particle is very small, electrons in the particle have discontinuous energy states due to an outer wall of the particle. In this state, as the size of a space in the particle decreases, the energy state of an electron becomes relatively higher and an energy band gap becomes wider, which is referred to as the quantum confinement effect. When a light such as an ultraviolet ray or a visible ray is incident on a QD, a light having a wavelength of various ranges may be generated according to the quantum confinement effect. The wavelength of the light generated from the QD may be determined based on the size, material, or structure of a particle (QD). In detail, when a light of a wavelength having energy greater than the energy band gap is incident on a QD, the QD is excited by absorbing the energy of light, and then returns to the base state by emitting a light of a particular wavelength. In this case, as the size of a QD (or, the core part of a QD) decreases, a light of a relatively short wavelength, for example, a blue series light or a green series light may be generated. As the size of a QD (or, the core part of a QD) increases, a light of a relatively long wavelength, for example, a red series light may be generated. Accordingly, various color lights may be implemented based on the size of a QD (or the core part of a QD). A QD particle capable of emitting a green series light may be referred to as the green light QD particle (Green QD particle), and a QD particle capable of emitting a red series light may be referred to as the red light QD particle (Red QD particle). For example, the green light QD particle (or core part) may be a particle having a width (diameter) of about 2 nm to about 3 nm, and the red light QD particle (or core part) may be a particle having a width (diameter) of about 5 nm to about 6 nm. The emission wavelength may be adjusted not only by the size (diameter) of a QD, but also by the constituent material and structure thereof.

Since the first color control element 70a can be regarded as a sort of color filter that converts color by using a QD, the first color control element 70a may be referred to as the "first QD color filter". Similarly, the second color control element 70b may be referred to as the "second QD color filter".

The first color filter 80a and the second color filter 80b, which are of a cut-off filter type, may be formed in, for example, a distributed Bragg reflector (DBR) structure. As the thickness and number of stacked layers are adjusted by repeatedly stacking two material layers (dielectric) having a different refractive index, a DBR structure for transmitting or reflecting only a desired wavelength range may be obtained and may be applied to the first color filter 80a or the second color filter 80b. For example, a $SiO_2$ layer and a $TiO_2$ layer may be repeatedly stacked under a condition of $\lambda/4$ (where, $\lambda$ is the wavelength of light), and reflectance or transmittance of a desired wavelength range may be increased by adjusting the thickness and number of stacked layers. Since the DBR structure is well-known, a detailed description thereof is omitted. Furthermore, at least one of the first color filter 80a and the second color filter 80b may have a structure other than the DBR structure, for example, a high-contrast grating (HCG) structure.

Figure 2:
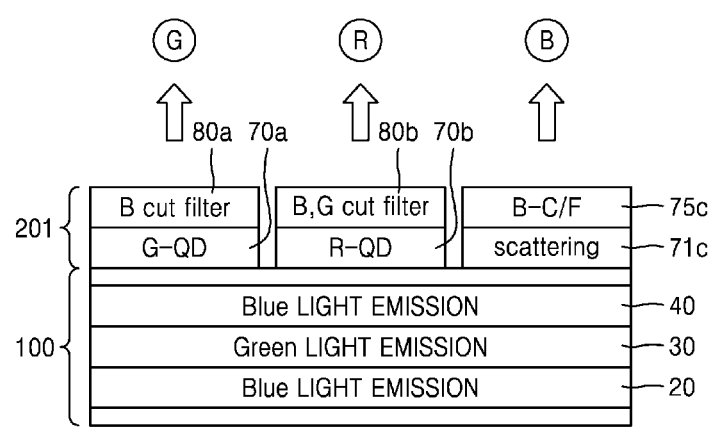
FIG. 2 is a cross-sectional view of a display apparatus according to another embodiment.

According to another embodiment, a light scattering element may be further provided between the third color control element 75c and the OLED substrate 100 of FIG. 1, and an example thereof is illustrated in FIG. 2.

Referring to FIG. 2, a light scattering element 71c may be further provided between the third color control element 75c and the OLED substrate 100. In this state, the third color control element 75c may be a Blue-color filter (C/F). The light scattering element 71c may include a resin material and a light scattering agent. The resin material may include a PR material. The light scattering agent may include, for example, titanium oxide $TiO_2$, etc., but the present disclosure is not limited thereto. As each of the first and second color control elements 70a and 70b may include the light scattering agent, color balance may be obtained by providing the light scattering element 71c under the third color control element 75c. In other words, a change in visibility among RGB areas may be reduced. Reference numeral 201 in FIG. 2 indicates a color controller.

According to another embodiment, instead of a Blue-color filter (C/F), a color converter containing QDs (Blue-QDs) may be used as the third color control element 75c of FIG. 1. An example thereof is illustrated in FIG. 3.

Figure 3:
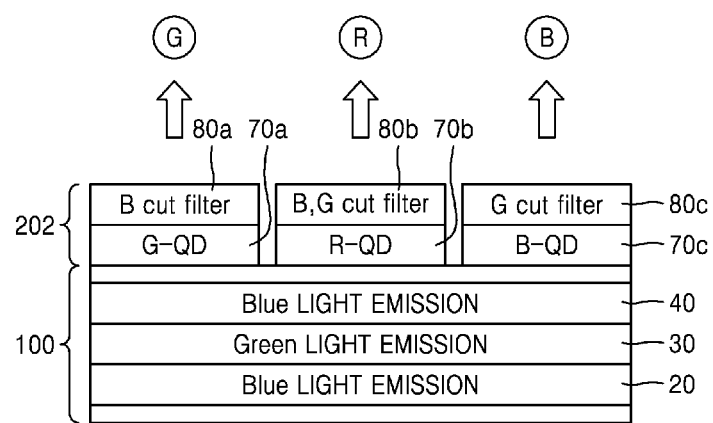
FIG. 3 is a cross-sectional view of a display apparatus according to another embodiment.

Referring to FIG. 3, although it is similar to FIG. 1, instead of Blue-color filter (C/F), a Blue-QD containing layer may be used as a third color control element 70c. The third color control element 70c may convert the light generated from the OLED substrate 100 to blue B. Accordingly, the third color control element 70c may be referred to as the third color converter. The third color control element 70c may include a resin material, QDs, and a light scattering agent. In this case, a color controller 202 may further include a third color filter 80c provided on the third color control element 70c. The third color filter 80c may block the remaining green range light among the light passing through the third color control element 70c. In other words, the third color filter 80c may be a Green-cut filter.

Figure 4:
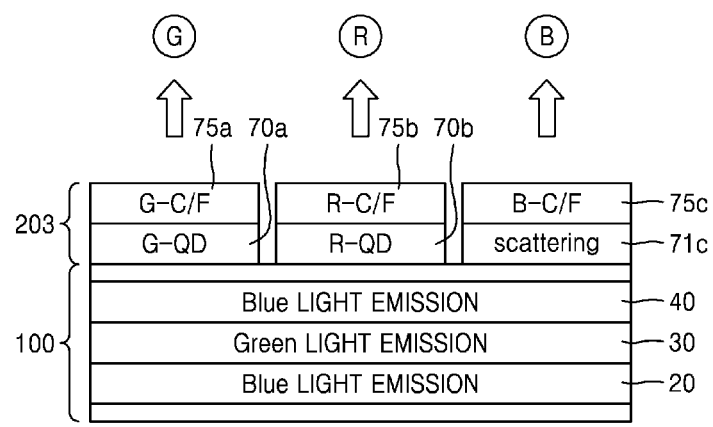
FIG. 4 is a cross-sectional view of a display apparatus according to another embodiment.

According to another embodiment, instead of the first and second color filters 80a and 80b of FIGS. 1 and 2 which are of a cut-off filter type, an absorption type color filter may be used, and an example thereof is illustrated in FIG. 4. FIG. 4 illustrates a modified example of the embodiment of FIG. 2.

Referring to FIG. 4, not a Blue-cut filter, but an absorption type Green-color filter (C/F) may be used as a first color filter 75a, and not a Blue and Green-cut filter, but an absorption type Red-color filter (C/F) may be used as a second color filter 75b. The Green-color filter 75a may selectively transmit a light in a green wavelength range and absorb a light in the other wavelength range. Similarly, the Red-color filter 75b may selectively transmit a light in a red wavelength range and absorb a light in the other wavelength range. In the present embodiment, a color controller 203 uses the absorption type color filters 75a, 75b, and 75c commonly for an R-sub-pixel area, a G-sub-pixel area, and a B-sub-pixel area. In the present embodiment, the third color control element 70c of FIG. 3, containing Blue-QD, may be used instead of the light scattering element 71c.

According to another embodiment, the display apparatus may include a fourth sub-pixel area, in addition to the R-sub-pixel (first sub-pixel) area, the G-sub-pixel (second sub-pixel) area, and the B-sub-pixel (third sub-pixel) area. The fourth sub-pixel may be configured to produce a color (fourth color) other than R, G, and B. The different color (fourth color) may be, for example, cyan C, but the present disclosure is not limited thereto. An example wherein the fourth sub-pixel area is included is illustrated FIGS. 5 to 8. In FIGS. 5 to 8, a reference numeral "100a" indicates an OLED substrate, and reference numerals 200a to 203a indicate color controllers.

Figure 5:
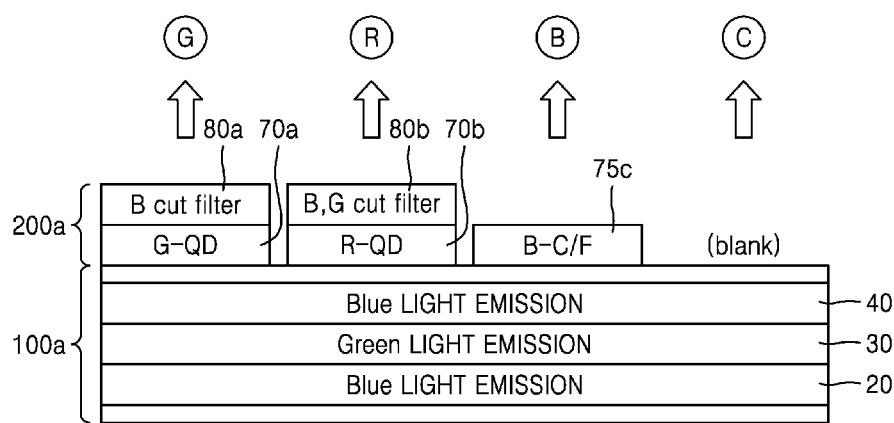
FIG. 5 is a cross-sectional view of a display apparatus according to another embodiment.

Referring to FIG. 5, similarly to FIG. 1, a partial area of an OLED substrate 100a may be left as a blank area. The blank area may correspond to the fourth sub-pixel area, and a cyan C color may be generated therefrom.

Figure 6:
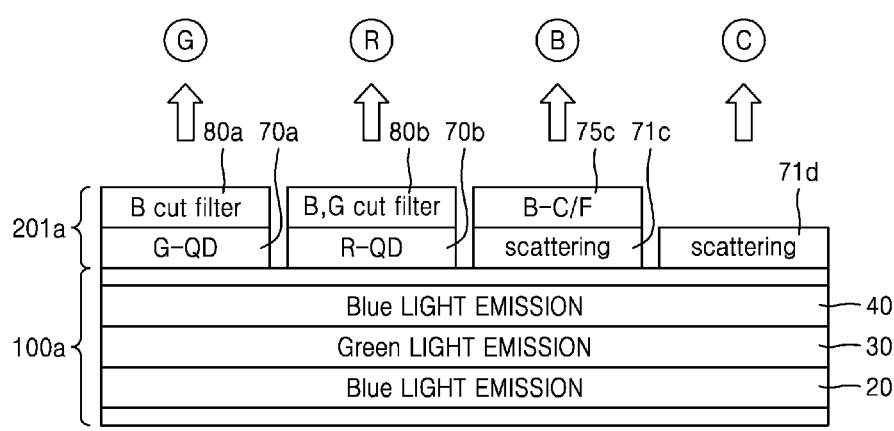
FIG. 6 is a cross-sectional view of a display apparatus according to another embodiment.

Referring to FIG. 6, similarly to FIG. 2, a light scattering element 71d may be provided in the fourth sub-pixel area of the OLED substrate 100a. When the light scattering element 71c provided under the third color control element 75c is referred to as the first light scattering element, the light scattering element 71d provided under the fourth sub-pixel area may be referred to as the second light scattering element. The first light scattering element 71c and second the light scattering element 71d may have the same or similar material structure.

Figure 7:
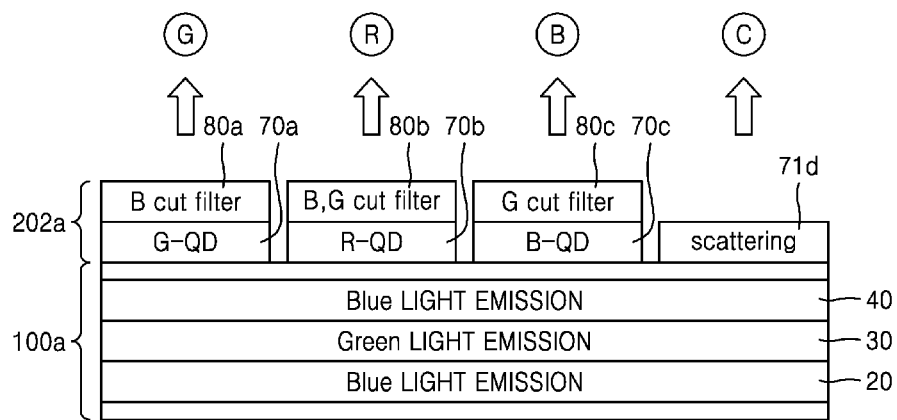
FIG. 7 is a cross-sectional view of a display apparatus according to another embodiment.

Referring to FIG. 7, similarly to FIG. 3, the light scattering element 71d may be provided in the fourth sub-pixel area of the OLED substrate 100a.

Figure 8:
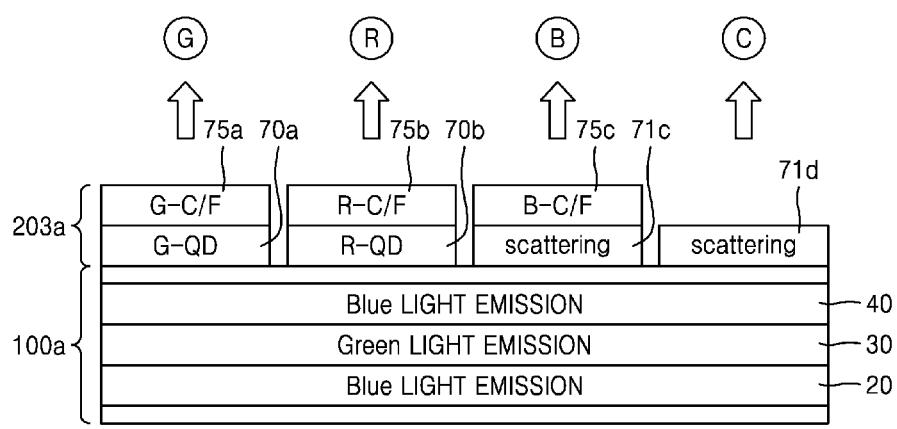
FIG. 8 is a cross-sectional view of a display apparatus according to another embodiment.

Referring to FIG. 8, similarly to FIG. 4, the light scattering element 71d may be provided in the fourth sub-pixel area of the OLED substrate 100a.

In the embodiments of FIGS. 5 to 8, the arrangement order and arrangement method of the R-sub-pixel (first sub-pixel) area, the G-sub-pixel (second sub-pixel) area, the B-sub-pixel (third sub-pixel) area, and the C-sub-pixel (fourth sub-pixel) area are exemplary and may be changed in various ways. For example, the R-, G-, B-, and C-sub-pixel areas may be arranged in a square matrix form, when viewed from the top. Furthermore, the color from the C-sub-pixel (fourth sub-pixel) area may be changed to a color other than cyan C.

Figure 9:
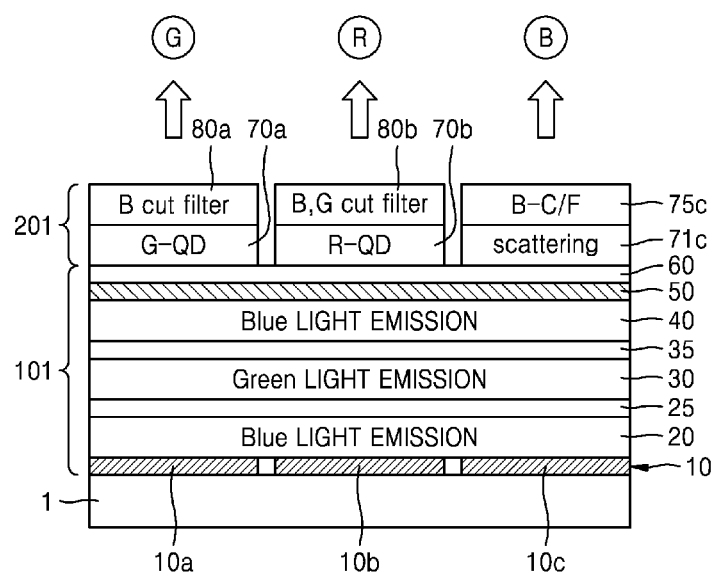
FIG. 9 is a cross-sectional view illustrating in detail a configuration of a display apparatus according to another embodiment.

FIG. 9 is a cross-sectional view illustrating in detail a configuration of a display apparatus according to another embodiment.

Referring to FIG. 9, a TFT array substrate 1 including a plurality of thin film transistors (TFTs) (not shown) may be provided, and an OLED substrate 101 may be provided on the TFT array substrate 1. The TFTs of the TFT array substrate 1 may be elements to drive pixel (sub-pixel) areas of the OLED substrate 101. The color controller 201 may be provided on the OLED substrate 101.

The OLED substrate 101 may include a plurality of first electrodes 10a, 10b, and 10c (10). The first electrodes 10a, 10b, and 10c may be elements patterned corresponding to the respective sub-pixel areas. Each of the first electrodes 10a, 10b, and 10c may be electrically connected to each TFT element of the TFT array substrate 1. The first blue light-emitting unit 20, the green light-emitting unit 30, and the second blue light-emitting unit 40 may be sequentially stacked over the first electrodes 10a, 10b, and 10c. A first charge generation layer 25 may be provided between the first blue light-emitting unit 20 and the green light-emitting unit 30. Furthermore, a second charge generation layer 35 may be provided between the green light-emitting unit 30 and the second blue light-emitting unit 40. Accordingly, the first blue light-emitting unit 20, the green light-emitting unit 30, and the second blue light-emitting unit 40 may be serially connected forming a tandem structure. A second electrode 50 may be provided on the second blue light-emitting unit 40. Although the second electrode 50 is illustrated as having a form that is not patterned, in some cases, the second electrode 50 may be patterned into a plurality of electrode elements. The first electrode 10 and the second electrode 50 may be an anode and a cathode, respectively, or vice versa. While the first electrode 10 is not patterned and the second electrode 50 is patterned, both of the first electrode 10 and the second electrode 50 may be patterned. Furthermore, a plurality of light-emitting units 20, 30, and 40 provided between the first electrode 10 and the second electrode 50, and the first and second charge generation layers 25 and 35 therebetween, may have a structure patterned in units of sub-pixels. A protection layer 60 may be further provided on the second electrode 50. The protection layer 60 may be formed of a transparent insulating material.

The color controller 201 may be provided on the protection layer 60. Although the color controller 201 is illustrated as having the same configuration as the color controller 201 of FIG. 2, the configuration may be changed in various ways.

Figure 10:
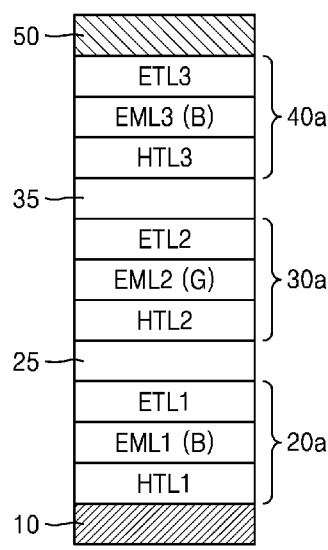
FIG. 10 is a cross-sectional view illustrating in detail a configuration of an OLED substrate that is applicable to a display apparatus according to an embodiment.

FIG. 10 is a cross-sectional view illustrating in detail a configuration of an OLED substrate that is applicable to a display apparatus according to an embodiment. FIG. 10 illustrates in detail a configuration that the OLED substrate 101 of FIG. 9 may have.

Referring to FIG. 10, a first blue light-emitting unit 20a, the first charge generation layer 25, a green light-emitting unit 30a, the second charge generation layer 35, a second blue light-emitting unit 40a, and the second electrode 50 may be sequentially provided over the first electrode 10.

The first blue light-emitting unit 20a may include a first blue emission layer EML1 having an organic material based blue light-emitting material, and may further include a first hole transport layer HTL1 and a first electron transport layer ETL1. The first hole transport layer HTL1 may be arranged between the first blue emission layer EML1 and the first electrode 10, and the first electron transport layer ETL1 may be arranged between the first blue emission layer EML1 and the first charge generation layer 25. The green light-emitting unit 30a may include a green emission layer EML2 having an organic material based green light-emitting material, and may further include a second hole transport layer HTL2 and a second electron transport layer ETL2. The second blue light-emitting unit 40a may include a second blue emission layer EML3 having an organic material based blue light-emitting material, and may further include a third hole transport layer HTL3 and a third electron transport layer ETL3. Although it is not illustrated in the drawings, each of the first blue light-emitting unit 20a, the green light-emitting unit 30a, and the second blue light-emitting unit 40a may further include at least one of a hole injection layer and an electron injection layer. The first and second charge generation layers 25 and 35 may be formed of metal or a metallic material, and emission efficiency of an OLED substrate may be improved.

Figure 11:
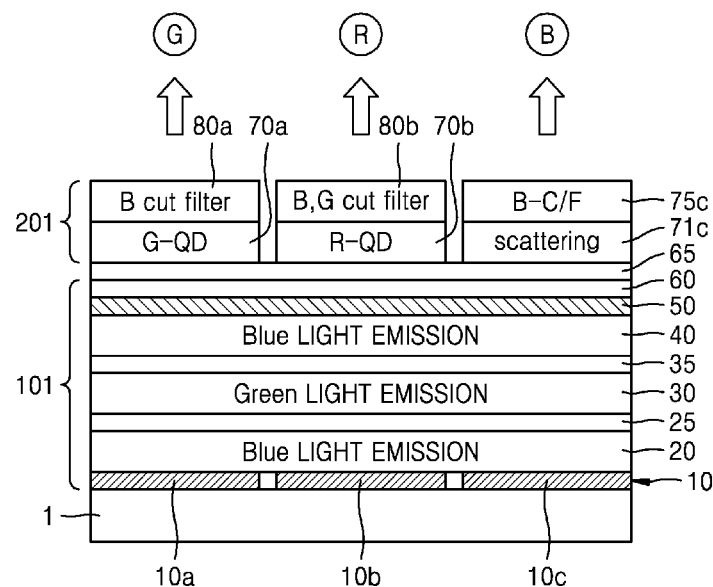
FIG. 11 is a cross-sectional view illustrating in detail a configuration of a display apparatus according to an embodiment.

According to another embodiment, in the structure illustrated in FIG. 9, a "selective reflection film" may be further provided between the OLED substrate 101 and the color controller 201, and an example thereof is illustrated in FIG. 11.

Referring to FIG. 11, similarly to FIG. 9, a selective reflection film 65 may be further provided between the OLED substrate 101 and the color controller 201. The selective reflection film 65 may be configured to, for example, transmit a blue light and a green light and reflect a red light. The selective reflection film 65 may transmit a light in a wavelength range of about 440 nm to about 550 nm, and may reflect a light in wavelength range of about 610 nm to about 760 nm. Accordingly, a mixed light of a blue light and a green light, which is emitted from the OLED substrate 101, may pass through the selective reflection film 65 to be incident on the color controller 201. Furthermore, a red light emitted downward from the second color control element 70b may be reflected by the selective reflection film 65 to be emitted upward. Light efficiency may be improved by the selective reflection film 65. If necessary, the selective reflection film 65 may be selectively formed under the second color control element 70b only.

The selective reflection film 65 may have, for example, a DBR structure. By repeatedly stacking two material layers (dielectric) having different refractive indexes to adjust the thickness and number of stacked material layers, a DBR structure capable of transmitting or reflecting a desired wavelength range only may be manufactured, and such a DBR structure may be applied to the selective reflection film 65. For example, when repeatedly stacking a first dielectric layer and a second dielectric layer, by adjusting the material, thickness, and number of stacked layers, reflectance or transmittance in a desired wavelength range may be improved. However, the configuration of the selective reflection film 65 is not limited to the DBR structure and may be changed. The selective reflection film 65 may have a dichroic mirror structure.

Although FIGS. 9 and 11 illustrate that the TFT array substrate 1 is provided under the OLED substrate 101 and the color controller 201 is arranged above the OLED substrate 101, the relative positional relationship thereof may be changed. When the OLED substrate 101 is not a top emission (top-surface emission) device, but a bottom emission (rear-surface emission) device, the color controller 201 may be provided on a lower surface of the TFT array substrate 1. In addition, the configuration of the display apparatus described with reference to FIGS. 9 and 11 may be changed in various ways.

In the following description, a blue light-emitting material and a green light-emitting material that may be applied to the OLED substrate of a display apparatus according to an embodiment are described.

The above-described green light-emitting material or blue light-emitting material may include a phosphorescent dopant. The phosphorescent dopant may be selected from, for example, the following compounds PD1 to PD25, but the present disclosure is not limited thereto.

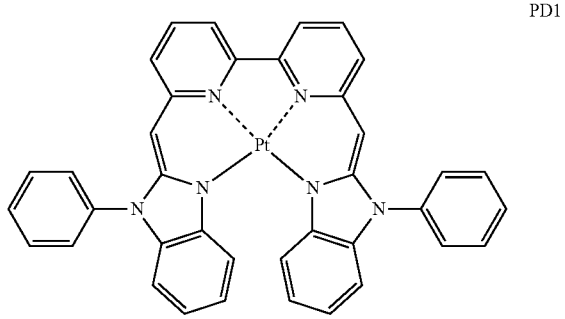

PD1

-continued
PD2
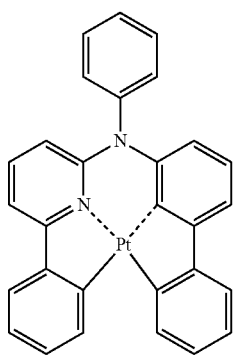
PD3
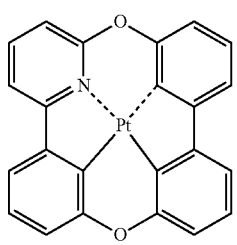
PD4
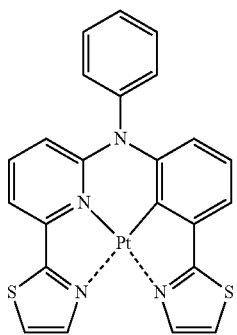
PD5
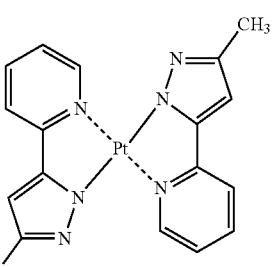
PD6
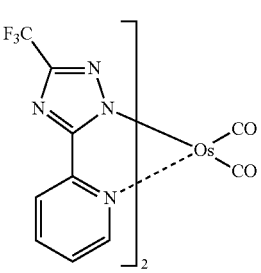
-continued
PD7
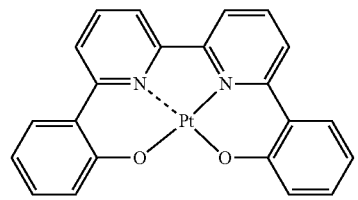
PD8
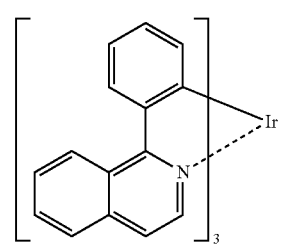
PD9
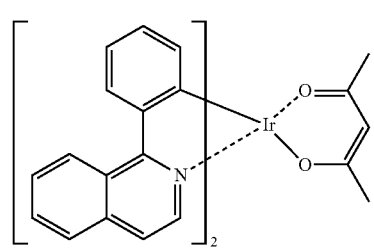
PD10
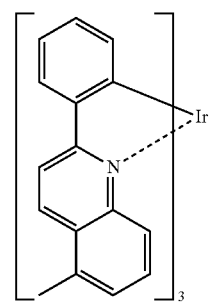
PD11
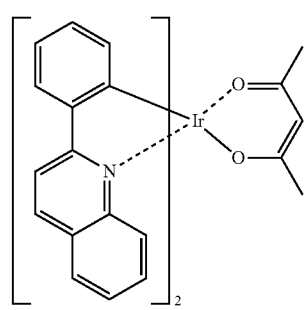

PD12 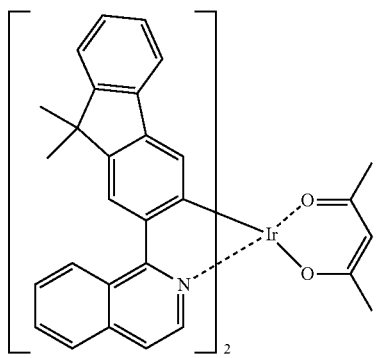
PD13 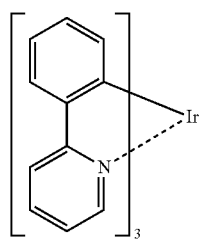
PD14 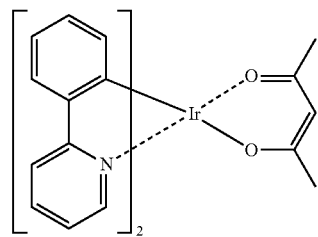
PD15 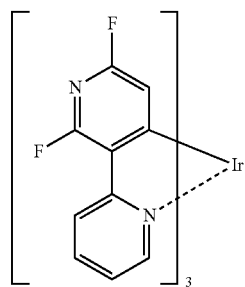
PD16 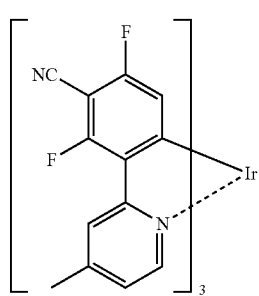
PD17 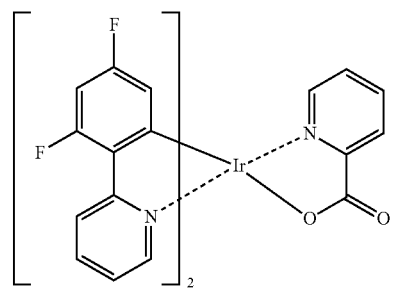
PD18 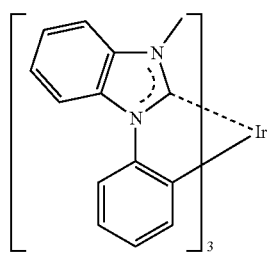
PD19 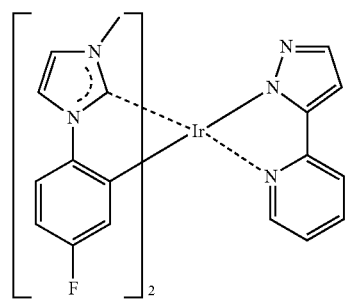
PD20 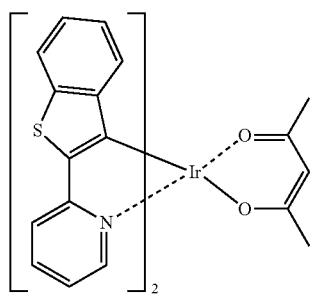
PD21 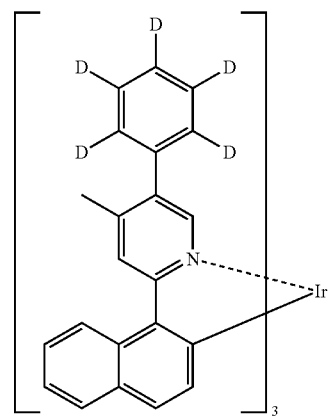

-continued

PD22
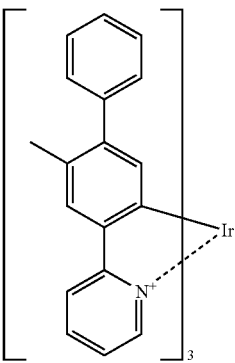

PD23
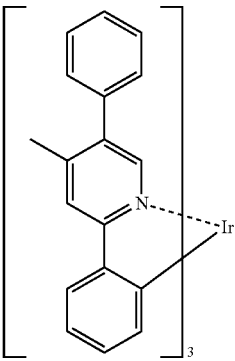

PD24
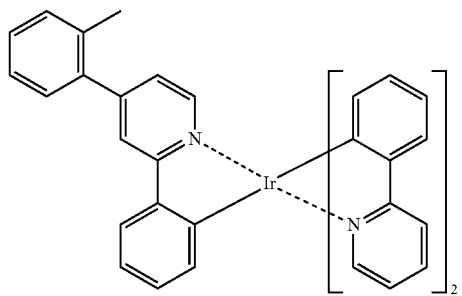

PD25
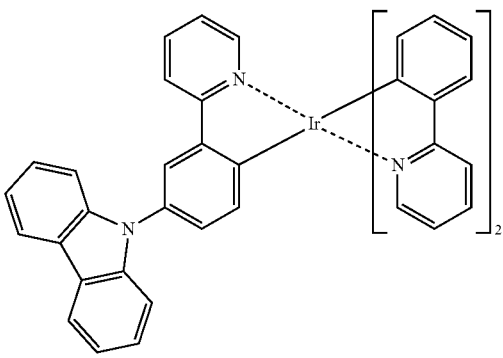

As described above, phosphorescent dopant may include an organic metal compound containing iridium (Ir), an organic metal compound containing platinum (Pt), or an organic metal compound containing osmium (Os). In addition, the phosphorescent dopant may include various other materials.

The emission layer of the green light-emitting unit (green OLED) 30 may include an electron transport host, a hole transport host, and a dopant. The dopant may be an organic metal compound, and the dopant may include iridium or may not include iridium. In other words, the dopant may be an iridium-containing or non-iridium-containing organic metal compound. The dopant of the emission layer of the green light-emitting unit (green OLED) 30 may be a phosphorescent emitting compound. The OLED may be clearly distinguished from the OLED that emits fluorescence by a fluorescent mechanism.

According to an embodiment, the dopant of the emission layer may satisfy that T1 (dopant)≤S1 (dopant)≤T1 (dopant)+0.5 electron Volts (eV), for example, T1 (dopant)≤S1 (dopant)≤T1 (dopant)+0.36 eV, but the present disclosure is not limited thereto. In this state, the T1 (dopant) is a triplet energy level (eV) of the dopant of the emission layer, and the S1 (dopant) is a singlet energy level (eV) of the dopant included in the emission layer.

As the S1 (dopant) satisfies the above-described range, the dopant of the emission layer may have a high radiative decay rate even when spin-orbital coupling (SOC) with the singlet energy level close to the triplet energy level is weak, a high radiative decay rate may be obtained.

For example, the dopant may be an organic metal compound containing iridium (Ir), or an organic metal compound containing platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au). For example, the dopant may be an organic metal compound containing platinum (Pt) or palladium (Pd), but the present disclosure is not limited thereto.

According to another embodiment, the dopant of the emission layer may be an organic metal compound having a square-planar coordination structure.

According to another embodiment, although the dopant of the emission layer may satisfy that T1 (dopant)≤$E_{gap}$ (dopant)≤T1 (dopant)+0.5 eV, the present disclosure is not limited thereto. In this state, the T1 (dopant) is a triplet energy level (eV) of the dopant of the emission layer, and the $E_{gap}$ (dopant) is a difference between the highest occupied molecular orbital (HOMO) (dopant) and the lowest unoccupied molecular orbital (LUMO) (dopant) of the dopant included in the emission layer. The HOMO (dopant) is a HOMO energy level (eV) of the dopant included in the emission layer, and the LUMO (dopant) is a LUMO energy level (eV) of the dopant included in the emission layer. The HOMO (dopant) and the LUMO (dopant) are negative values measured by using differential pulse voltammetry by using ferrocene as a reference material. The T1 (dopant) is calculated from the peak wavelength of a phosphorescent spectrum of the dopant measured by using an emission measurement device. The dopant of the emission layer may satisfy that −2.8 eV≤LUMO (dopant)≤−2.3 eV, −2.8 eV≤LUMO (dopant)≤−2.4 eV, −2.7 eV≤LUMO (dopant)≤−2.5 eV, or −2.7 eV≤LUMO (dopant)≤−2.61 eV.

According to another embodiment, the dopant of the emission layer may satisfy that −6.0 eV≤HOMO (dopant)≤−4.5 eV, −5.7 eV≤HOMO (dopant)≤−5.1 eV, −5.6 eV≤HOMO (dopant)≤−5.2 eV, or −5.6 eV≤HOMO (dopant)≤−5.25 eV.

According to another embodiment, the dopant may include metal M and an organic ligand, and the metal M and the organic ligand may form one, two, or three cyclometallated rings. The metal M may be iridium (Ir), platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au).

According to another embodiment, the dopant may include metal M and a four-coordinate organic ligand that may form three or four (for example, three) cyclometallated rings. The metal M is as described in the present specification. The four-coordinate organic ligand may include, for example, a benzimidazole group and a pyridine group, but the present disclosure is not limited thereto.

According to another embodiment, the dopant may include metal M and at least one of ligands indicated by the following Chemical Formulae 1-1 to 1-4.

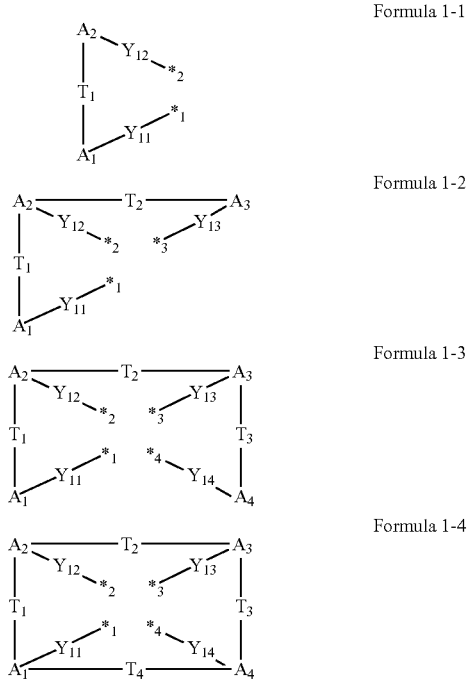

Formula 1-1

Formula 1-2

Formula 1-3

Formula 1-4

For example, when the metal M is iridium (Ir), the metal M may be coupled to the ligand of Chemical Formula 1-1, and when the metal M is platinum (Pt), the metal M may be coupled to the ligand expressed by Chemical Formulae 1-2 to 1-4. When the metal M is osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au), the metal M may be coupled to any one ligand of Chemical Formulae 1-1 to 1-4.

In Formulae 1-1 to 1-4, $A_1$ to $A_4$ may each independently be selected from a substituted or unsubstituted $C_5$-$C_{30}$ carbocyclic group, a substituted or unsubstituted $C_1$-$C_{30}$ heterocyclic group, and a substituted or unsubstituted non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be selected from a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—S(=O)$_2$—*', *—C($R_{93}$)=*', *=C($R_{93}$)—*, *—C($R_{93}$)=C($R_{94}$)—*', *—C(=S)—*', and *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, and

*$^1$, *$^2$, *$^3$ and *$^4$ each indicate a binding site to M of the dopant.

For example, the dopant may include a ligand represented by Formula 1-3, and any two of $A_1$ to $A_4$ may each be a substituted or unsubstituted benzimidazole group and a substituted or unsubstituted pyridine group, but embodiments of the present disclosure are not limited thereto.

In one or more embodiments, the dopant may be an organometallic compound represented by Formula 1A:

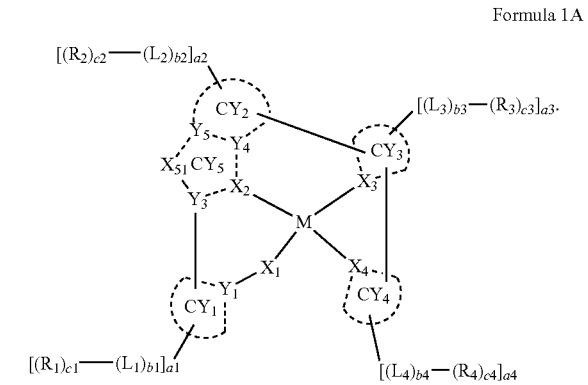

Formula 1A

In Formula 1A,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), rhutenium (Ru), rhodium (Rh), palladium (Pd), silver (Ag), rhenium (Re), platinum (Pt), or gold (Au), $X_1$ may be O or S, and a bond between $X_1$ and M may be a covalent bond, $X_2$ to $X_4$ may each independently be C or N, one bond selected from a bond between $X_2$ and M, a bond between $X_3$ and M, and a bond between $X_4$ and M may be a covalent bond, and the others thereof may each be a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ may each be a chemical bond, $CY_1$ to $CY_5$ may each independently be a $C_5$-$C_{30}$ carbocyclic group or a $C_1$-$C_{30}$ heterocyclic group, and $CY_4$ is not a benzimidazole group, a cyclometalated ring formed by $CY_5$, $CY_2$, $CY_3$, and M may be a 6-membered ring, $X_{51}$ may be selected from O, S, N-[$(L_7)_{b7}$-$(R_7)_{c7}$], $C(R_7)(R_8)$, $Si(R_7)(R_8)$, $Ge(R_7)(R_8)$, C(=O), N, $C(R_7)$, $Si(R_7)$, and $Ge(R_7)$, $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be a substituted or unsubstituted $C_5$-$C_{30}$ carbocyclic group or a substituted or unsubstituted $C_1$-$C_{30}$ heterocyclic group, b1 to b4 and b7 may each independently be an integer from 0 to 5, $R_1$ to $R_4$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, c1 to c4 may each independently be an integer from 1 to 5, a1 to a4 may each independently be 0, 1, 2, 3, 4, or 5, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and two or more groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group.

In Formulae 1-1 to 1-4 and 1A, a $C_5$-$C_{30}$ carbocyclic group, a $C_1$-$C_{30}$ heterocyclic group, and $CY_1$ to $CY_4$ may each independently be a) a 6-membered ring, b) a condensed ring in which two or more 6-membered rings are condensed each other, or c) a condensed ring in which at least one 6-membered ring and one 5-membered ring are condensed each other; the 6-membered ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group; and the 5-membered ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, and a thiadiazole group.

In Formulae 1-1 to 1-4, a non-cyclic group may be *—C(=O)—*', *—O—C(=O)—*', *—S—C(=O)—*', *—O—C(=S)—*', or *—S—C(=S)—*', but embodiments of the present disclosure are not limited thereto.

In Formulae 1-1 to 1-4 and 1A, a substituent of the substituted $C_5$-$C_{30}$ carbocyclic group, a substituent of the substituted $C_1$-$C_{30}$ heterocyclic group, $R_{91}$ to $R_{94}$, $R_1$ to $R_4$, $R_7$, and $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ and Q$_{33}$ to Q$_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In one or more embodiments, the dopant may be an organometallic compound represented by Formula 1A, provided that, in Formula 1A, X$_2$ and X$_3$ may each independently be C or N, X$_4$ may be N, when i) M may be Pt, ii) X$_1$ may be 0, iii) X$_2$ and X$_4$ may each independently be N, X$_3$ may be C, a bond between X$_2$ and M and a bond between X$_4$ and M may each independently be a coordinate bond, and a bond between X$_3$ and M may be a covalent bond, iv) Y$_1$ to Y$_5$ may each independently be C, v) a bond between Y$_5$ and X$_{51}$ and a bond between Y$_3$ and X$_{51}$ may each independently be a single bond, vi) CY$_1$, CY$_2$, and CY$_3$ may each independently be a benzene group, and CY$_4$ may be a pyridine group, vii) X$_{51}$ may be O, S, or N-[(L$_7$)$_{b7}$-(R$_7$)$_{c7}$], and viii) b7 may be 0, and c7 may be 1, and R$_7$ is a substituted or unsubstituted $C_1$-$C_{60}$ alkyl group, a) a1 to a4 may each independently be 1, 2, 3, 4, or 5, and b) at least one of R$_1$ to R$_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the dopant may be represented by Formula 1A-1:

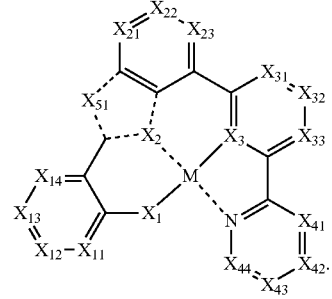

Formula 1A-1

In Formula 1A-1,

M, X$_1$ to X$_3$, and X$_5$si are each independently the same as described herein, X$_{11}$ may be N or C-[(L$_{11}$)$_{b11}$-(R$_{11}$)$_{c11}$], X$_{12}$ may be N or C-[(L$_{12}$)$_{b12}$-(R$_{12}$)$_{c12}$], X$_{13}$ may be N or C-[(L$_{13}$)$_{b13}$-(R$_{13}$)$_{c13}$], and X$_{14}$ may be N or C-[(L$_{14}$)$_{b14}$-(R$_{14}$)$_{c14}$], L$_{11}$ to L$_{14}$, b11 to b14 R$_{11}$ to R$_{14}$, and c11 to c14 are each independently the same as described in connection with L$_1$, b1, R$_1$, and c1, X$_{21}$ may be N or C-[(L$_{21}$)$_{b21}$-(R$_{21}$)$_{c21}$], X$_{22}$ may be N or C-[(L$_{22}$)$_{b22}$-(R$_{22}$)$_{c22}$], and X$_{23}$ may be N or C-[(L$_{23}$)$_{b23}$-(R$_{23}$)$_{c23}$], L$_{21}$ to L$_{23}$, b21 to b23, R$_{21}$ to R$_{23}$, and c21 to c23 are each independently the same as described in connection with L$_2$, b2, R$_2$, and c2, $X_{31}$ may be N or C-[$(L_{31})_{b31}$-$(R_{31})_{c31}$], $X_{32}$ may be N or C-[$(L_{32})_{b32}$-$(R_{32})_{c32}$], and $X_{33}$ may be N or C-[$(L_{33})_{b33}$-$(R_{33})_{c33}$], $L_{31}$ to $L_{33}$, b31 to b33, $R_{31}$ to $R_{33}$, and c31 to c33 are each independently the same as described in connection with $L_3$, b3, $R_3$, and c3, $X_{41}$ may be N or C-[$(L_{41})_{b41}$-$(R_{41})_{c41}$], $X_{42}$ may be N or C-[$(L_{42})_{b42}$-$(R_{42})_{c42}$], $X_{43}$ may be N or C-[$(L_{43})_{b43}$-$(R_{43})_{c43}$], and $X_{44}$ may be N or C-[$(L_{44})_{b44}$-$(R_{44})_{c44}$], $L_{41}$ to $L_{44}$, b41 to b44, $R_{41}$ to $R_{44}$, and c41 to c44 are each independently the same as described in connection with $L_4$, b4, $R_4$, and c4, two of $R_{11}$ to $R_{14}$ may optionally be linked to form a substituted or unsubstituted $C_5$-$C_{30}$ carbocyclic group or a substituted or unsubstituted $C_1$-$C_{30}$ heterocyclic group, two of $R_{21}$ to $R_{23}$ may optionally be linked to form a substituted or unsubstituted $C_5$-$C_{30}$ carbocyclic group or a substituted or unsubstituted $C_1$-$C_{30}$ heterocyclic group, two of $R_{31}$ to $R_{33}$ may optionally be linked to form a substituted or unsubstituted $C_5$-$C_{30}$ carbocyclic group or a substituted or unsubstituted $C_1$-$C_{30}$ heterocyclic group, and two of $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group.

For example, the dopant may be one of Compounds 1-1 to 1-88, 2-1 to 2-47, and 3-1 to 3-582, but embodiments of the present disclosure are not limited thereto:

1-1

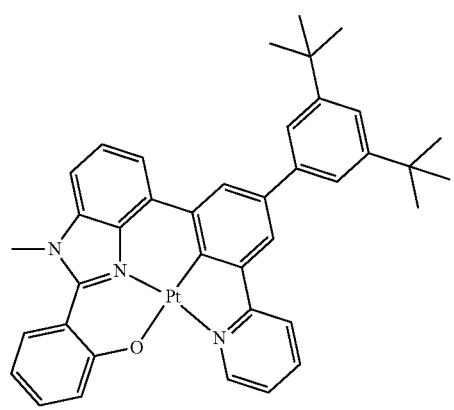

1-2

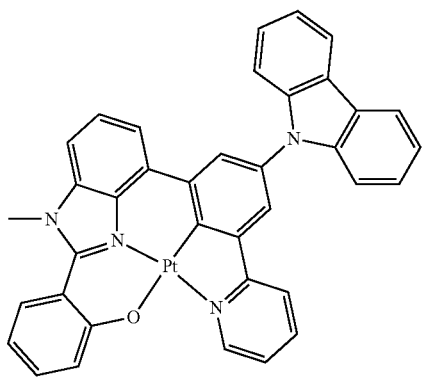

1-3

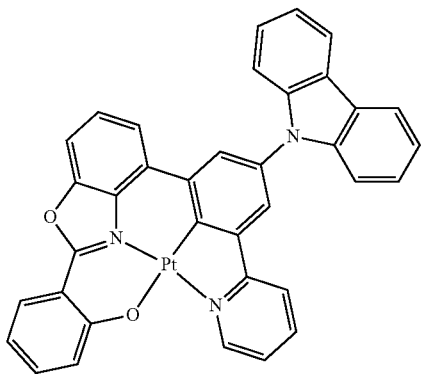

1-4

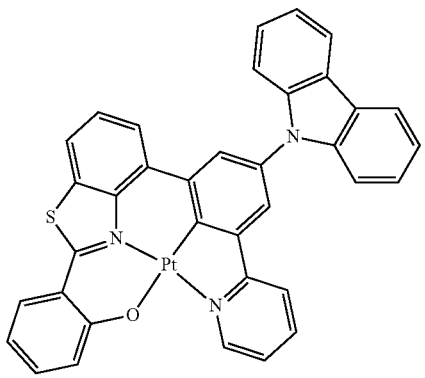

1-5

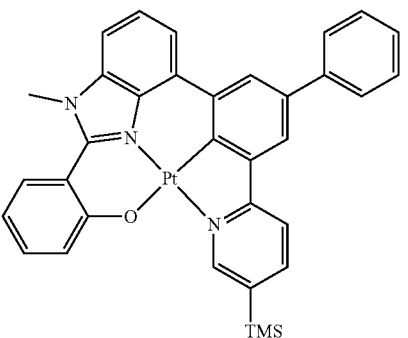

1-6

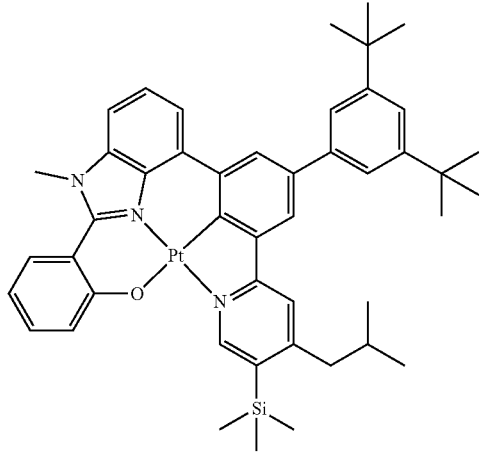

1-7
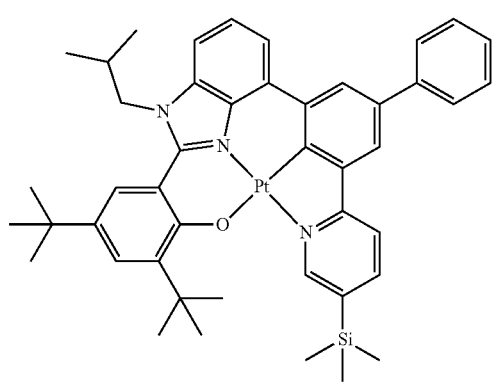
1-8
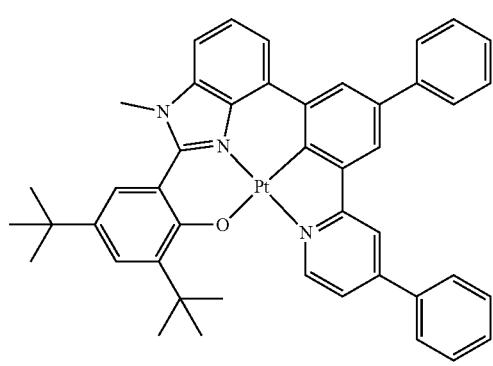
1-9
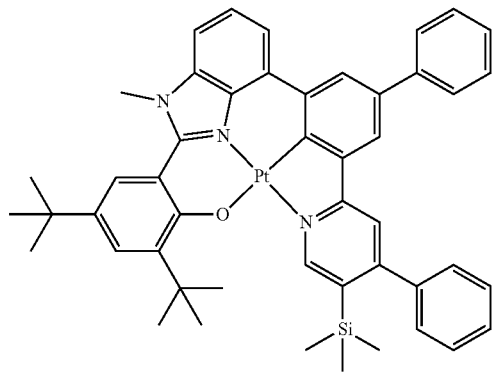
1-10
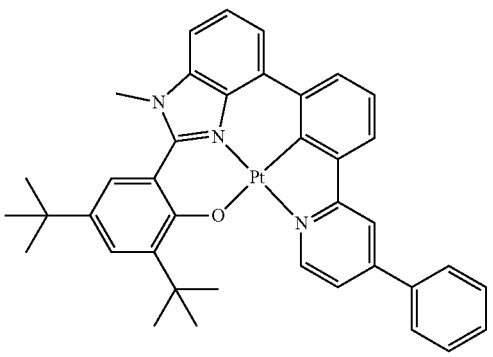
1-11
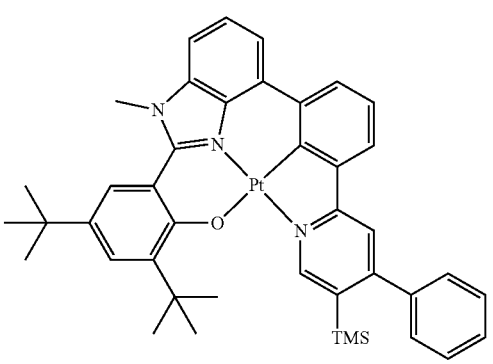
1-12
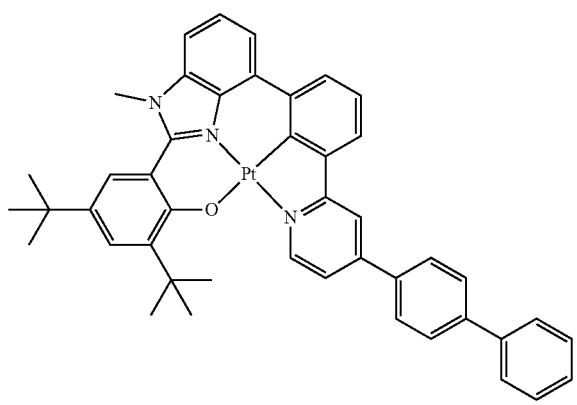
1-13
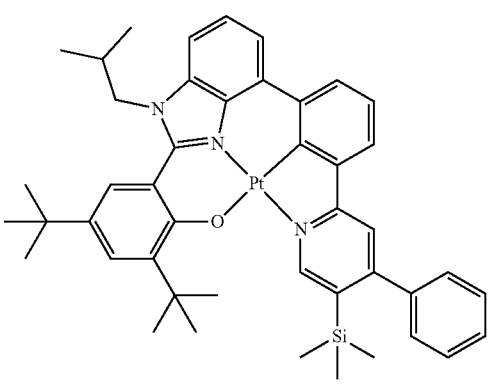
1-14
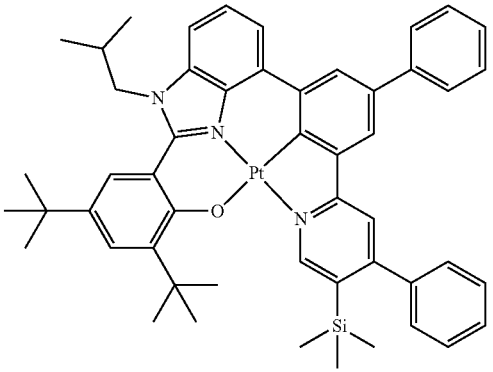

1-15
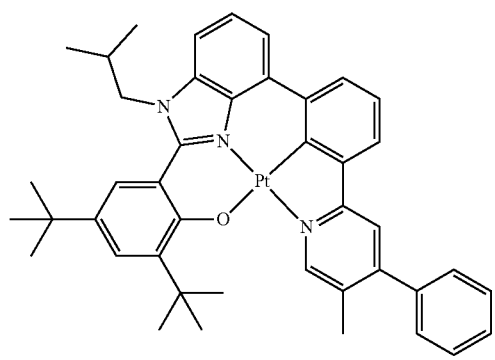
1-16
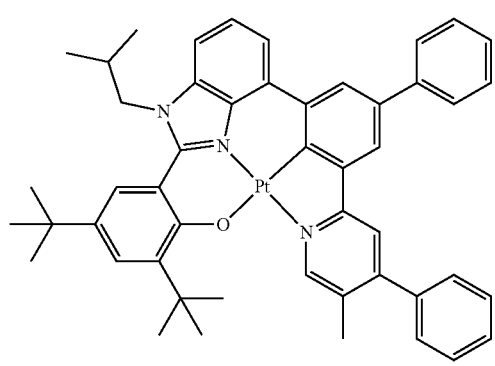
1-17
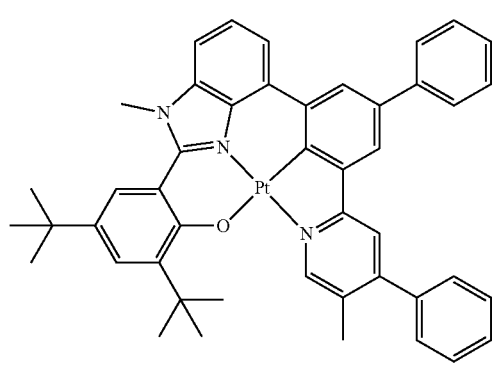
1-18
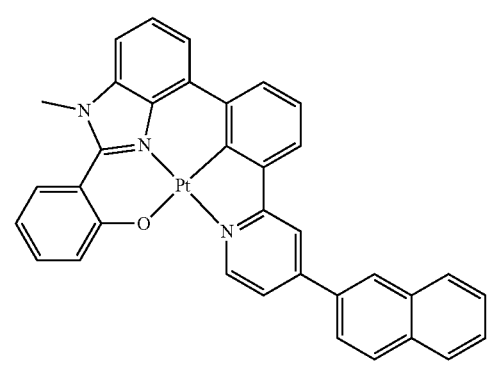
1-19
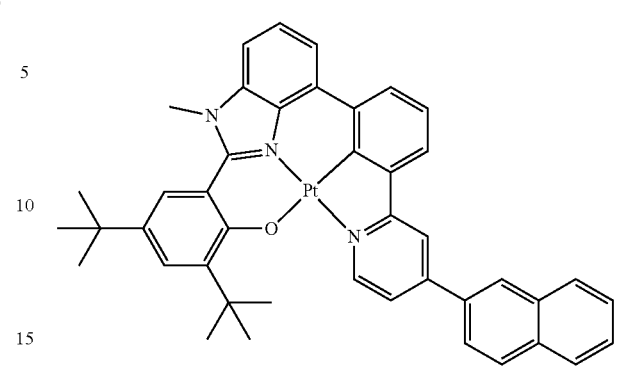
1-20
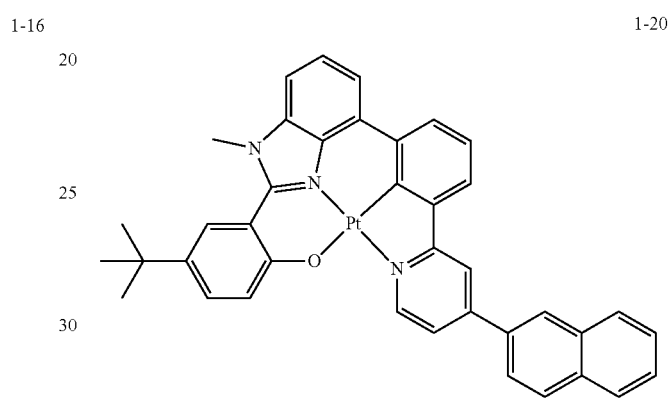
1-21
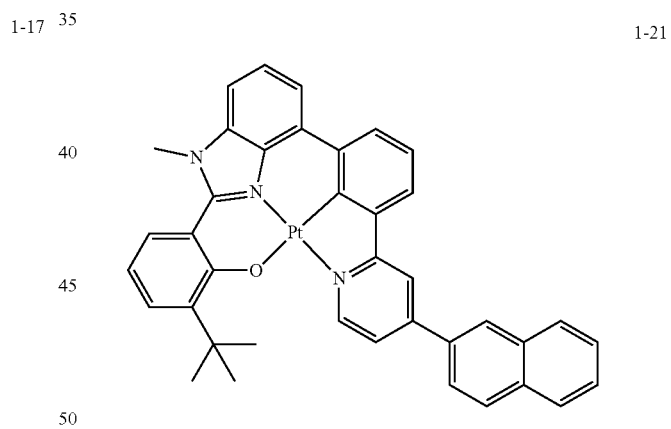
1-22
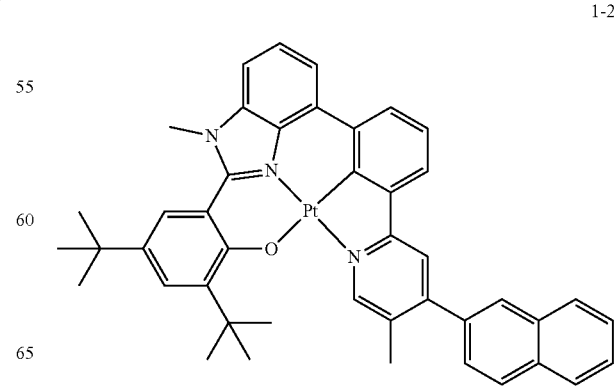

-continued
1-23
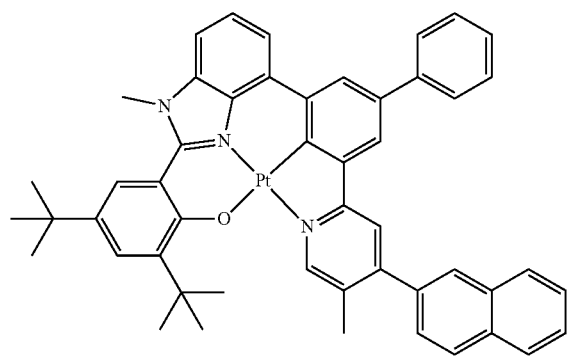
1-24
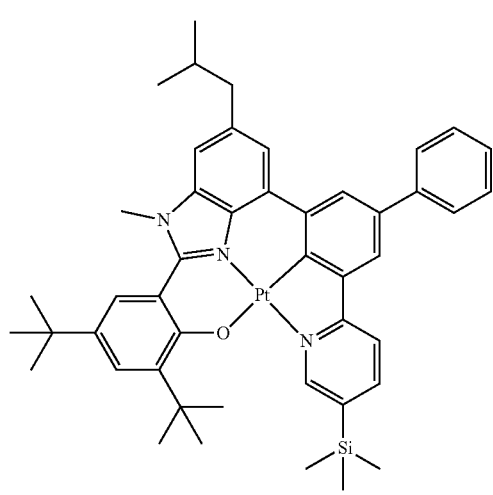
1-25
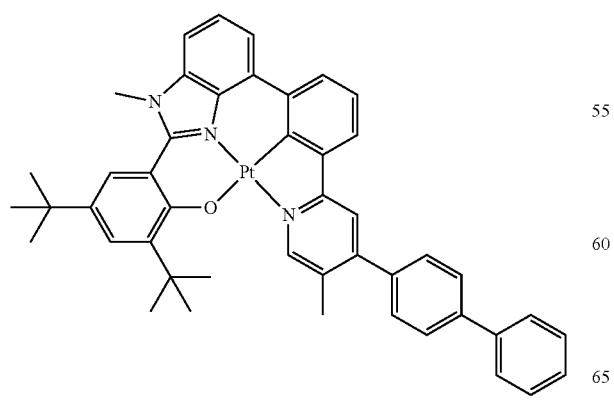
-continued
1-26
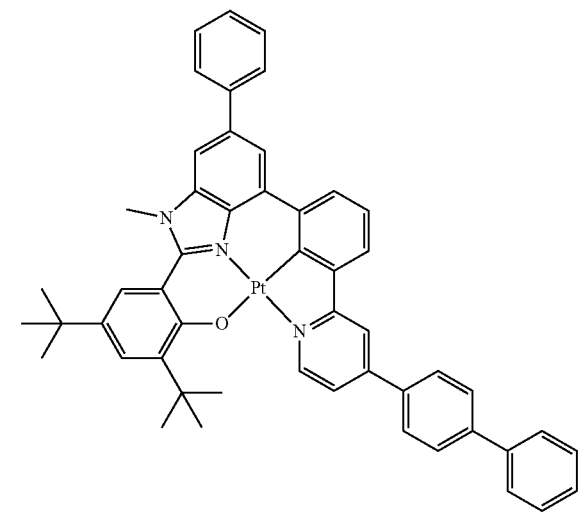
1-27
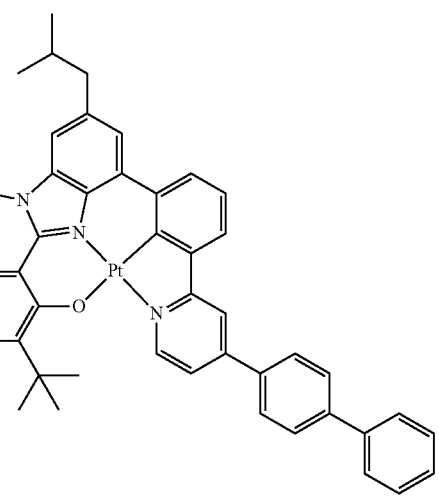
1-28
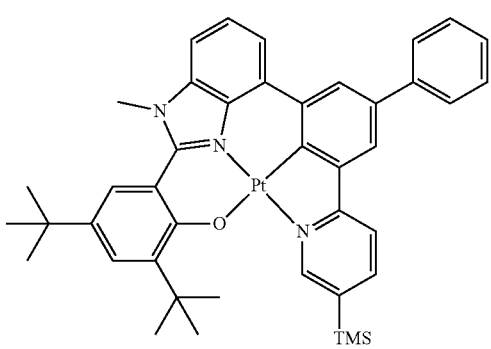

1-29
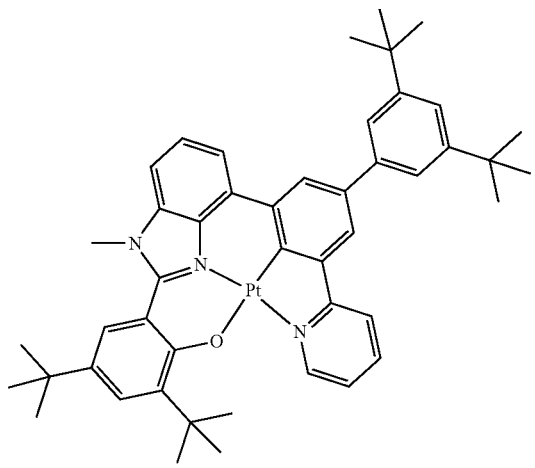
1-30
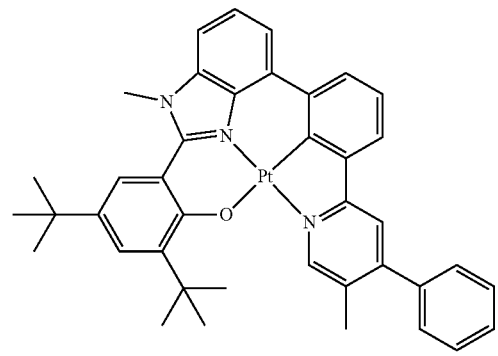
1-31
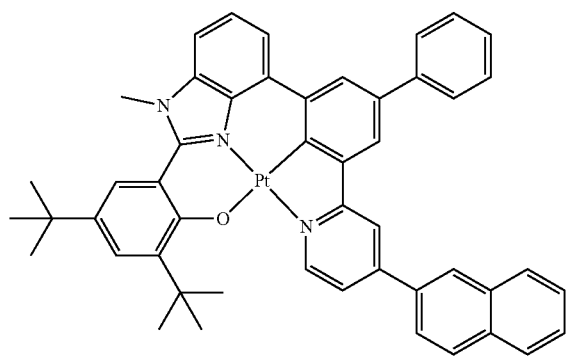
1-32
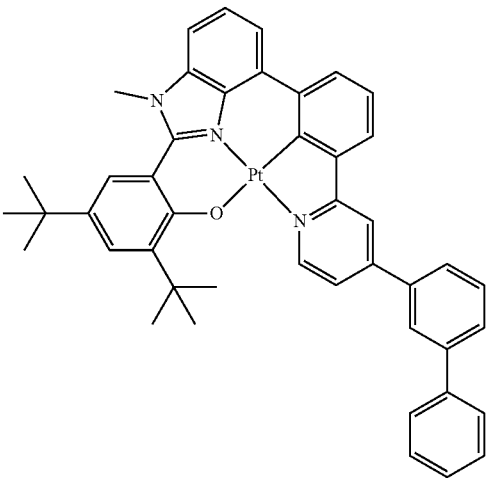
1-33
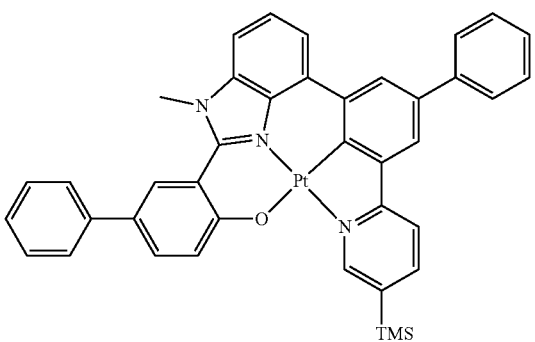
1-34
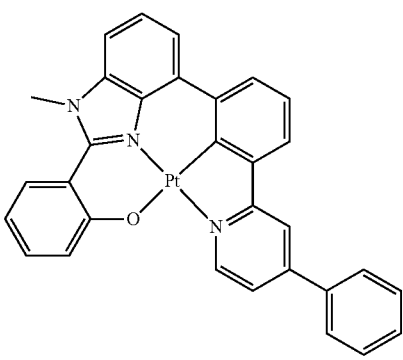
1-35
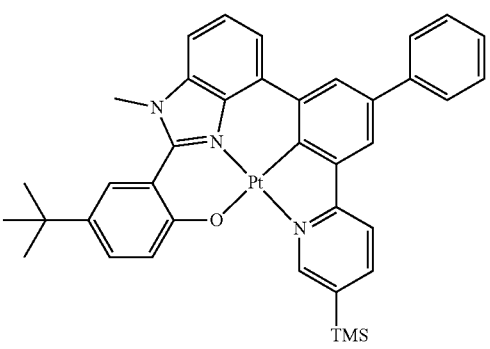

-continued
1-36
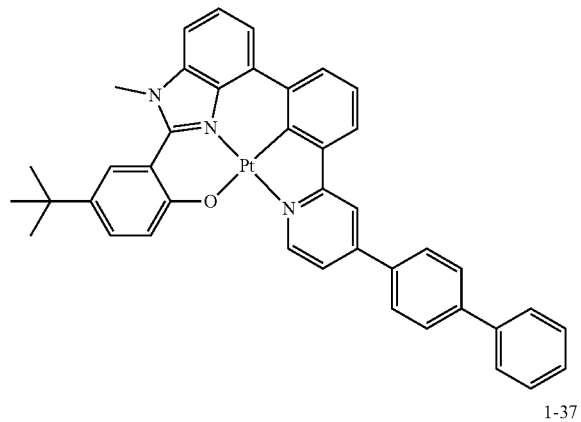
1-37
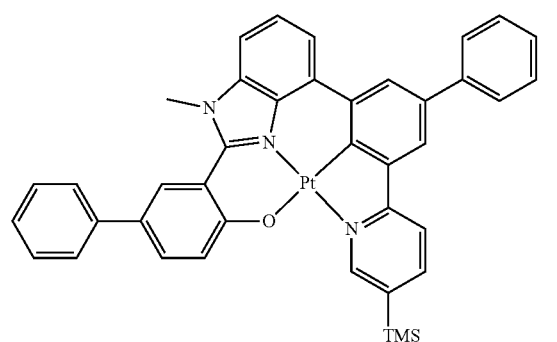
1-38
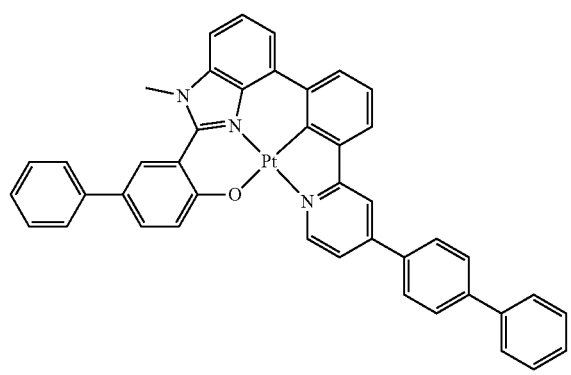
1-39
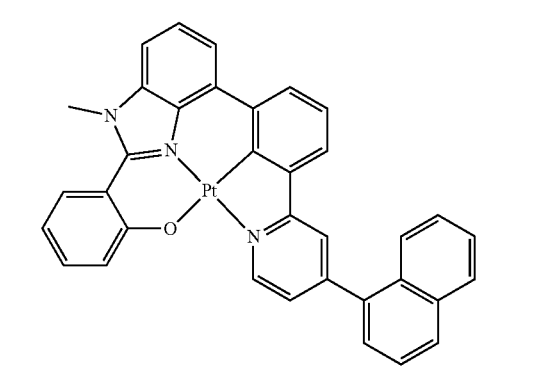
-continued
1-40
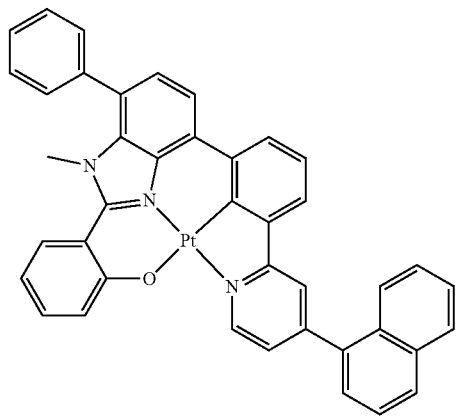
1-41
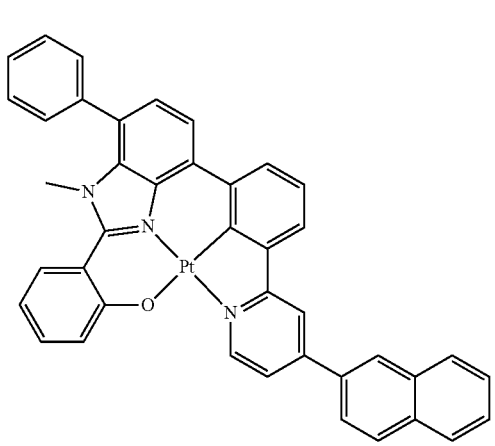
1-42
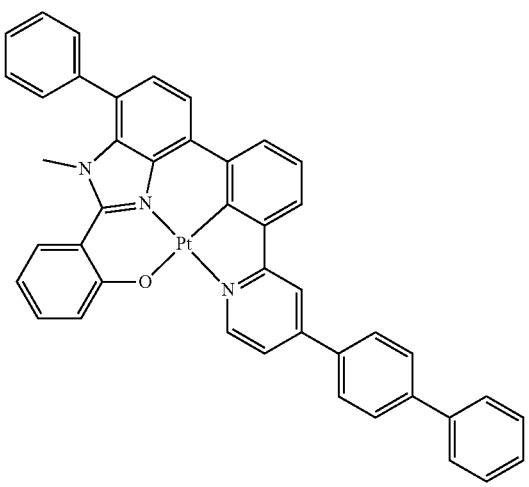

1-43
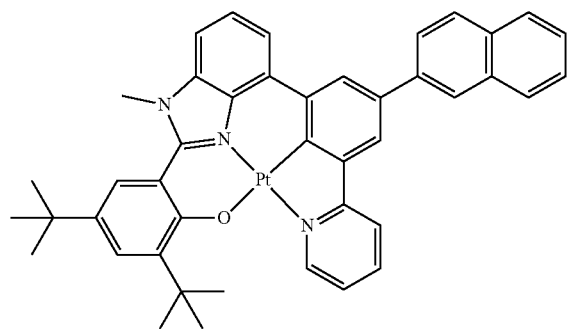
1-47
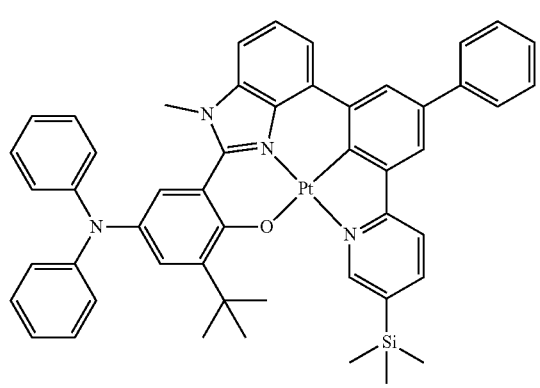
1-44
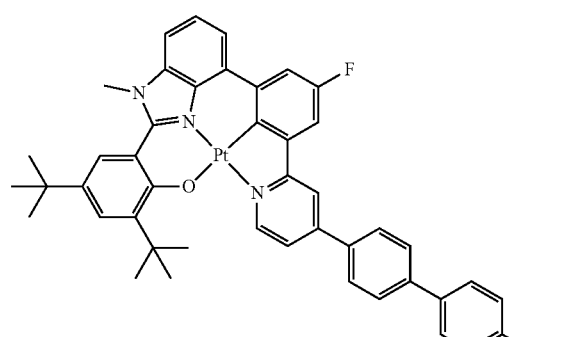
1-48
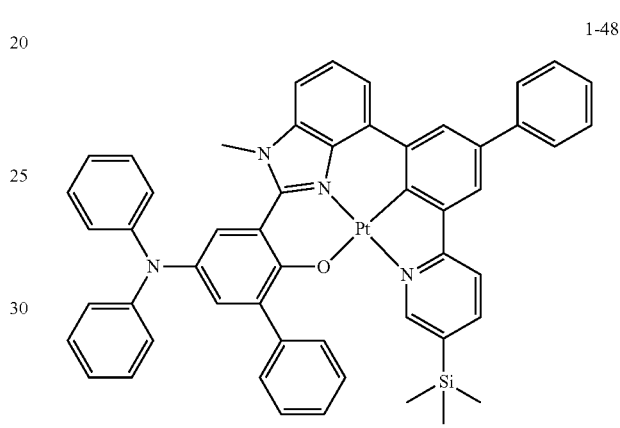
1-45
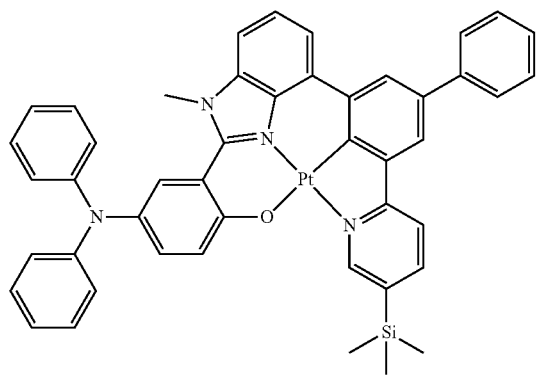
1-49
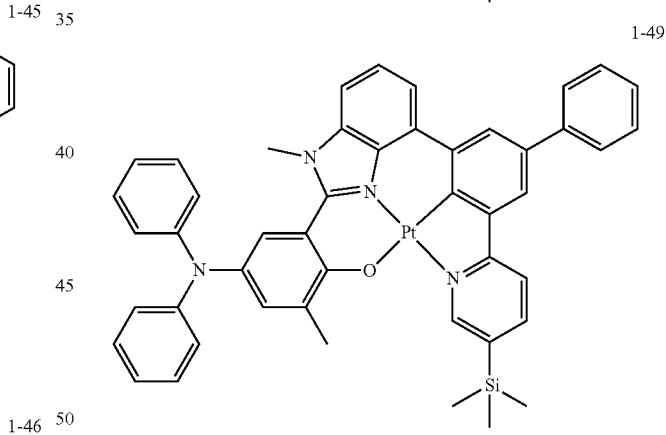
1-46
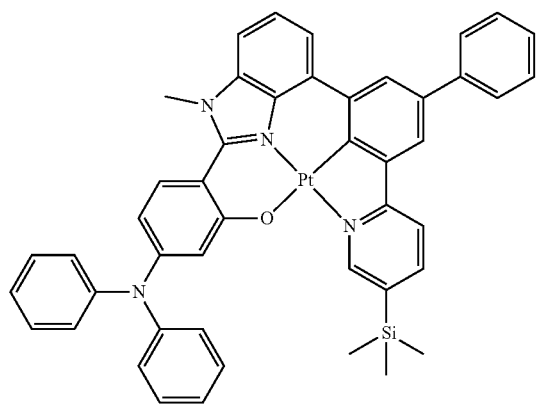
1-50
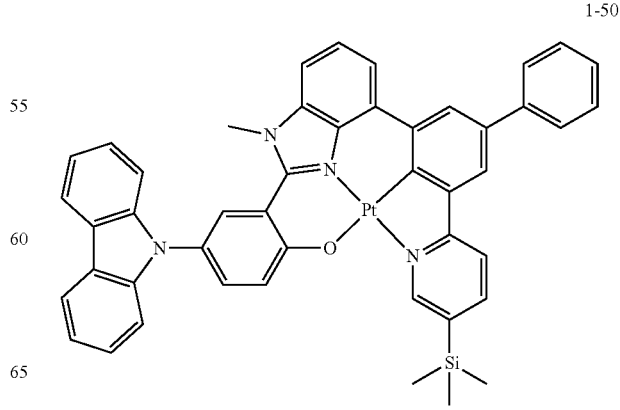

1-51
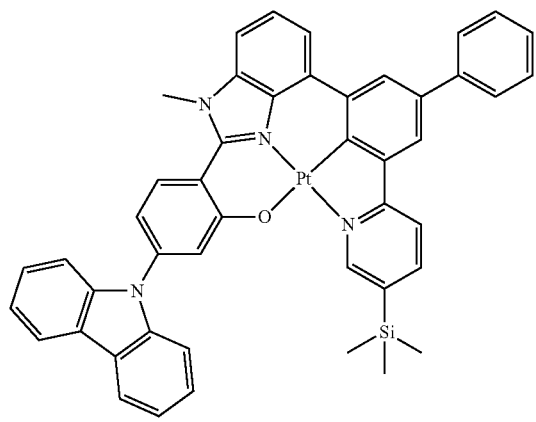
1-52
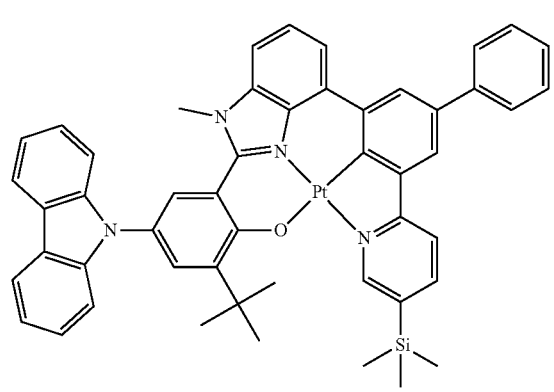
1-53
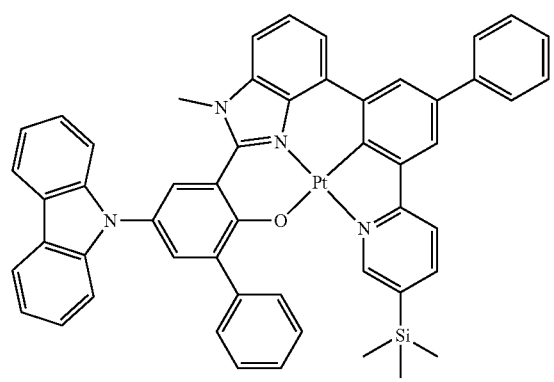
1-54
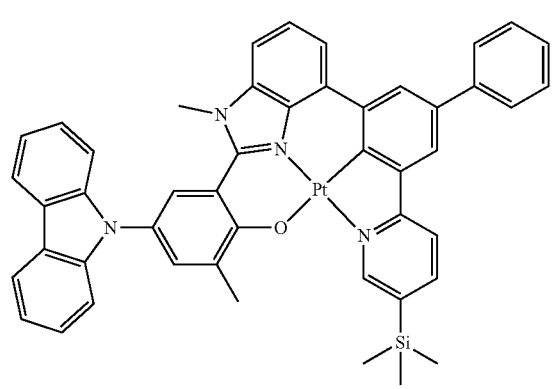
1-55
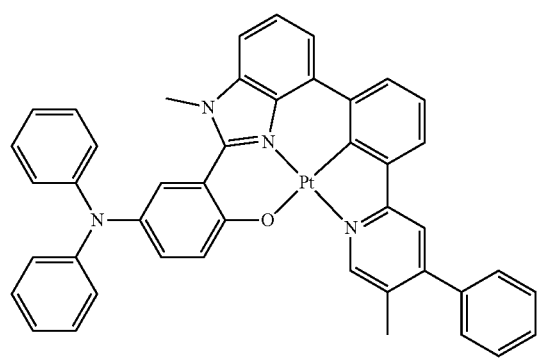
1-56
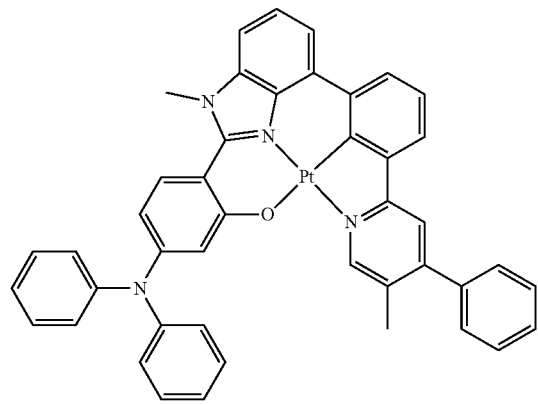
1-57
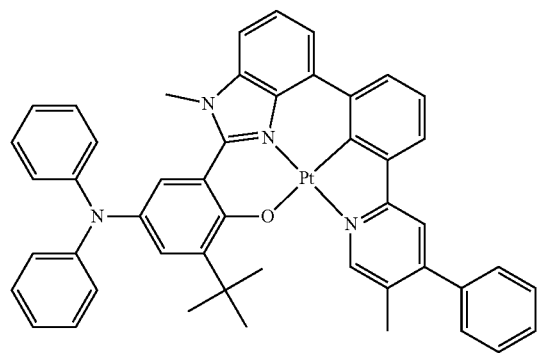
1-58
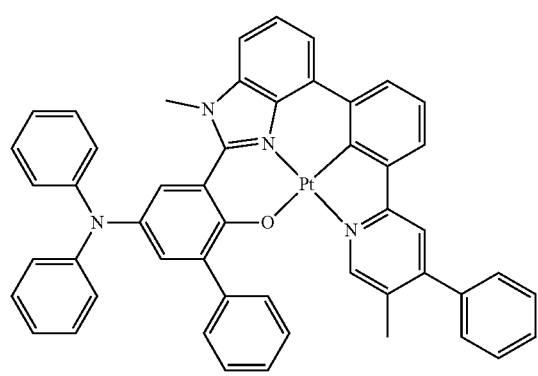

1-59
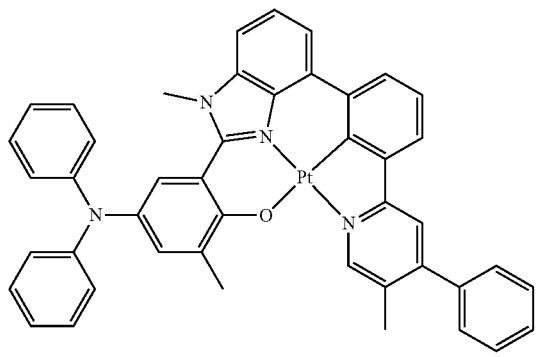
1-60
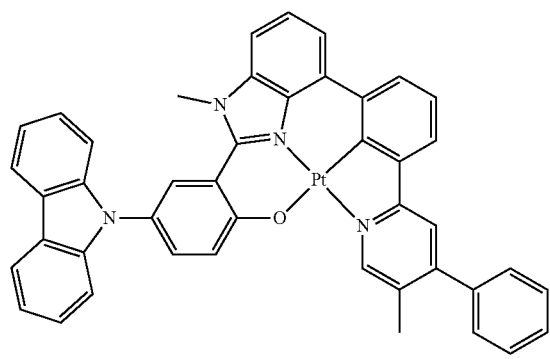
1-61
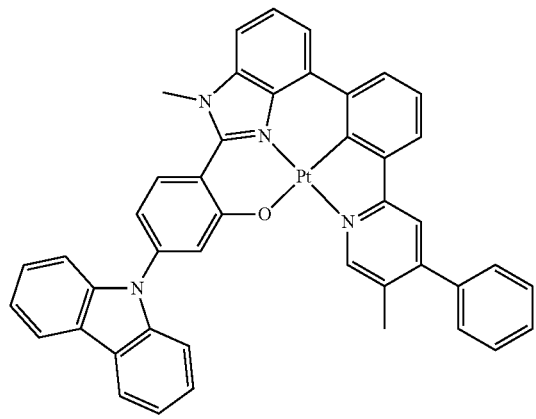
1-62
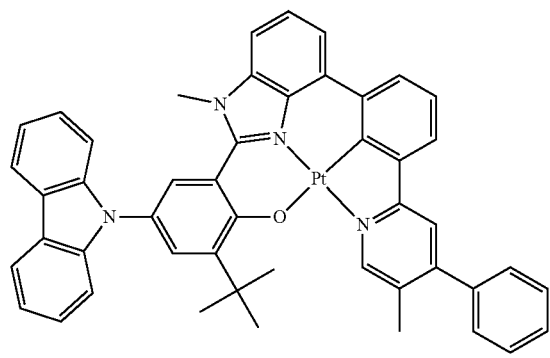
1-63
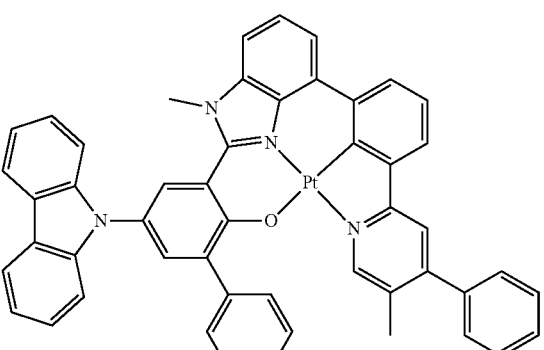
1-64
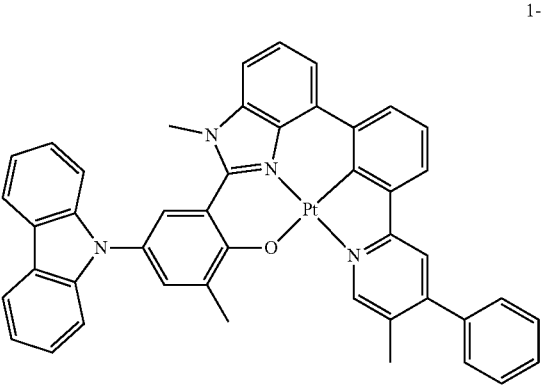
1-65
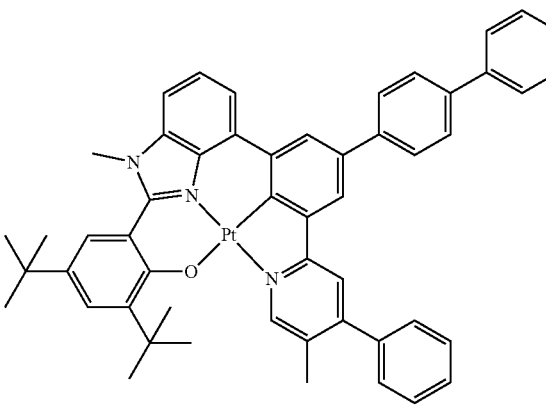
1-66
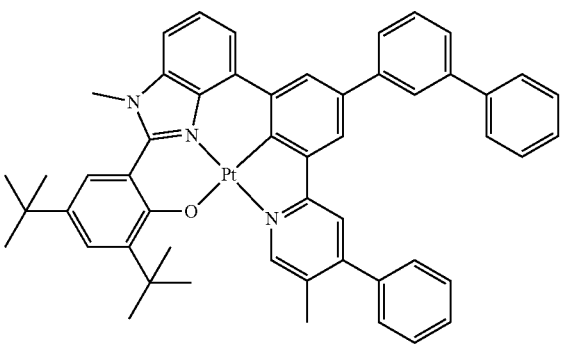

-continued
1-67
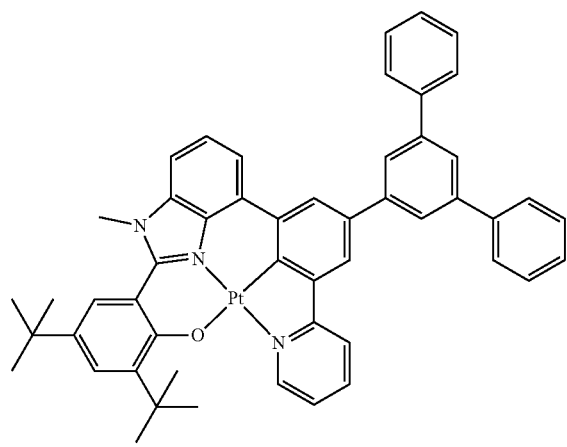
1-68
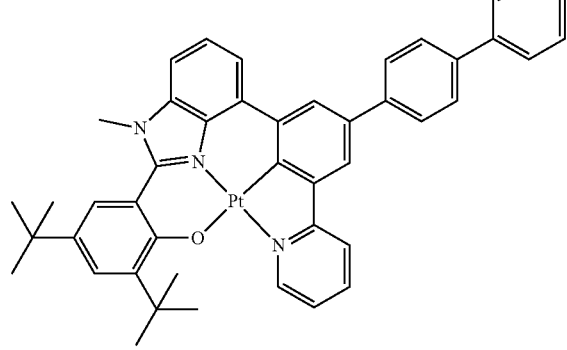
1-69
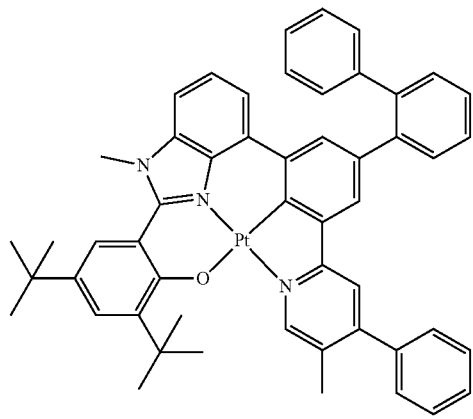
-continued
1-70
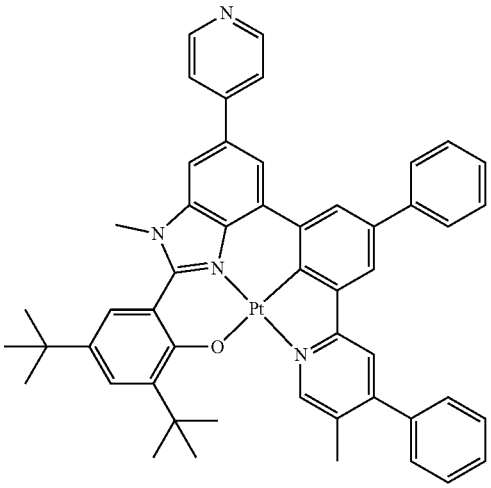
1-71
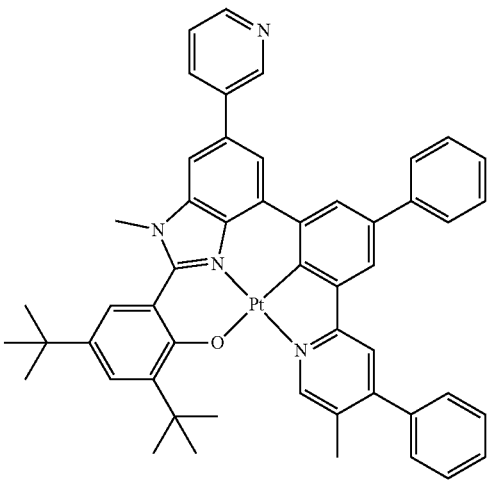
1-72
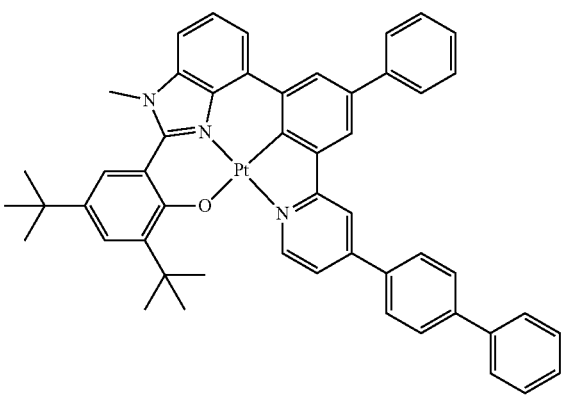

-continued
1-73
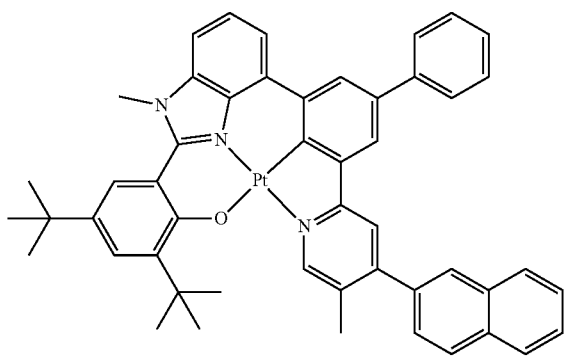
1-74
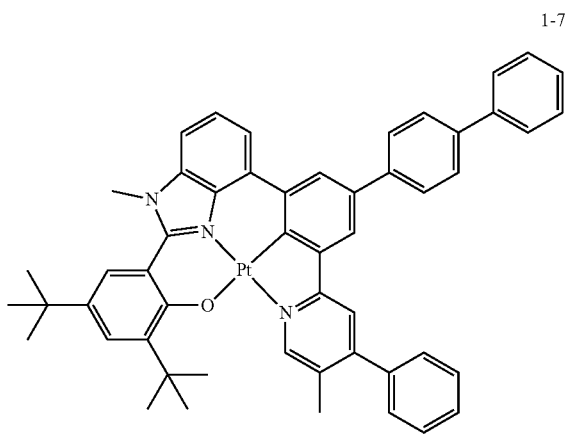
1-75
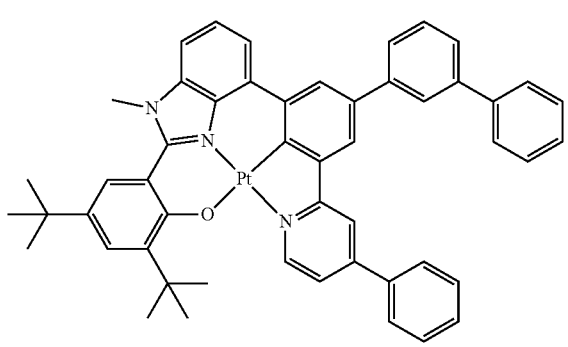
1-76
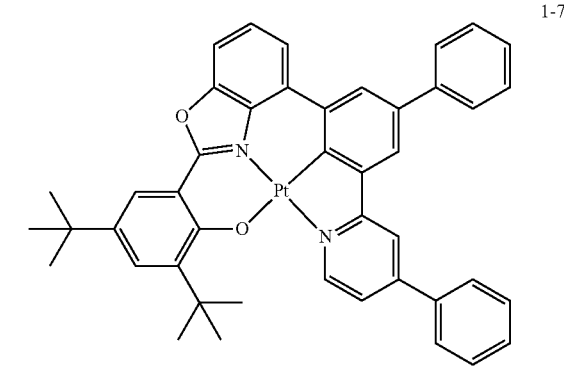
-continued
1-77
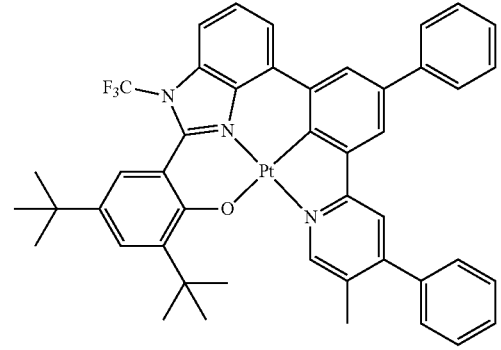
1-78
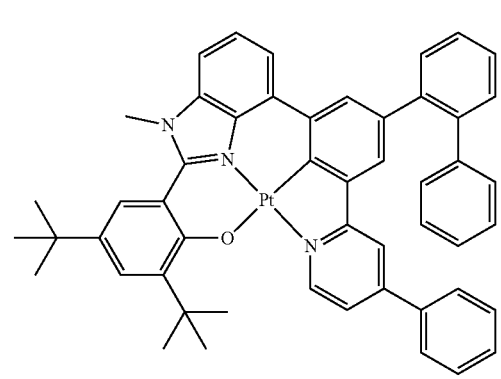
1-79
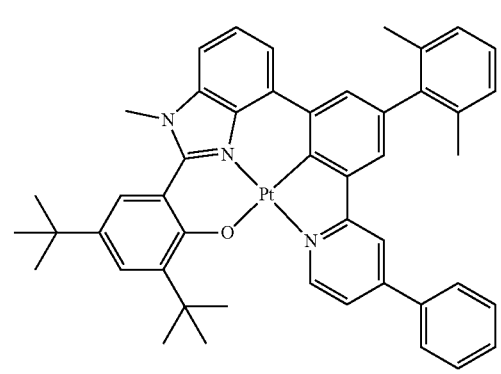
1-80
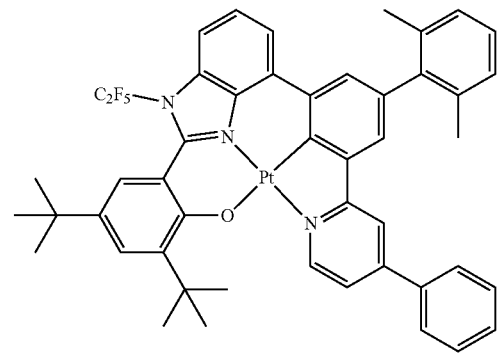

1-81
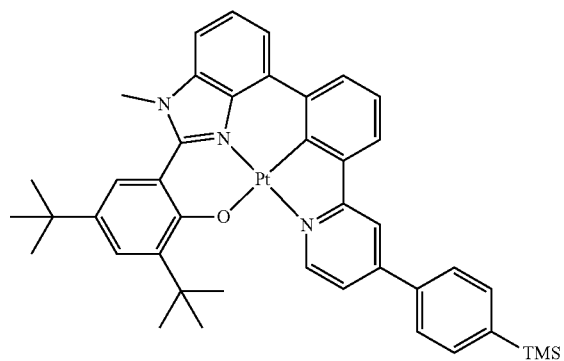
1-82
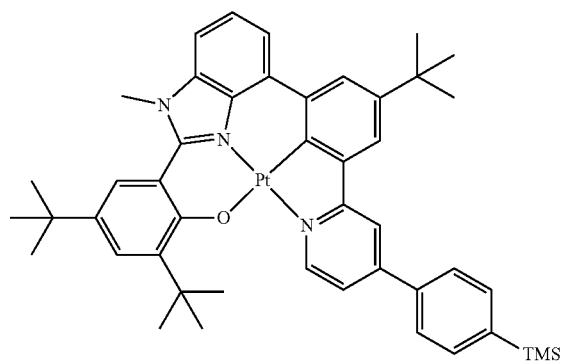
1-83
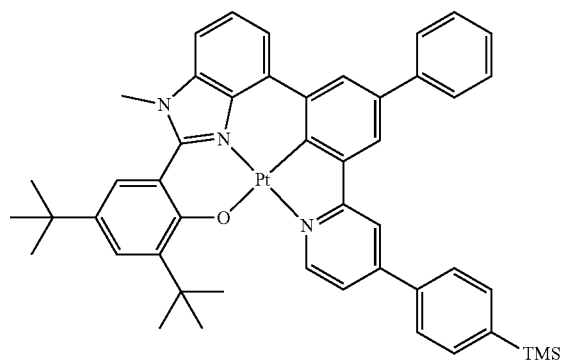
1-84
1-85
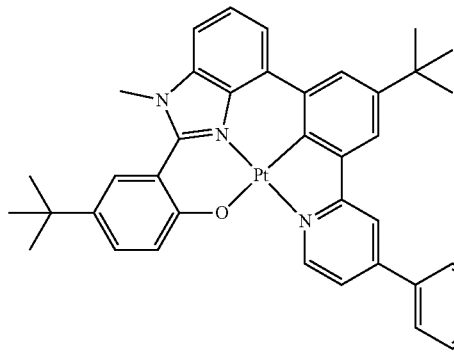
1-86
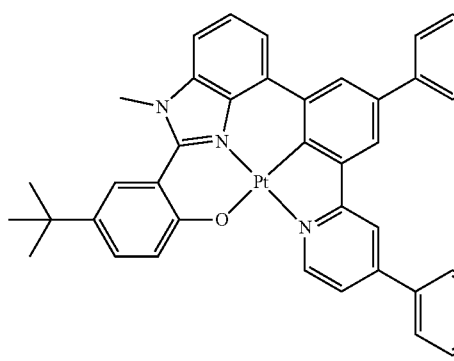
1-87
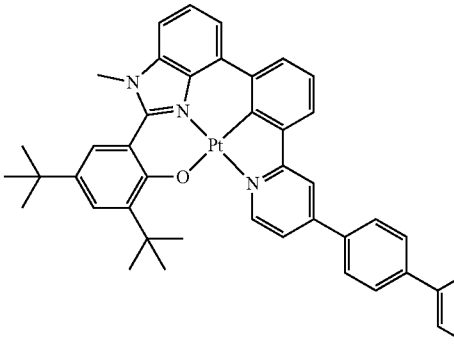
1-88
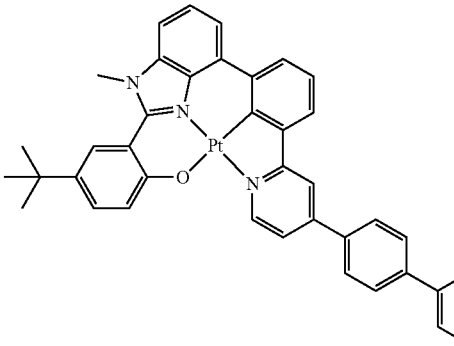

-continued
2-1
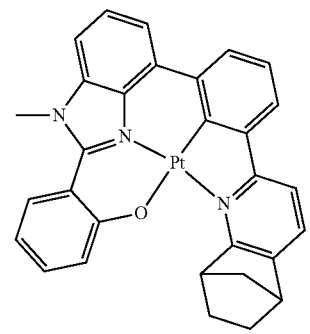
2-2
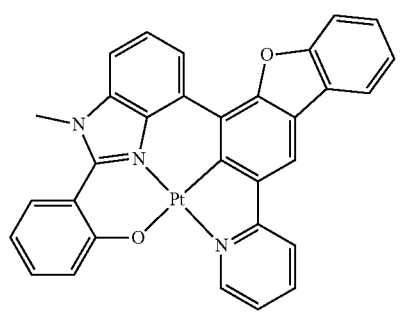
2-3
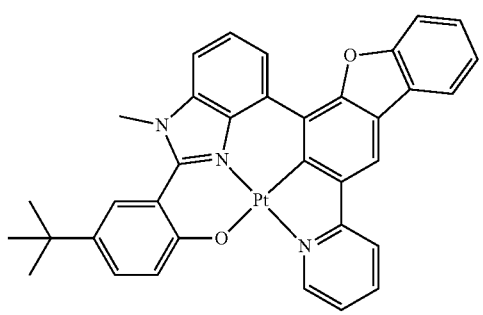
2-4
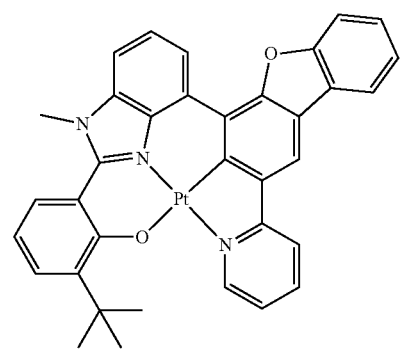
2-5
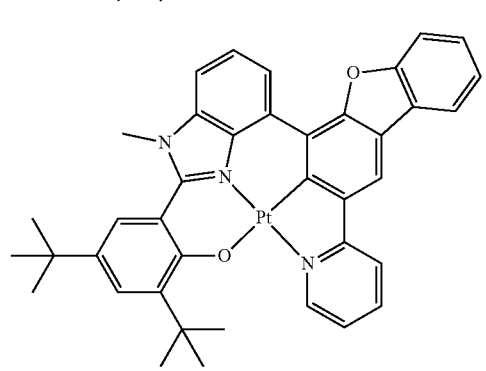
-continued
2-6
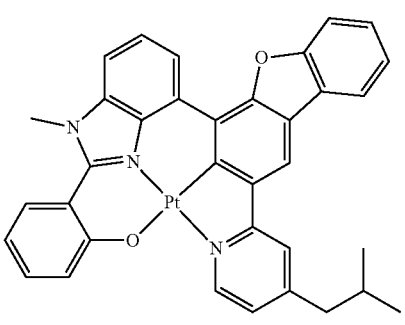
2-7
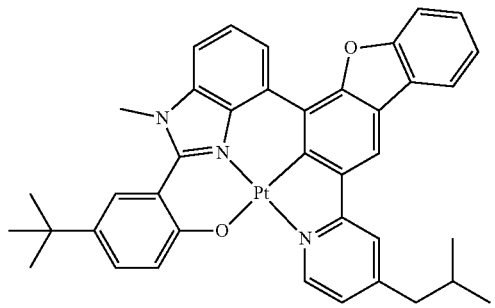
2-8
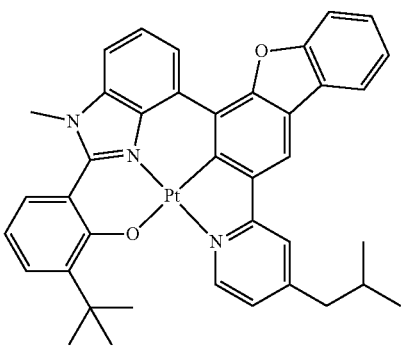
2-9
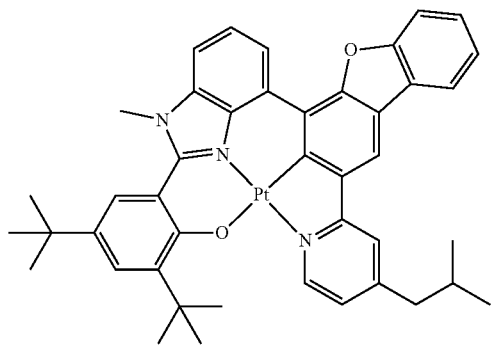

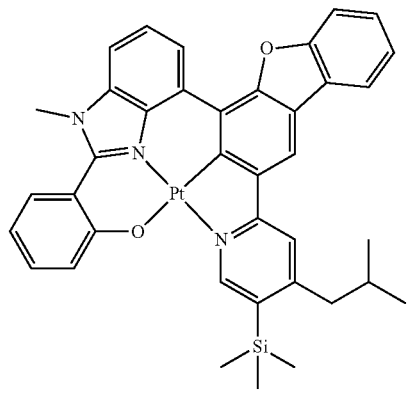
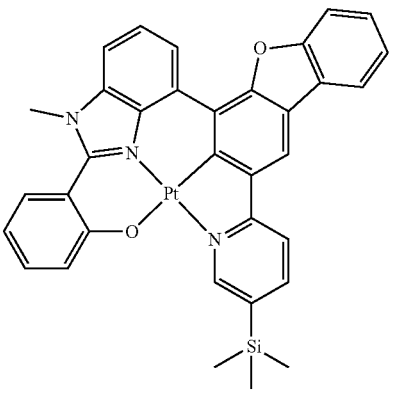

2-18
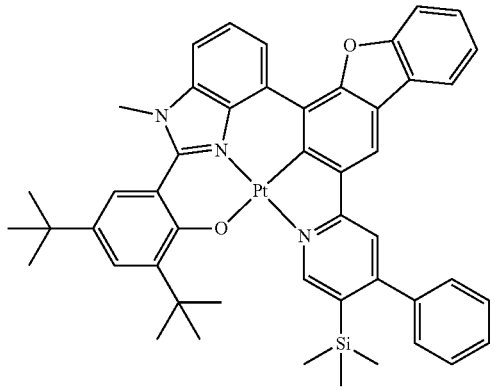
2-19
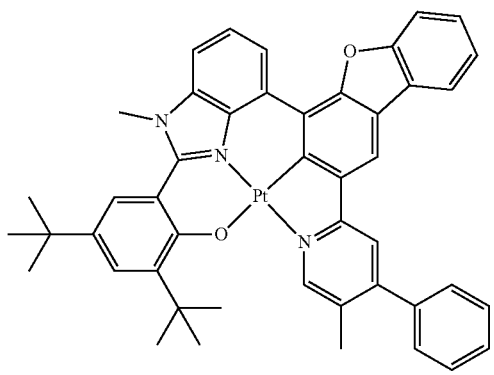
2-20
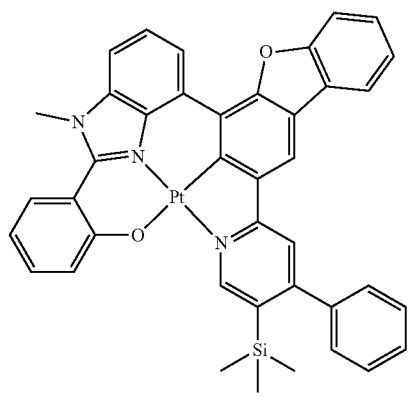
2-21
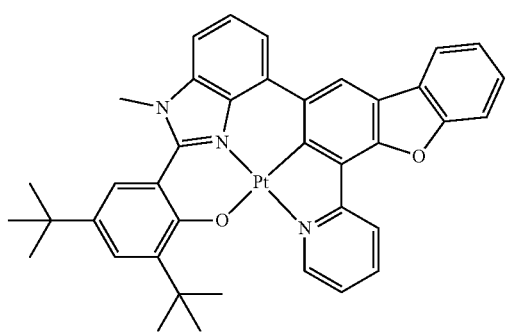
2-22
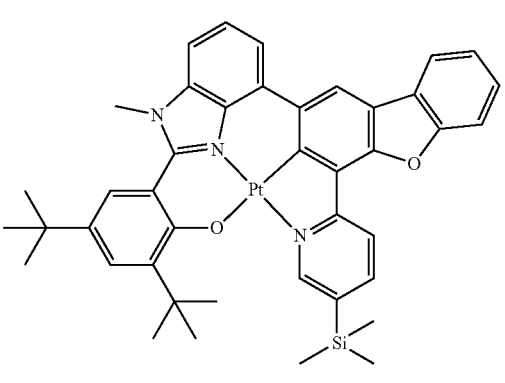
2-23
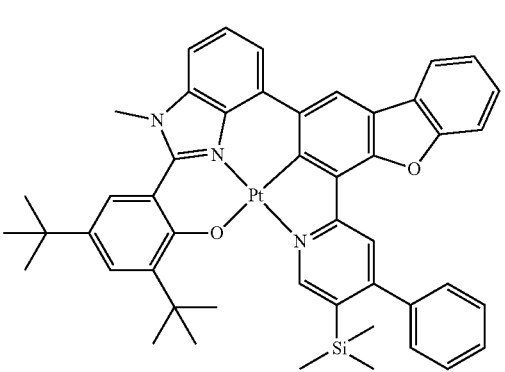
2-24
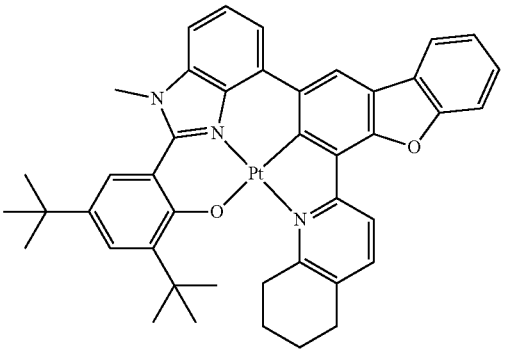
2-25
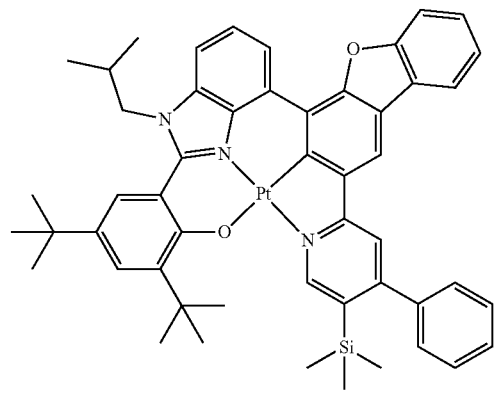

-continued
2-26
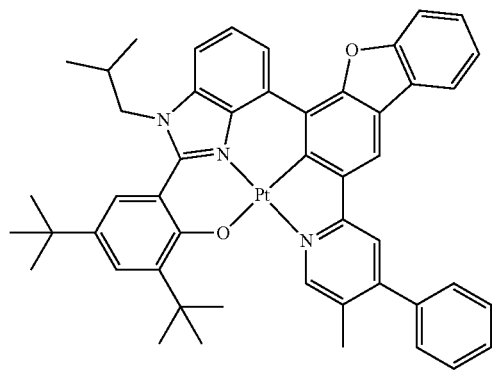
2-27
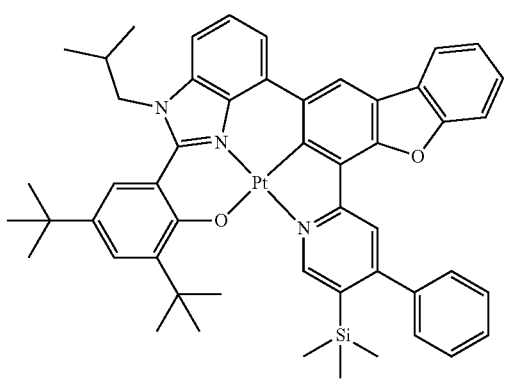
2-28
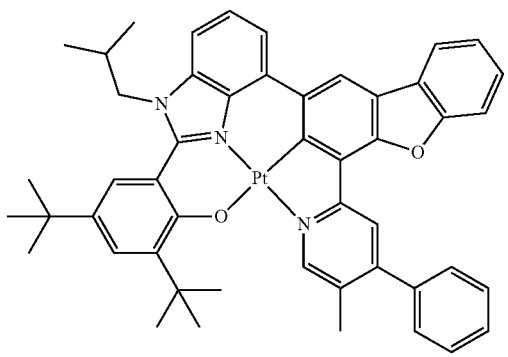
2-29
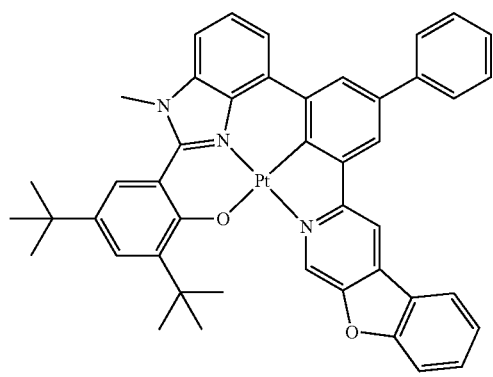
-continued
2-30
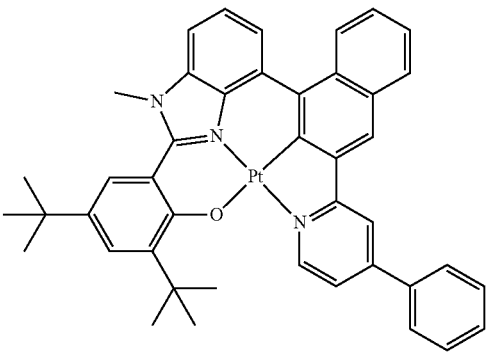
2-31
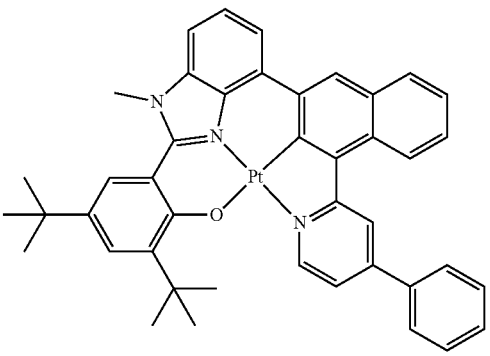
2-32
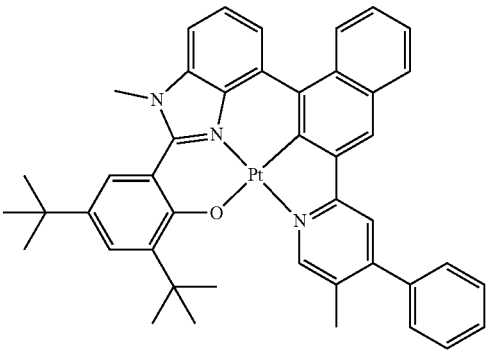
2-33
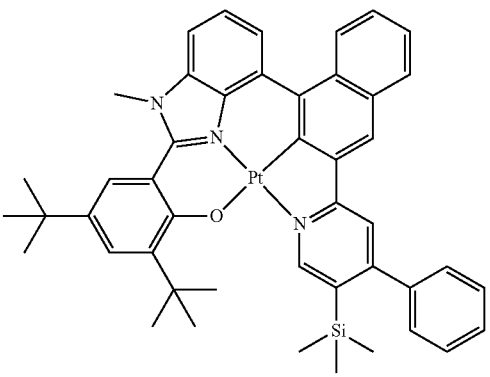

-continued
2-34
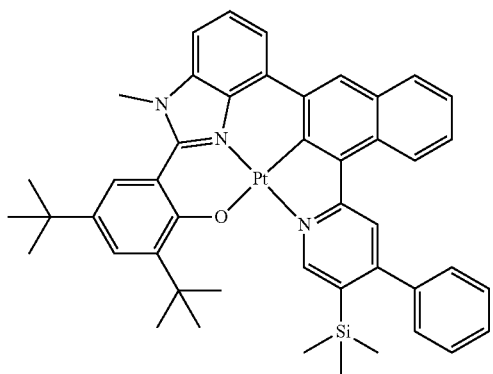
2-35
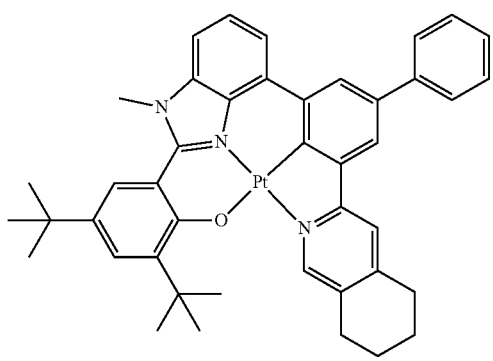
2-36
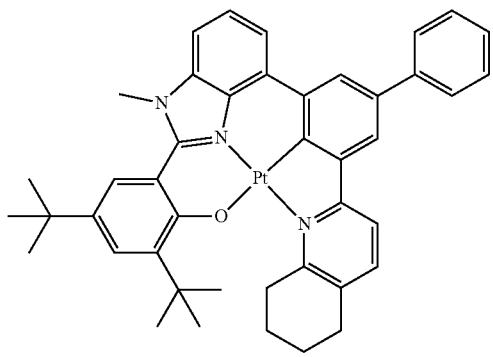
2-37
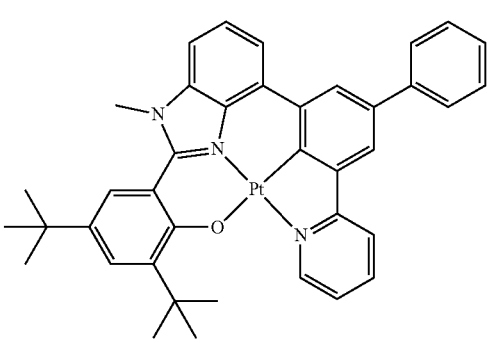
-continued
2-38
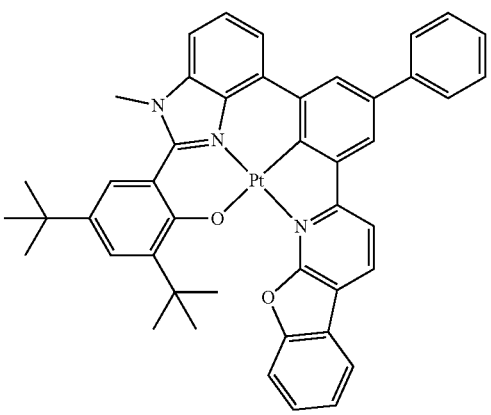
2-39
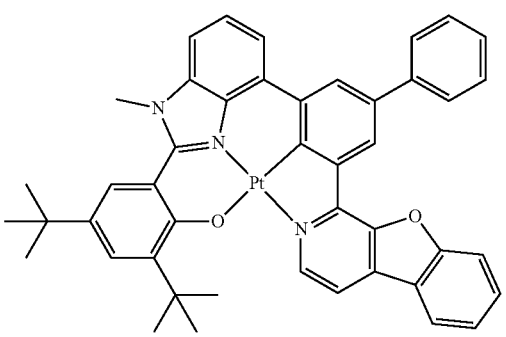
2-40
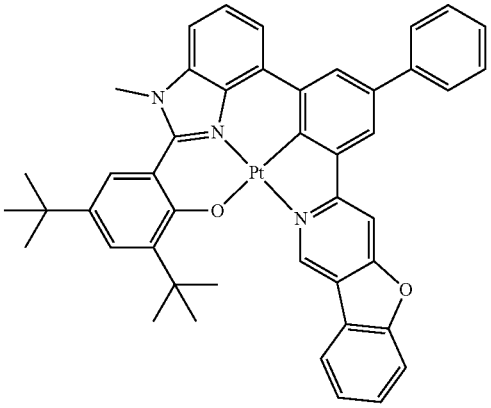
2-41

-continued
2-42
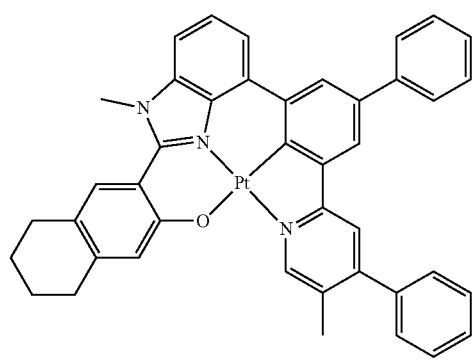
2-43
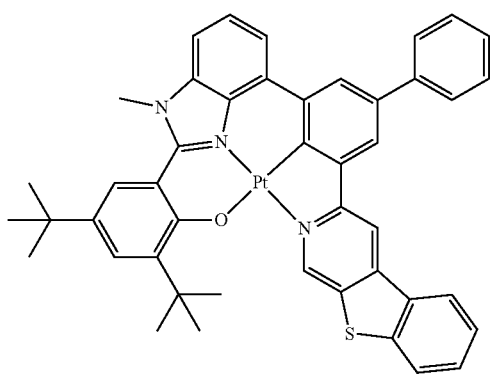
2-44
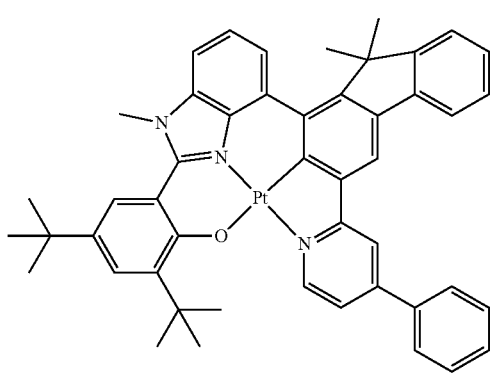
2-45
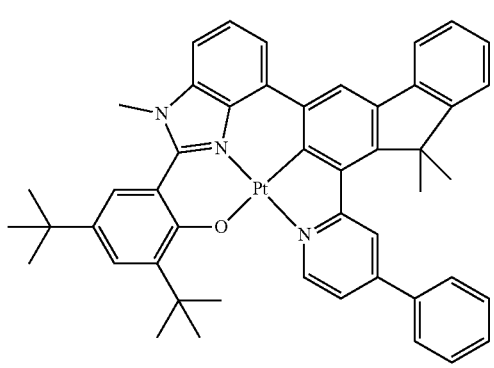
-continued
2-46
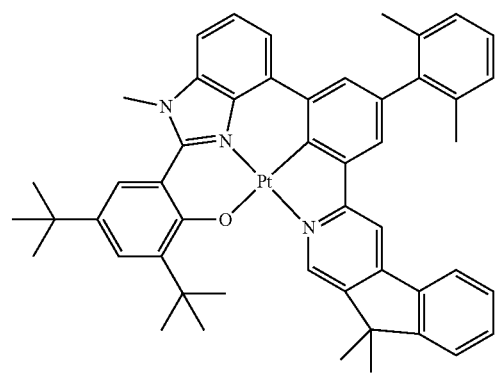
2-47
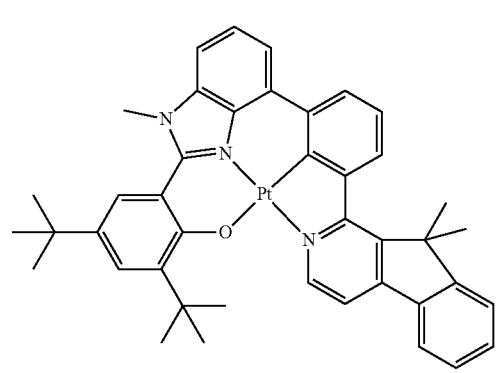
3-1
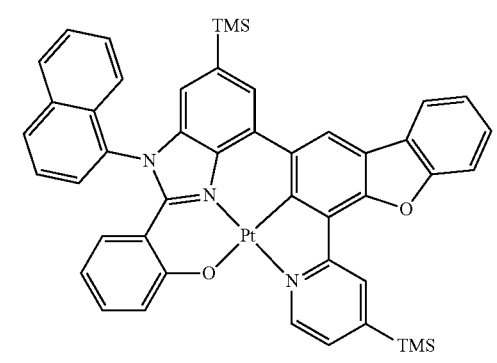
3-2
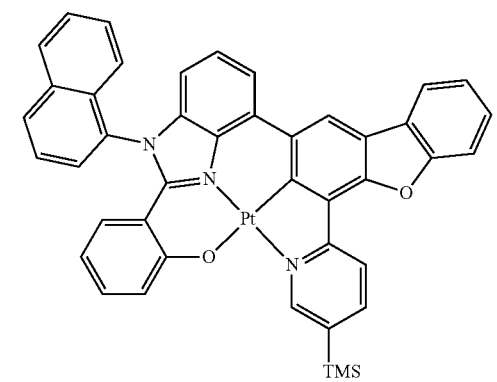

-continued
3-3
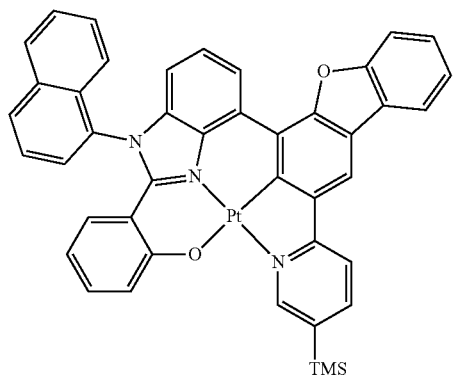
3-4
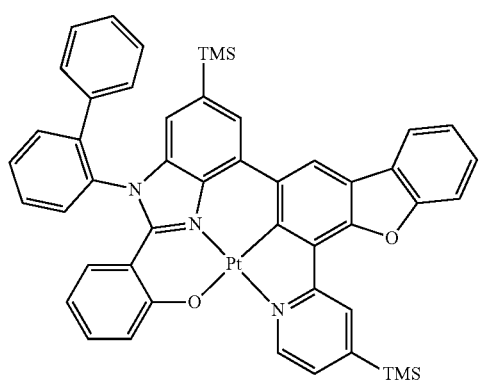
3-5
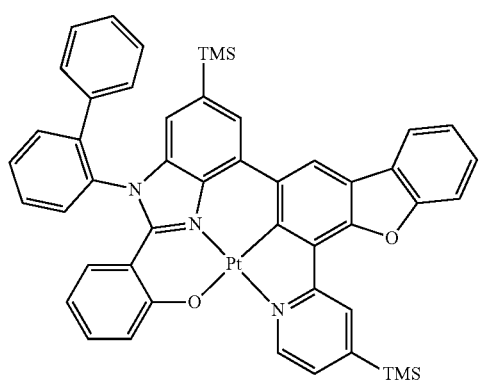
3-6
-continued
3-7
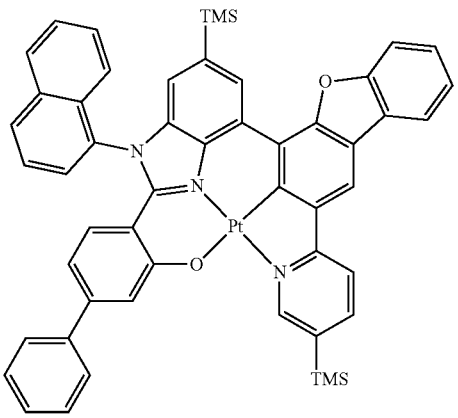
3-8
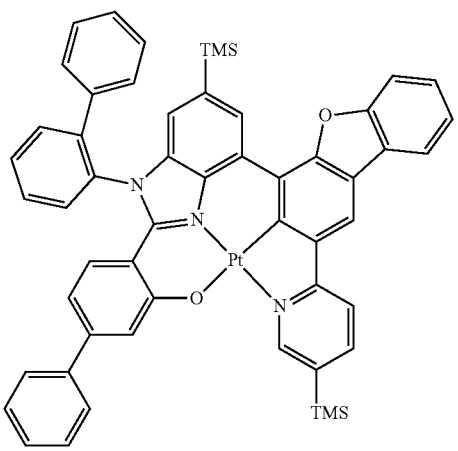
3-9
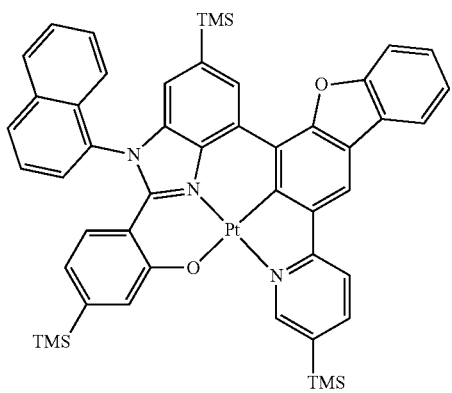

-continued
3-10
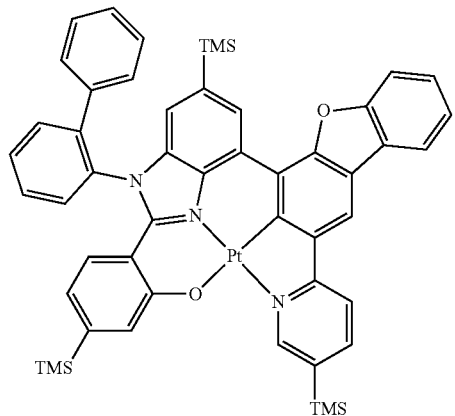
3-11
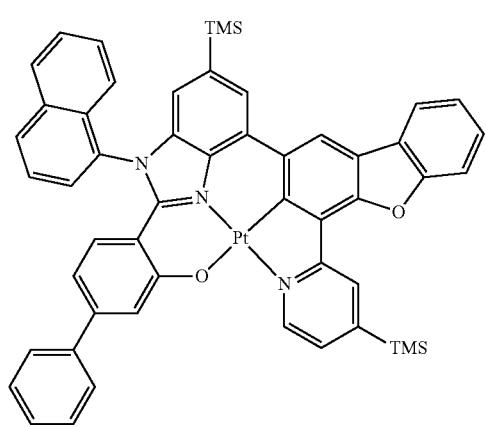
3-12
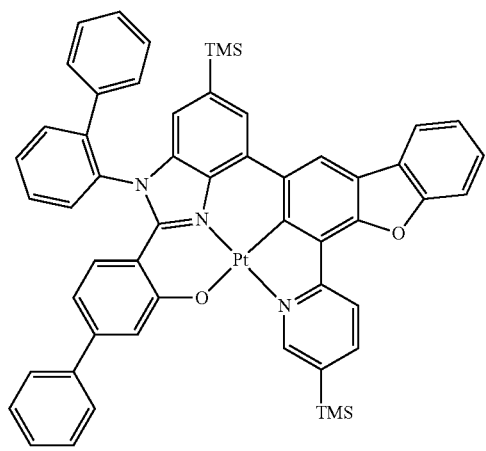
3-13
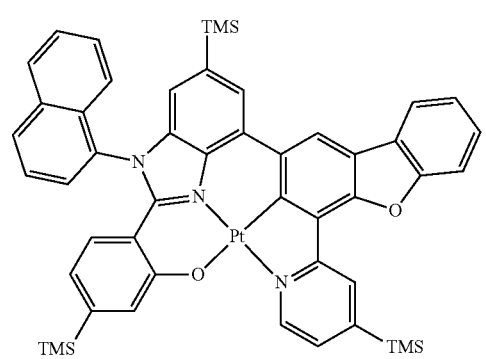
-continued
3-14
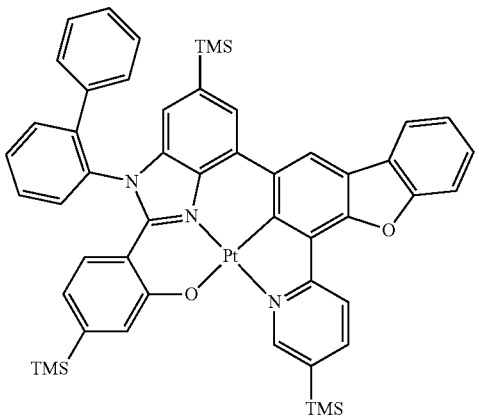
3-15
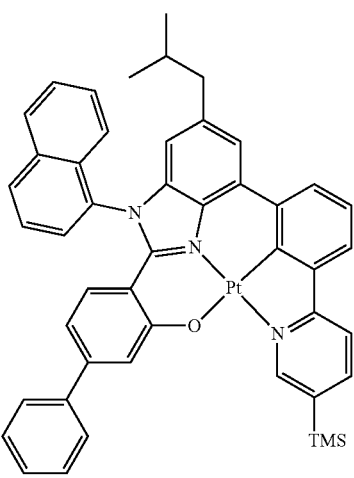
3-16
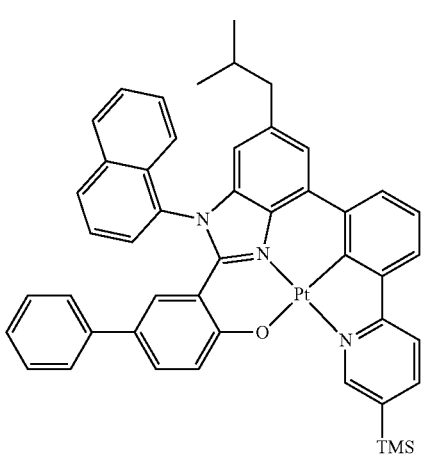

65
-continued
3-17
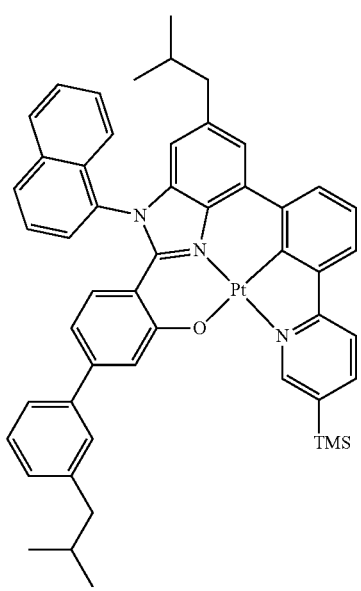
3-18
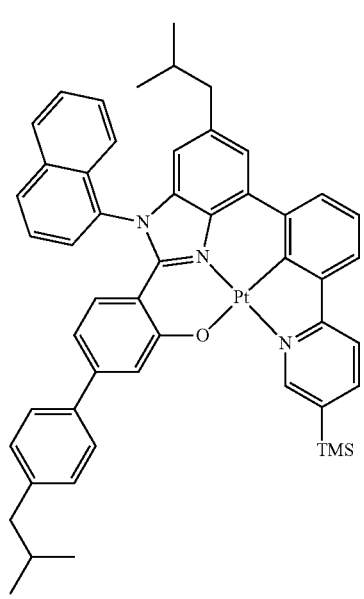
3-19
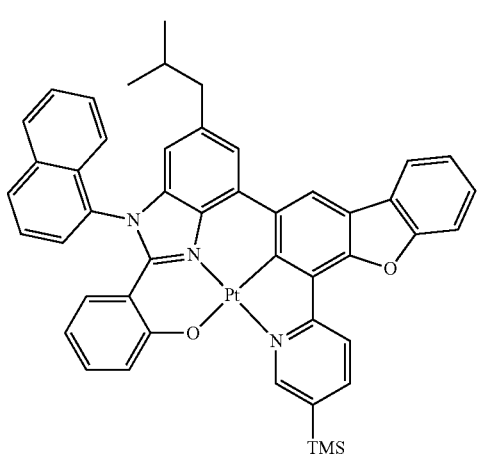
66
-continued
3-20
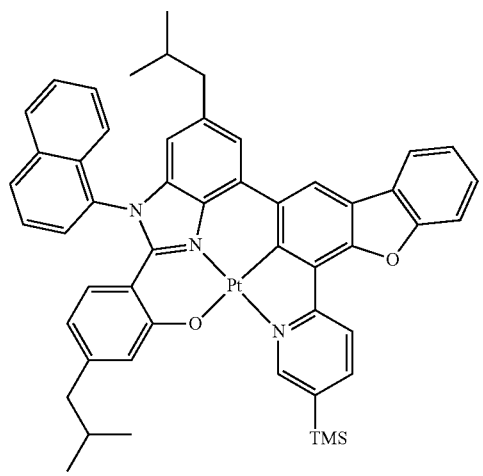
3-21
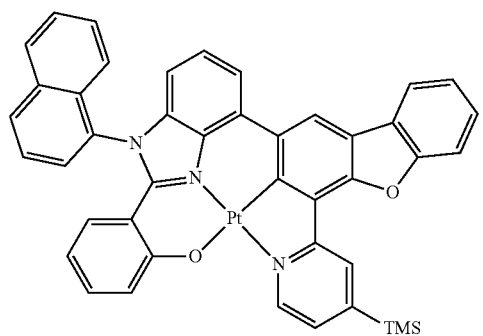
3-22
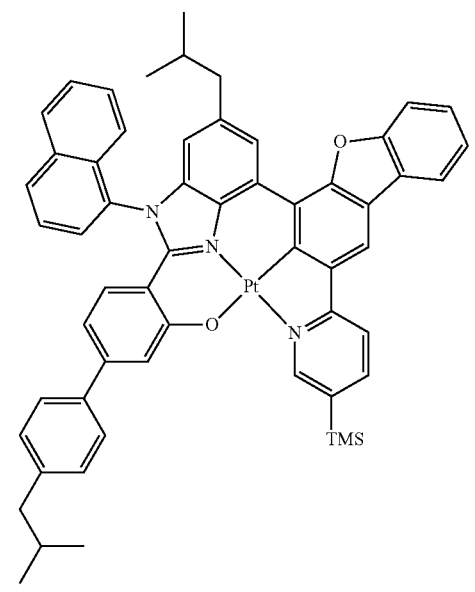

-continued
3-23
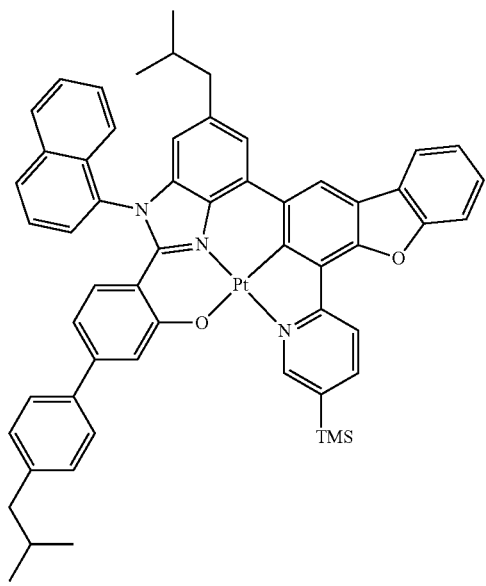
3-24
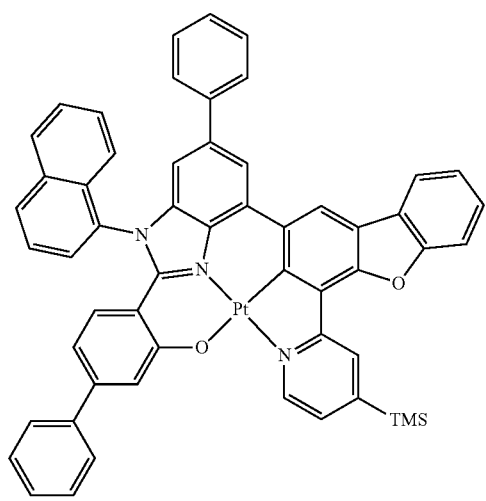
3-25
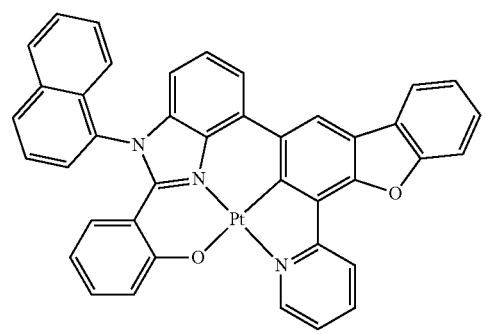
-continued
3-26
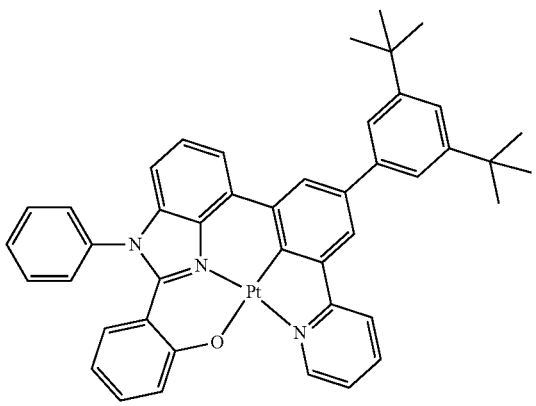
3-27
3-28
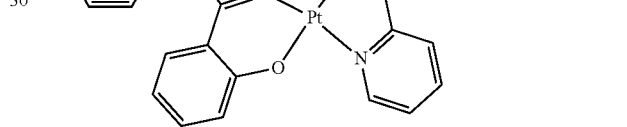
3-29
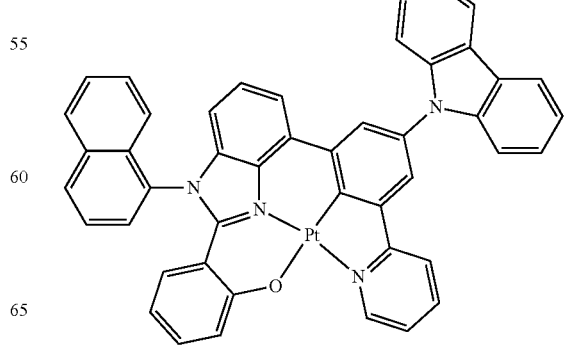

3-30
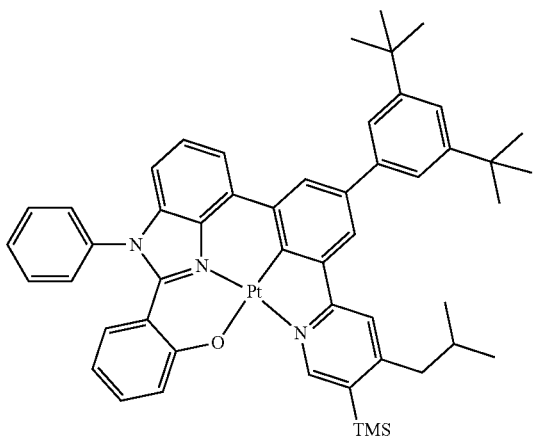
3-31
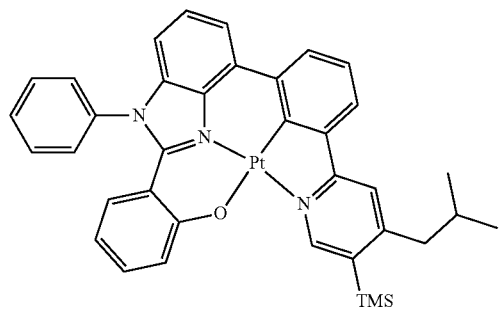
3-32
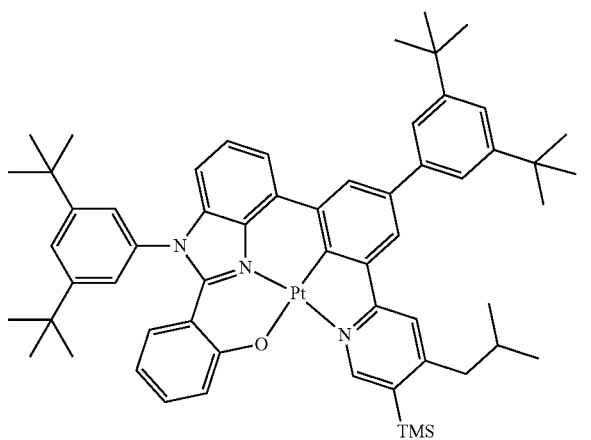
3-33
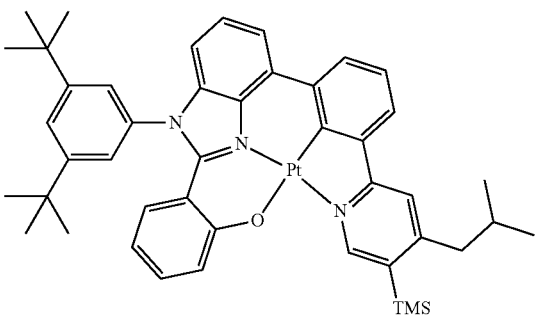
3-34
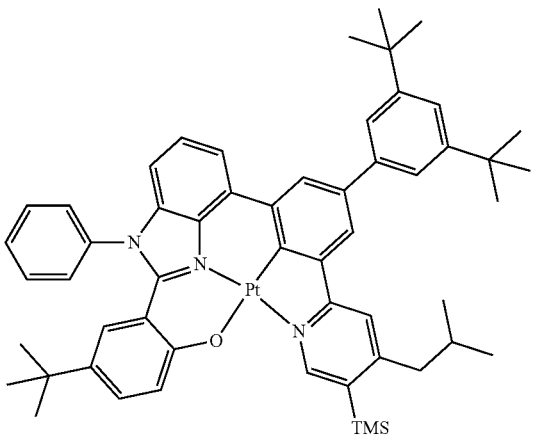
3-35
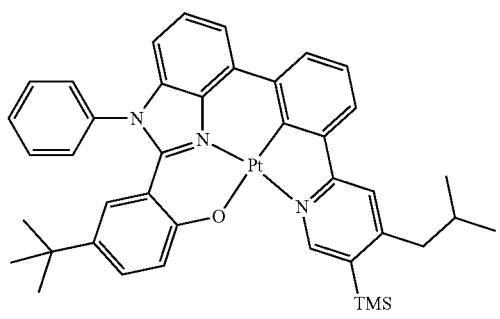
3-36
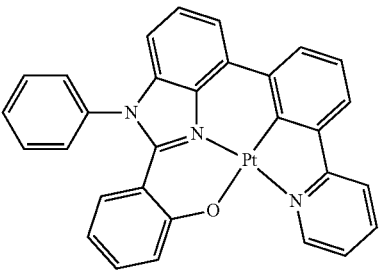
3-37
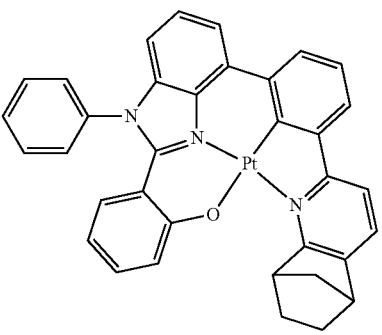

-continued
3-38
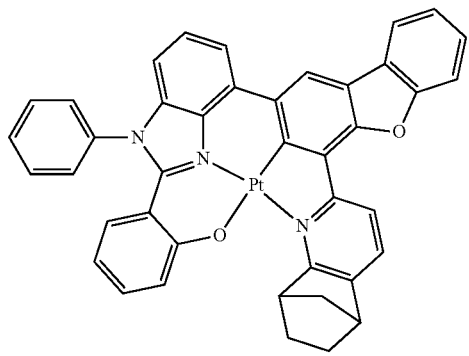
3-39
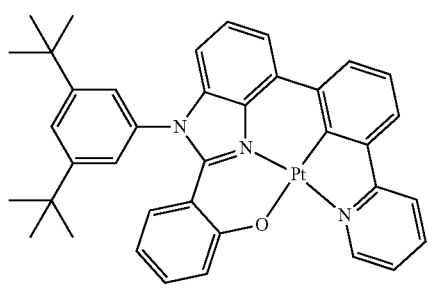
3-40
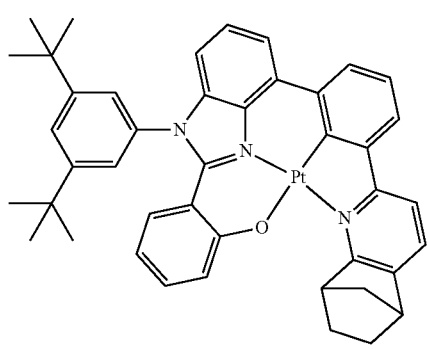
3-41
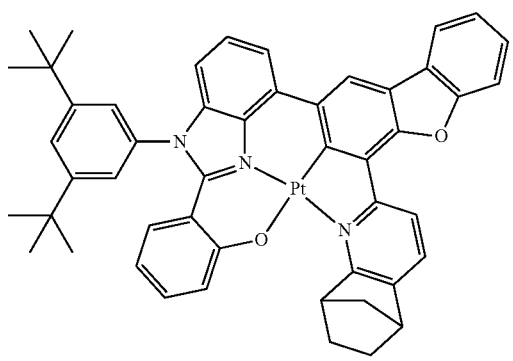
3-42
-continued
3-43
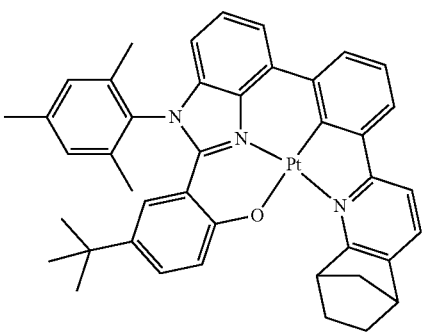
3-44
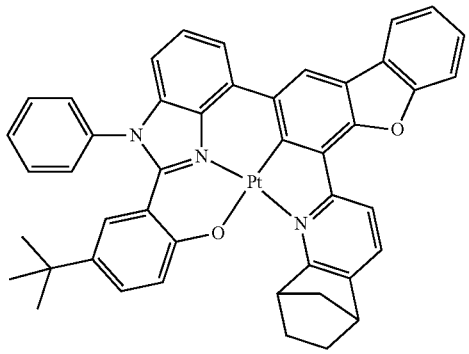
3-45
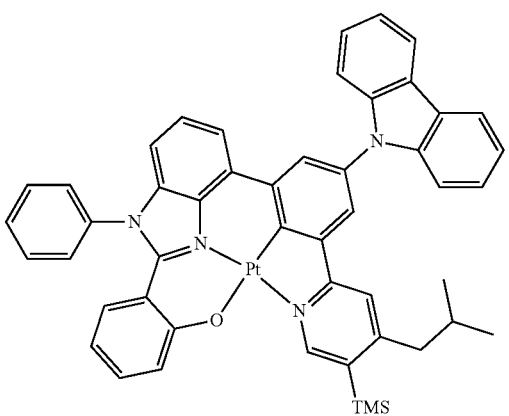
3-46
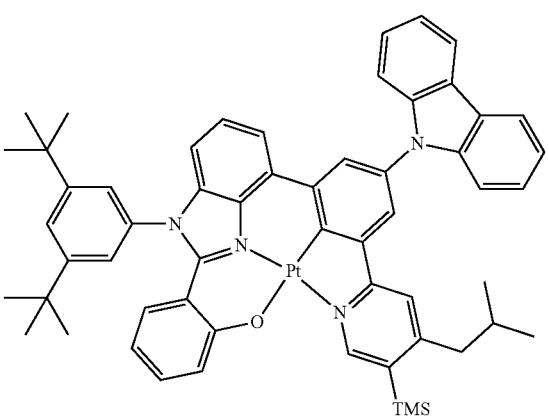

-continued
3-47
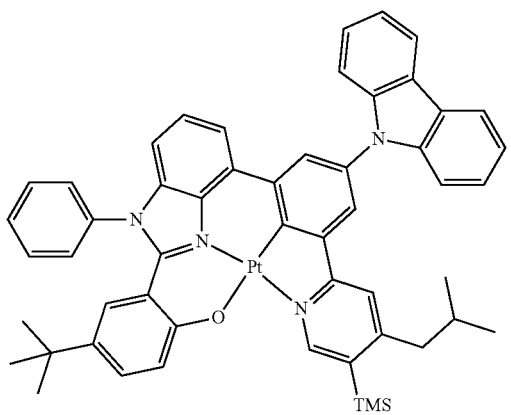
3-48
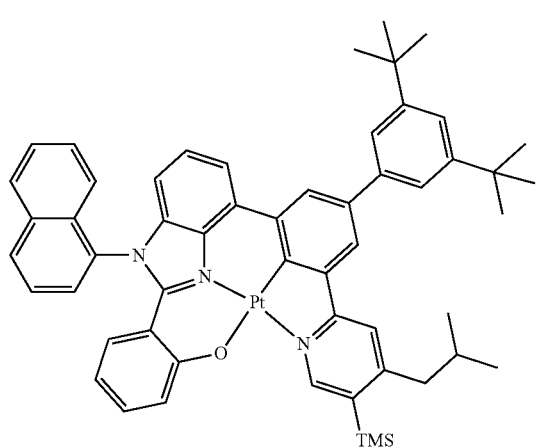
3-49
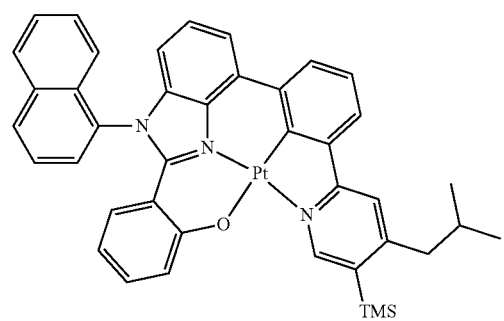
-continued
3-50
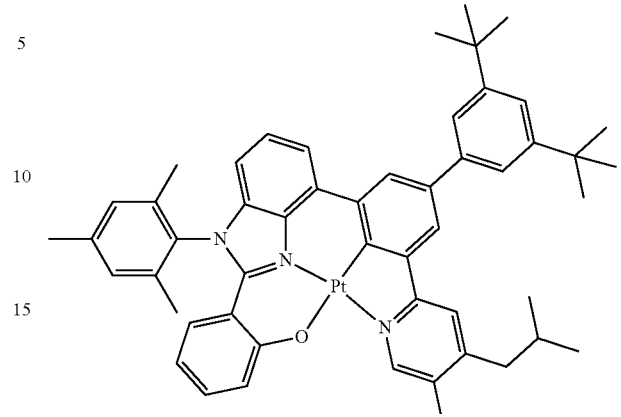
3-51
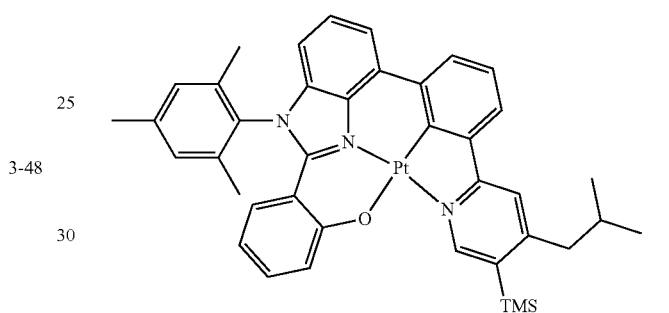
3-52
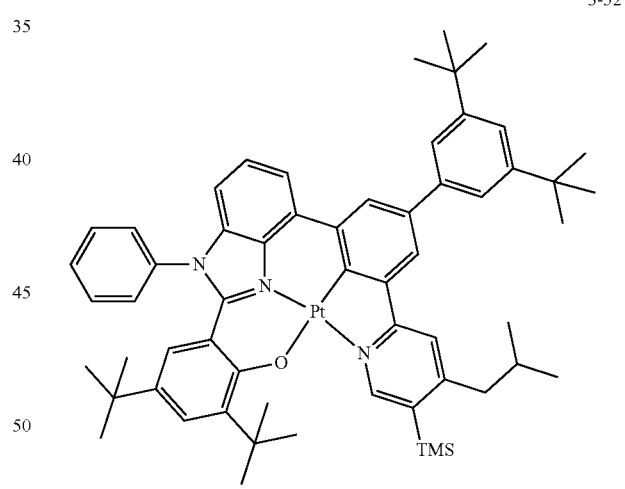
3-53
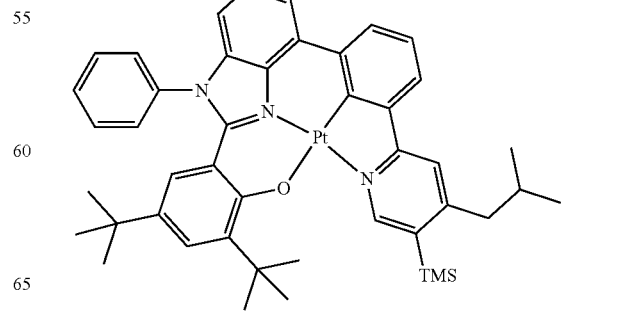

75
-continued
3-54
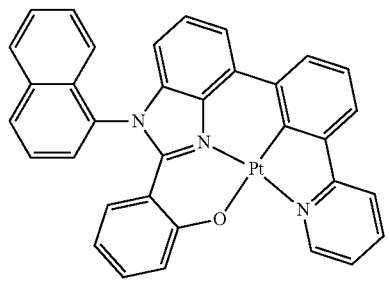
3-55
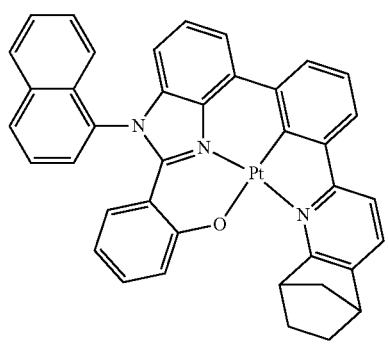
3-56
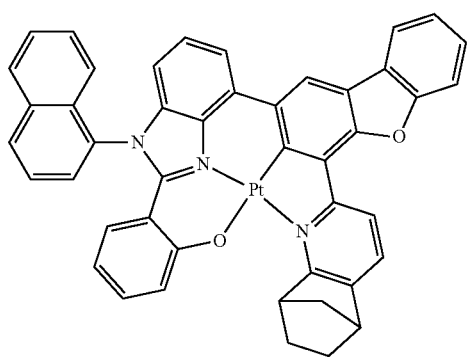
3-57
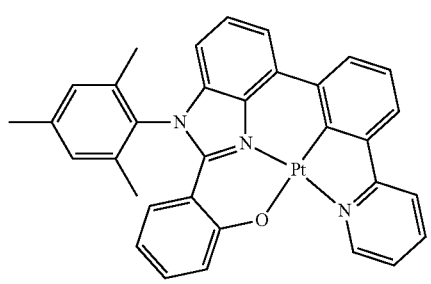
3-58
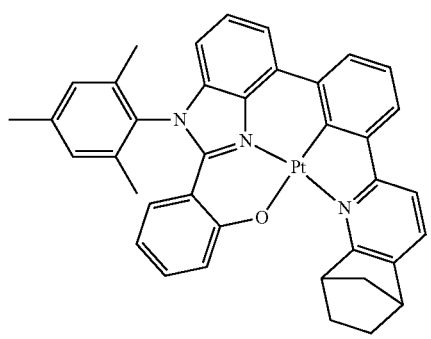
76
-continued
3-59
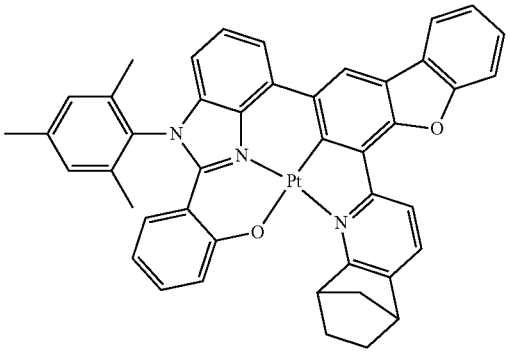
3-60
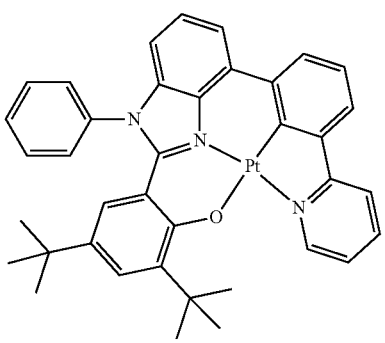
3-61
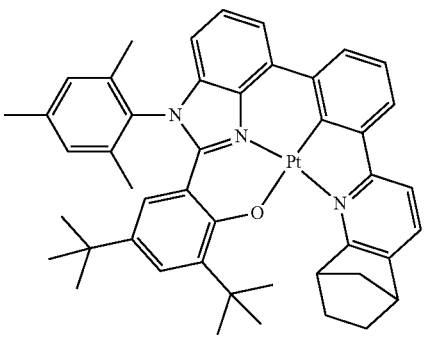
3-62
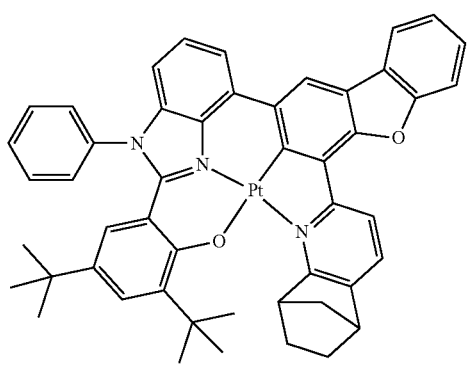

-continued
3-63
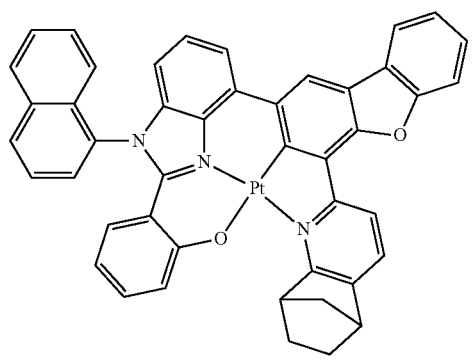
3-64
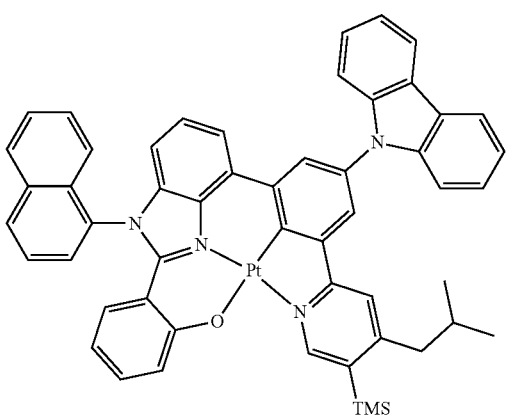
3-65
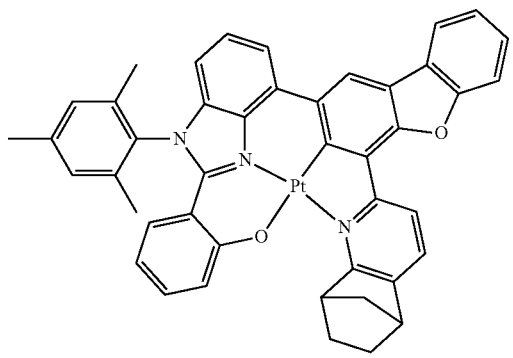
3-66
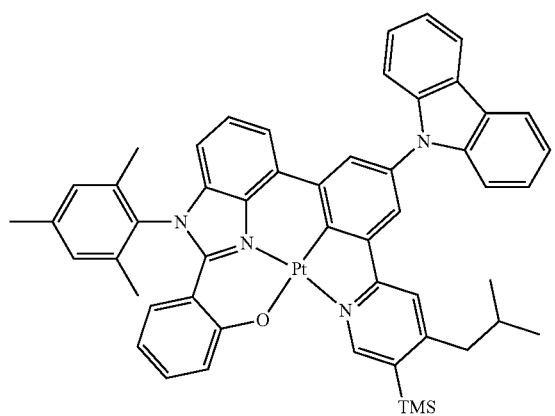
-continued
3-67
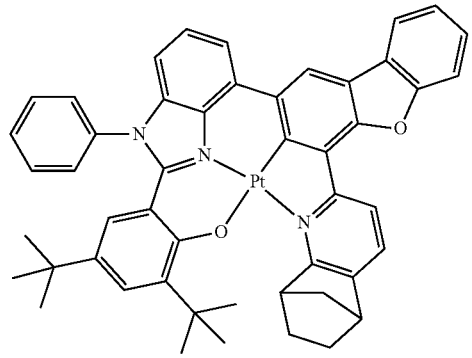
3-68
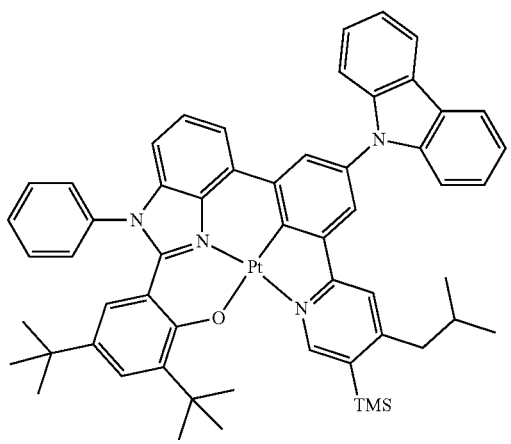
3-69
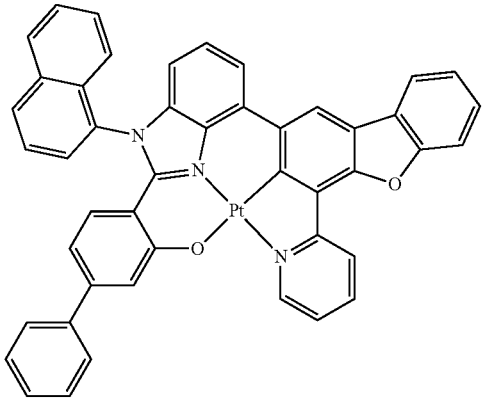
3-70
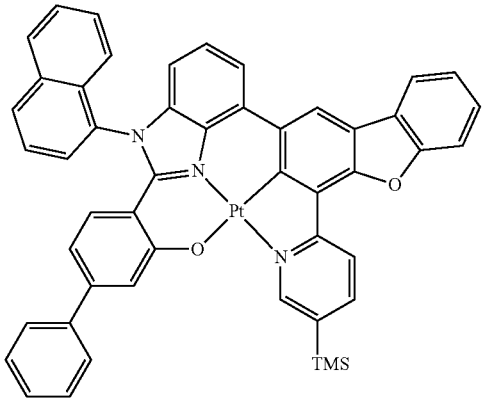

-continued
3-71
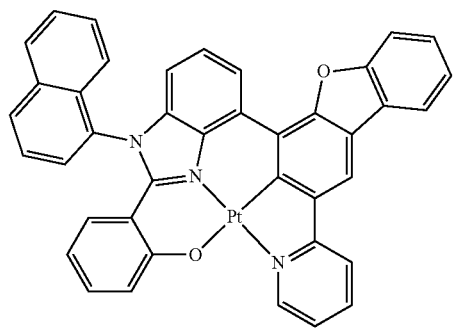
3-72
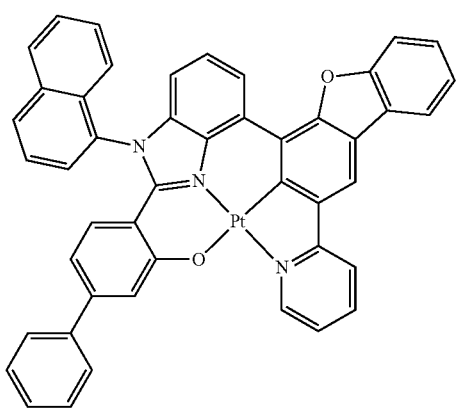
3-73
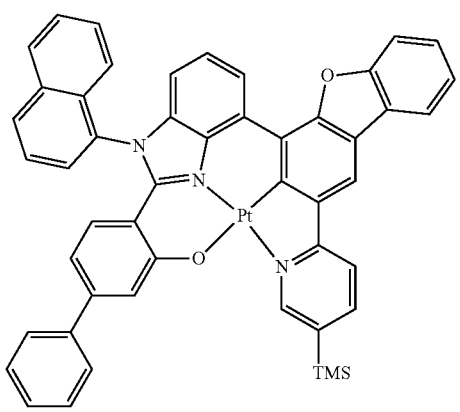
3-74
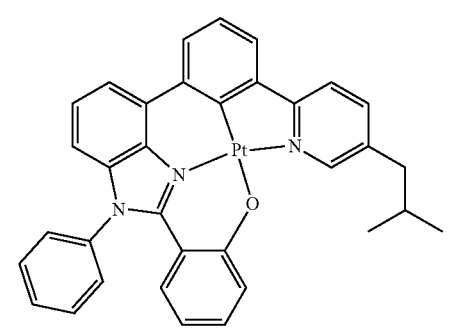
-continued
3-75
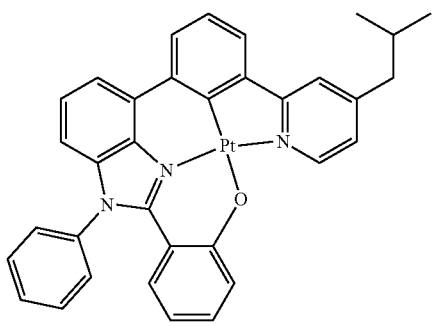
3-76
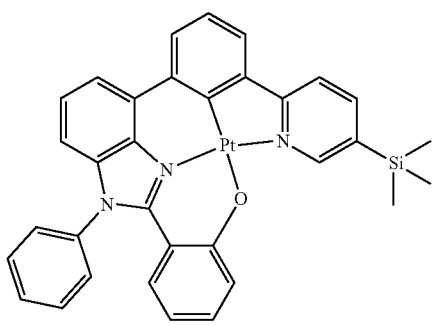
3-77
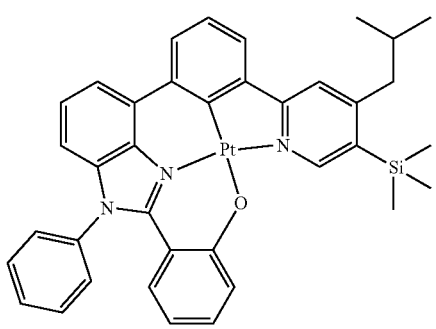
3-78
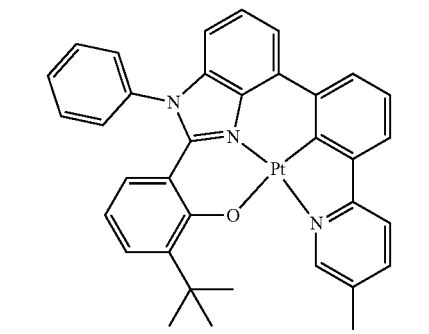
3-79
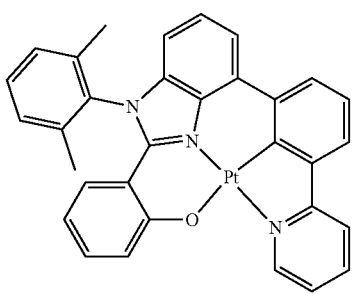

3-80
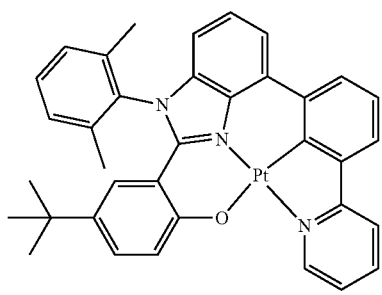
3-81
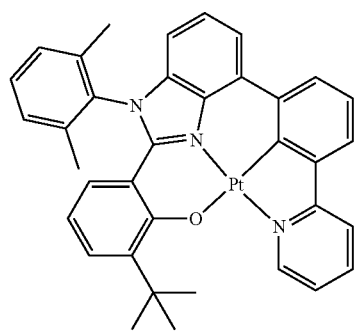
3-82
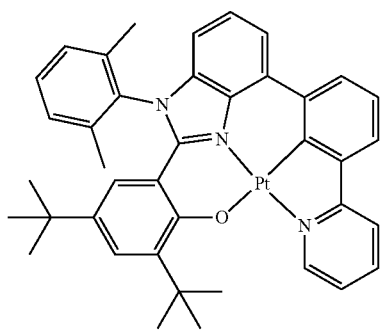
3-83
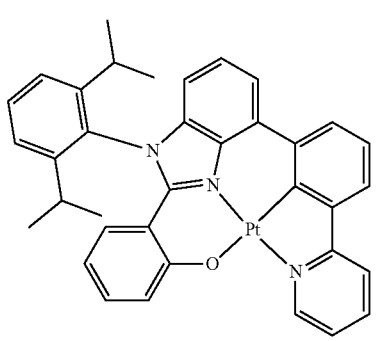
3-84
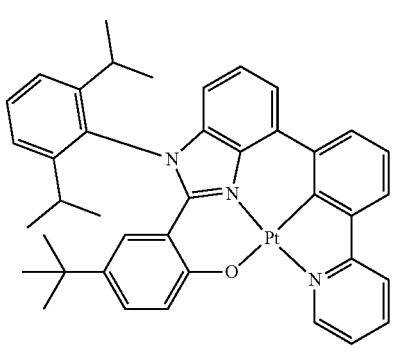
3-85
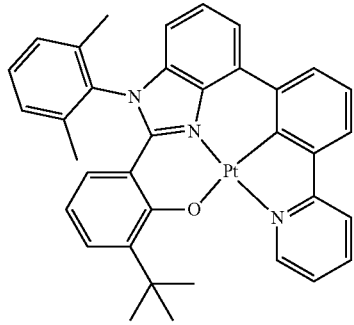
3-86
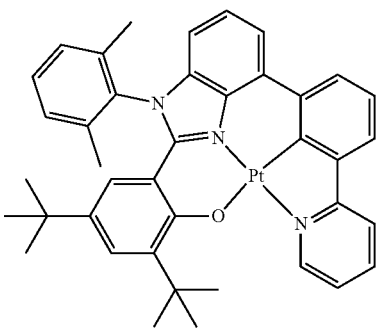
3-87
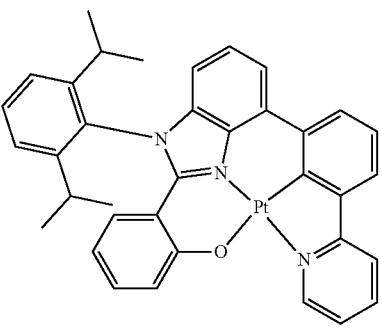
3-88
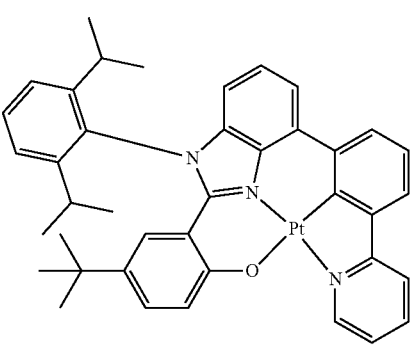

3-89
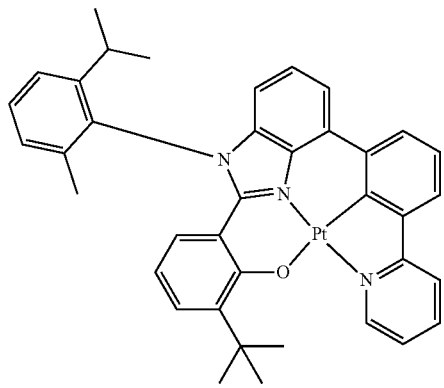
3-93
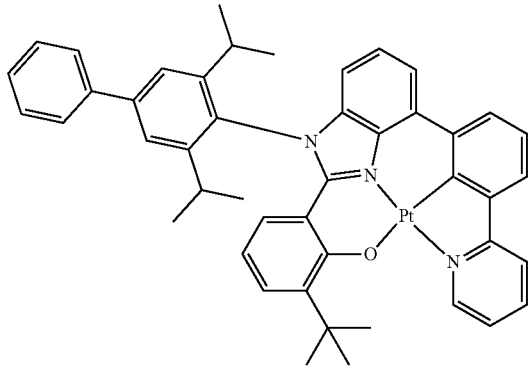
3-90
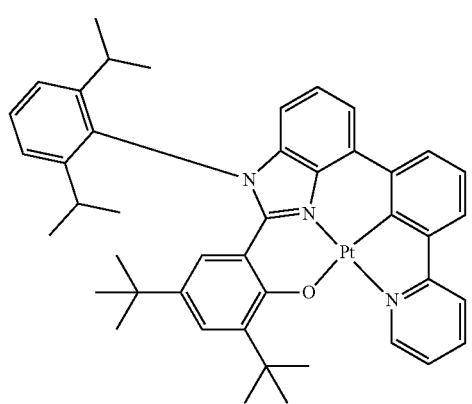
3-94
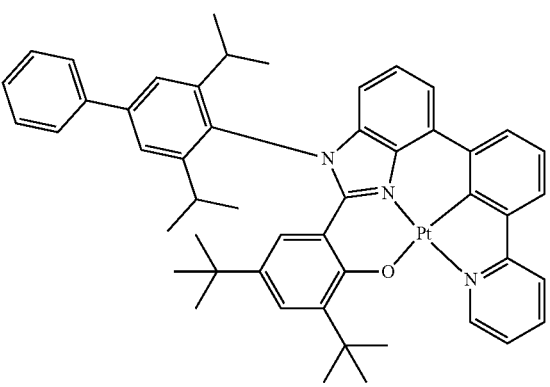
3-91
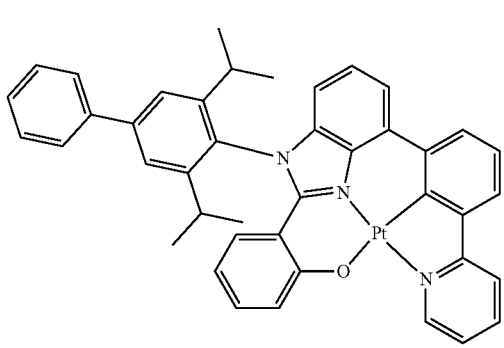
3-95
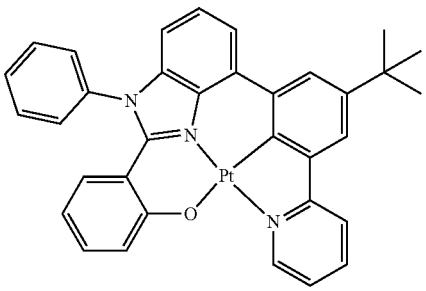
3-92
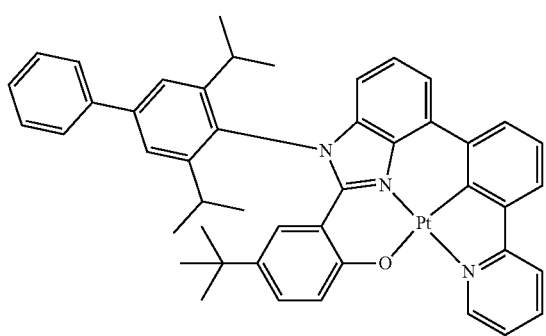
3-96
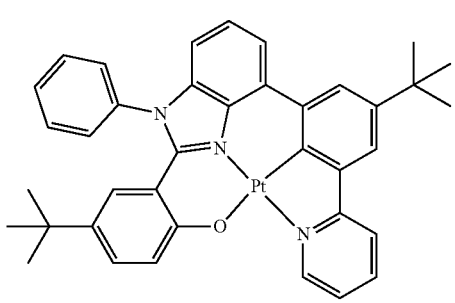

3-97
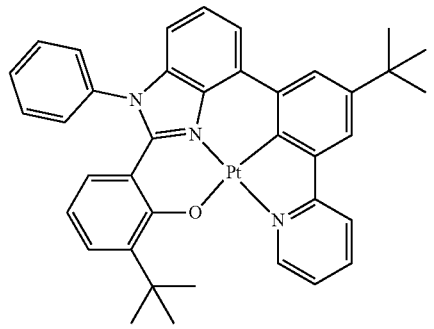
3-98
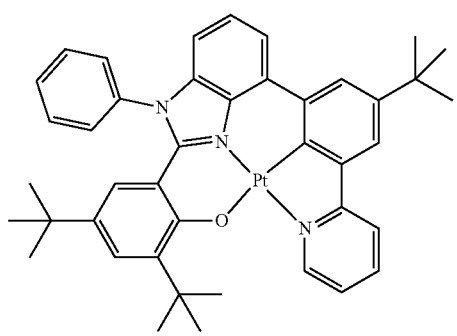
3-99
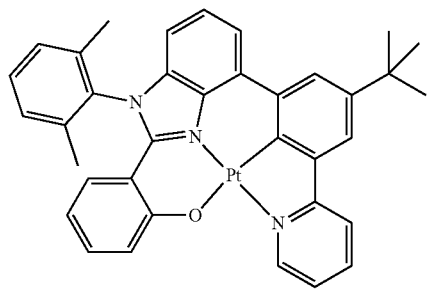
3-100
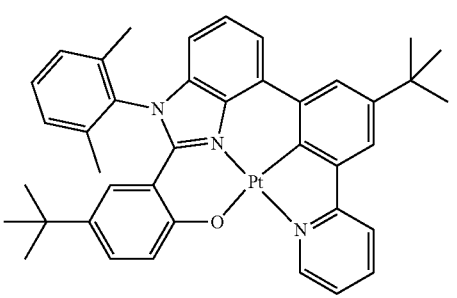
3-101
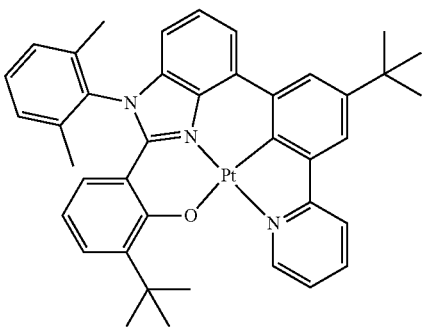
3-102
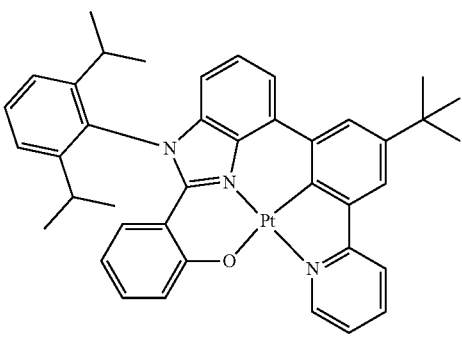
3-103
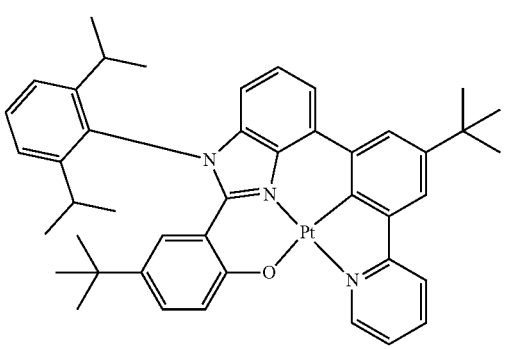
3-104
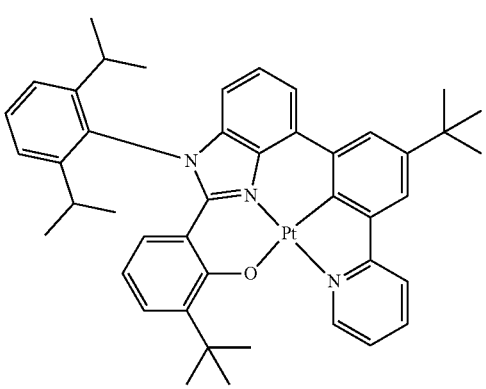
3-105
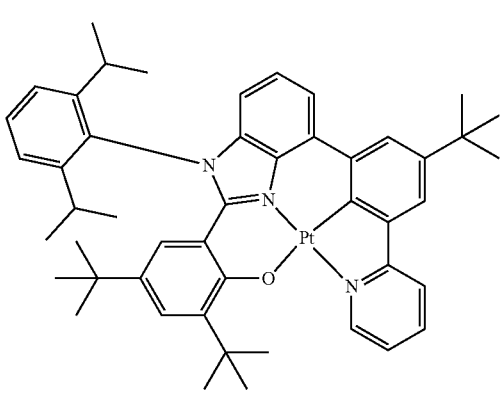

-continued
3-106
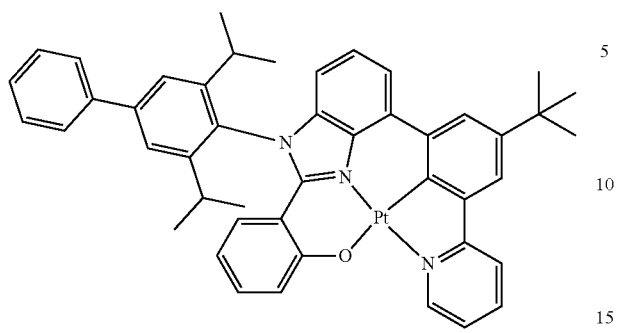
3-107
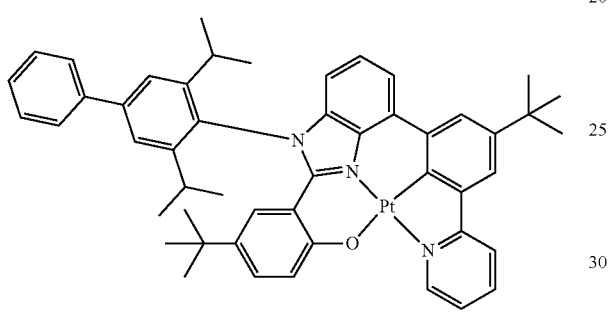
3-108
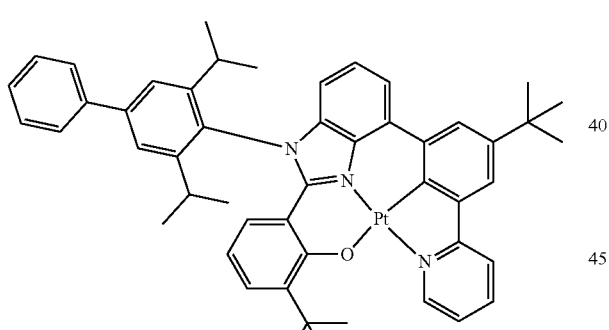
3-109
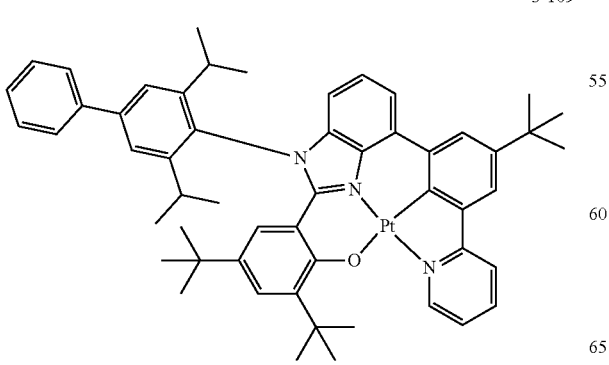
-continued
3-110
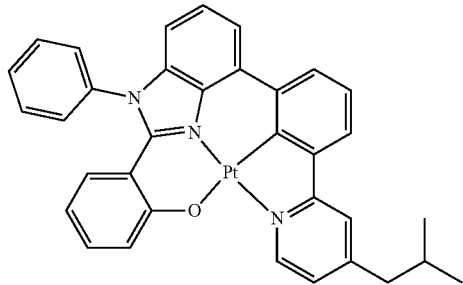
3-111
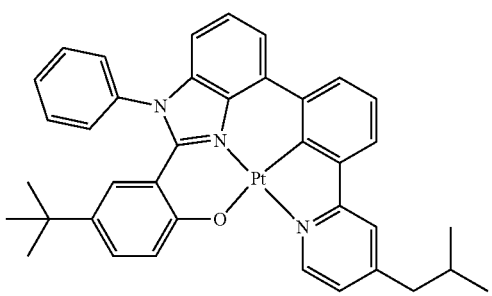
3-112
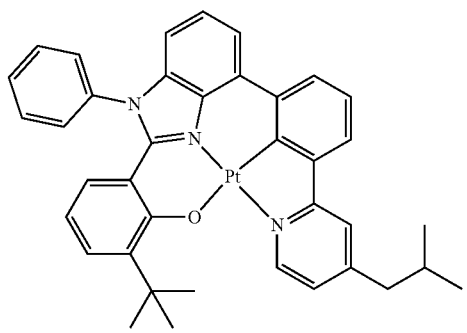
3-113
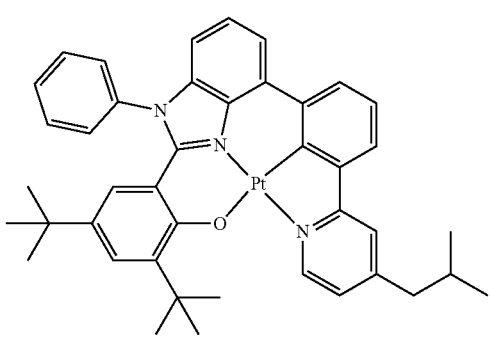

3-114
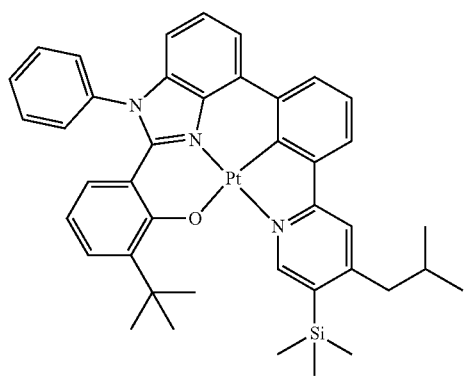
3-115
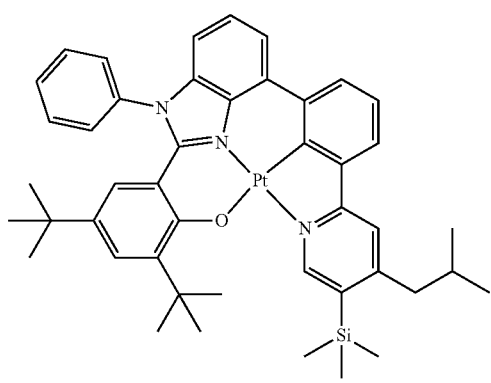
3-116
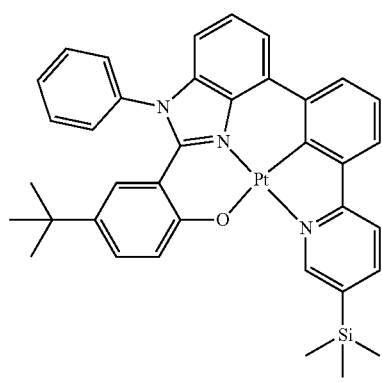
3-117
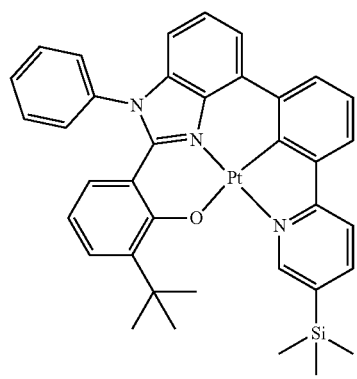
3-118
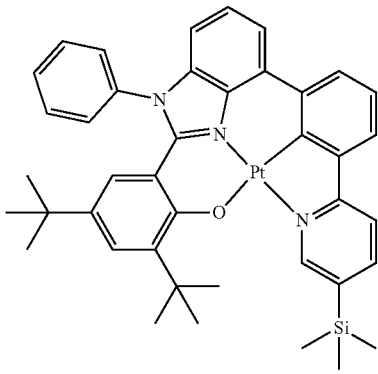
3-119
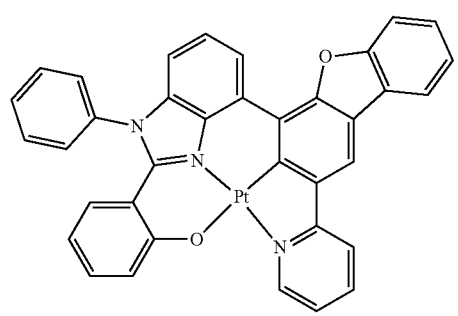
3-120
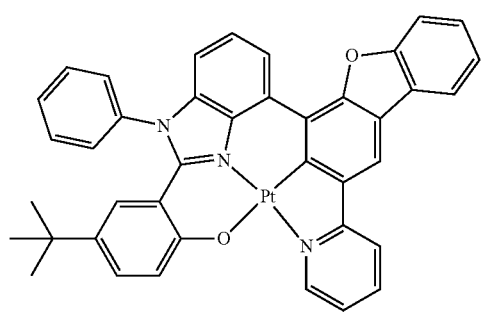
3-121
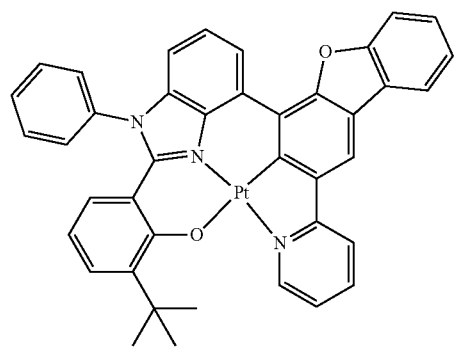

-continued
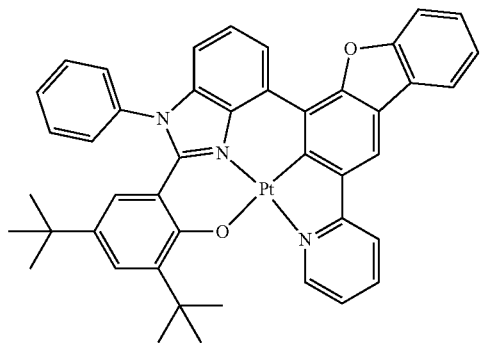
3-122
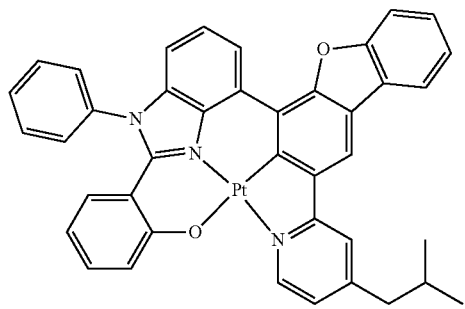
3-123
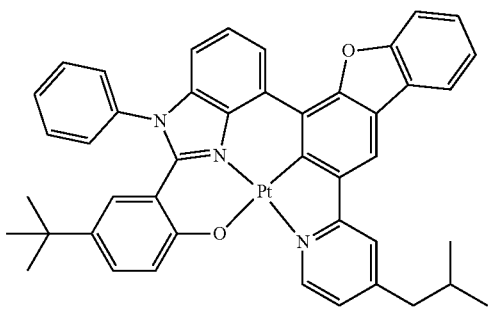
3-124
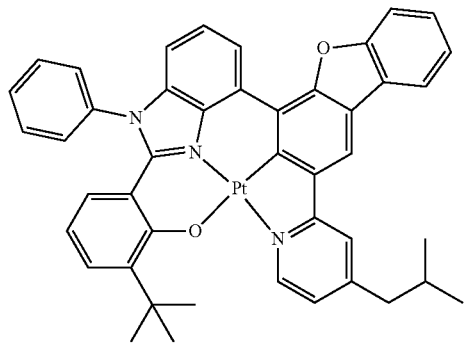
3-125
-continued
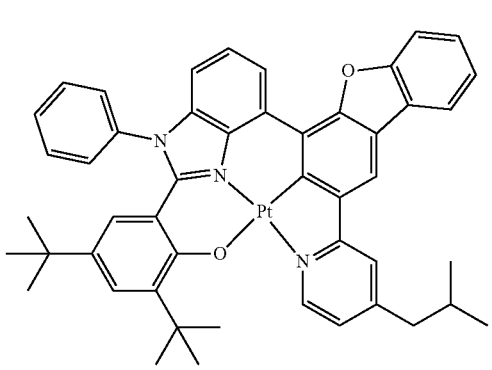
3-126
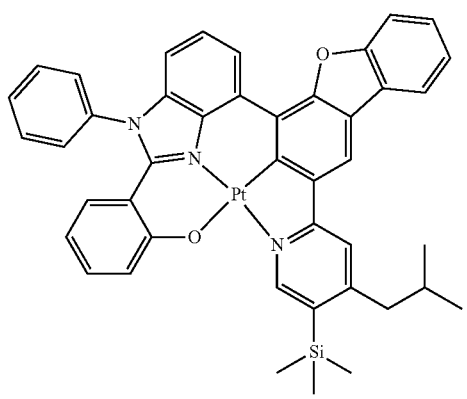
3-127
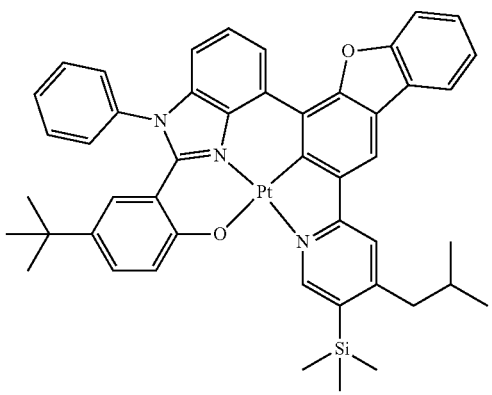
3-128
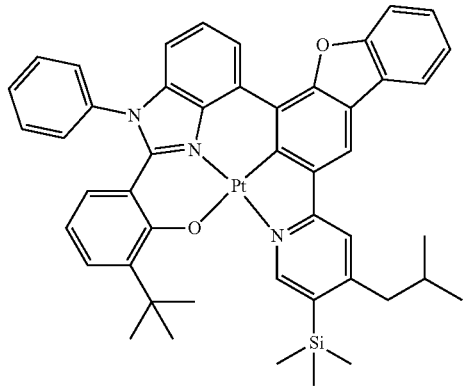
3-129

3-130
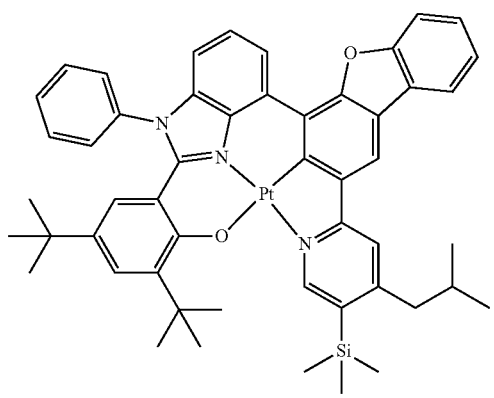
3-131
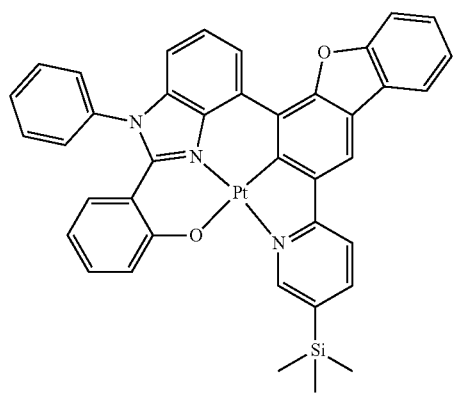
3-132
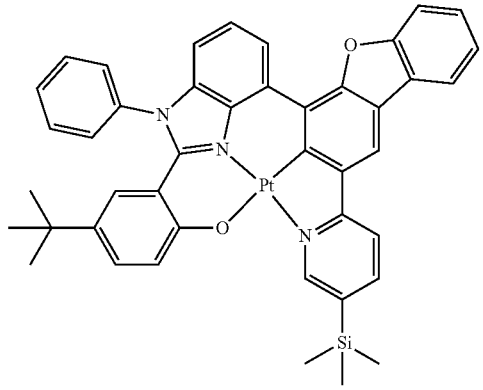
3-133
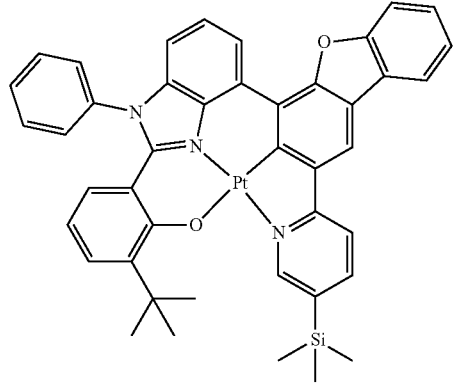
3-134
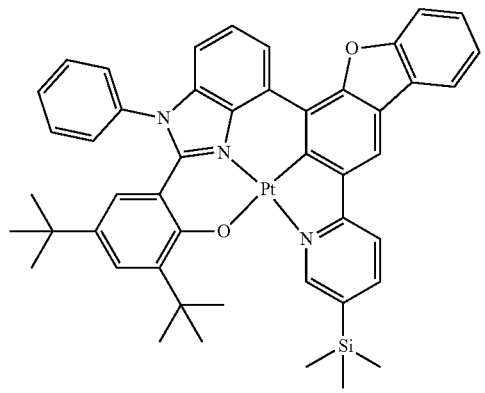
3-135
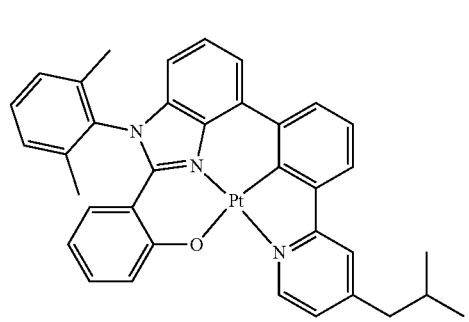
3-136
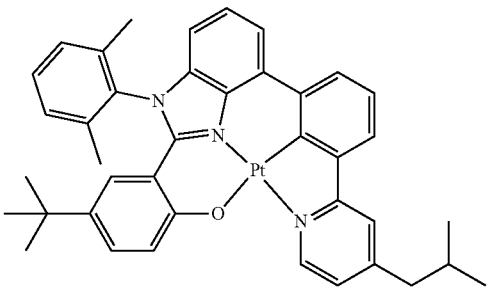
3-137
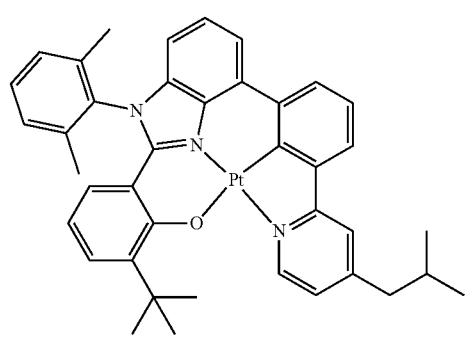

3-138
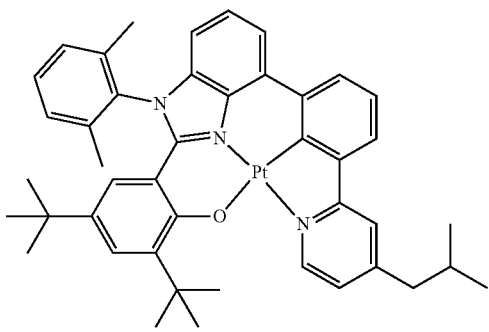
3-139
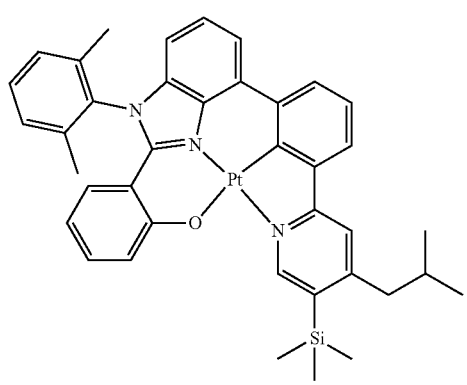
3-140
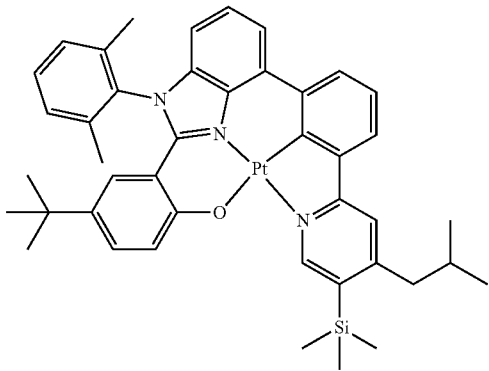
3-141
3-142
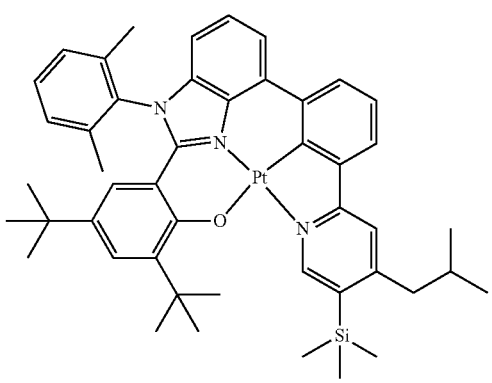
3-143
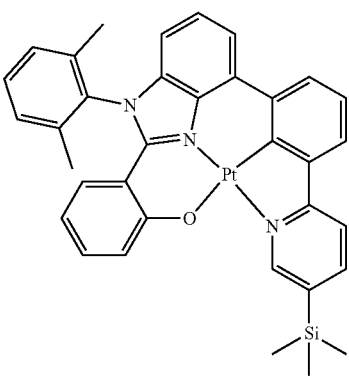
3-144
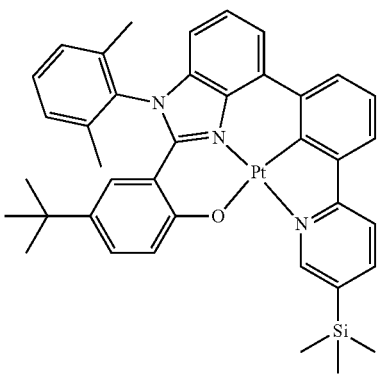
3-145
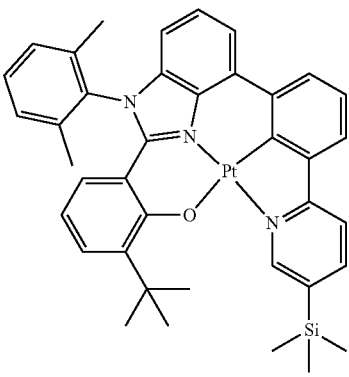

-continued
3-146
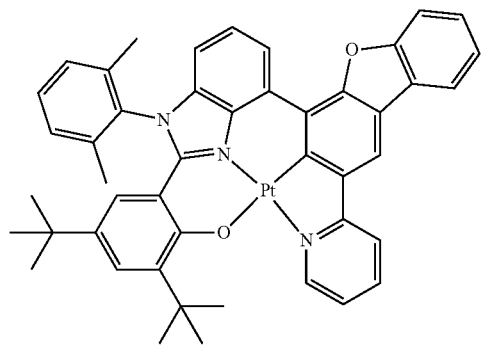
3-147
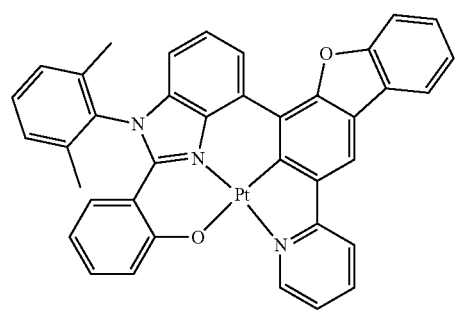
3-148
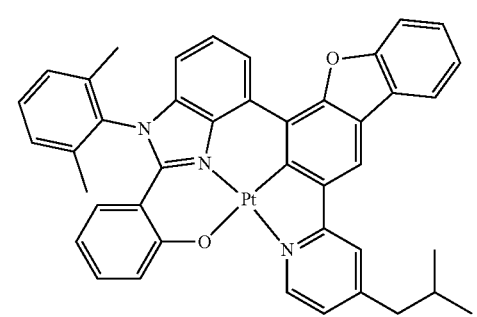
3-149
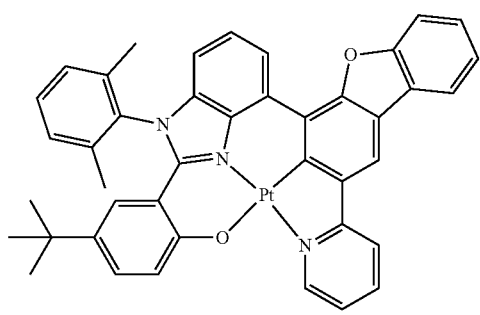
-continued
3-150
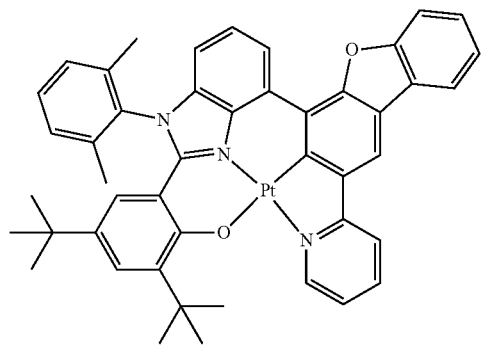
3-151
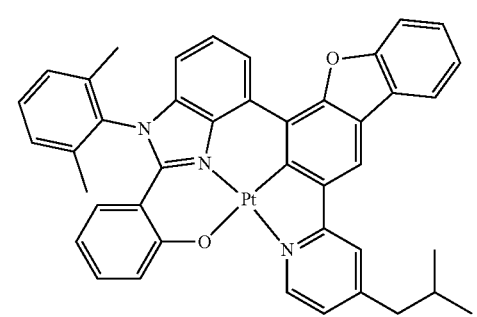
3-152
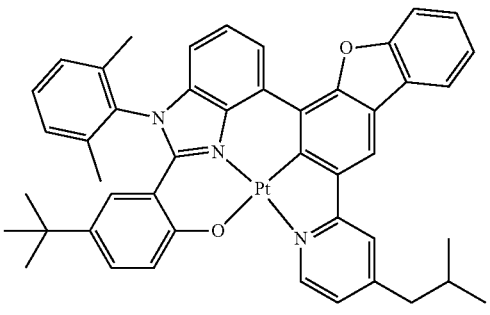
3-153
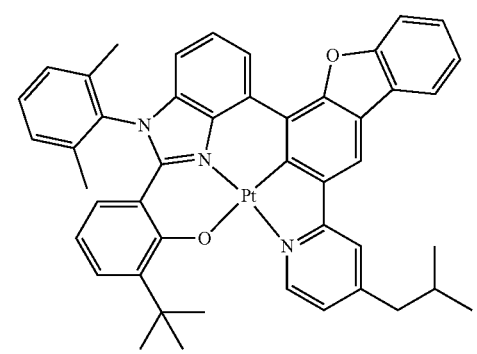

-continued
3-154
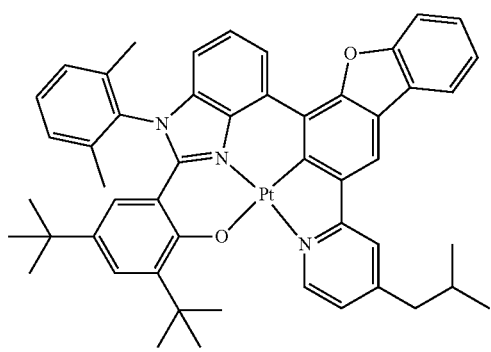
3-155
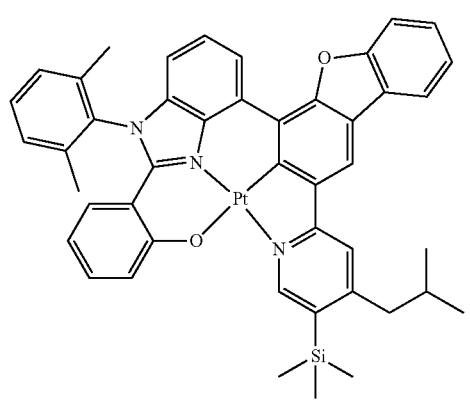
3-156
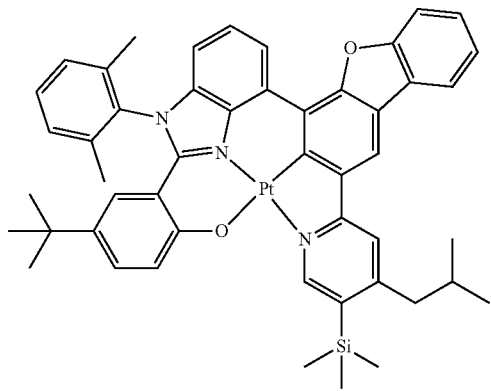
3-157
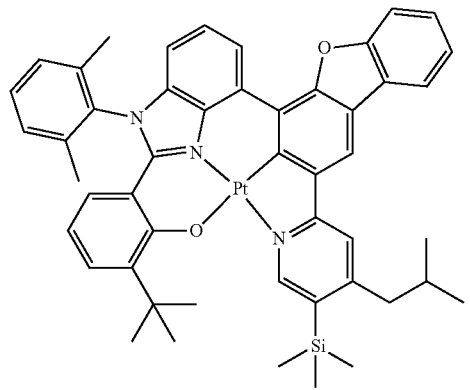
-continued
3-158
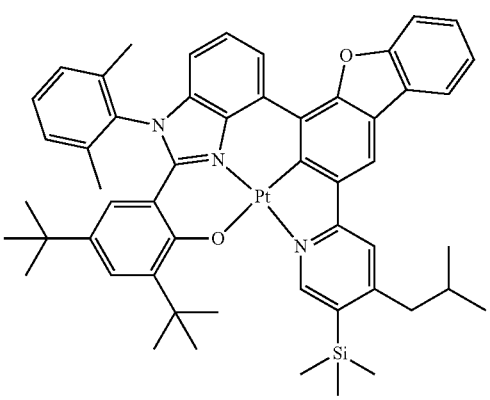
3-159
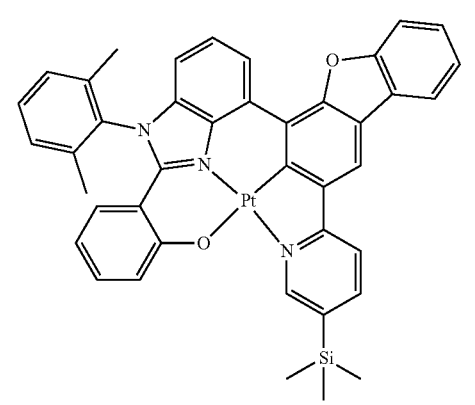
3-160
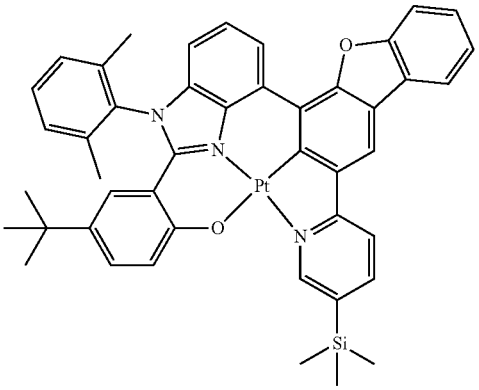
3-161
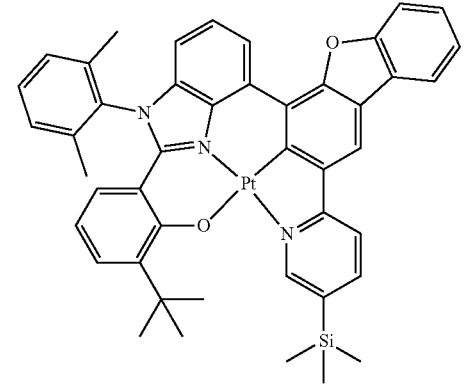

3-162
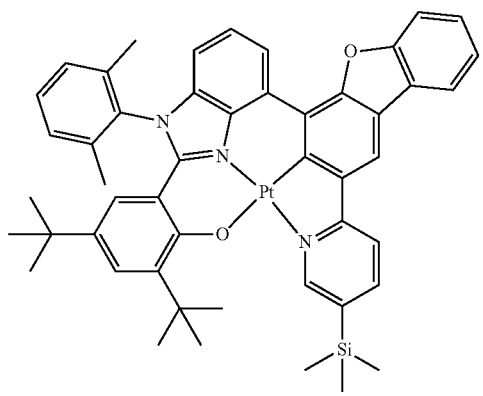
3-163
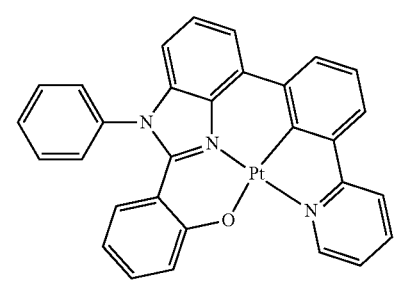
3-164
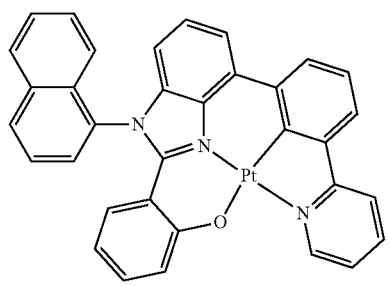
3-165
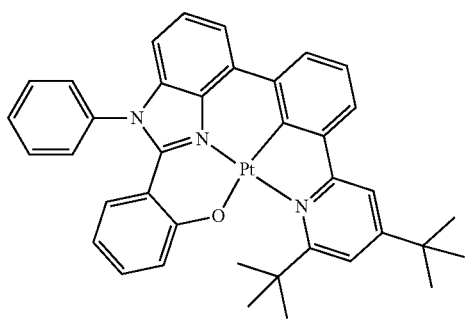
3-166
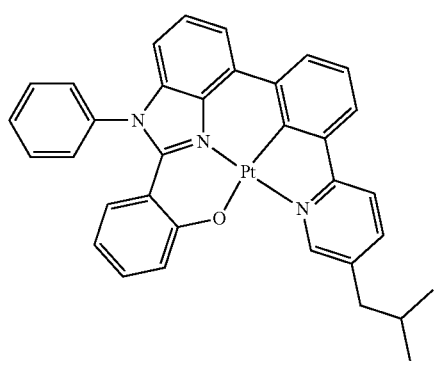
3-167
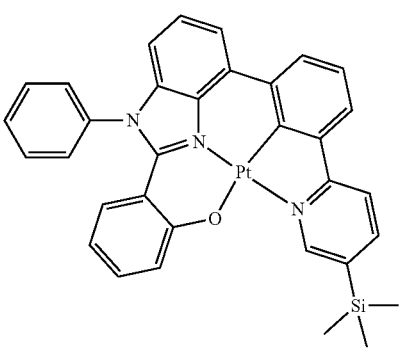
3-168
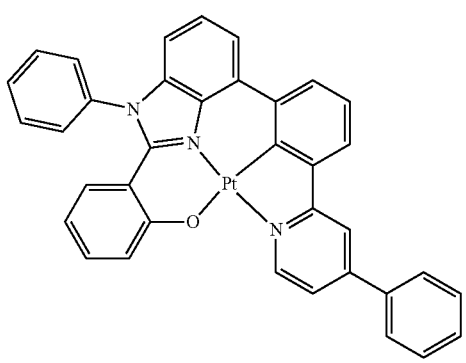
3-169
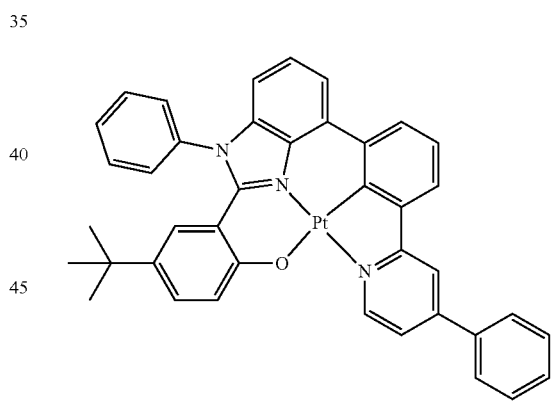
3-170
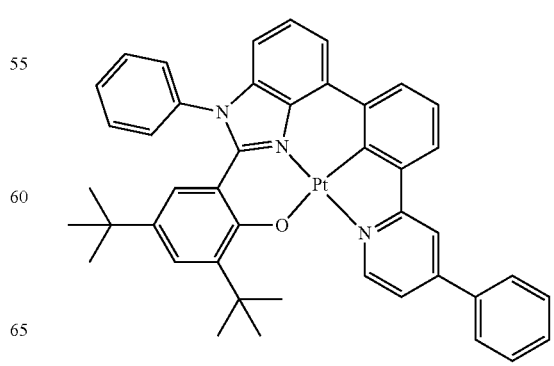

| | |
|---|---|
| 3-171 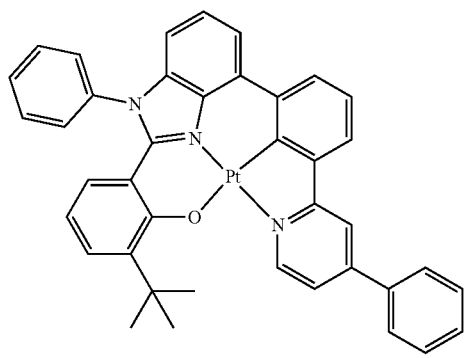 | 3-175 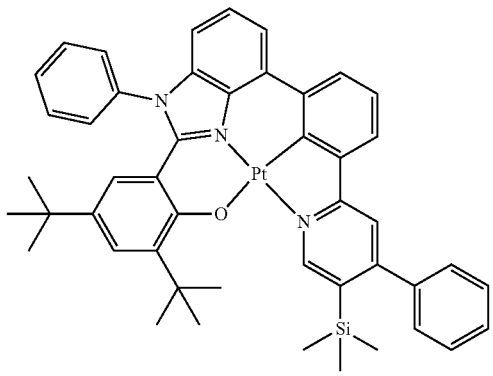 |
| 3-172 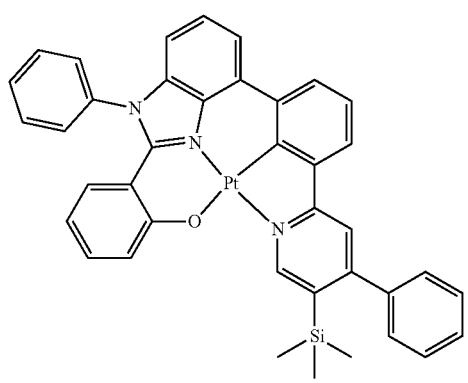 | 3-176 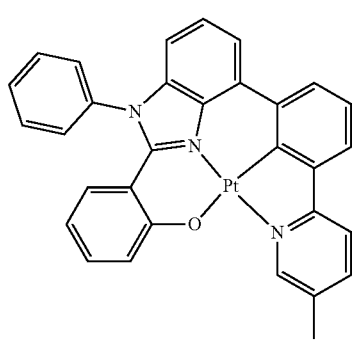 |
| 3-173 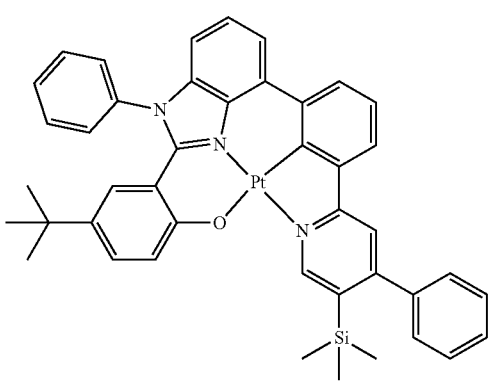 | 3-177 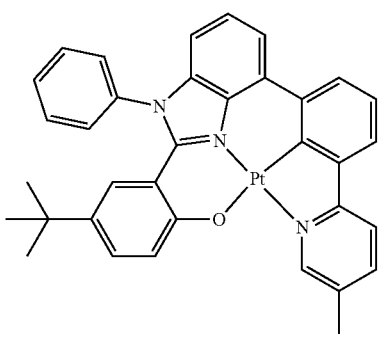 |
| 3-174 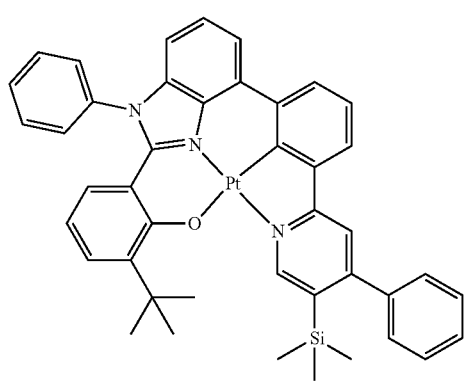 | 3-178 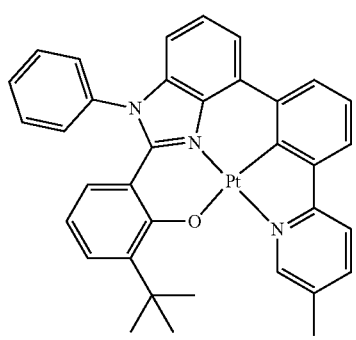 |

3-179
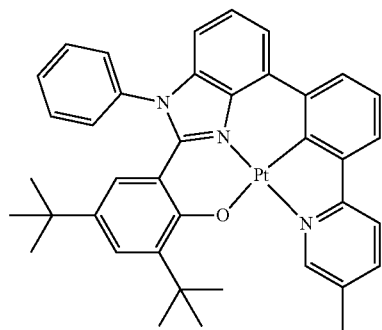
3-183
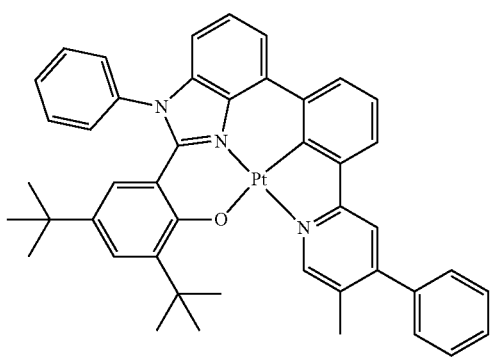
3-180
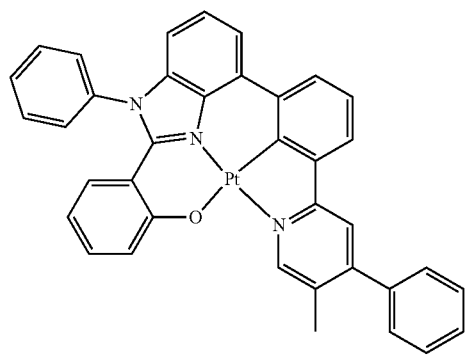
3-184
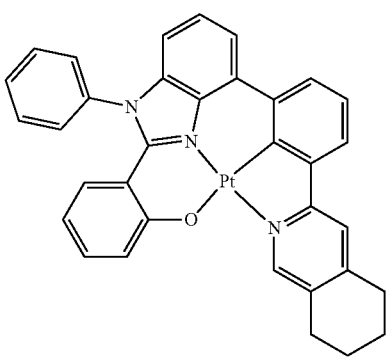
3-181
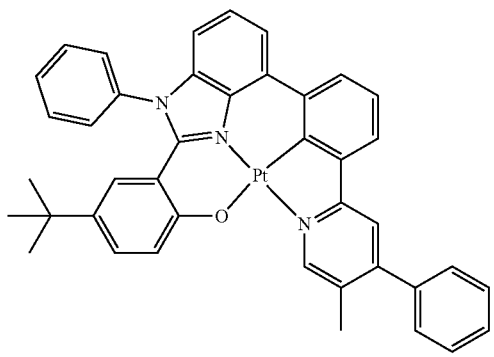
3-185
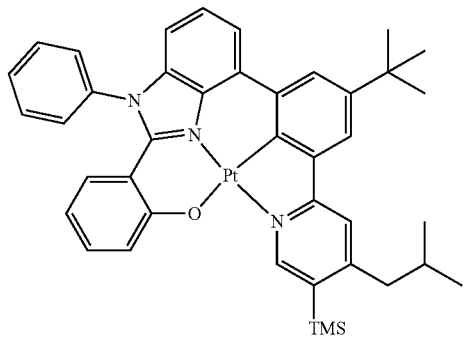
3-182
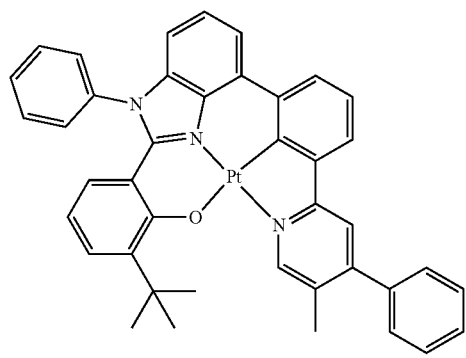
3-186
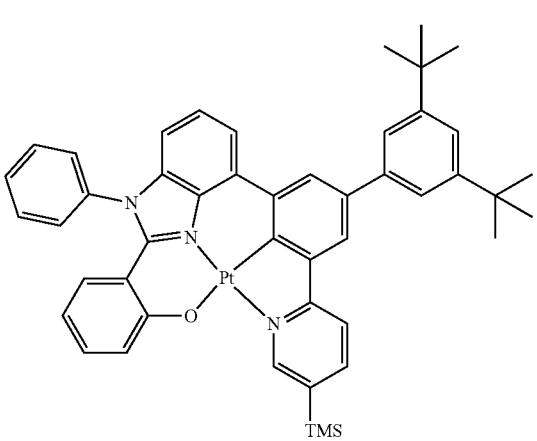

3-187
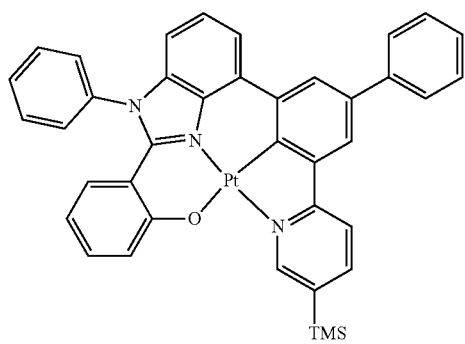
3-188
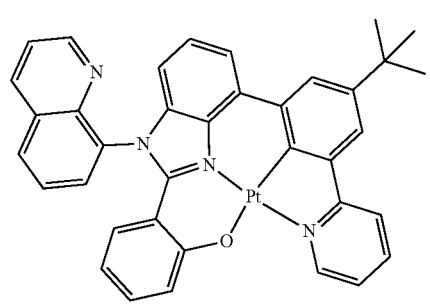
3-189
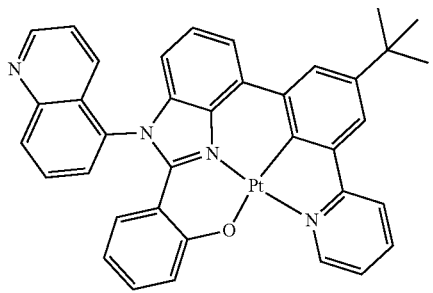
3-190
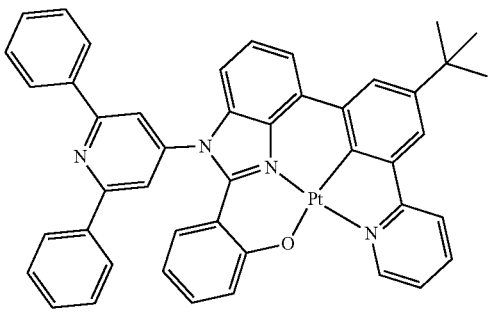
3-191
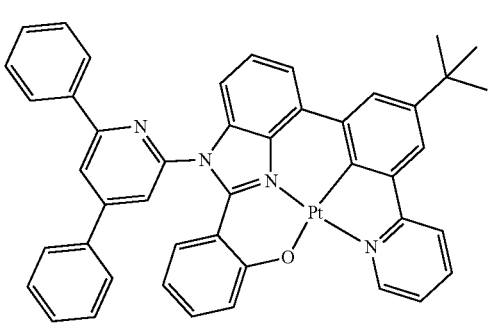
3-192
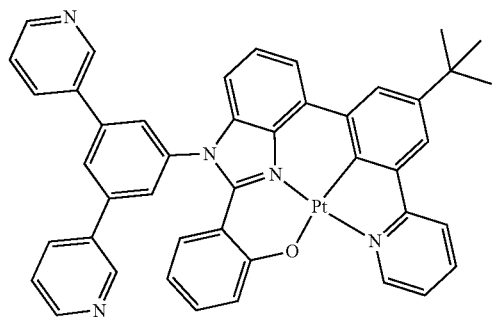
3-193
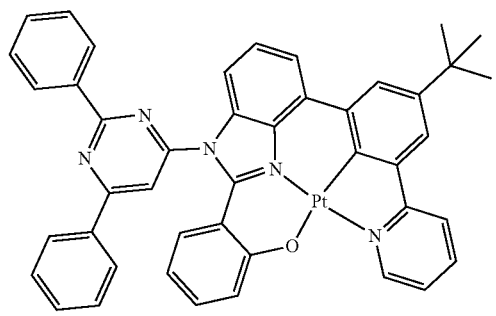
3-194
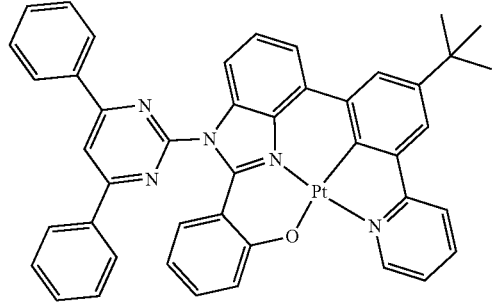
3-195
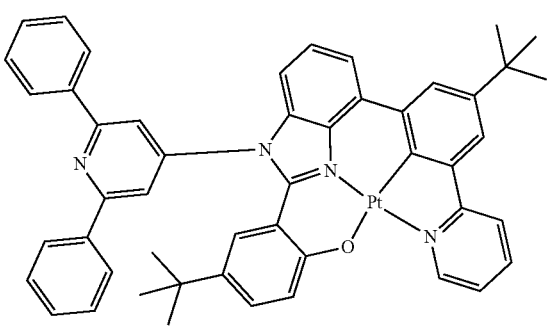
3-196
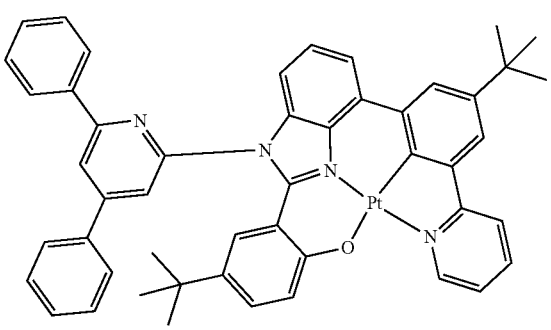

3-197
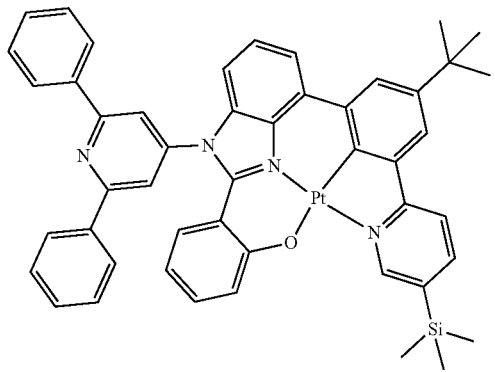
3-198
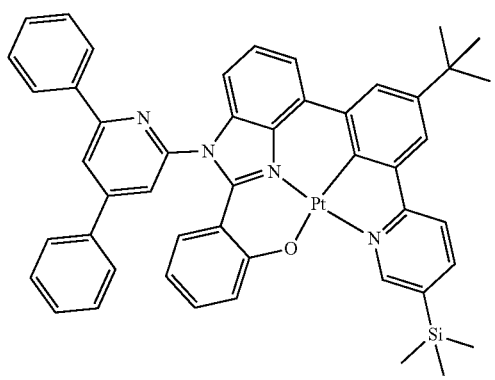
3-199
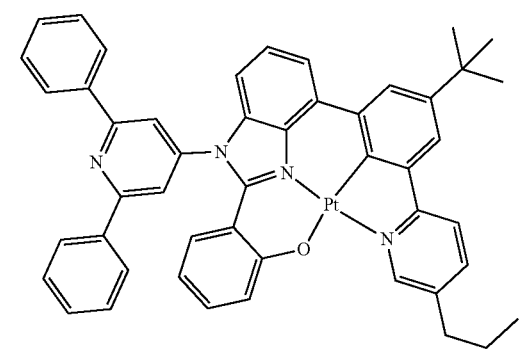
3-200
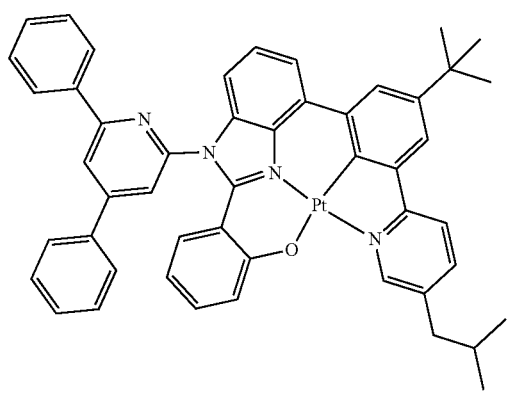
3-201
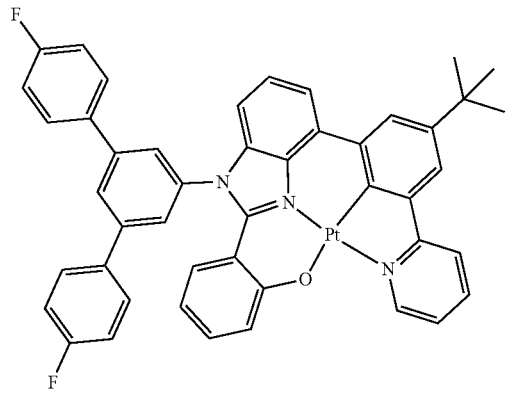
3-202
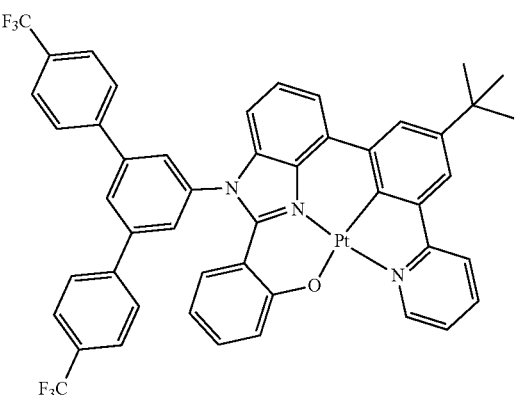
3-203
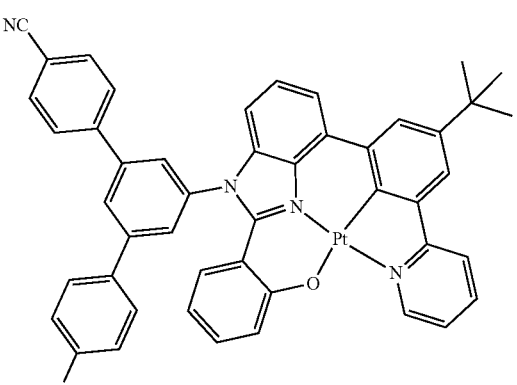
3-204
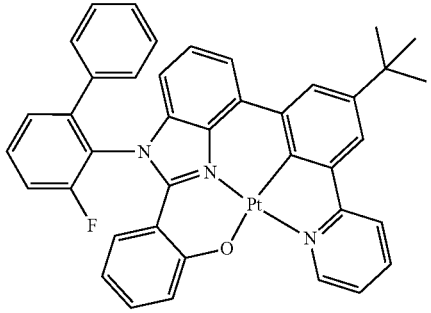

-continued
3-205
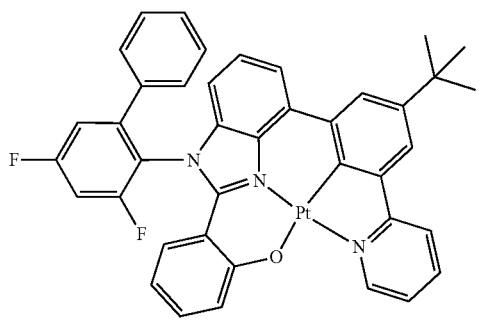
3-206
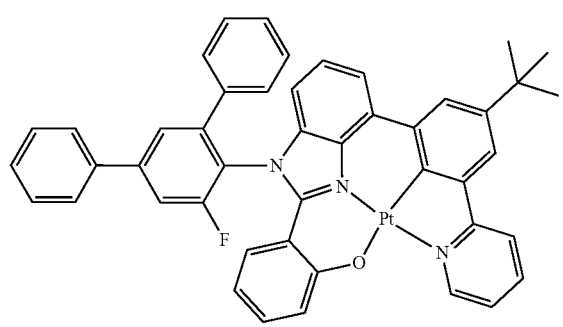
3-207
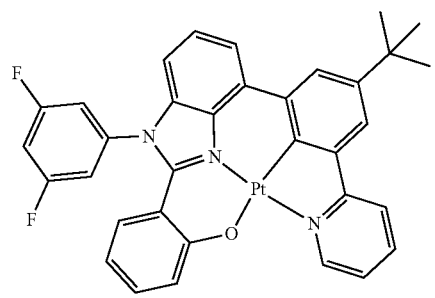
3-208
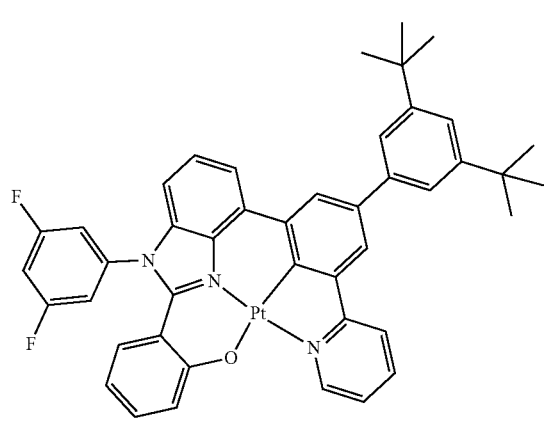
-continued
3-209
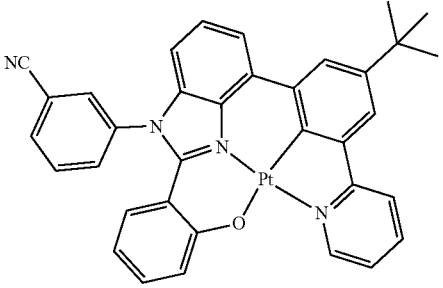
3-210
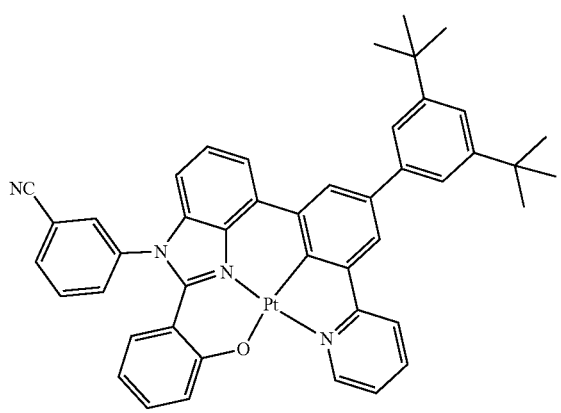
3-211
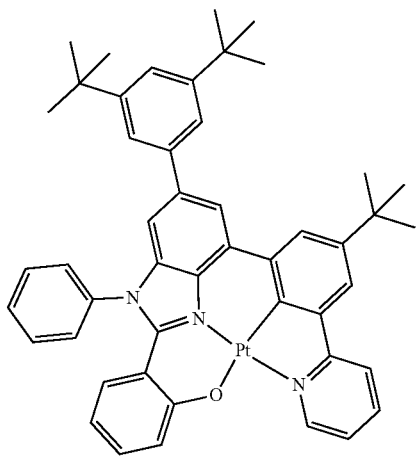
3-212
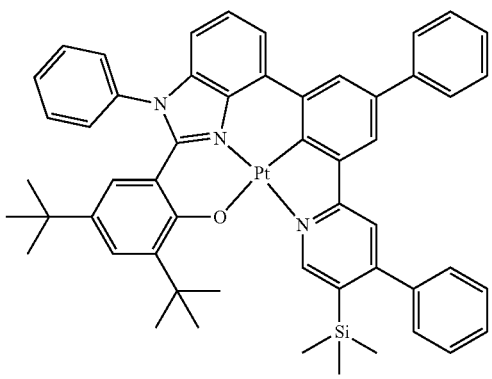

-continued
3-213
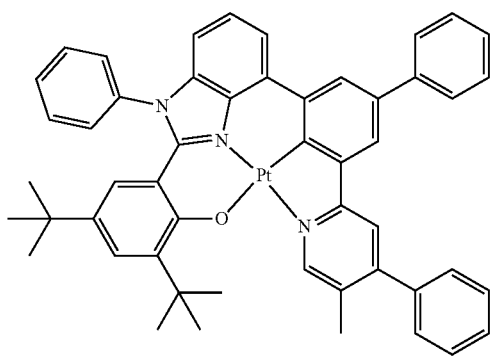
3-214
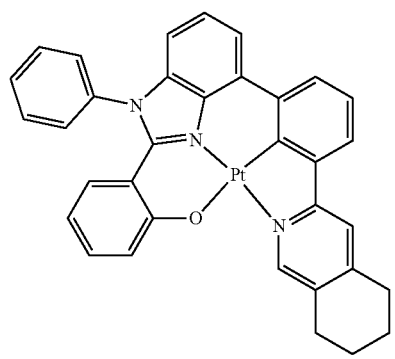
3-215
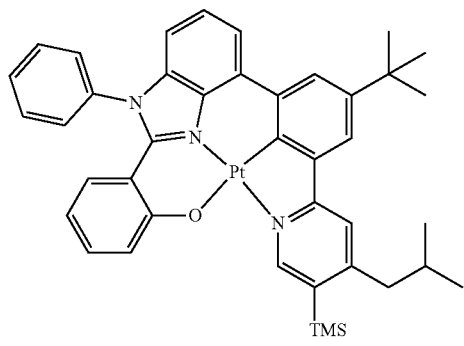
3-216
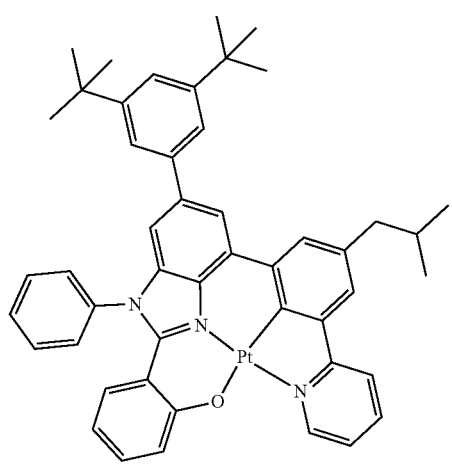
-continued
3-217
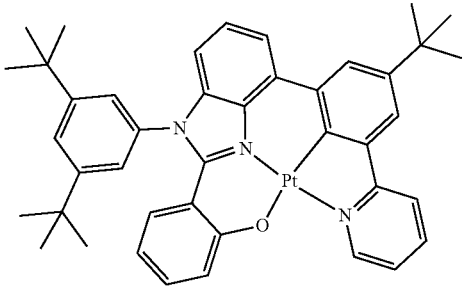
3-218
3-219
3-220
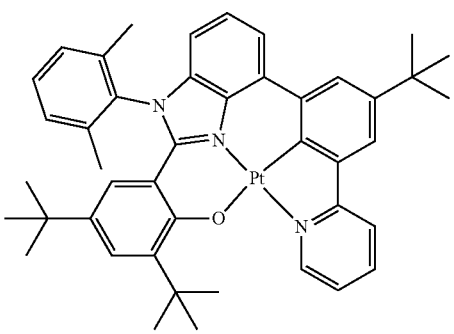

3-221
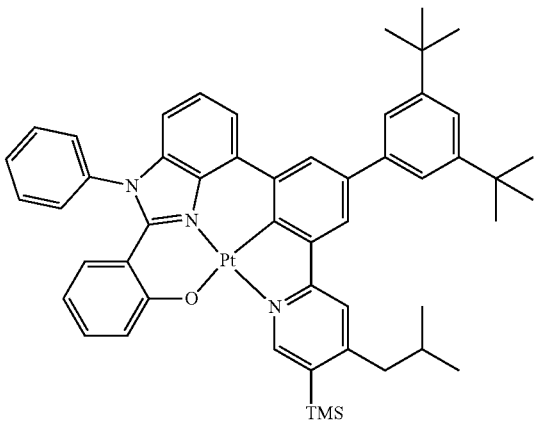
3-222
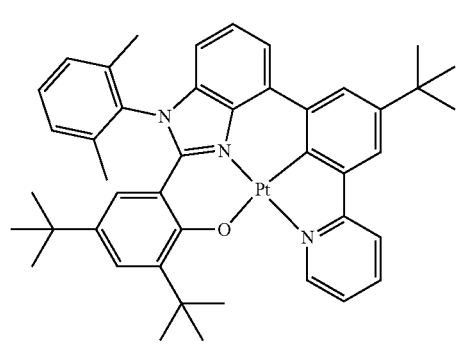
3-223
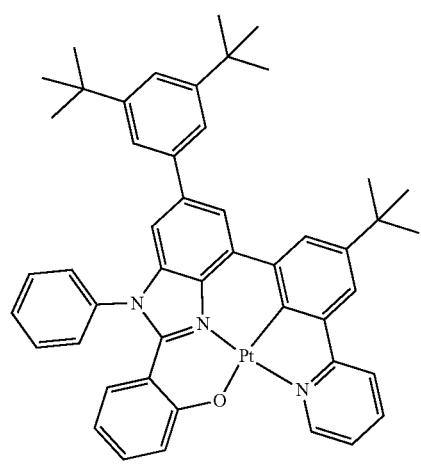
3-224
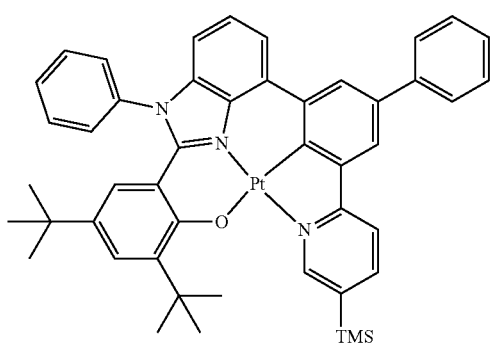
3-225
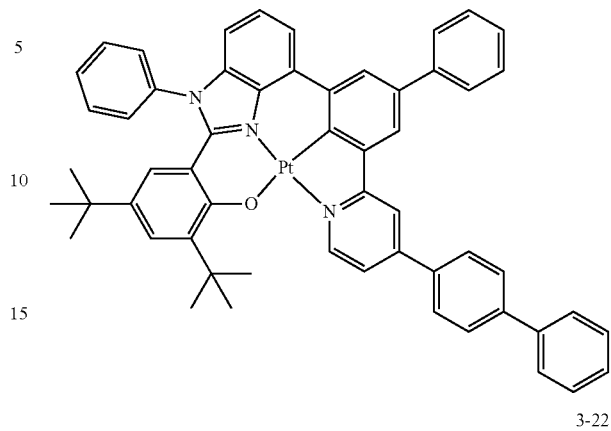
3-226
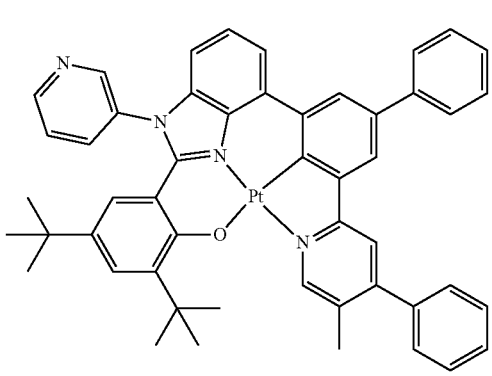
3-227
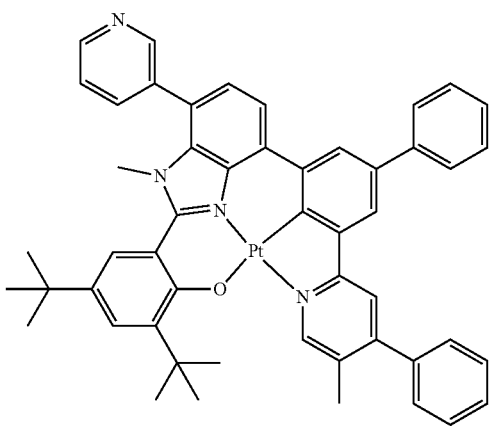
3-228
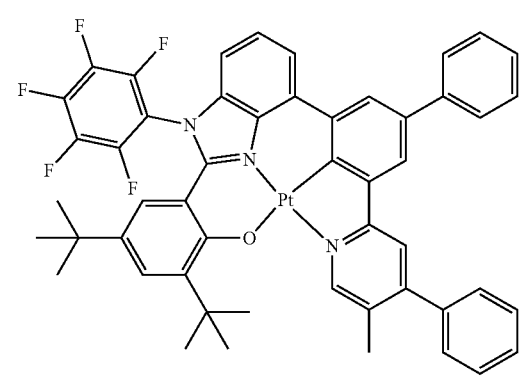

3-229
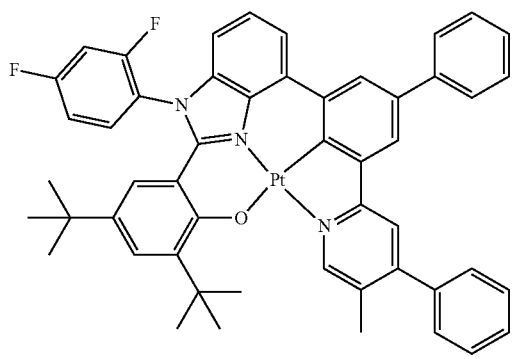
3-230
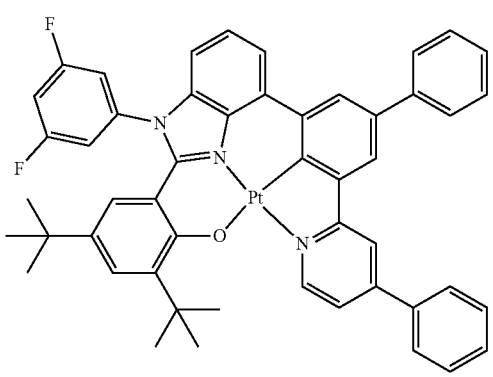
3-231
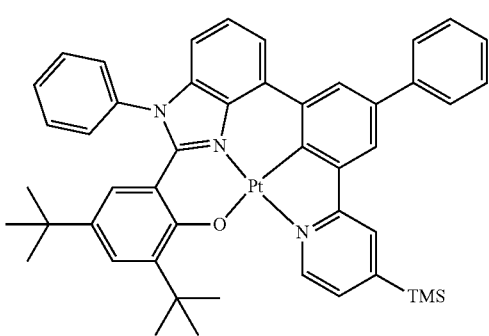
3-232
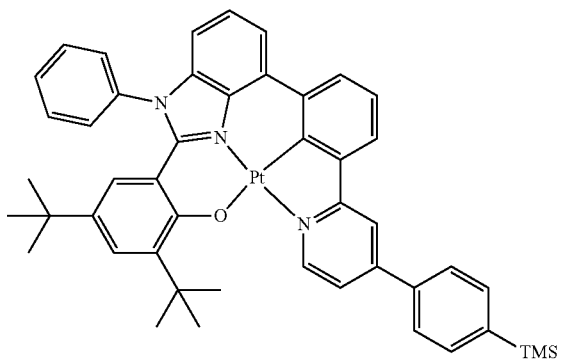
3-233
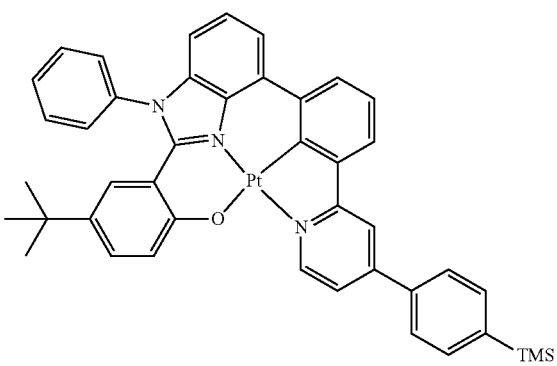
3-234
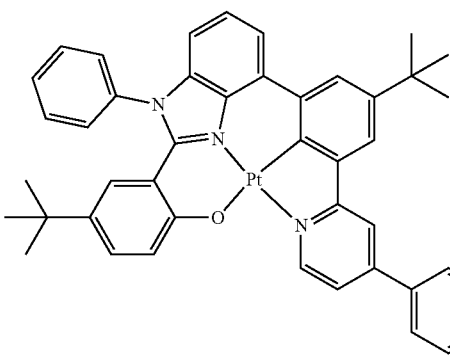
3-235
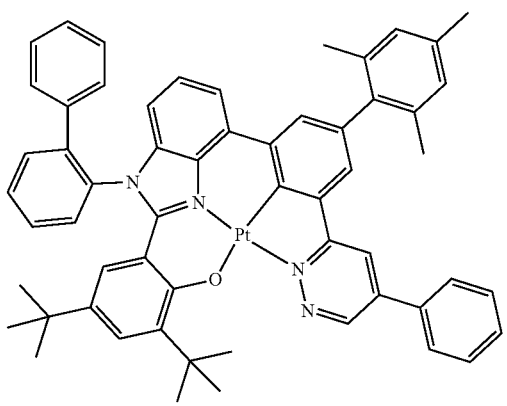
3-236
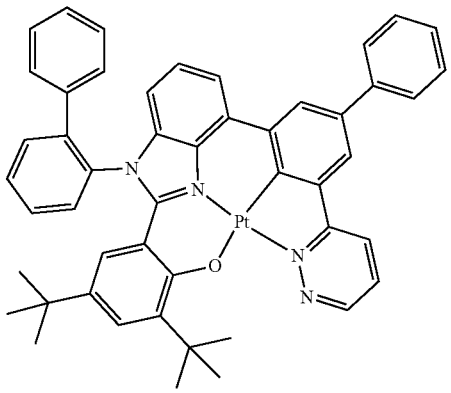

-continued
3-237
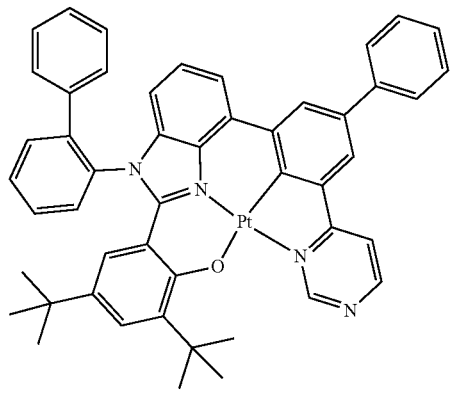
3-238
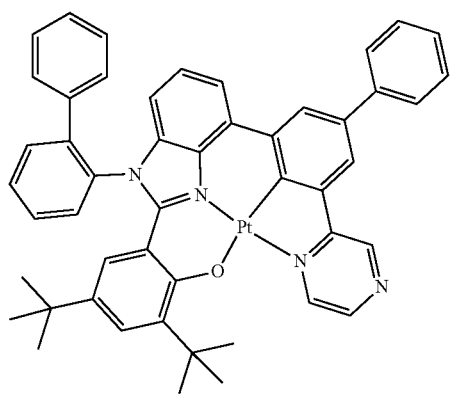
3-239
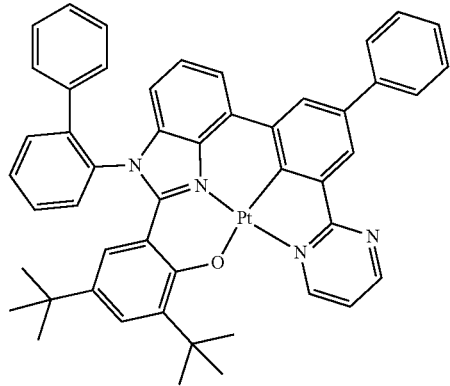
3-240
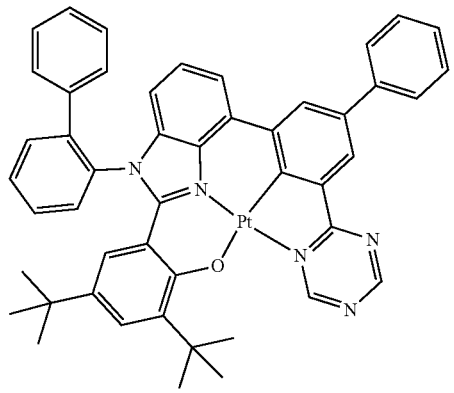
-continued
3-241
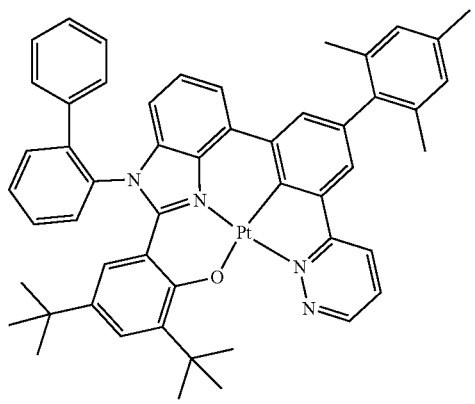
3-242
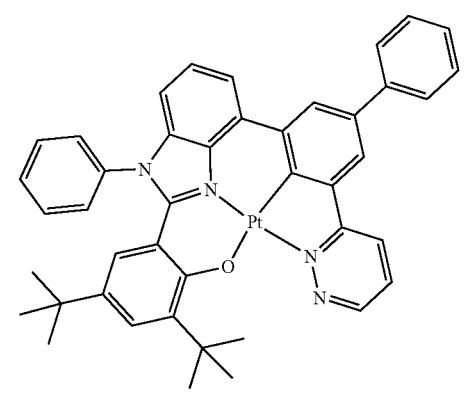
3-243
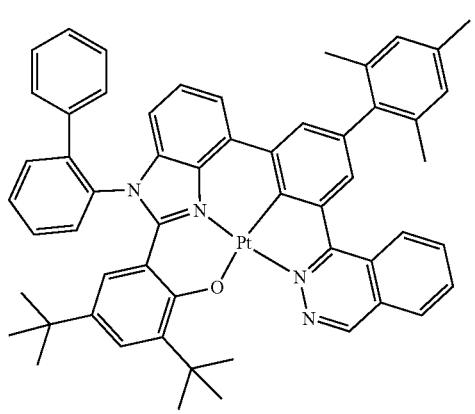
3-244
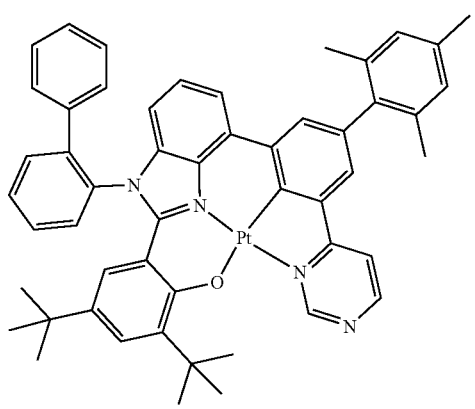

-continued
3-245
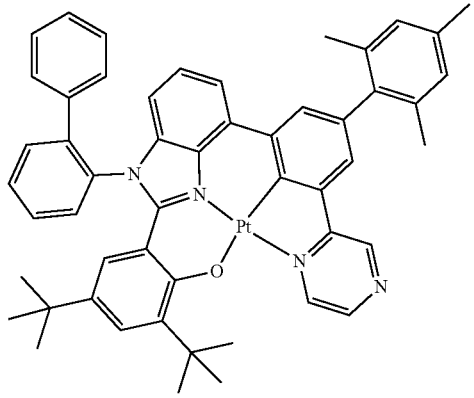
3-246
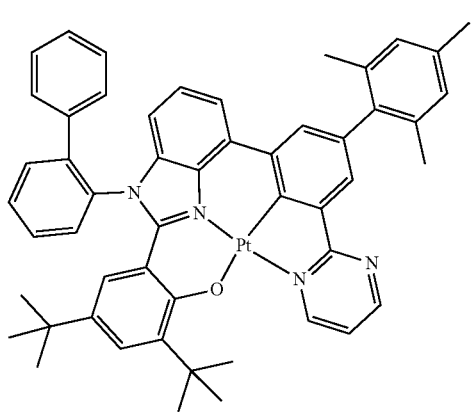
3-247
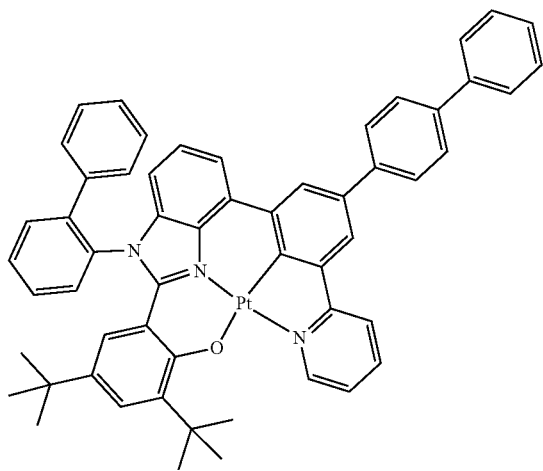
-continued
3-248
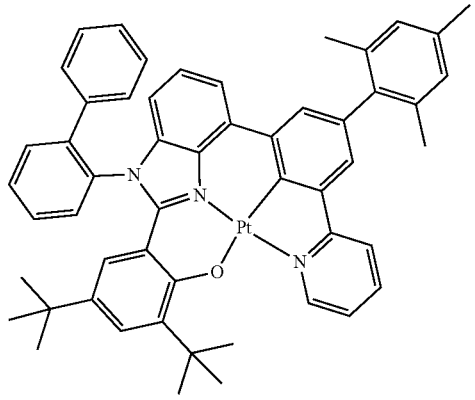
3-249
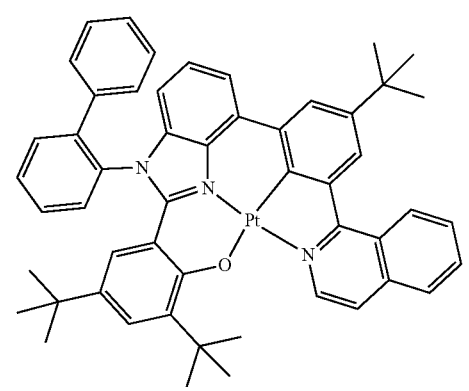
3-250
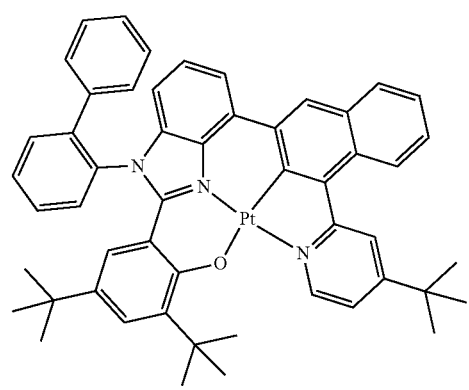
3-251
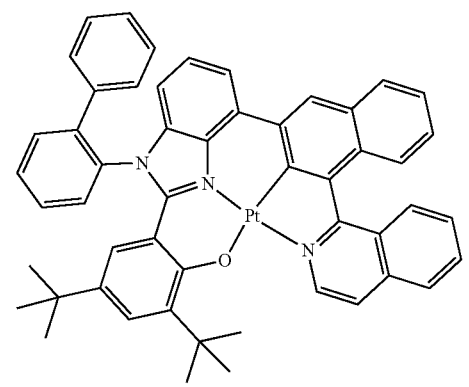

-continued
3-252
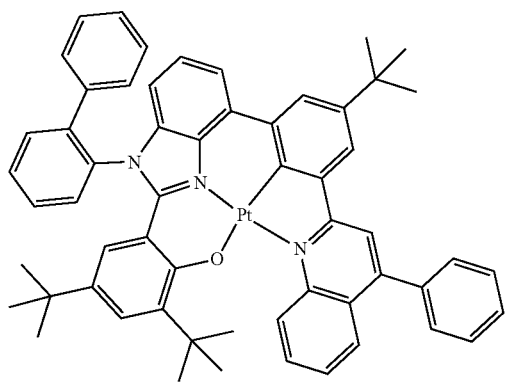
3-253
3-254
3-255
-continued
3-256
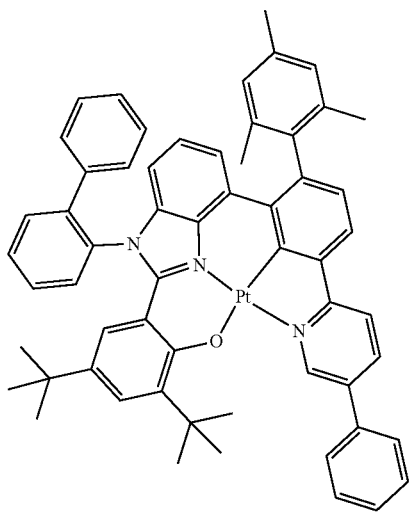
3-257
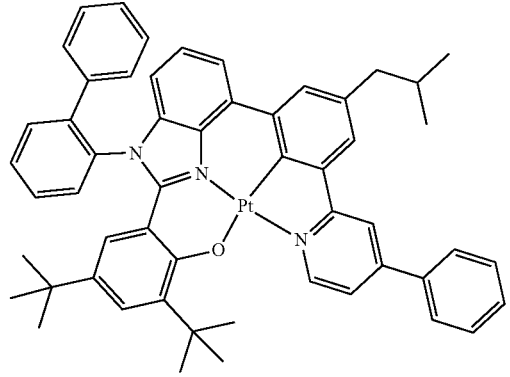
3-258
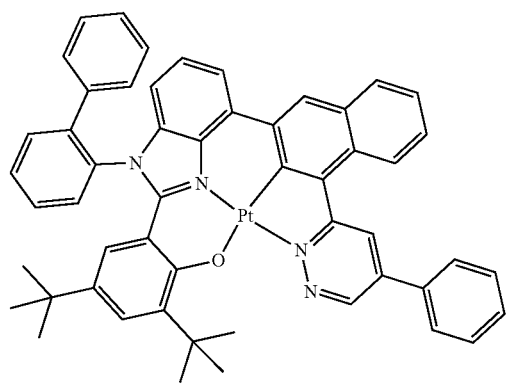

3-259
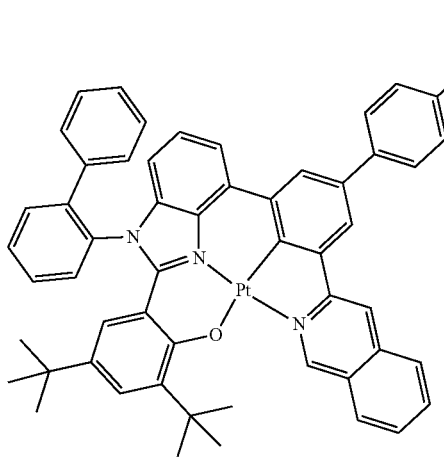
3-262
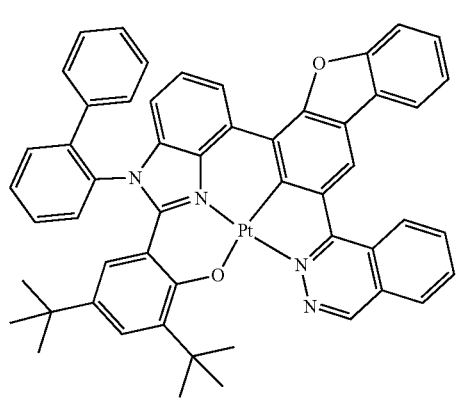
3-260
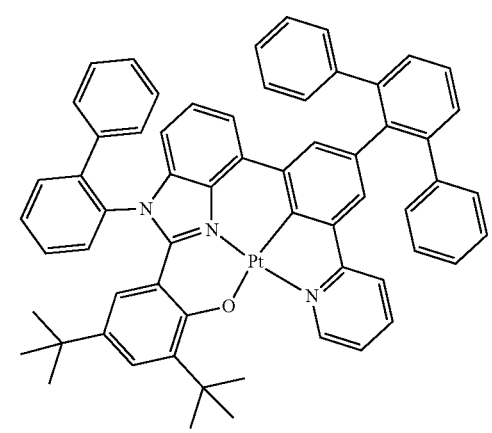
3-263
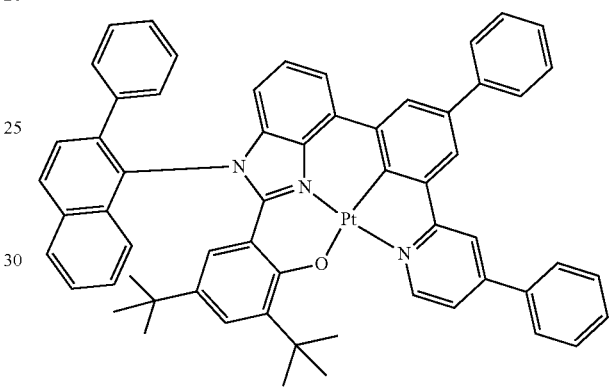
3-264
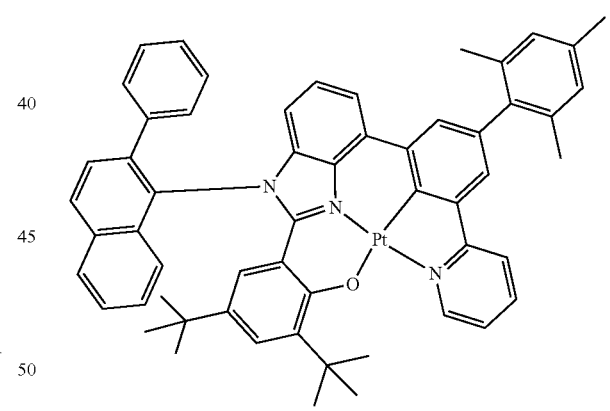
3-261
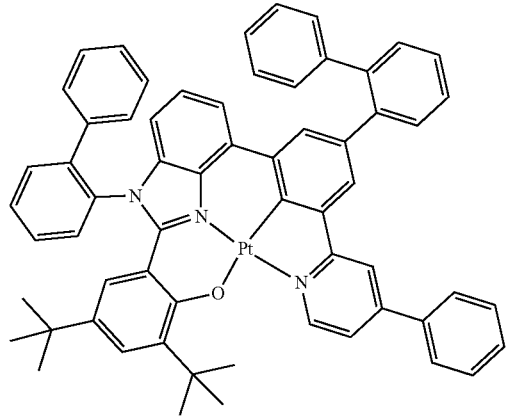
3-265
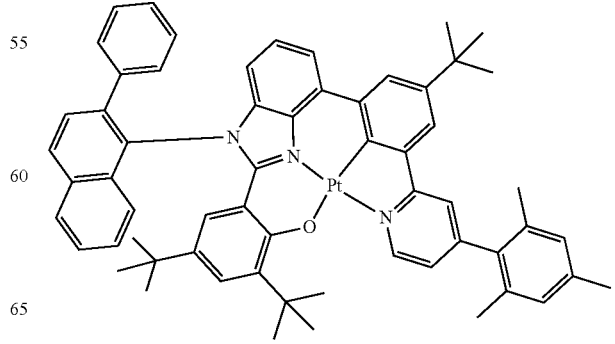

-continued
3-266
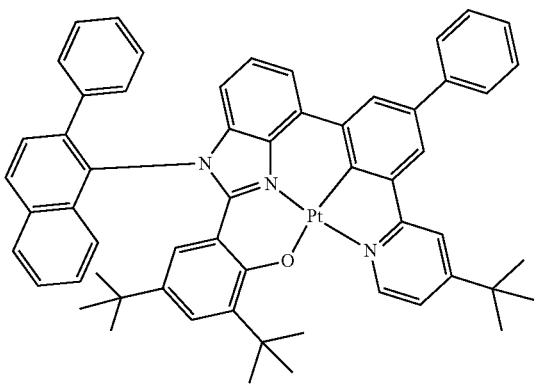
3-267
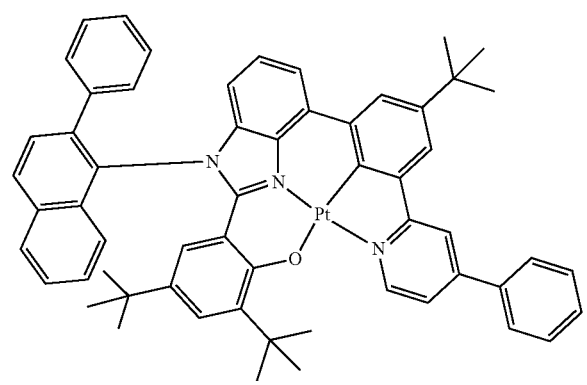
3-268
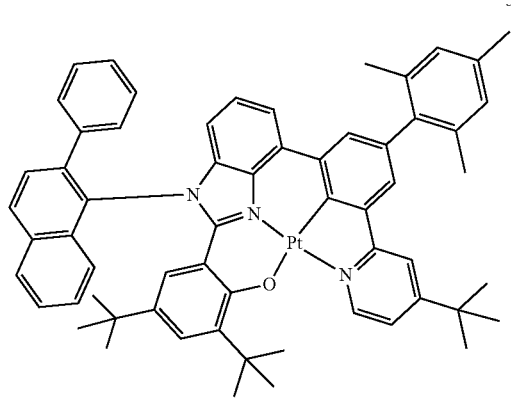
-continued
3-269
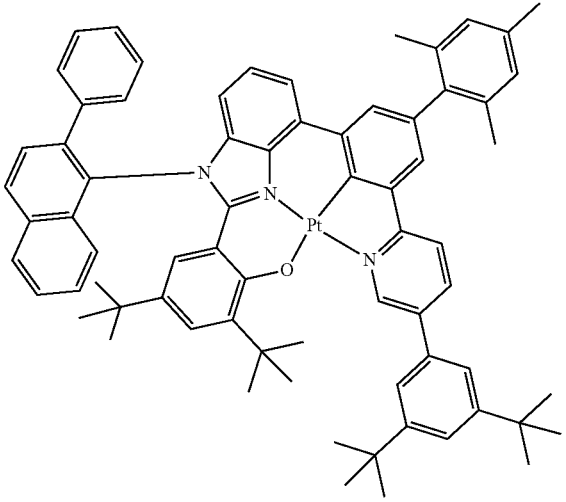
3-270
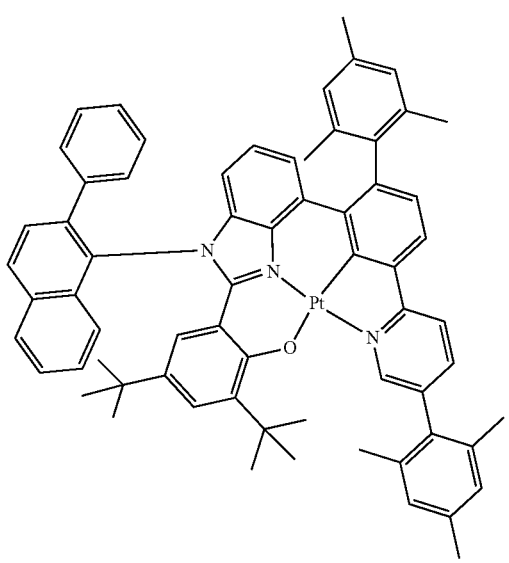
3-271
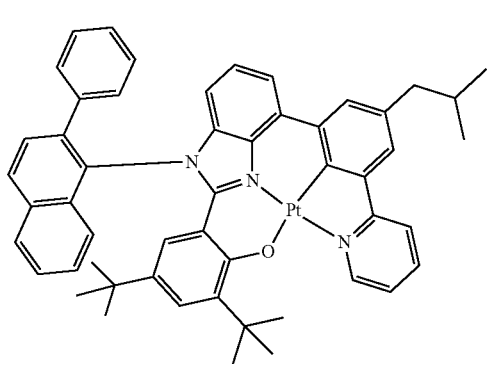

3-272
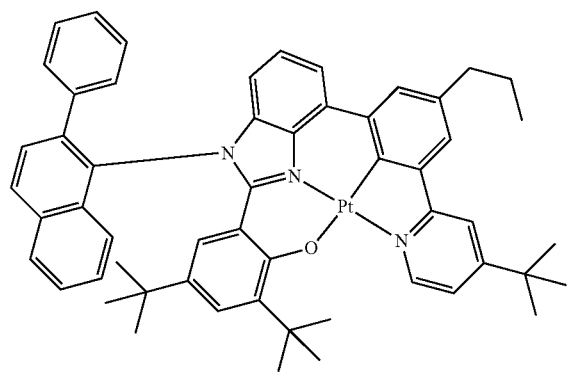
3-273
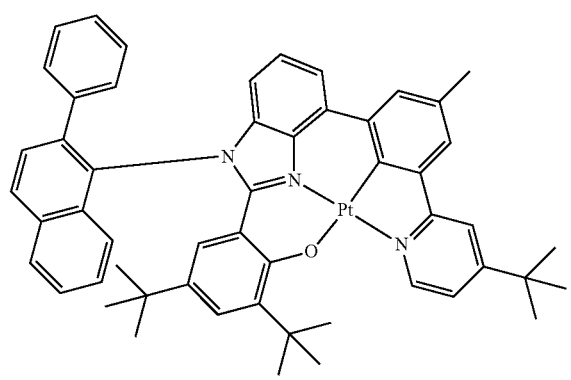
3-274
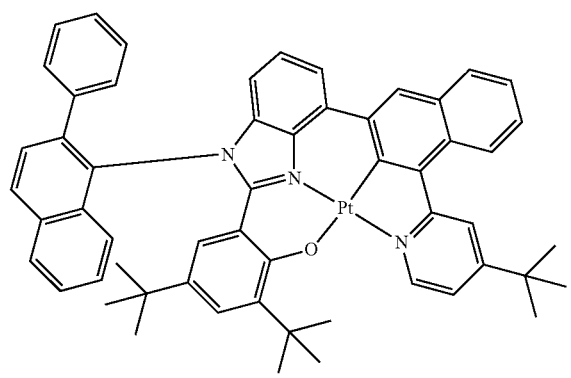
3-275
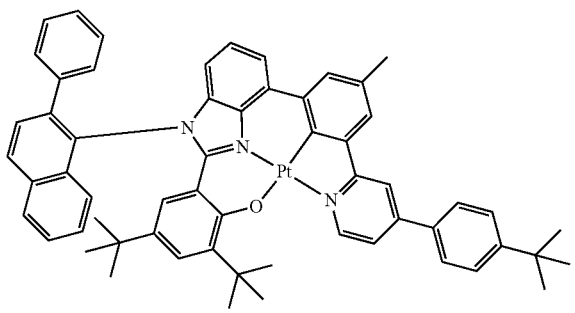
3-276
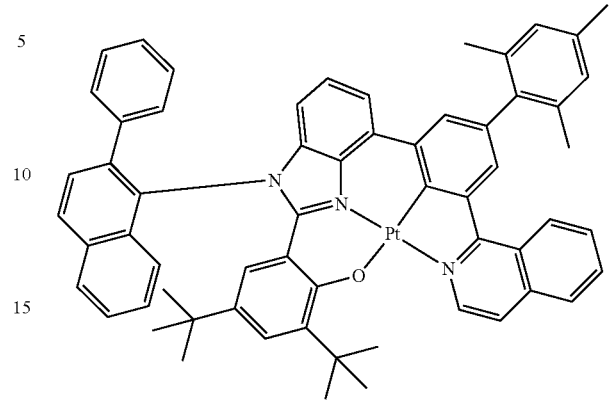
3-277
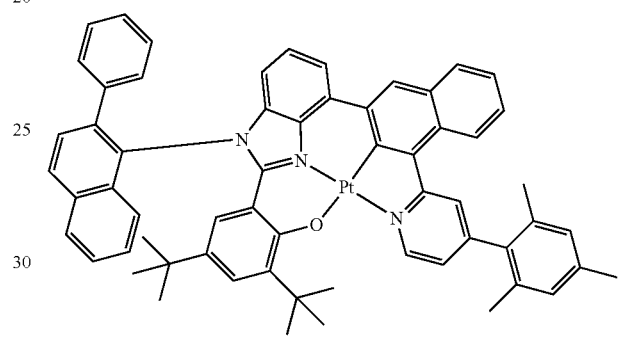
3-278
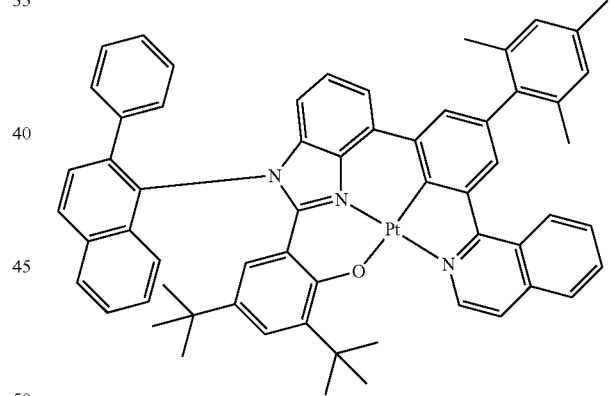
3-279
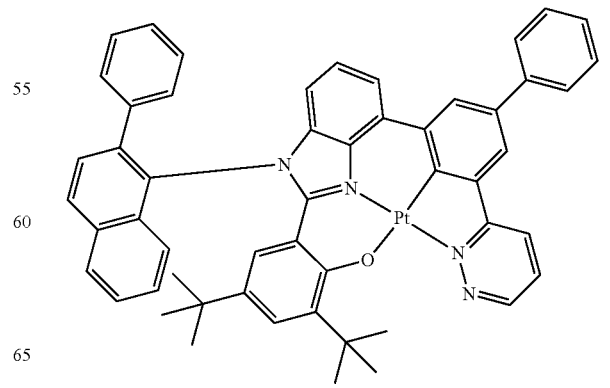

3-280
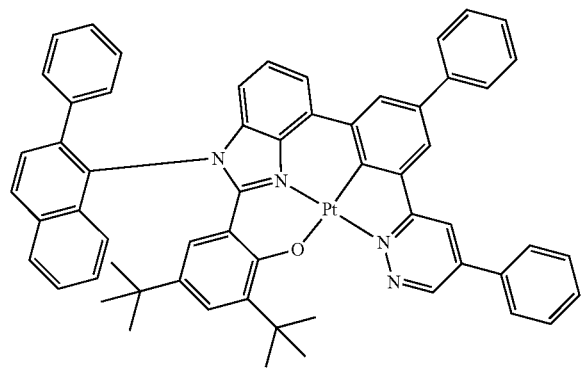
3-284
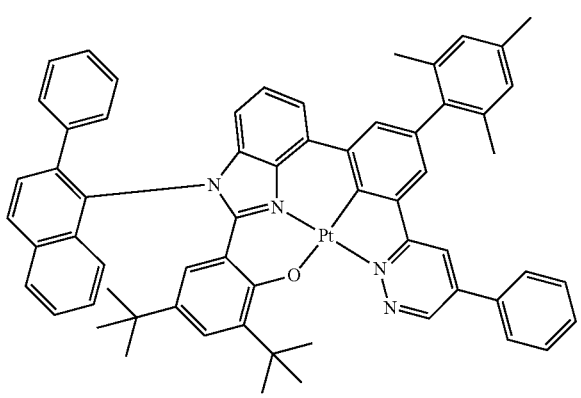
3-281
3-285
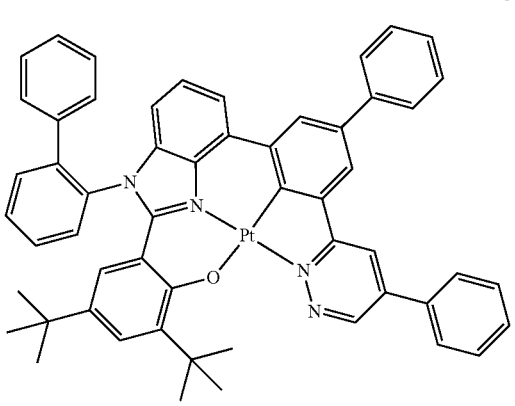
3-282
3-286
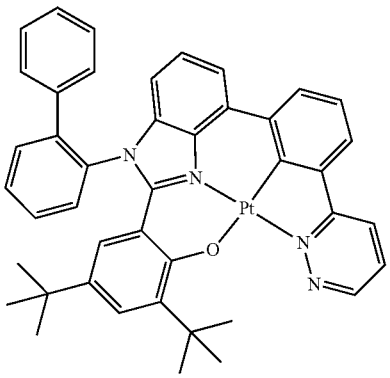
3-283
3-287
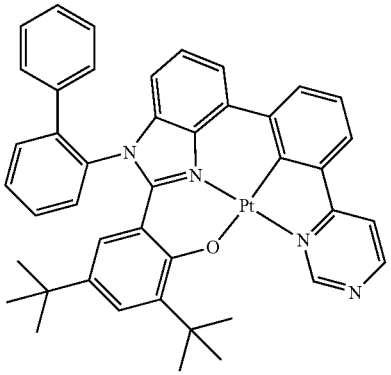

3-288
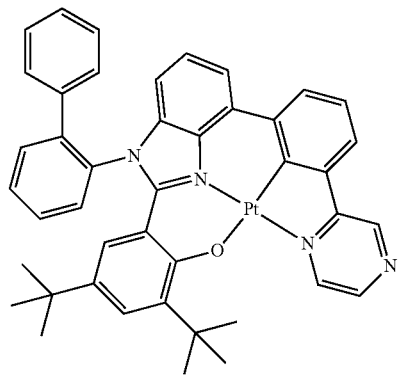
3-289
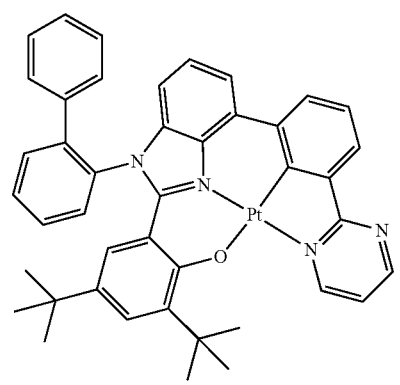
3-290
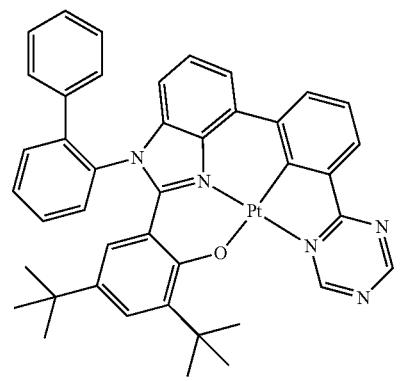
3-291
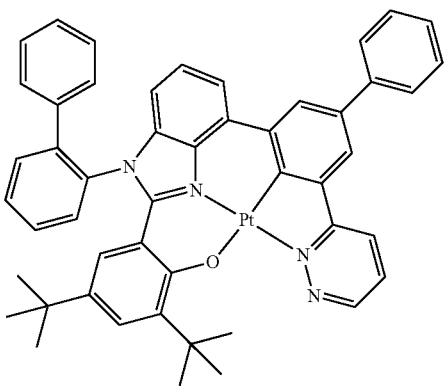
3-292
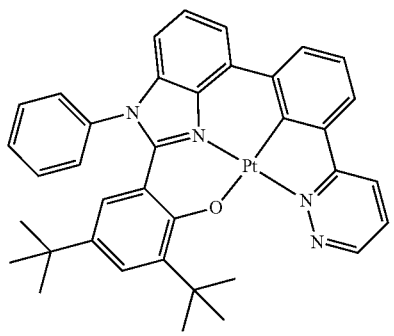
3-293
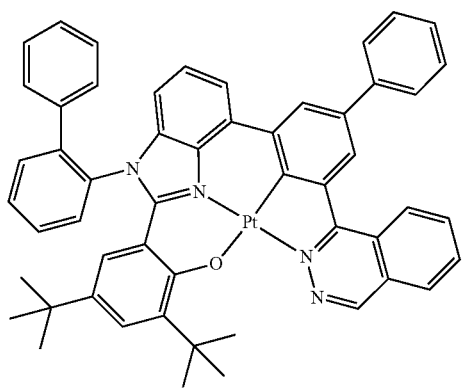
3-294
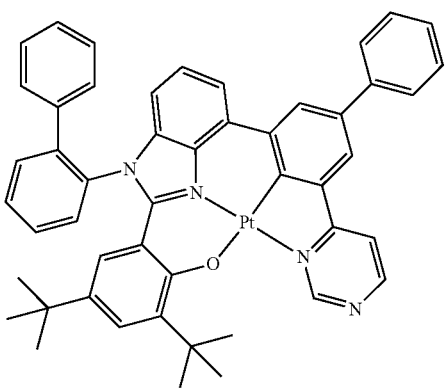
3-295
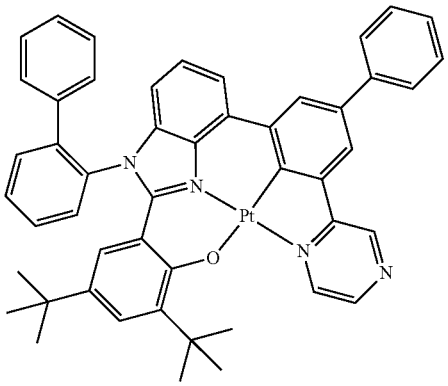

3-296
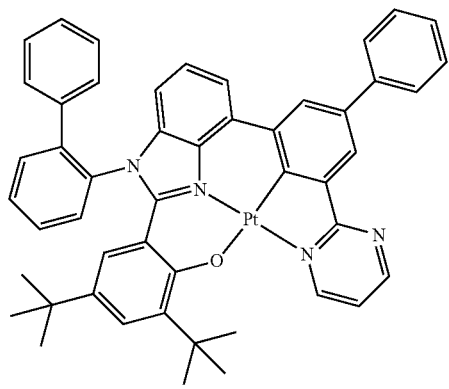
3-297
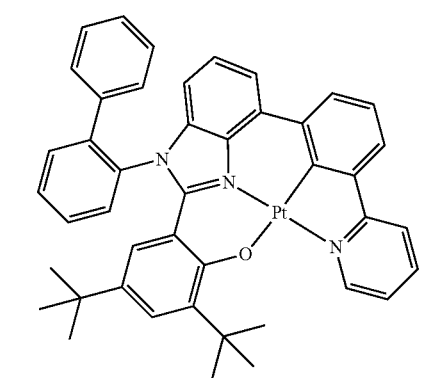
3-298
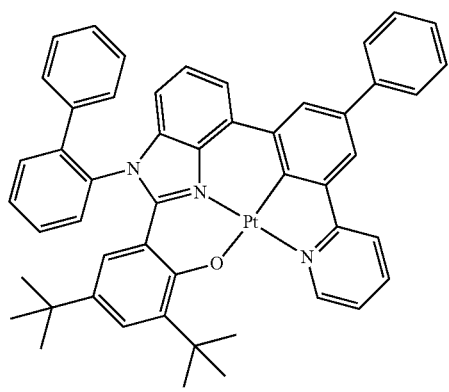
3-299
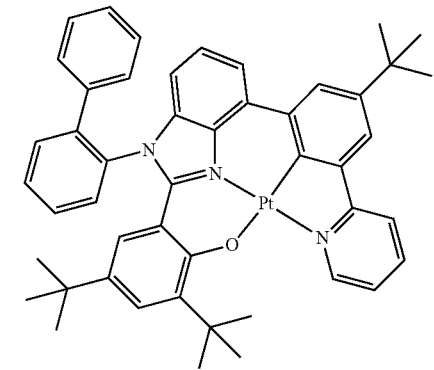
3-300
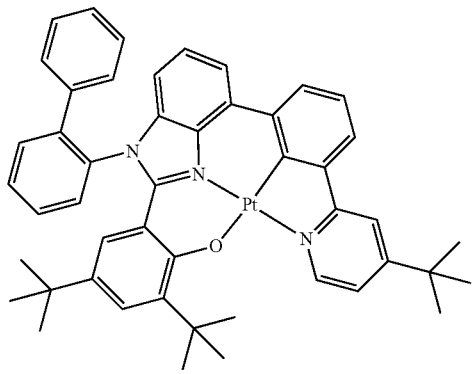
3-301
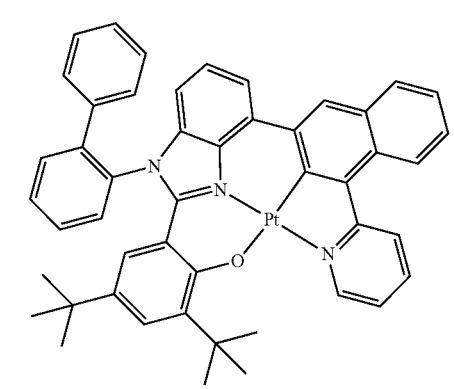
3-302
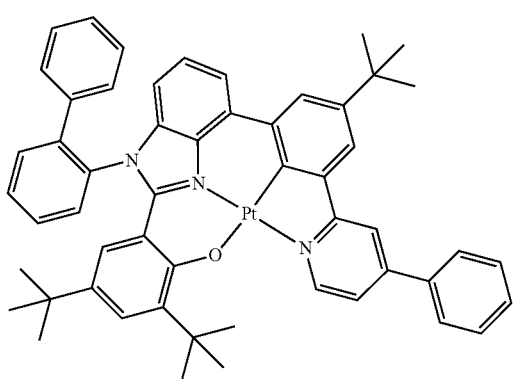
3-303
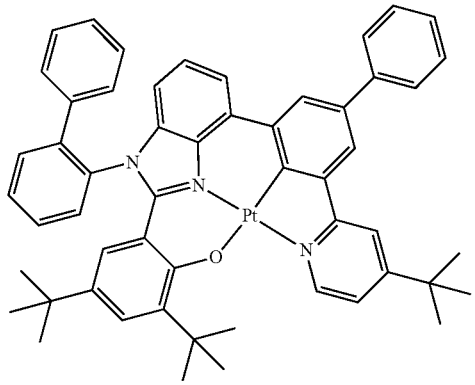

137
-continued
3-304
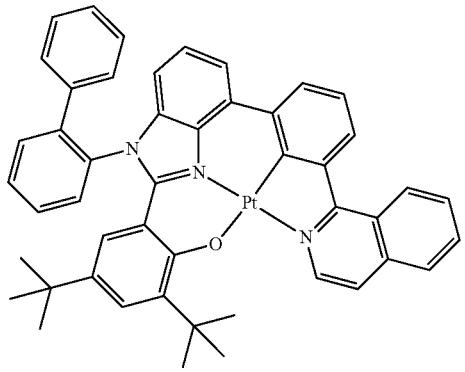
3-305
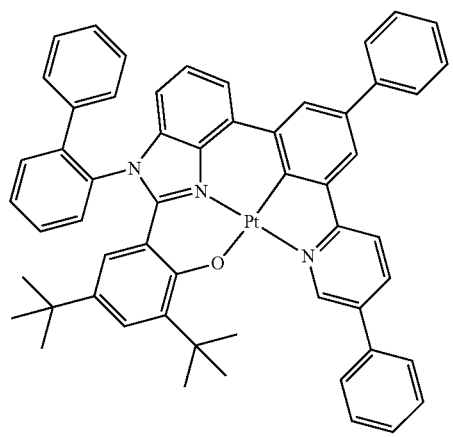
3-306
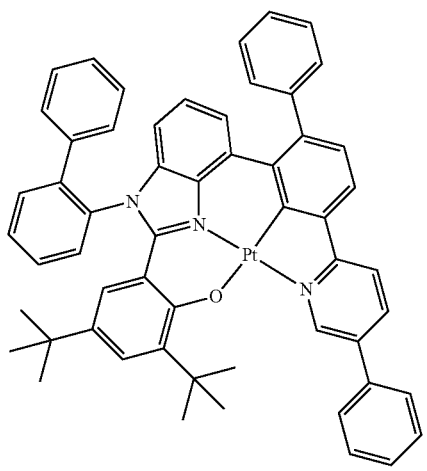
3-307
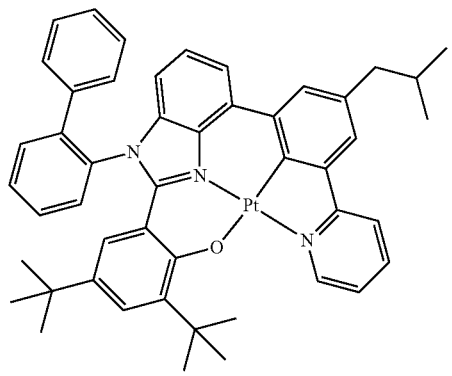
138
-continued
3-308
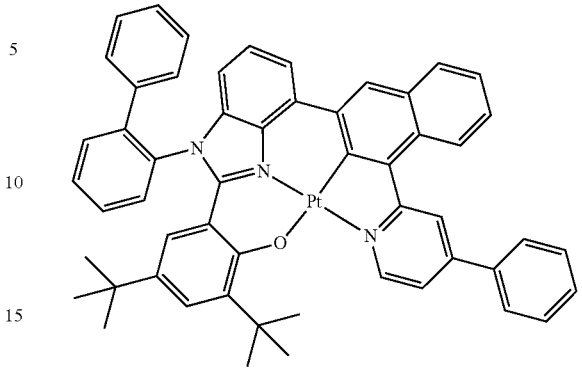
3-309
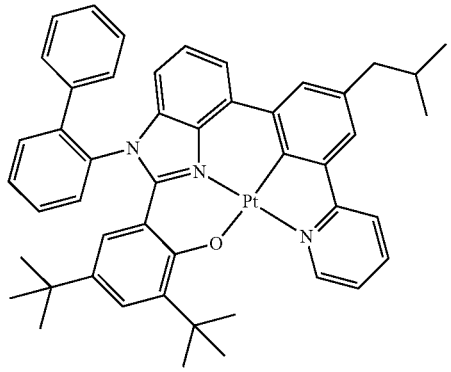
3-310
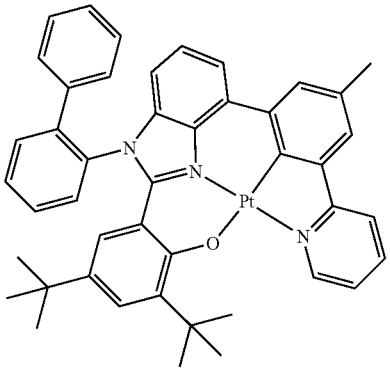
3-311
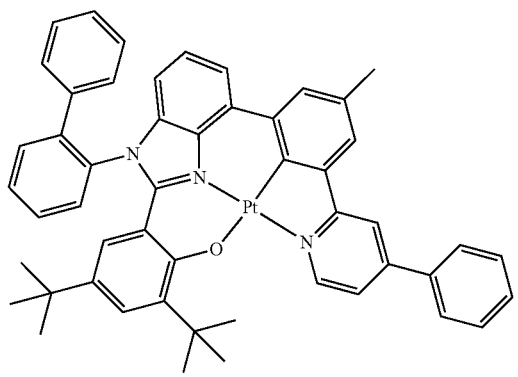

3-312
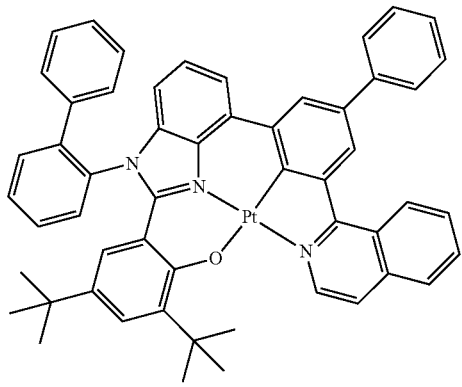
3-316
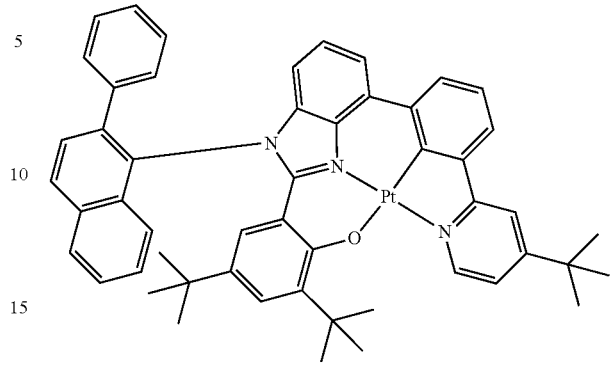
3-313
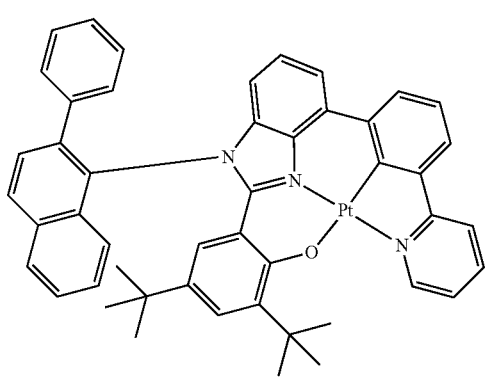
3-317
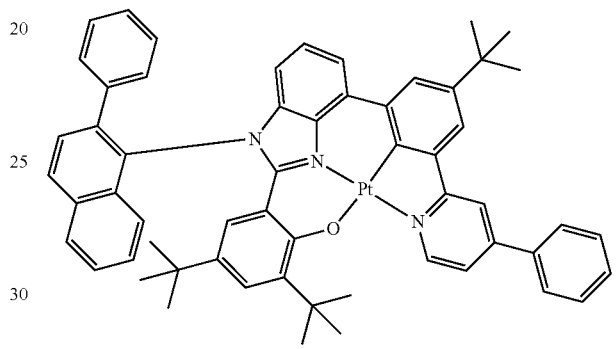
3-314
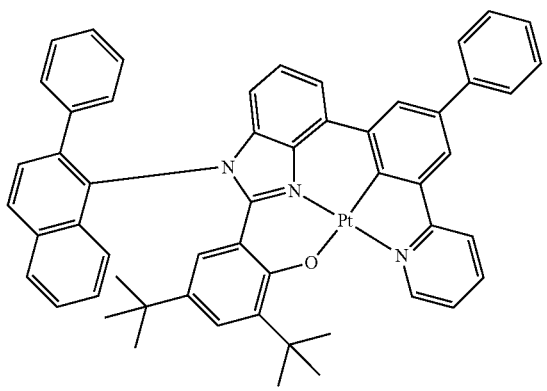
3-318
3-315
3-319
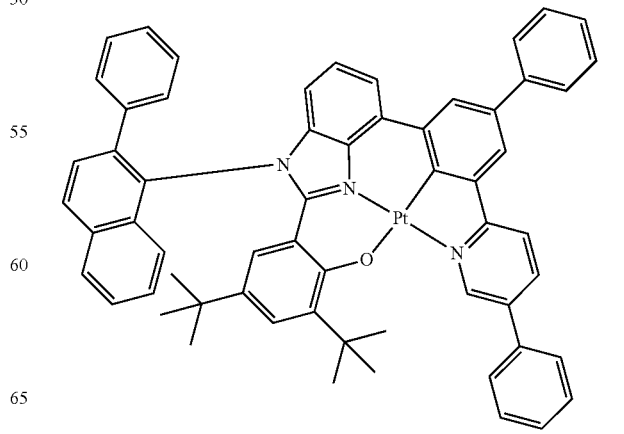

3-320
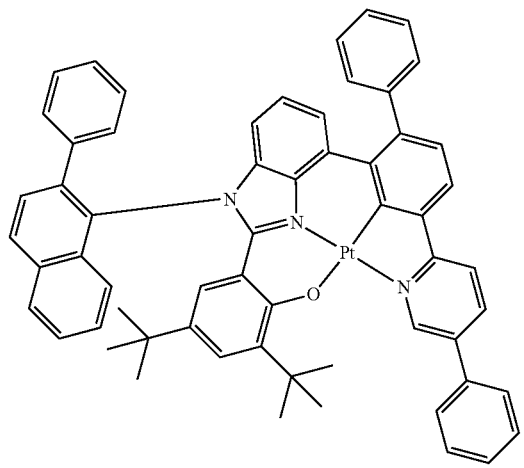
3-321
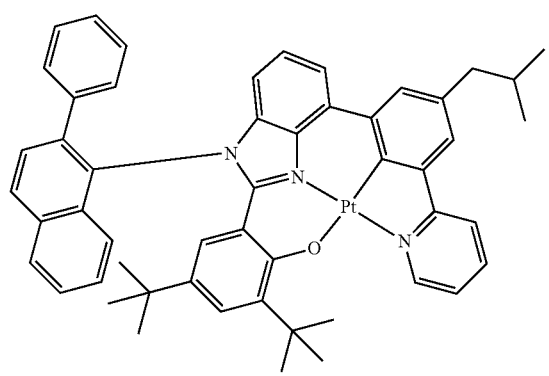
3-322
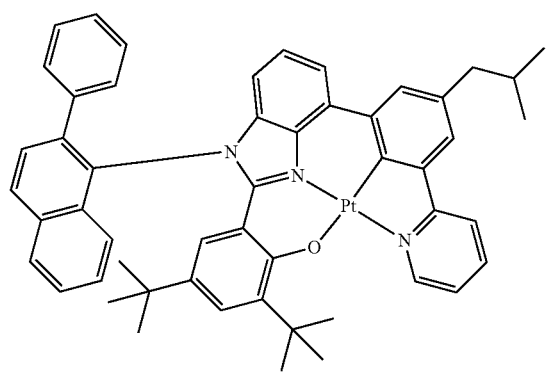
3-323
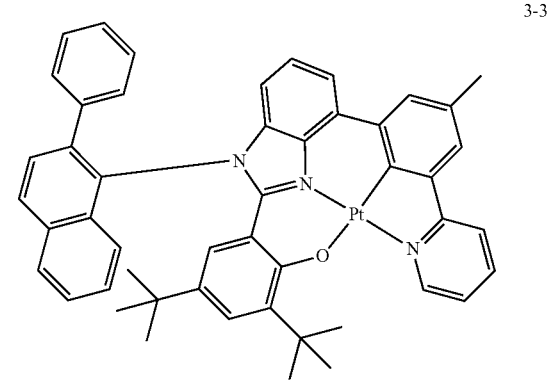
3-324
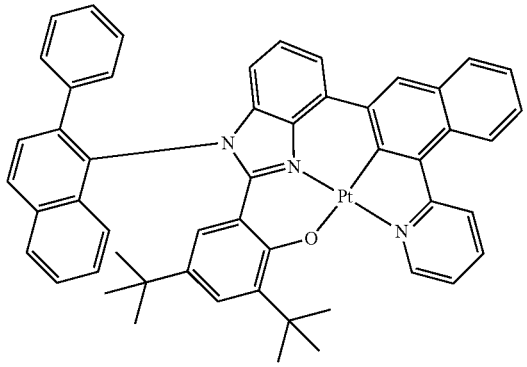
3-325
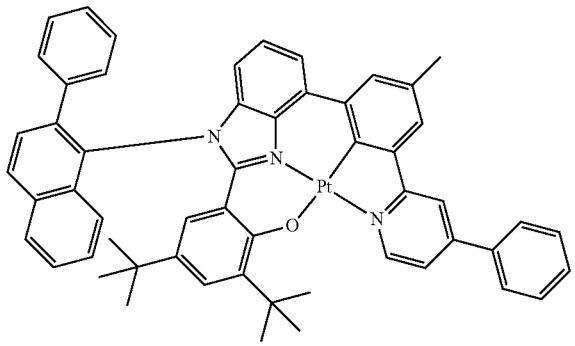
3-326
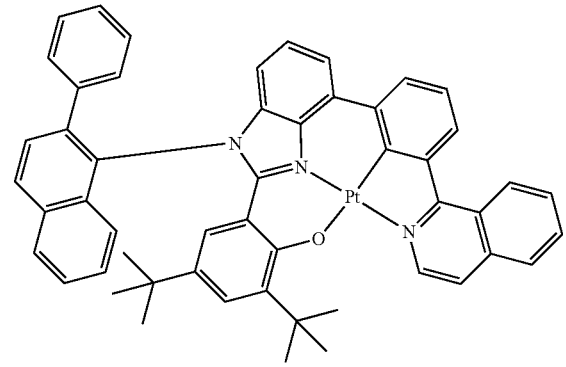
3-327
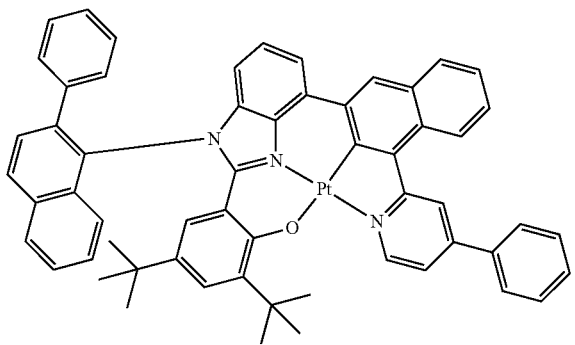

3-328
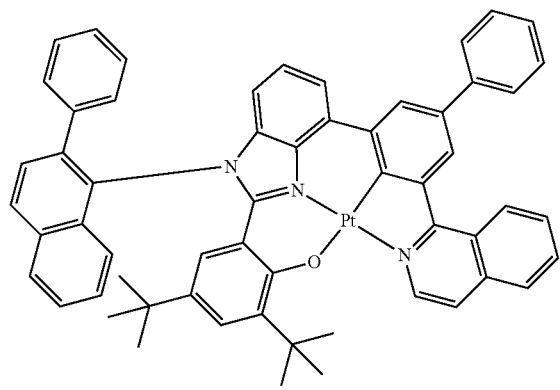
3-329
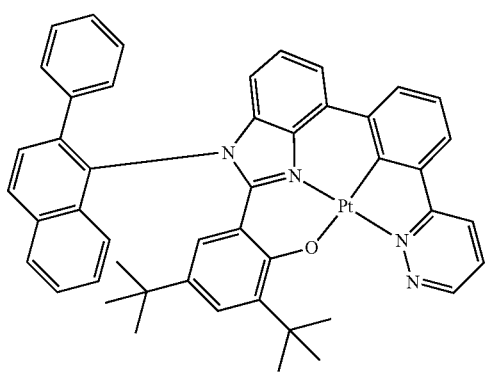
3-330
3-331
3-332
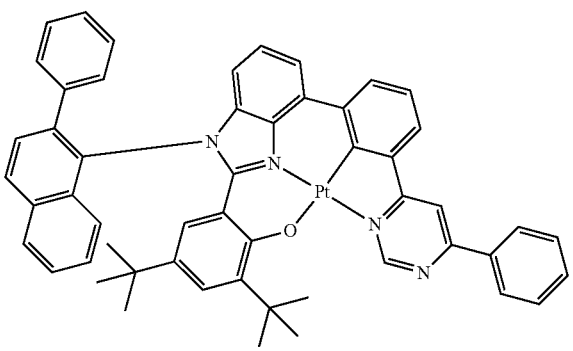
3-333
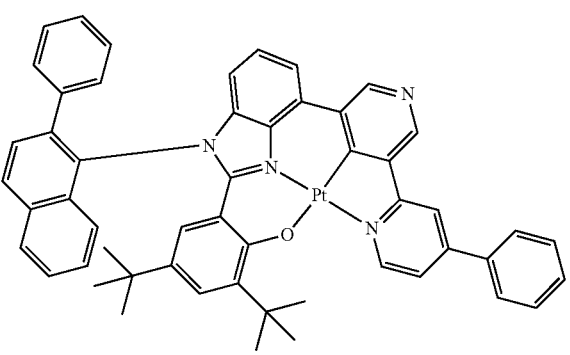
3-334
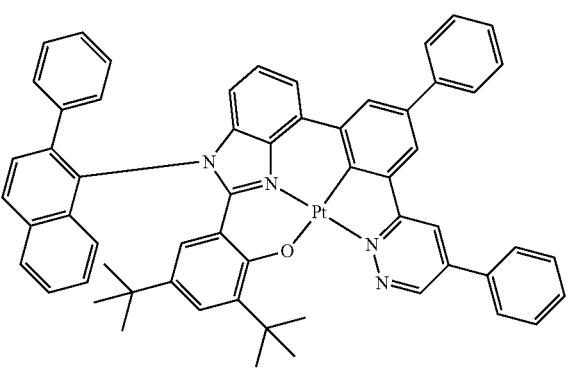
3-335
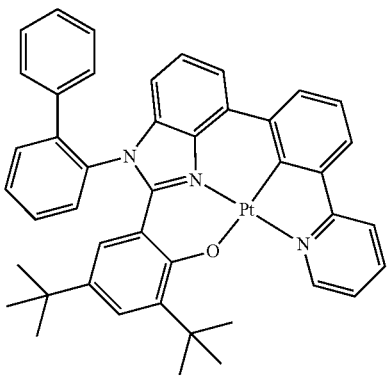

3-336
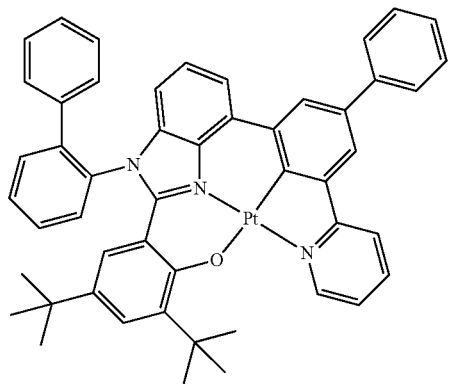
3-337
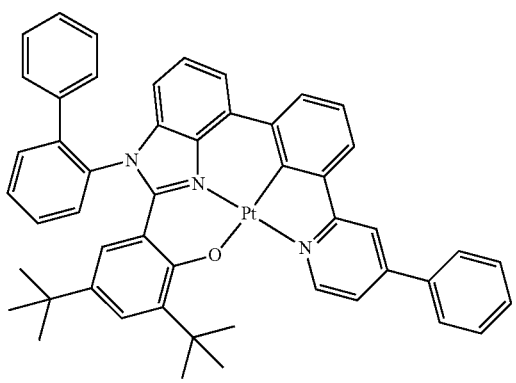
3-338
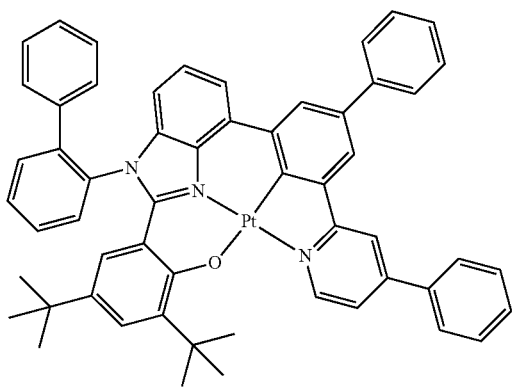
3-339
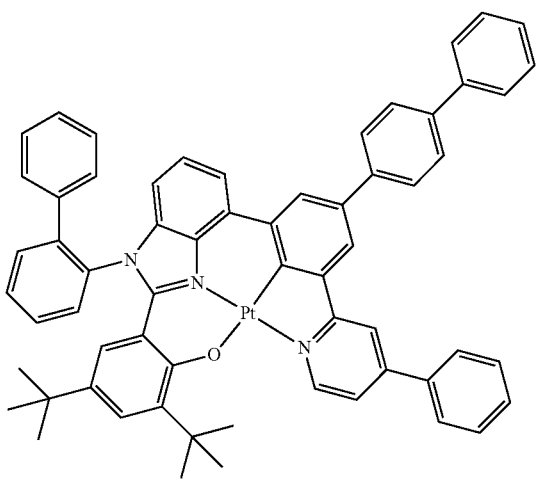
3-340
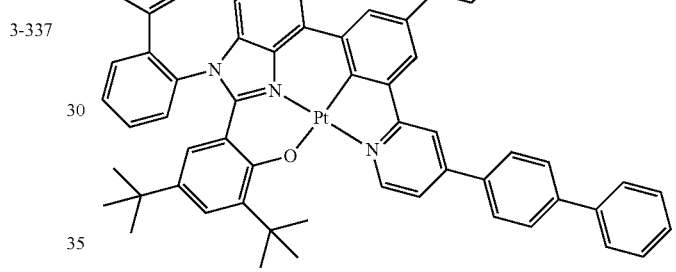
3-341
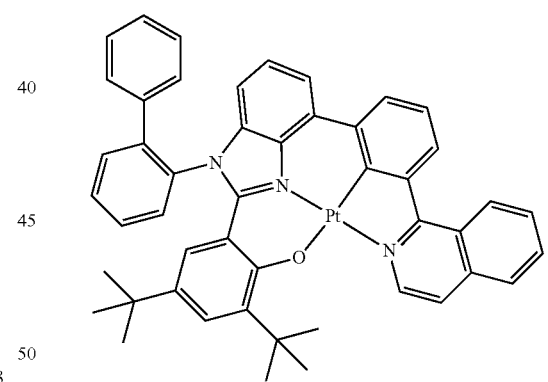
3-342
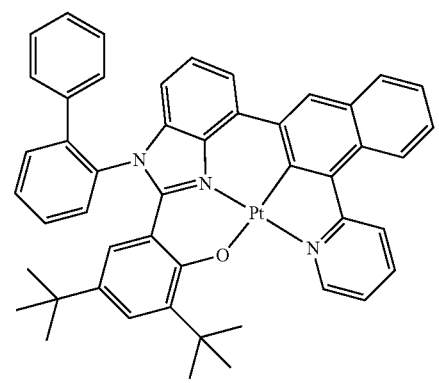

-continued
3-343
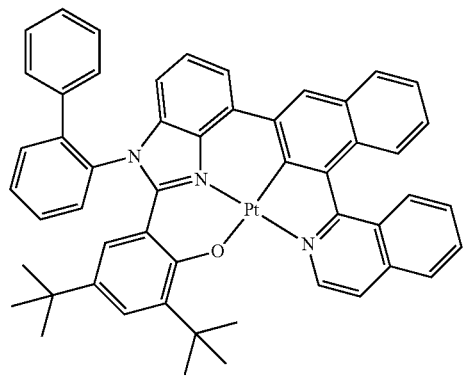
3-344
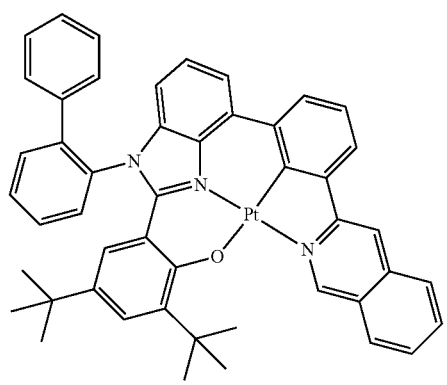
3-345
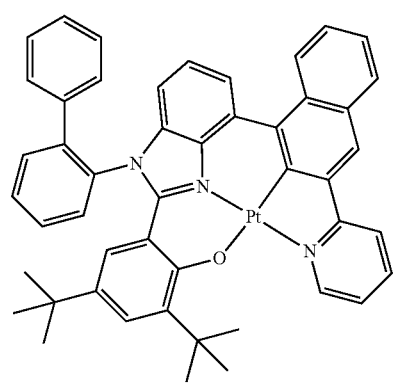
3-346
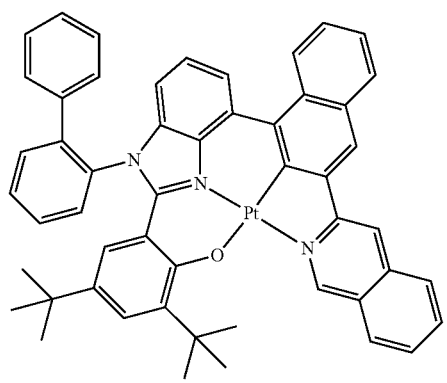
-continued
3-347
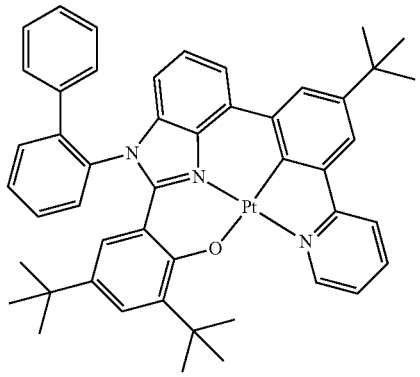
3-348
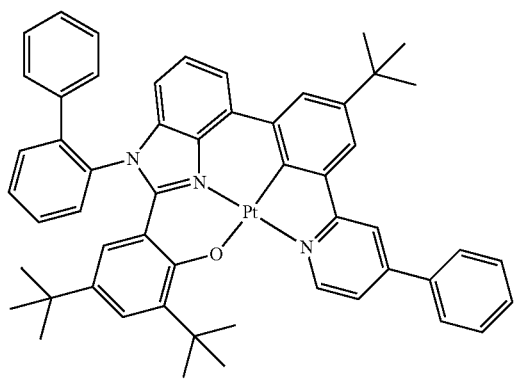
3-349
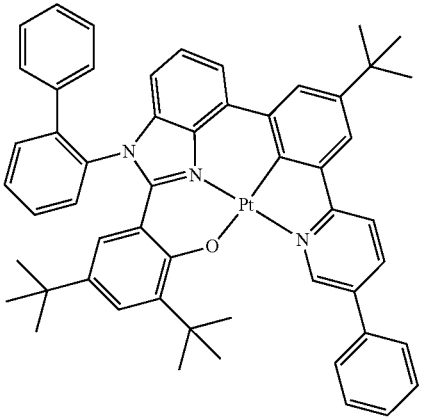
3-350
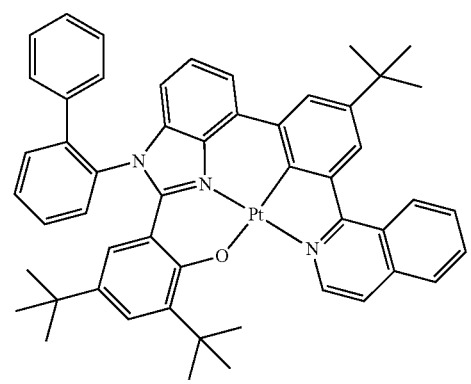

-continued
3-351
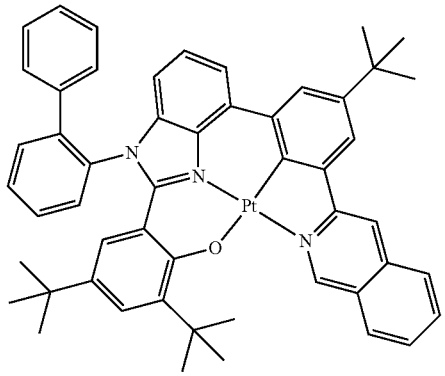
3-352
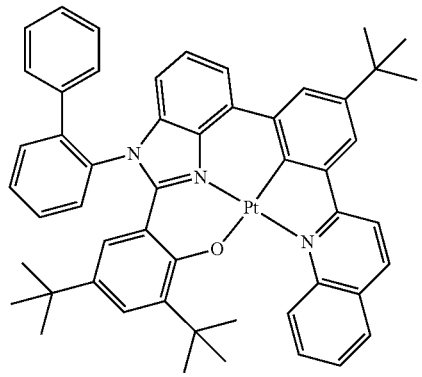
3-353
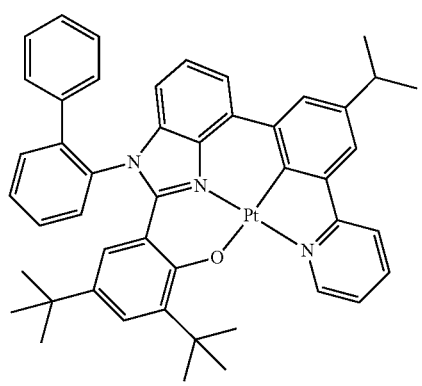
3-354
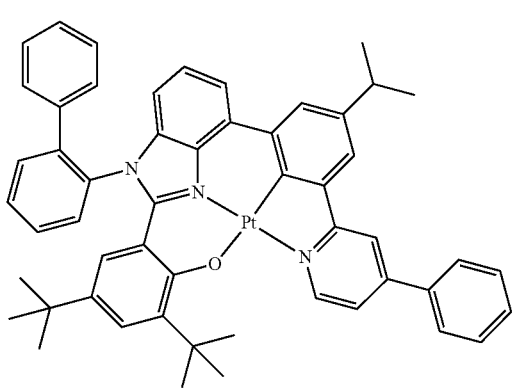
3-355
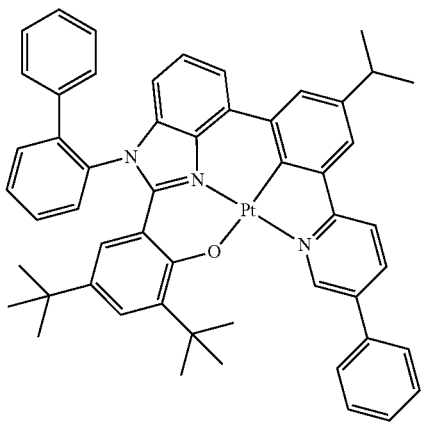
3-356
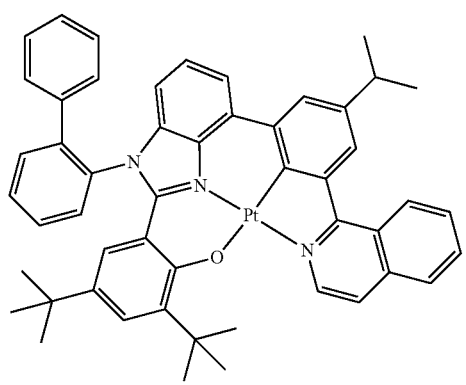
3-357
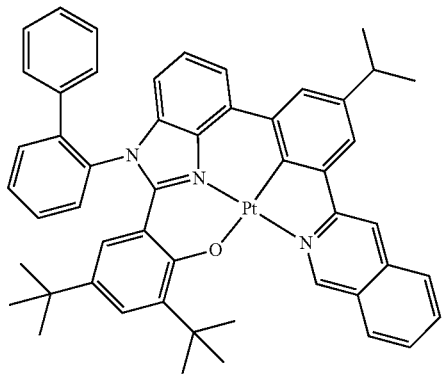
3-358
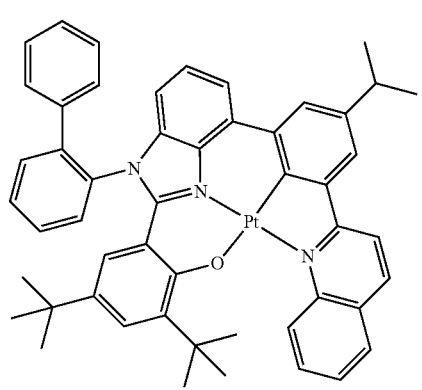

3-359
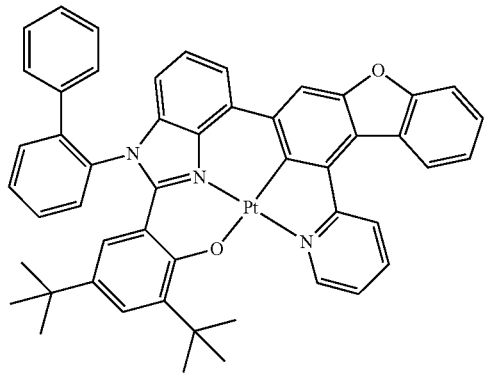
3-360
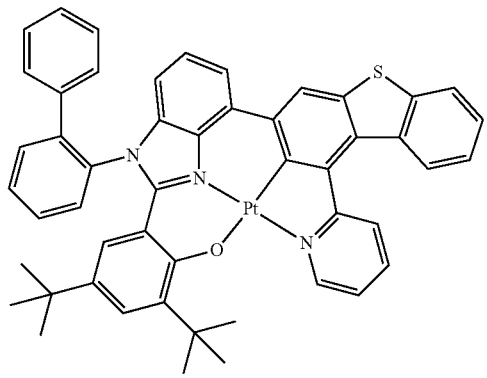
3-361
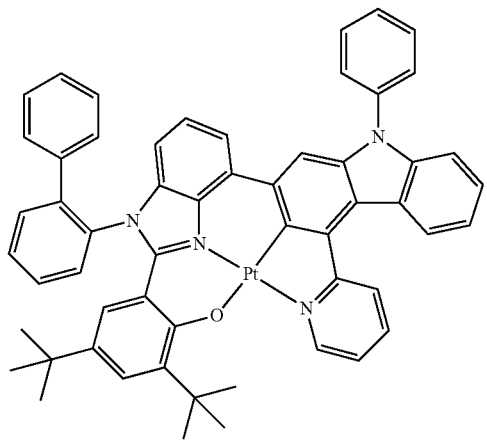
3-362
3-363
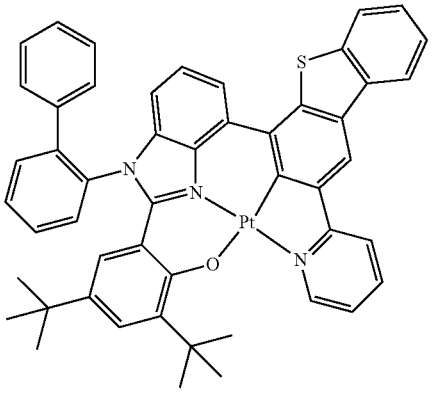
3-364
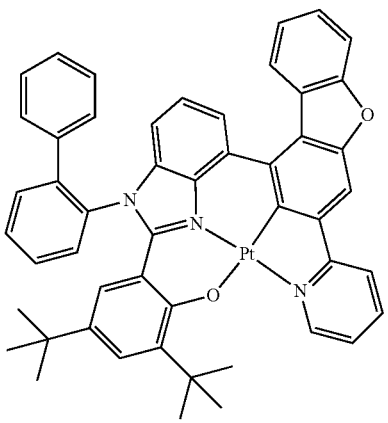
3-365
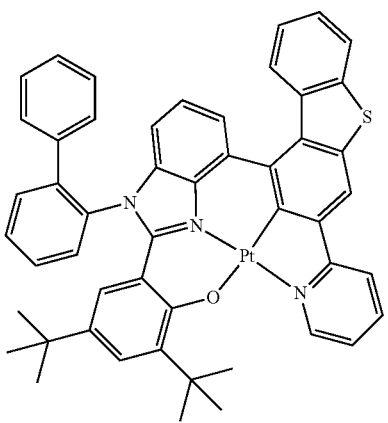

3-366
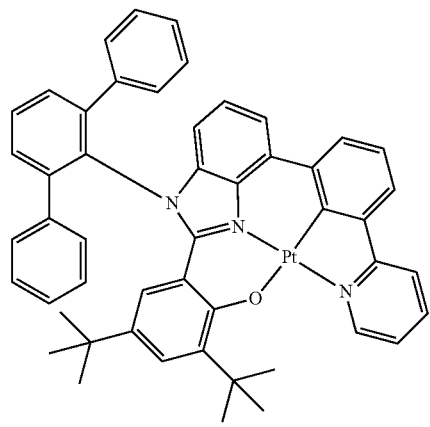
3-367
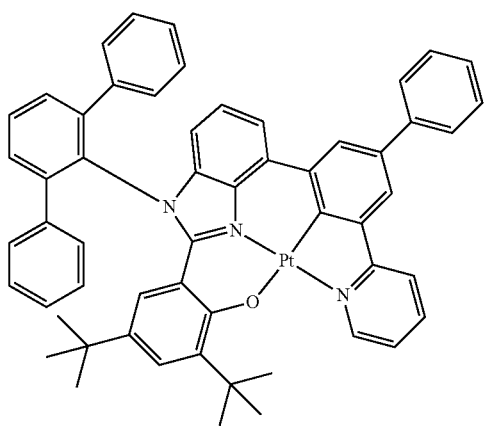
3-368
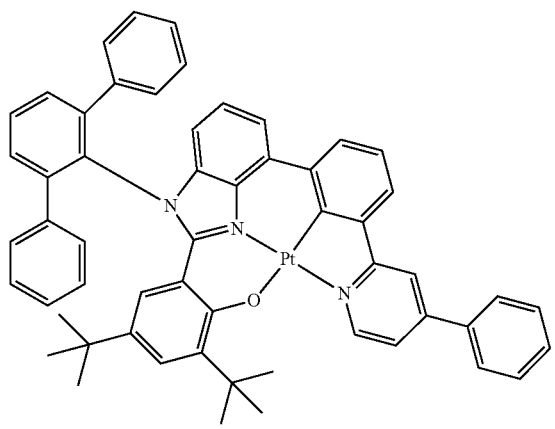
3-369
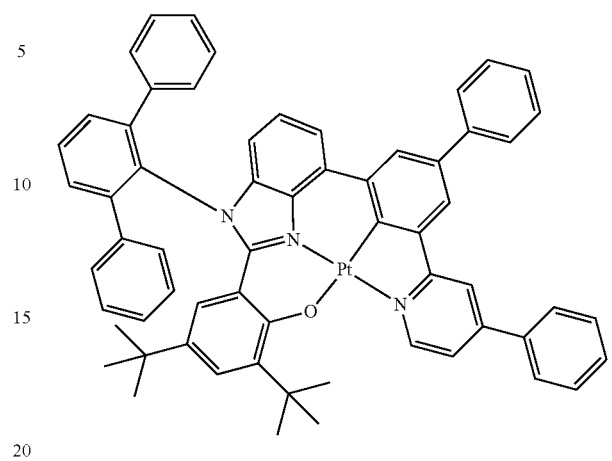
3-370
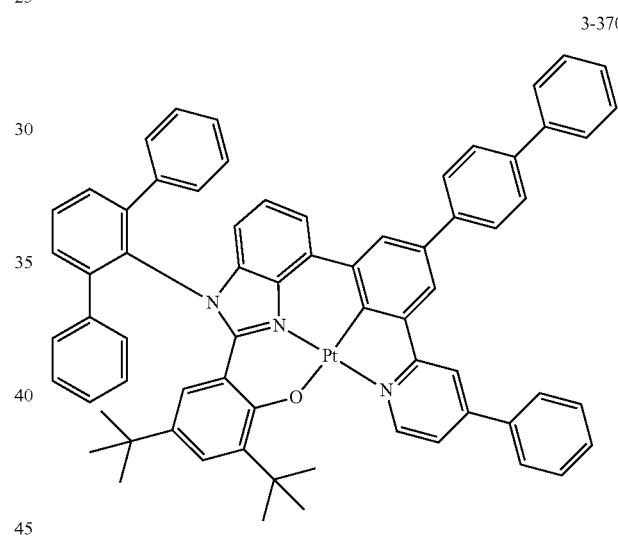
3-371
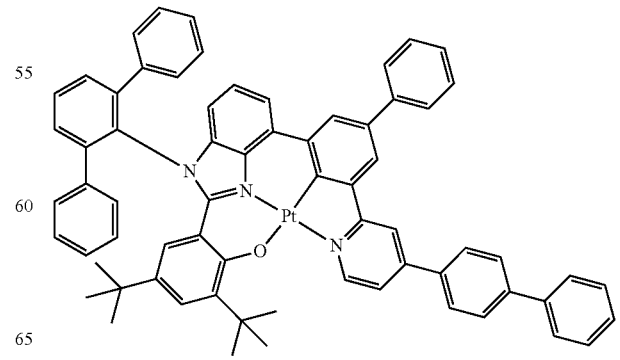

3-372
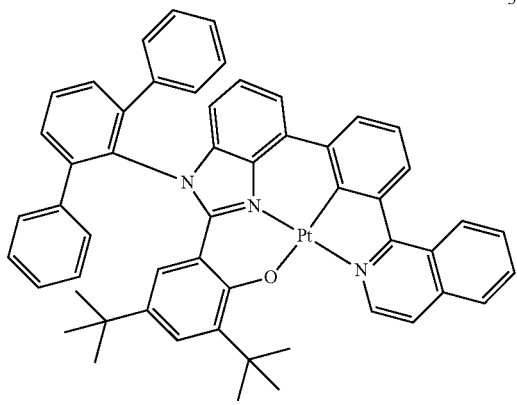
3-373
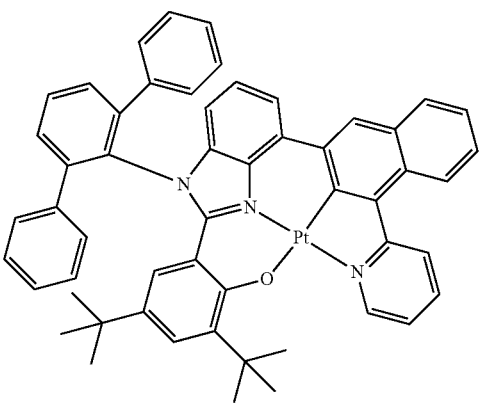
3-374
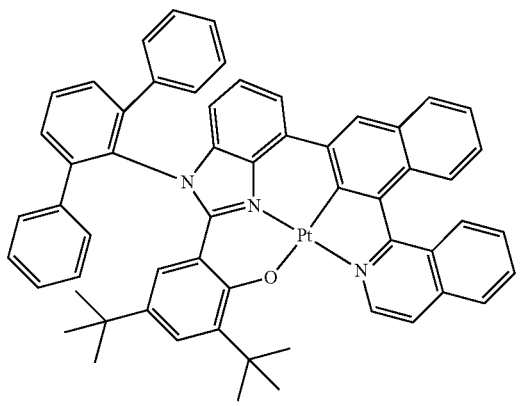
3-375
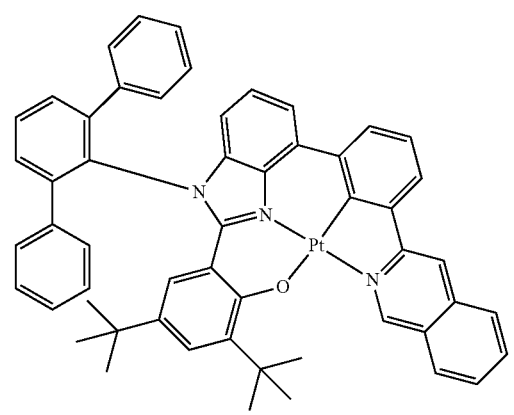
3-376
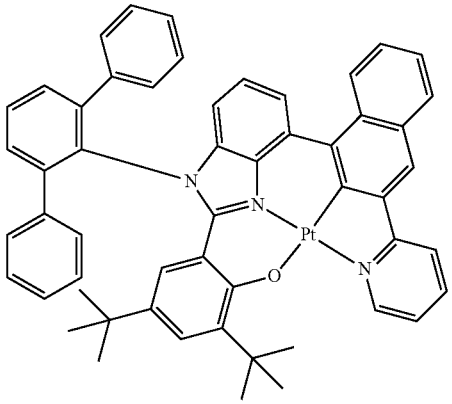
3-377
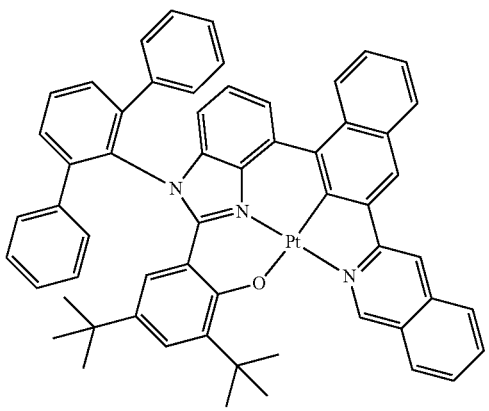
3-378
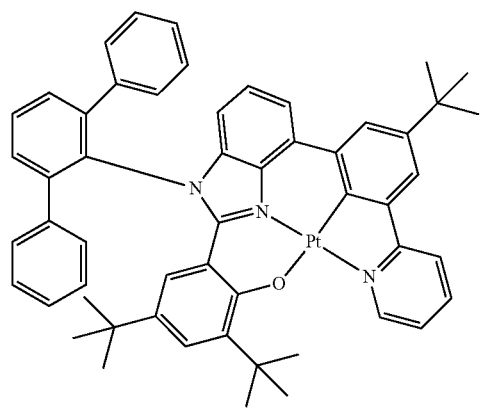

3-379
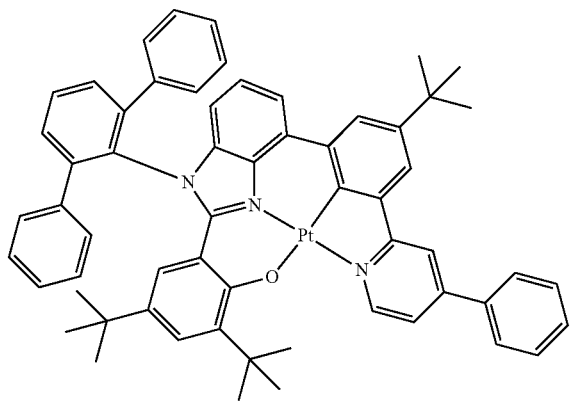
3-382
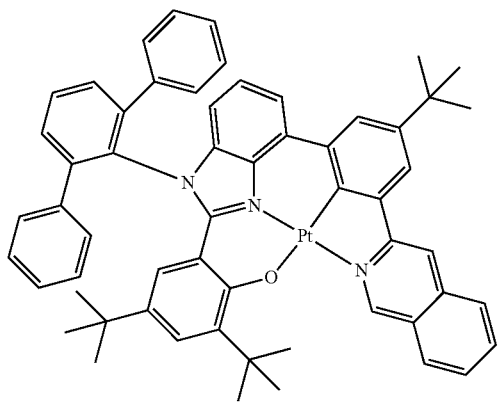
3-380
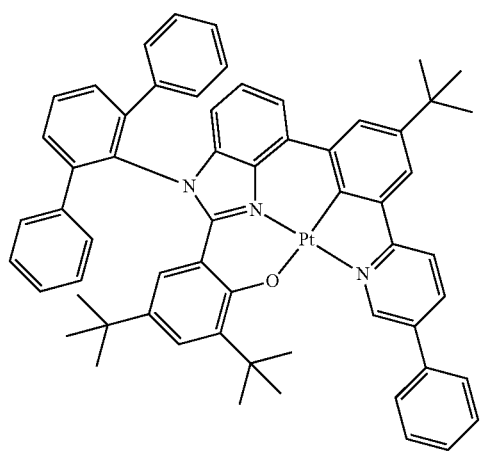
3-383
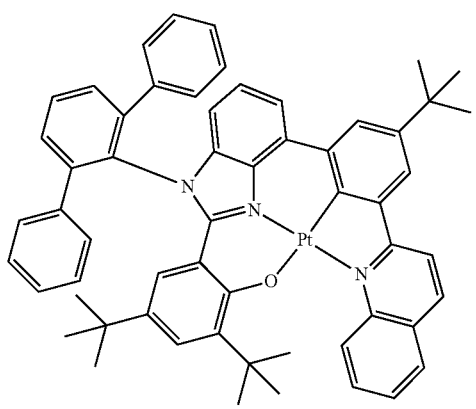
3-381
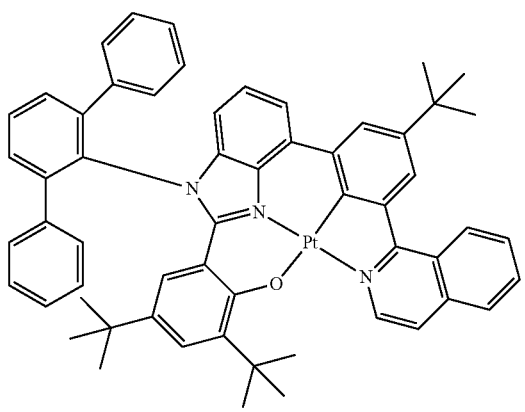
3-384
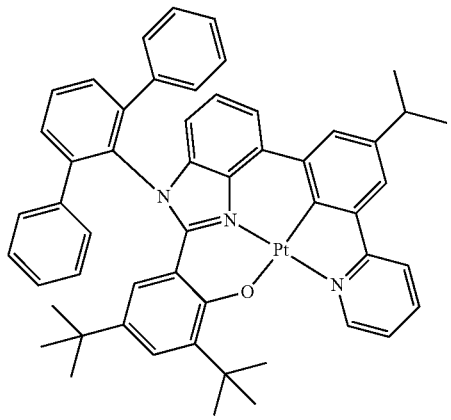

3-385
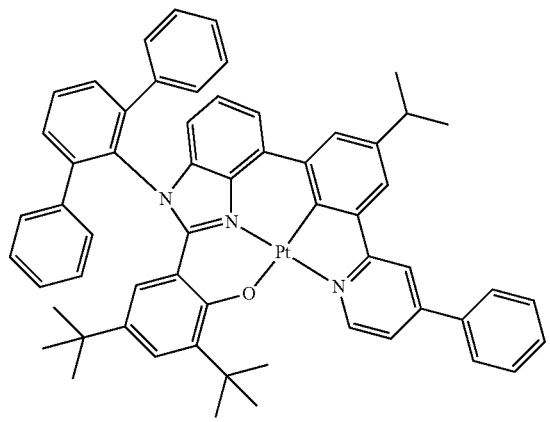
3-388
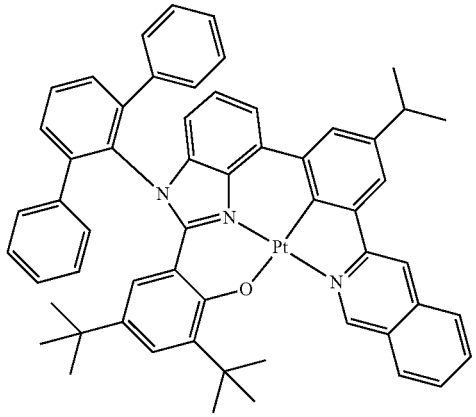
3-386
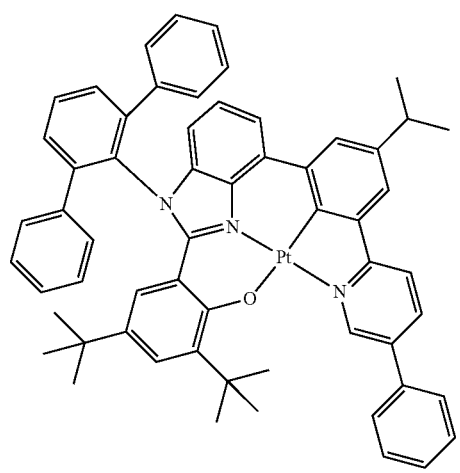
3-389
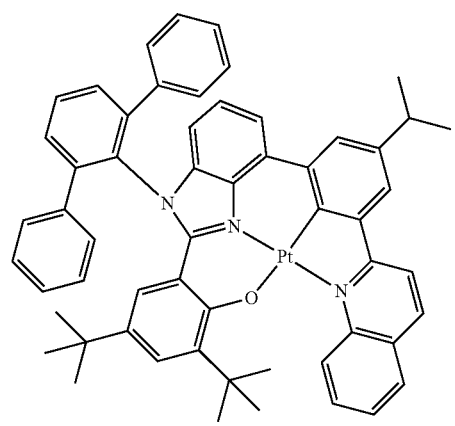
3-387
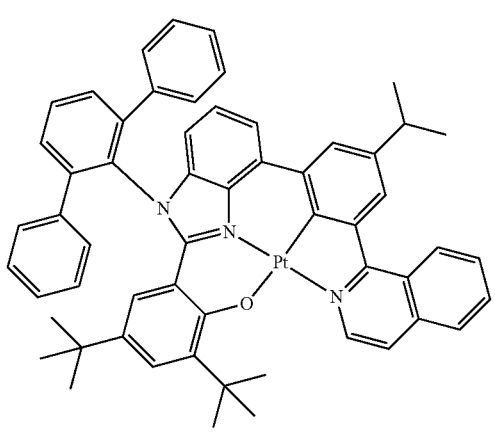
3-390
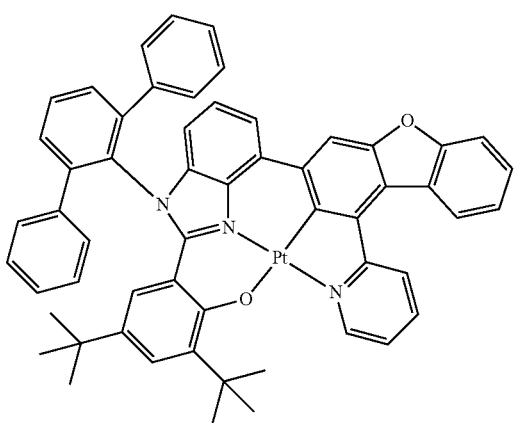

3-391
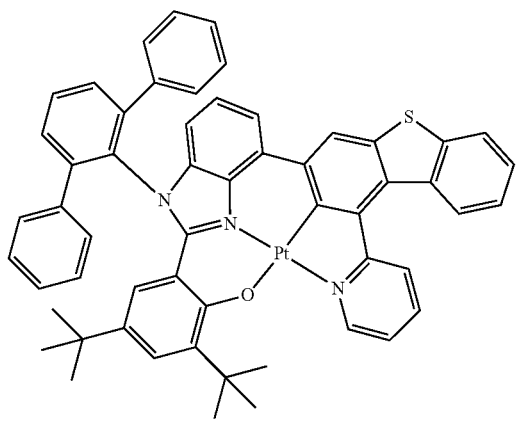
3-392
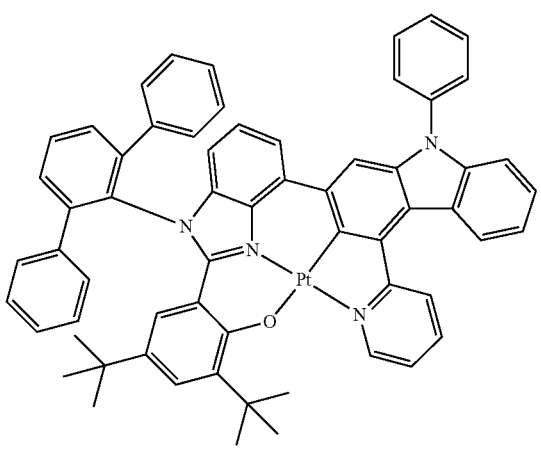
3-393
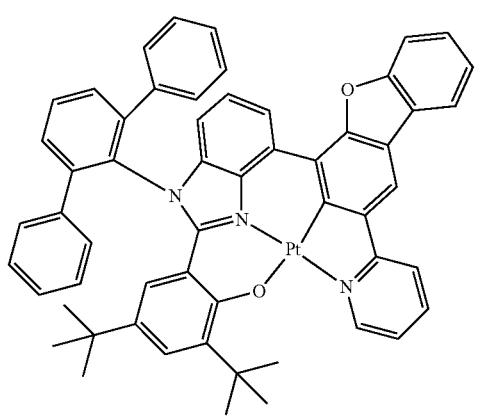
3-394
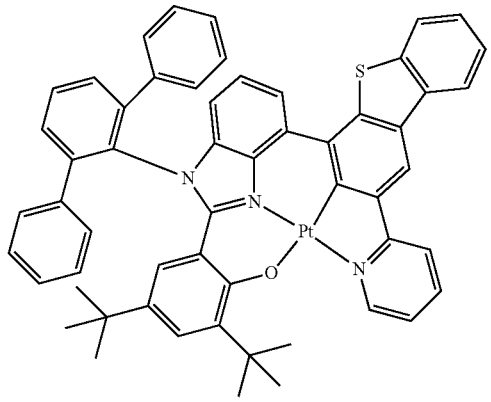
3-395
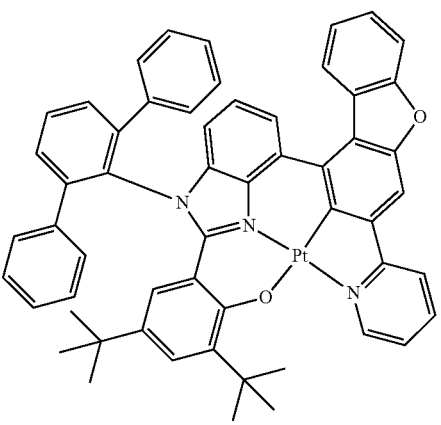
3-396
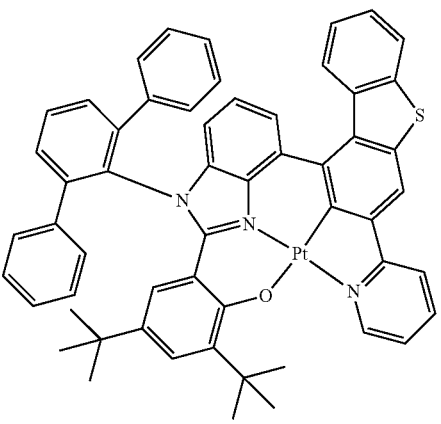
3-397
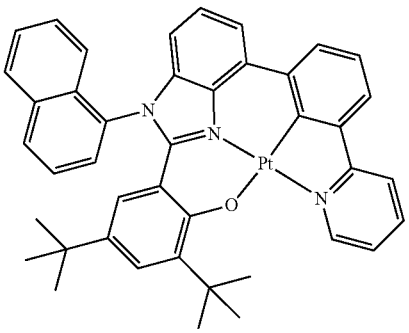

-continued
3-398
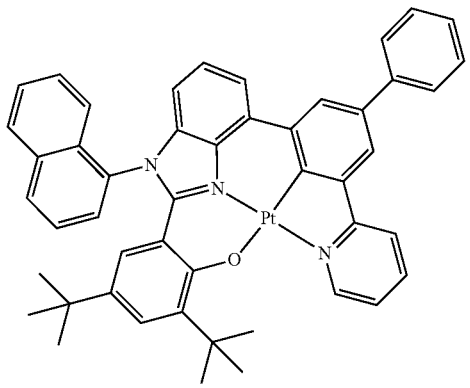
3-399
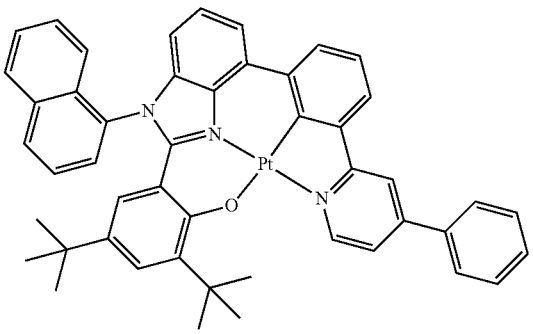
3-400
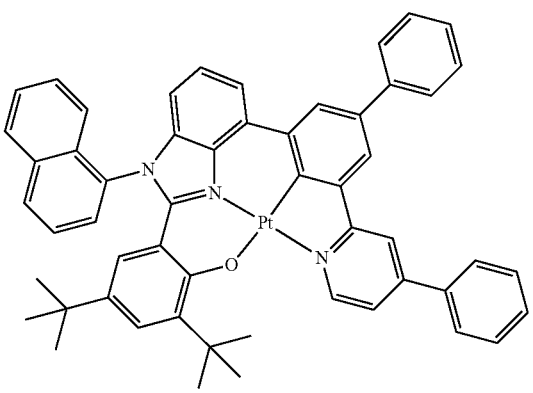
3-401
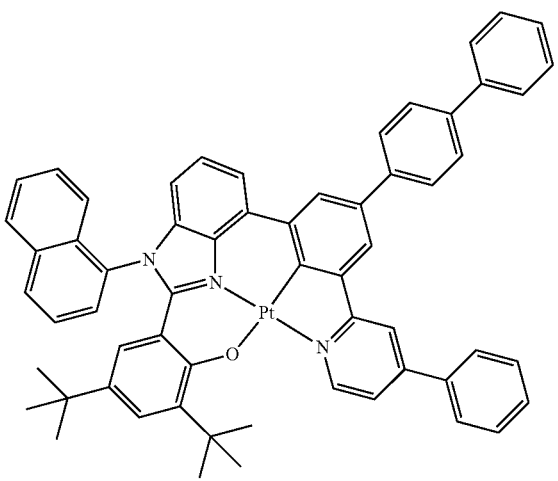
-continued
3-402
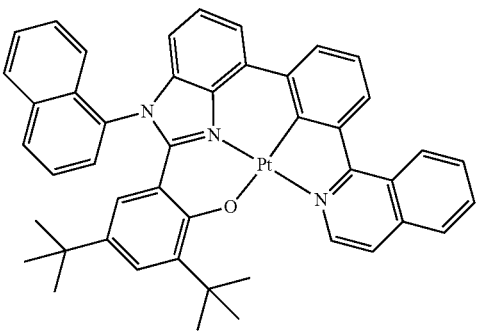
3-403
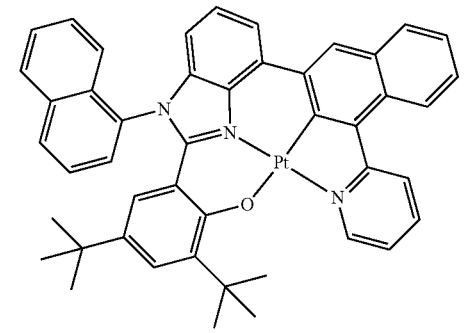
3-404
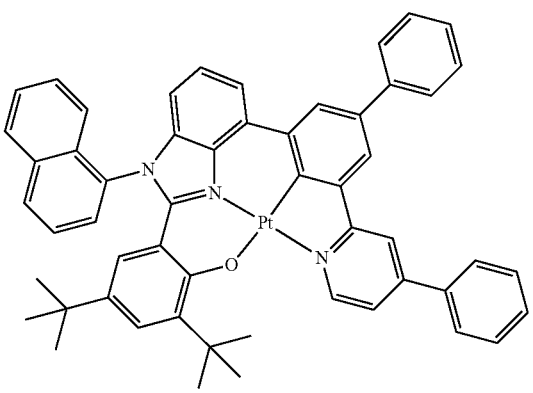
3-405
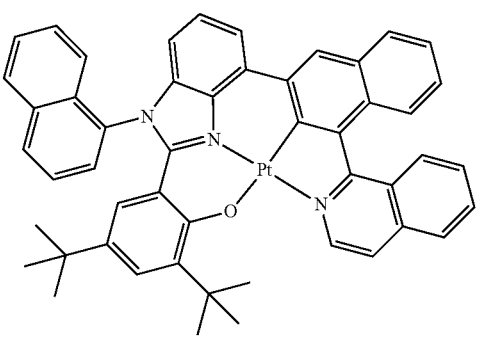

3-406
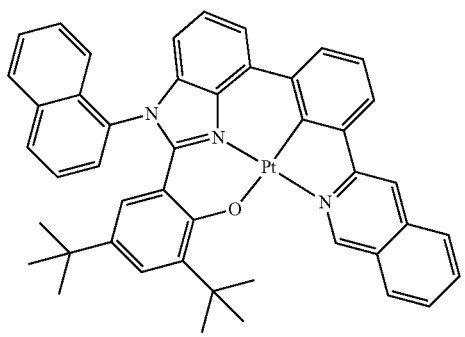
3-410
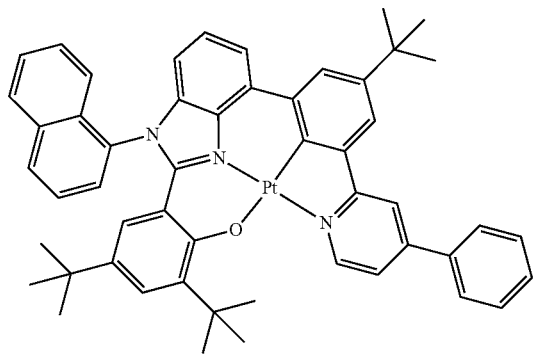
3-407
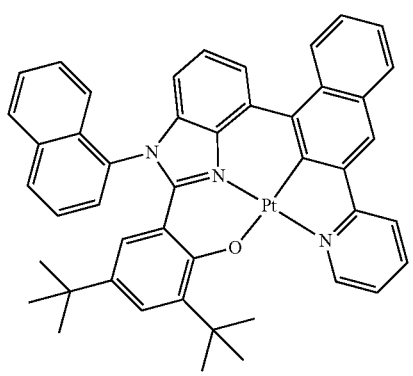
3-411
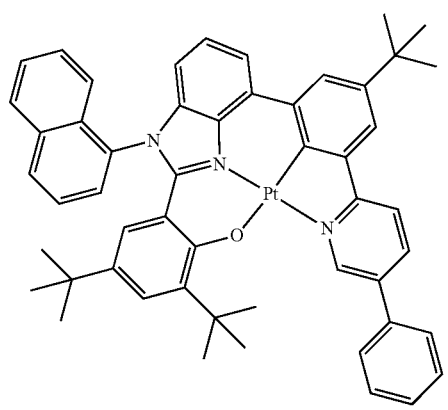
3-408
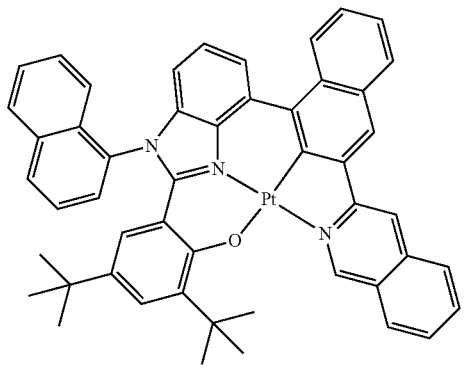
3-412
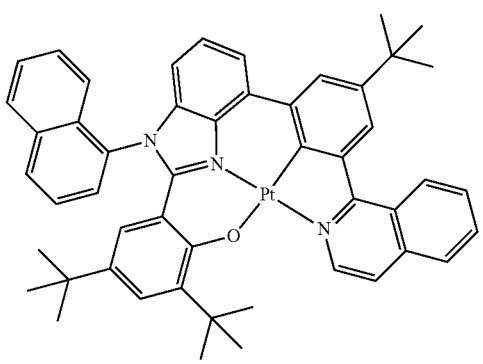
3-409
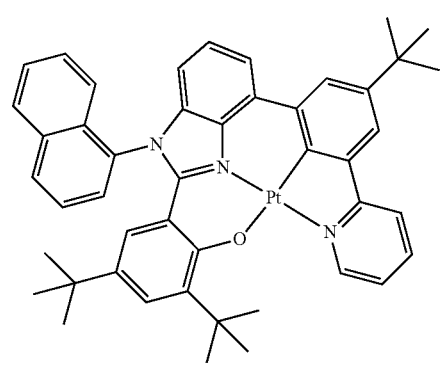
3-413
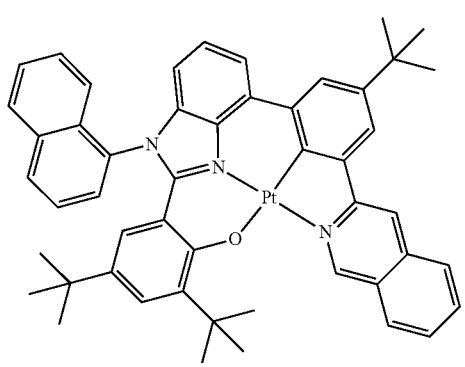

-continued
3-414
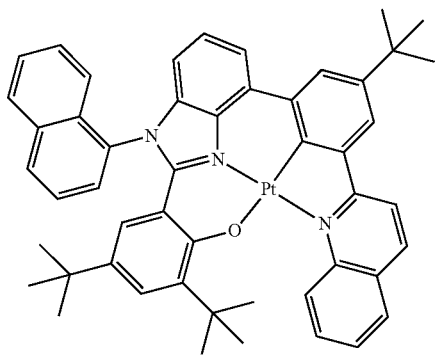
3-415
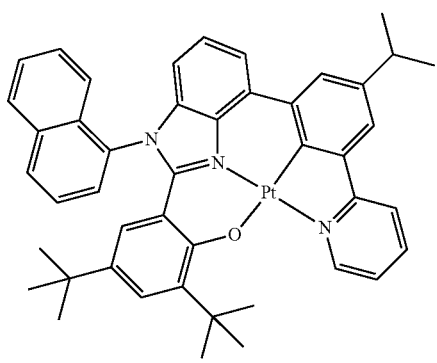
3-416
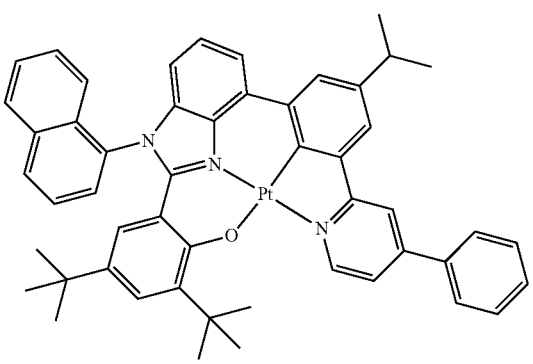
3-417
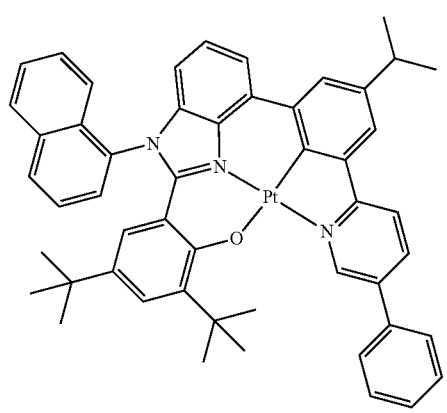
-continued
3-418
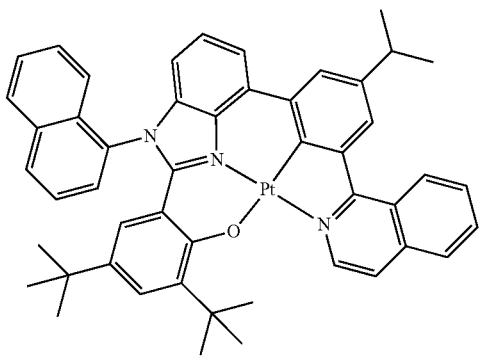
3-419
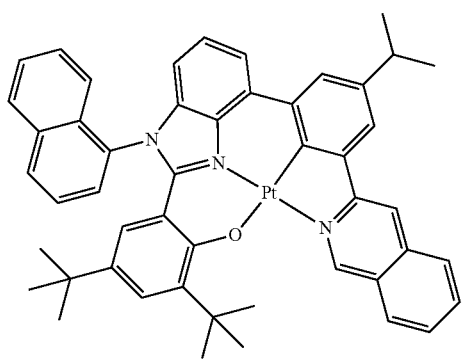
3-420
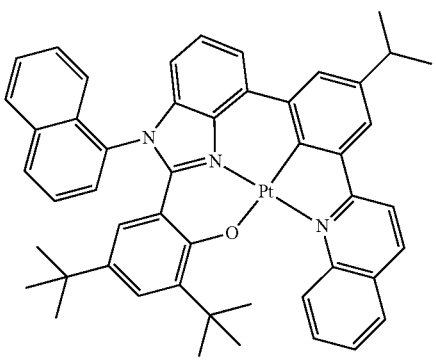
3-421
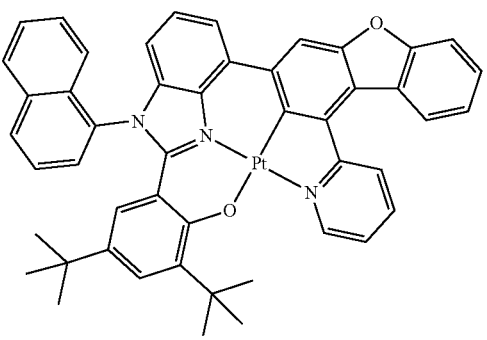

3-422
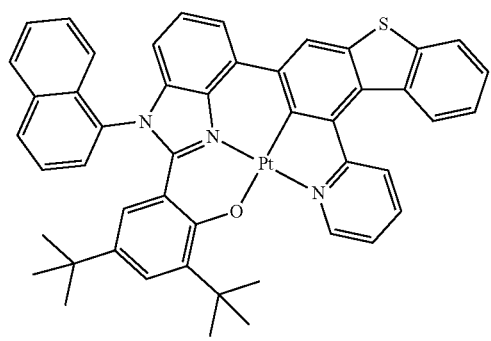
3-423
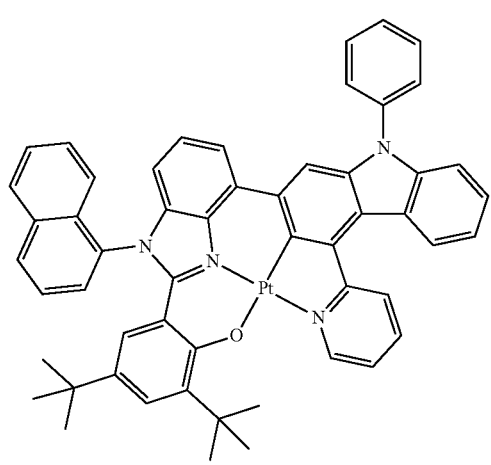
3-424
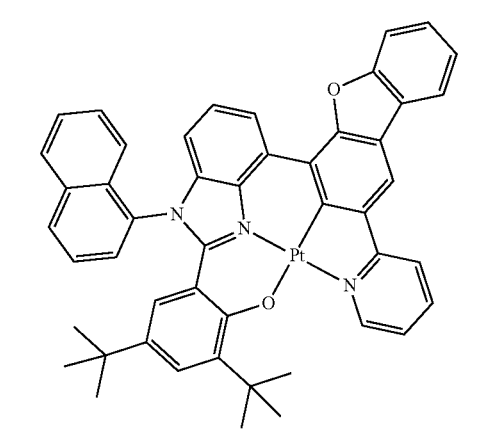
3-425
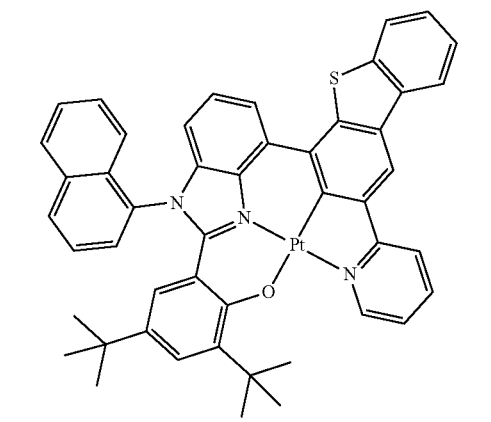
3-426
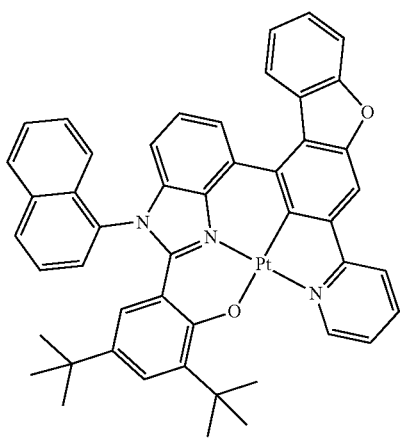
3-427
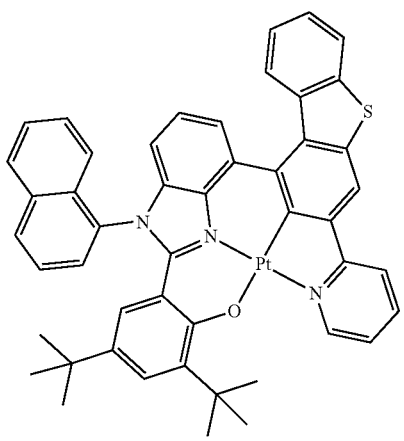
3-428
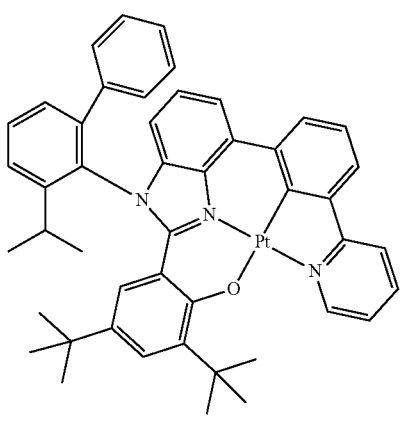

3-429
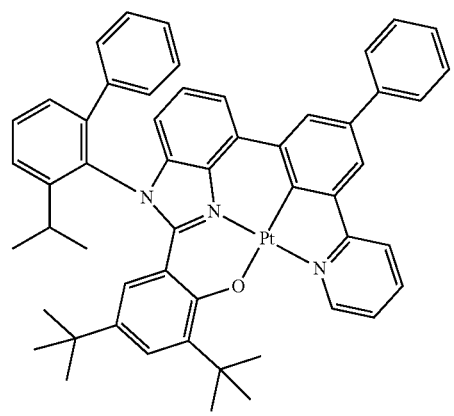
3-432
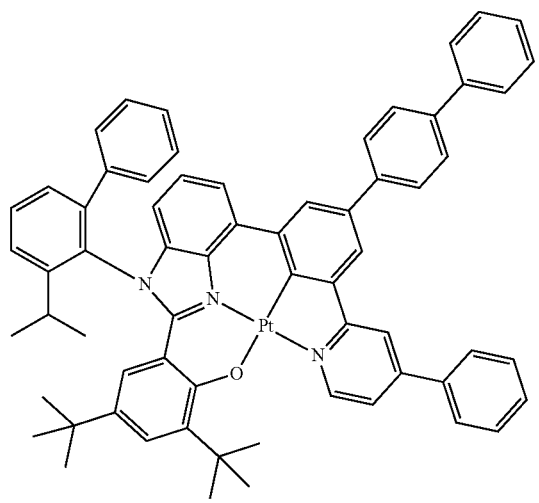
3-430
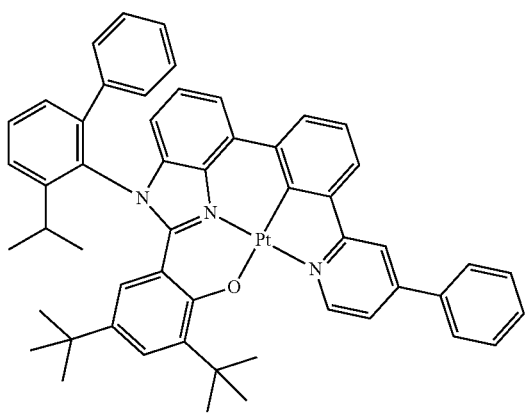
3-433
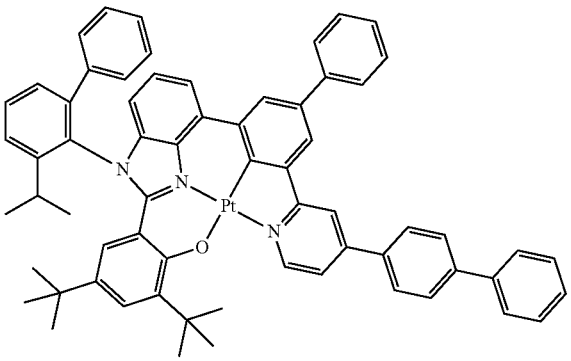
3-431
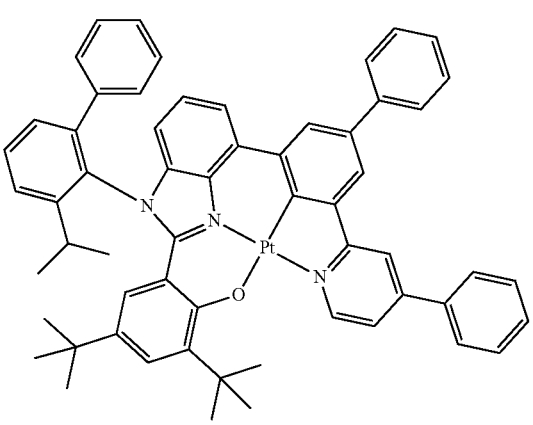
3-434
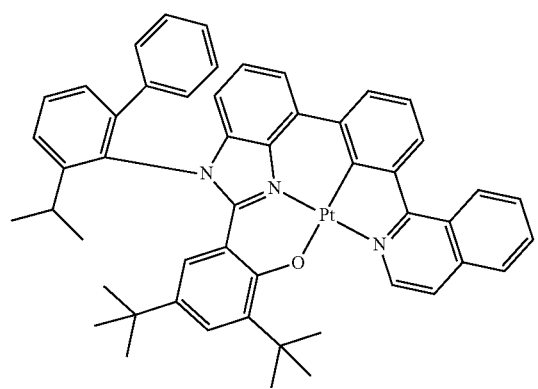

3-435
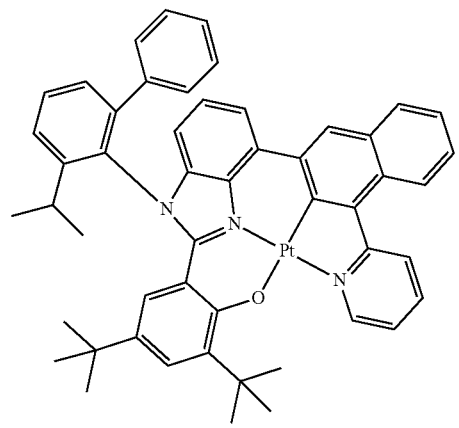
3-436
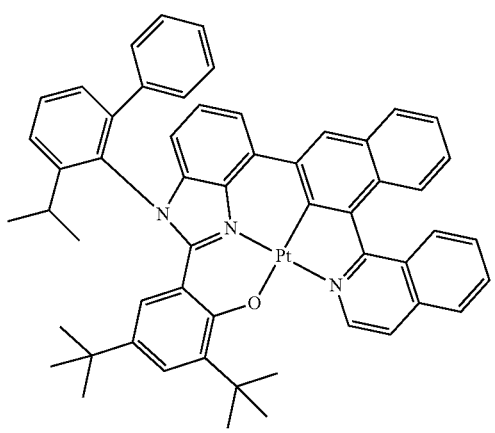
3-437
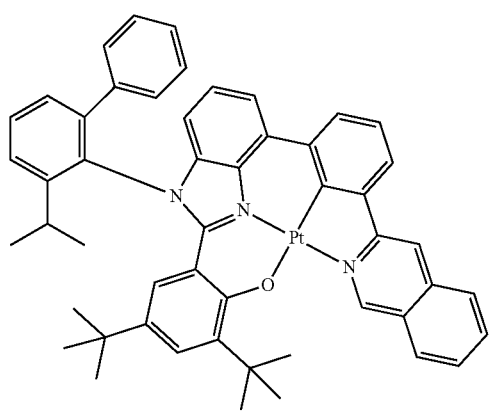
3-438
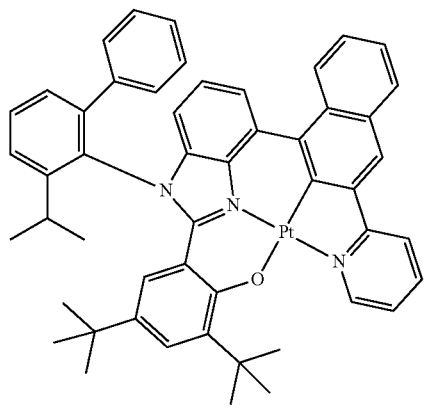
3-439
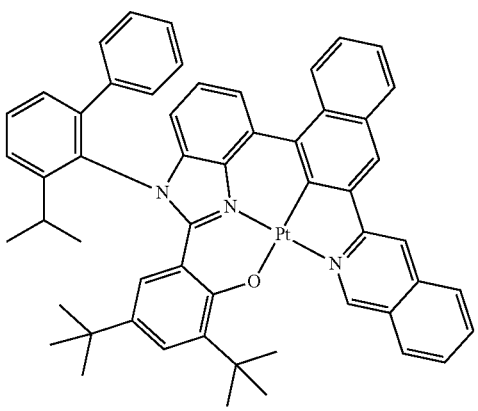
3-440
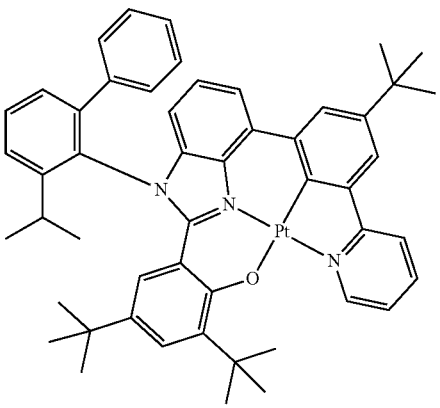

-continued
3-441
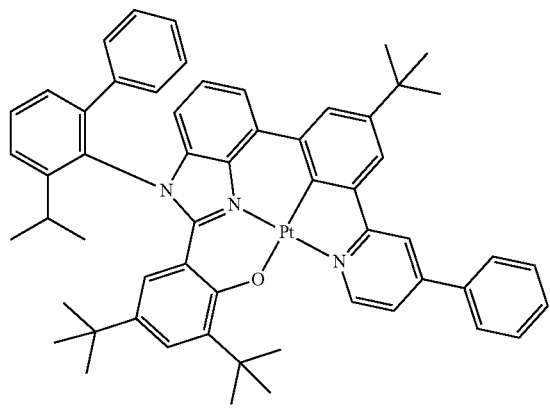
3-442
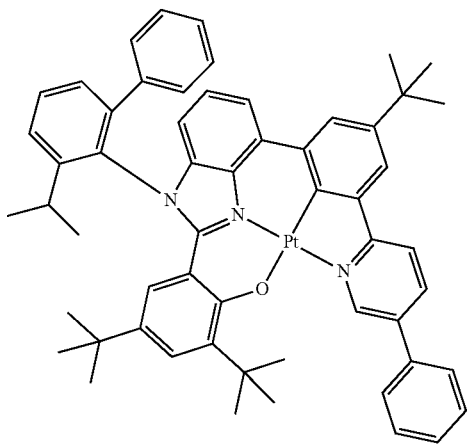
3-443
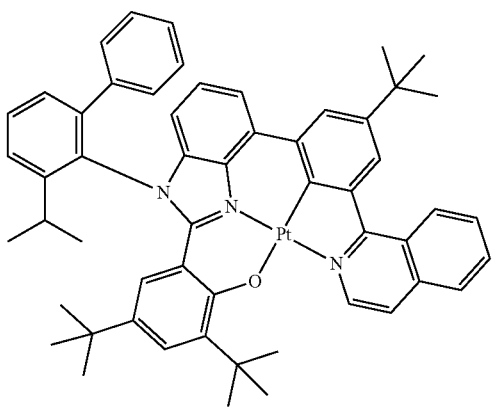
-continued
3-444
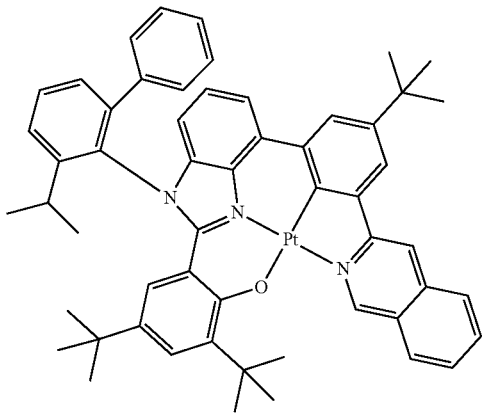
3-445
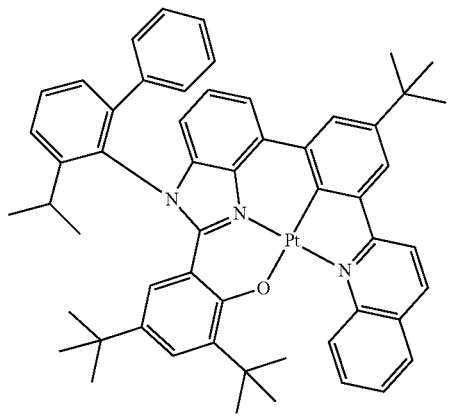
3-446
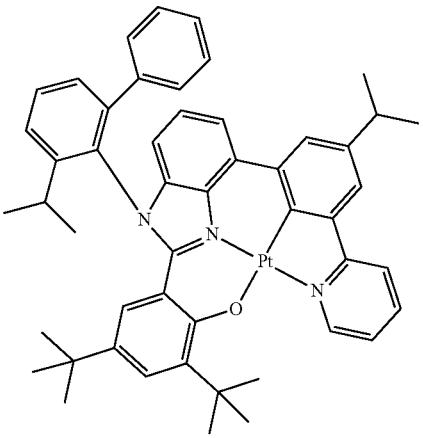

3-447
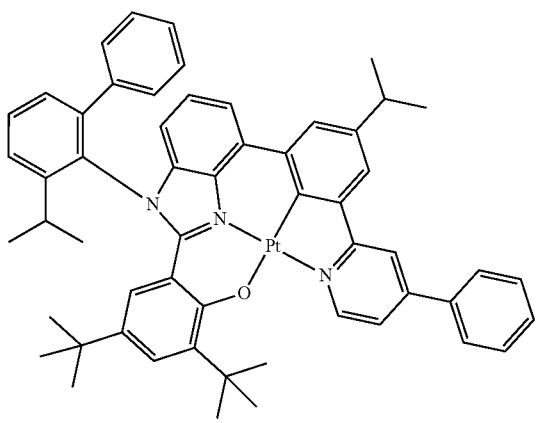
3-450
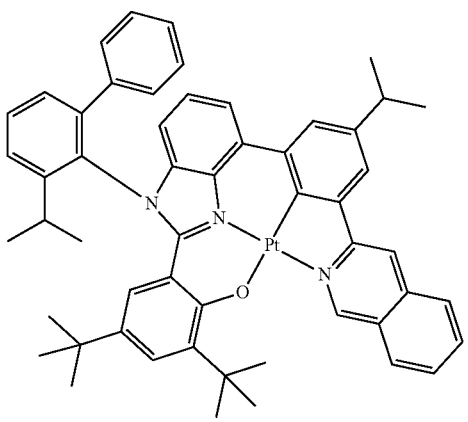
3-448
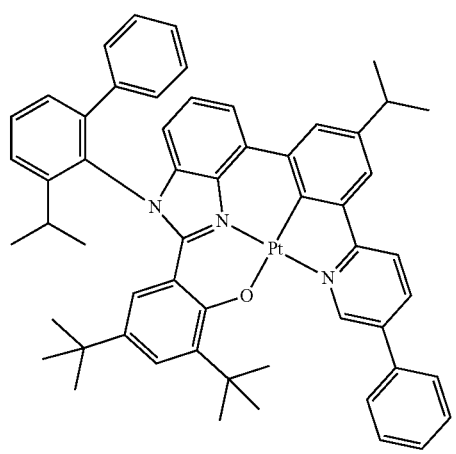
3-451
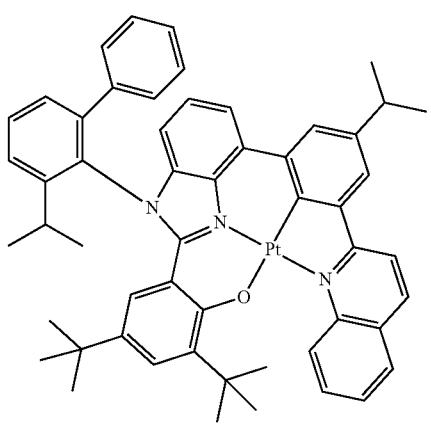
3-449
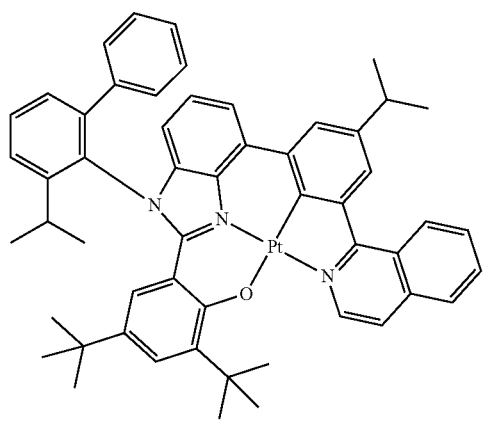
3-452
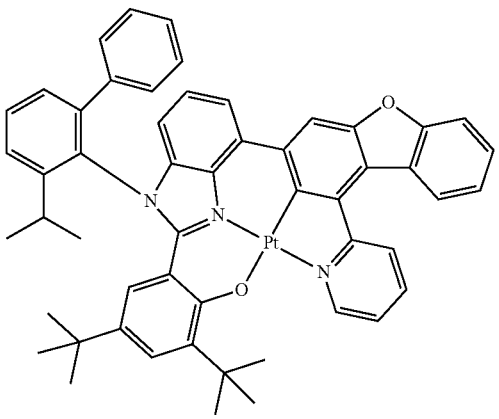

3-453
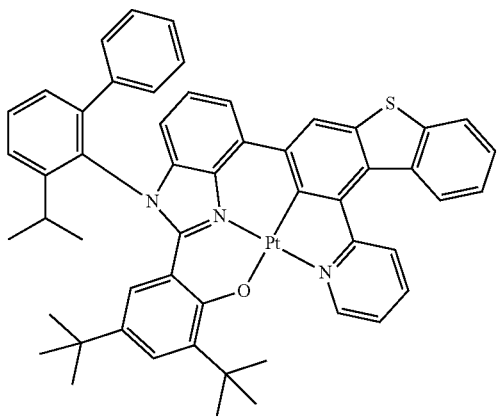
3-454
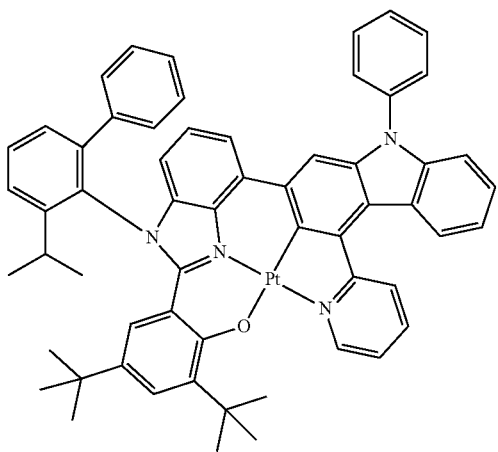
3-455
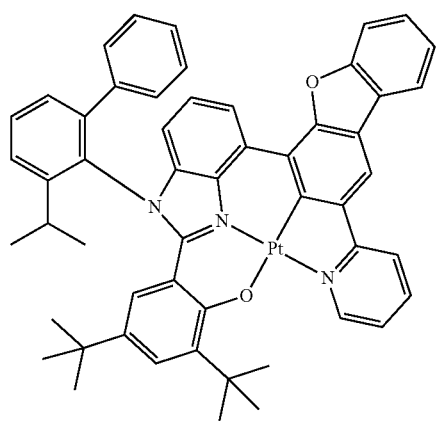
3-456
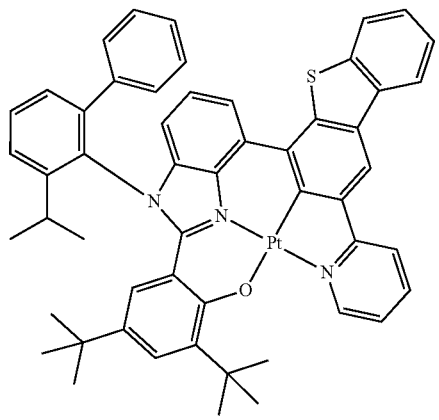
3-457
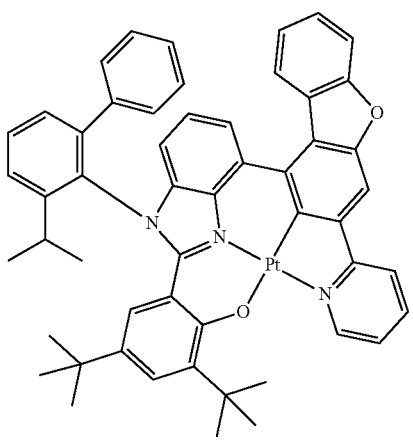
3-458
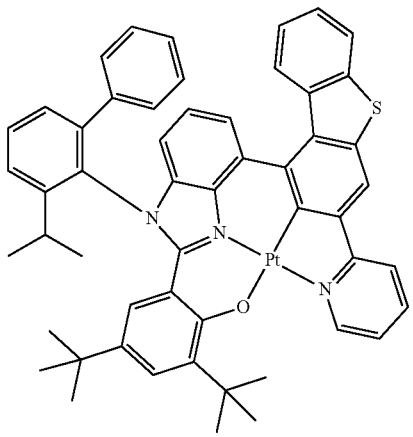

-continued
3-459
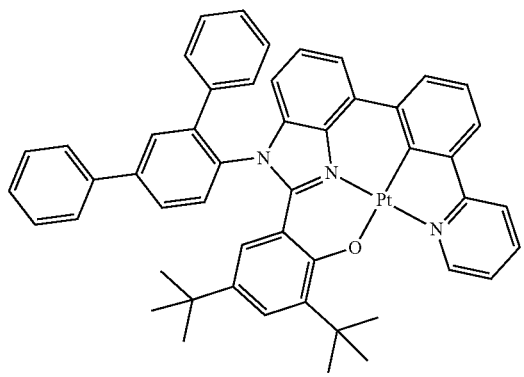
3-460
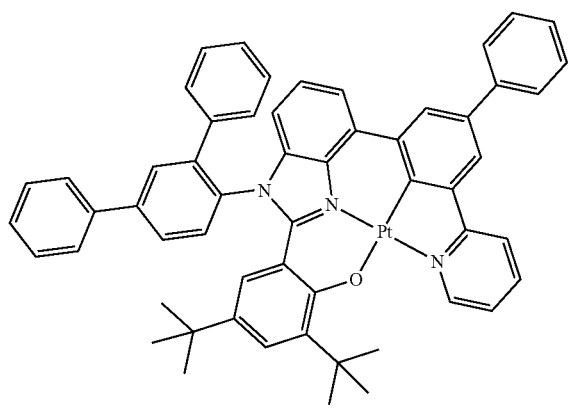
3-461
3-462
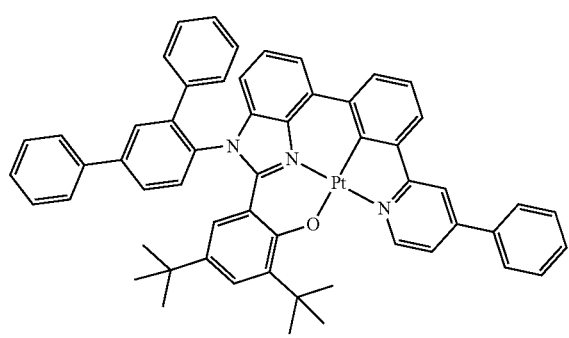
-continued
3-463
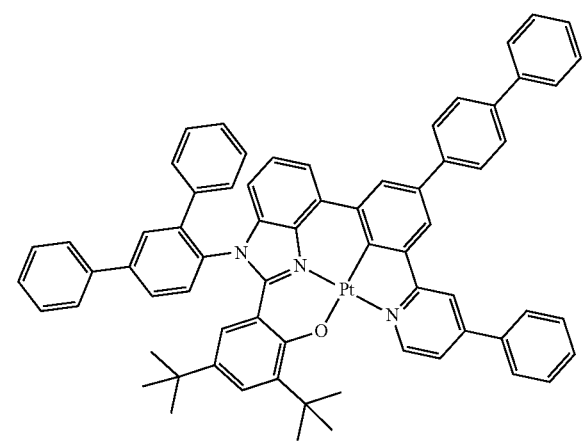
3-464
3-465
3-466
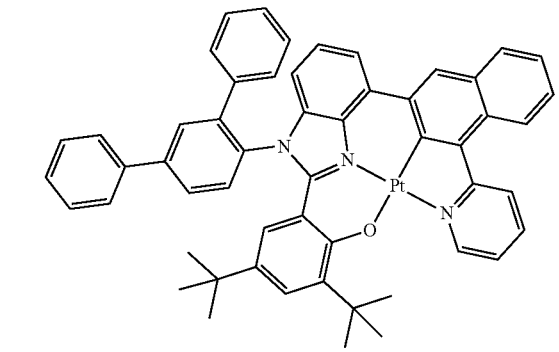

3-467
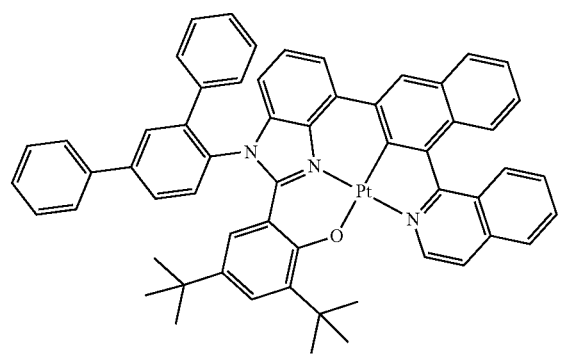
3-468
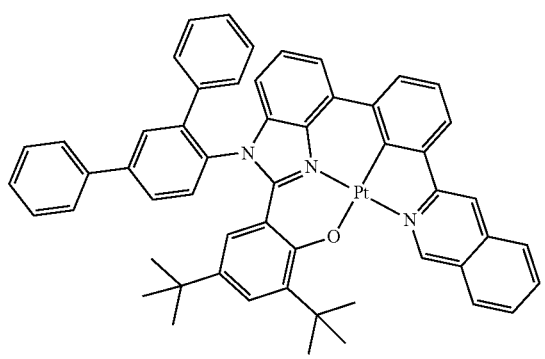
3-469
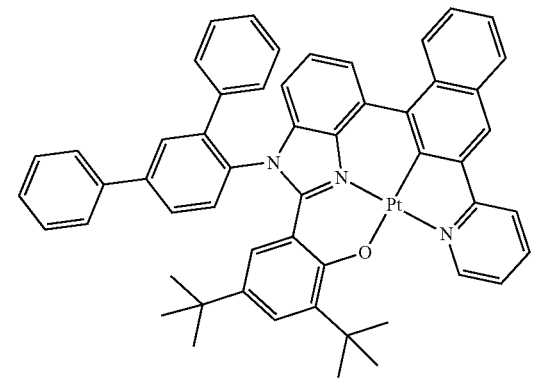
3-470
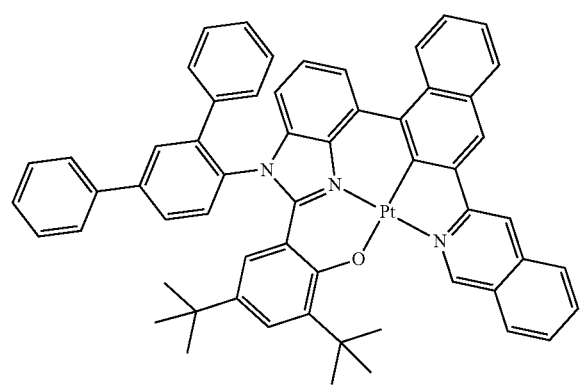
3-471
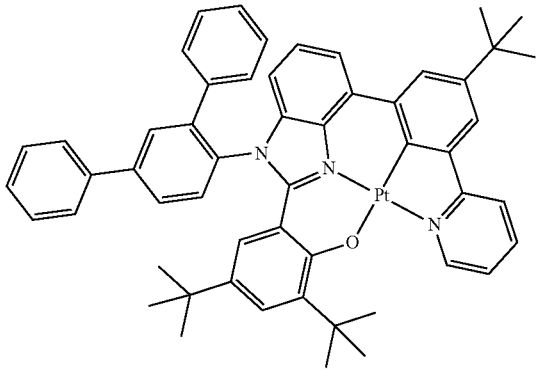
3-472
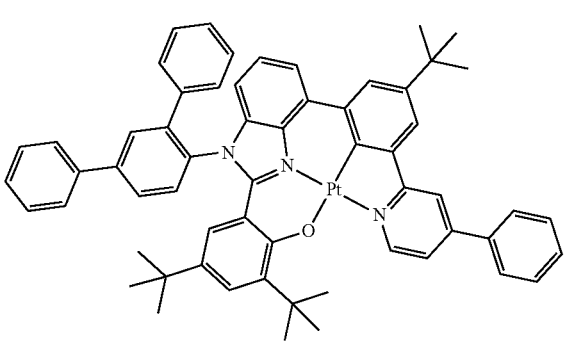
3-473
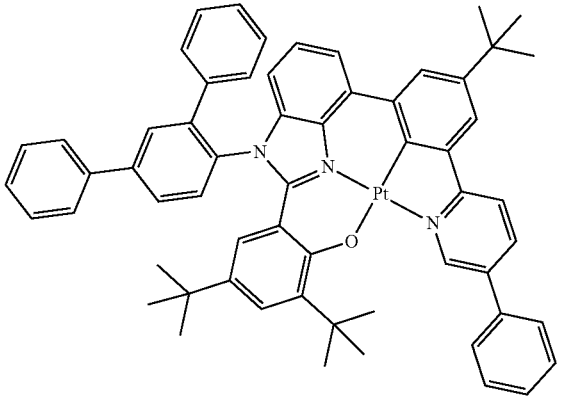
3-474
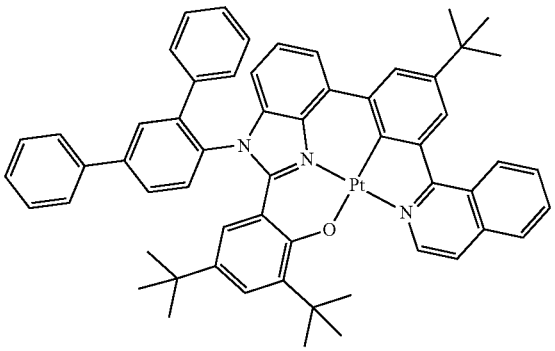

3-475
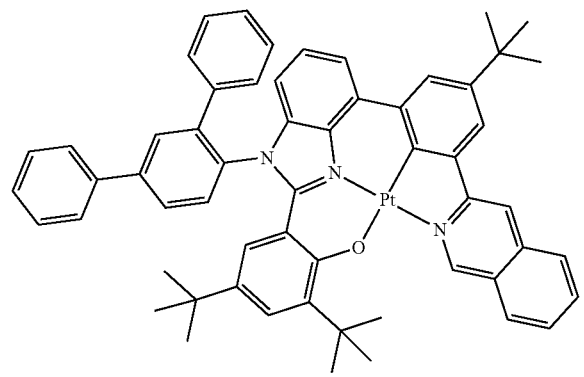
3-476
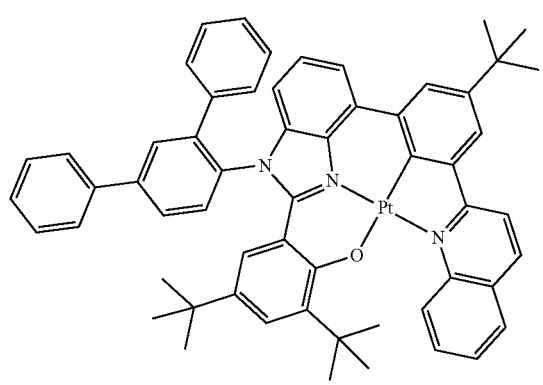
3-477
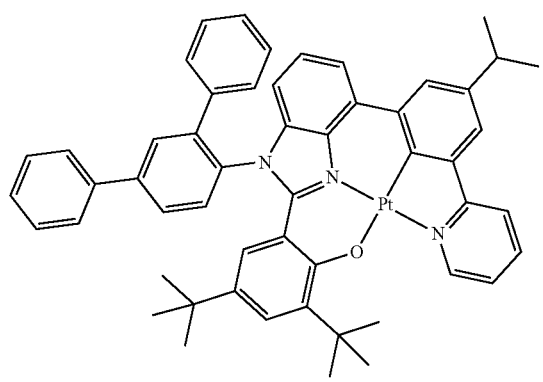
3-478
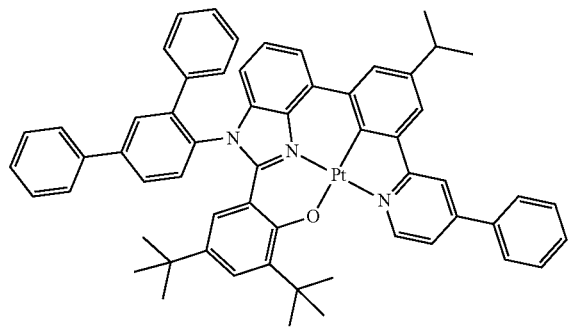
3-479
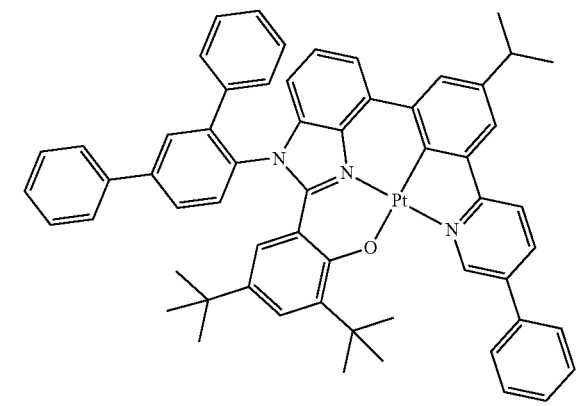
3-480
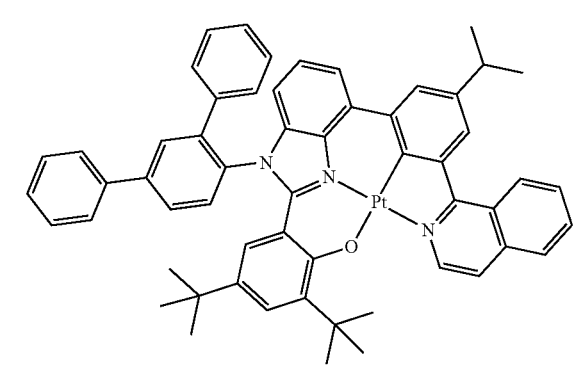
3-481
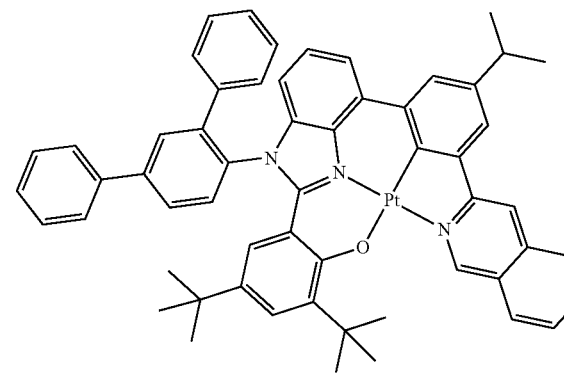
3-482
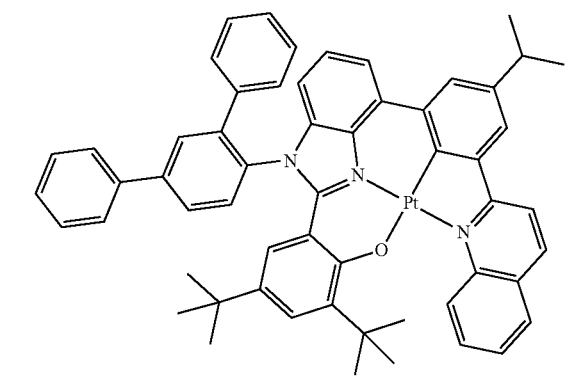

3-483
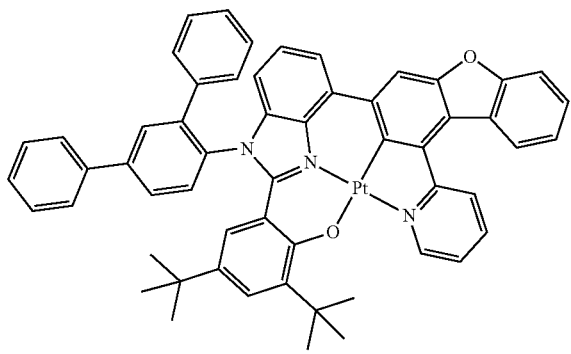
3-484
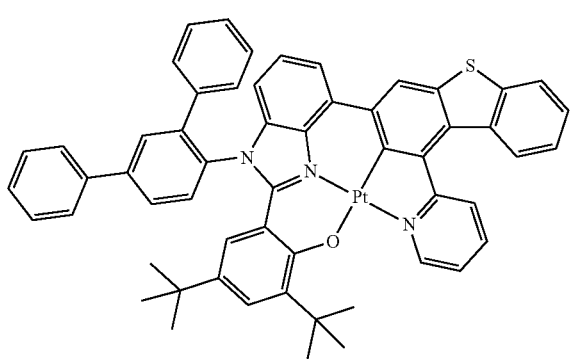
3-485
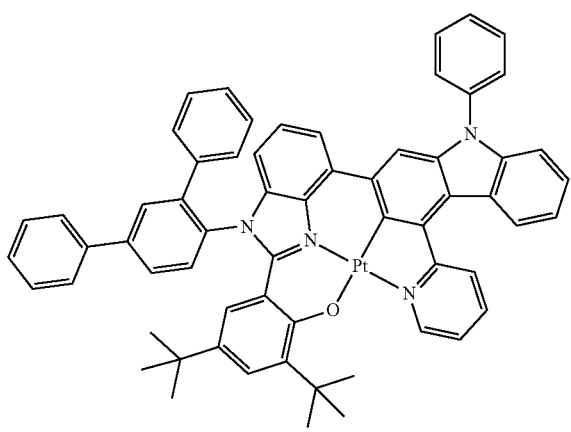
3-486
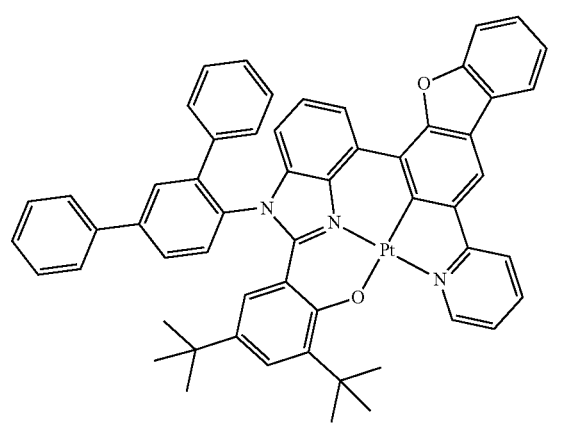
3-487
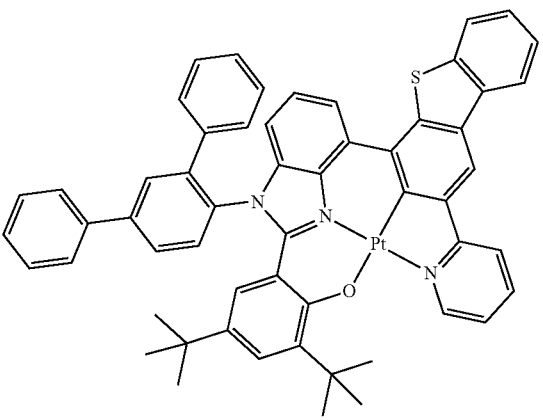
3-488
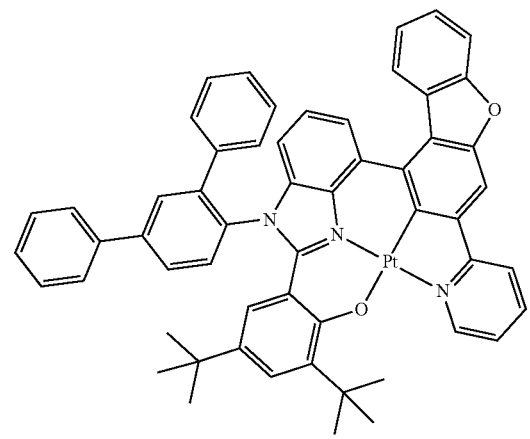
3-489
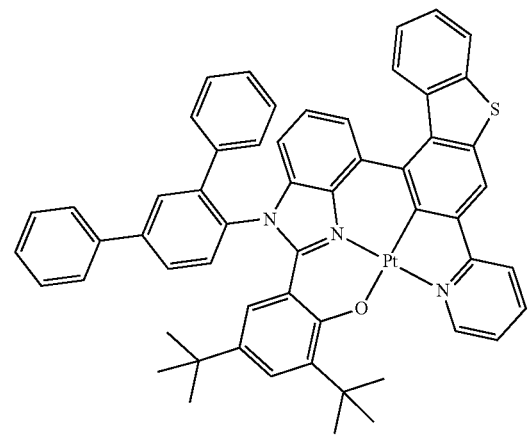

3-490
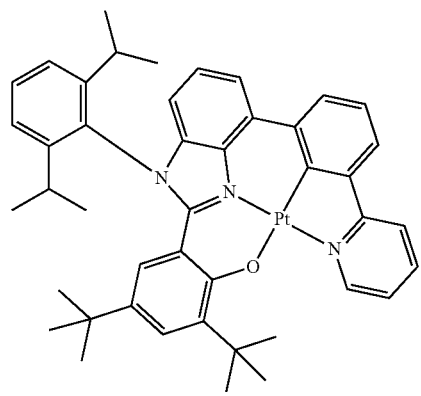
3-491
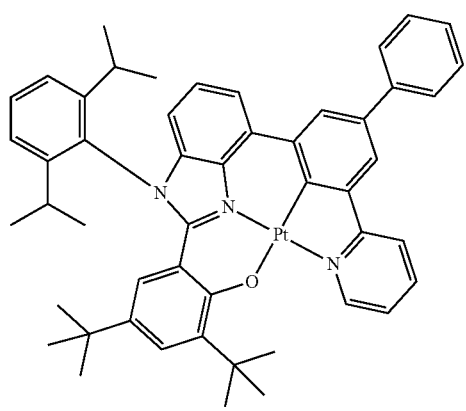
3-492
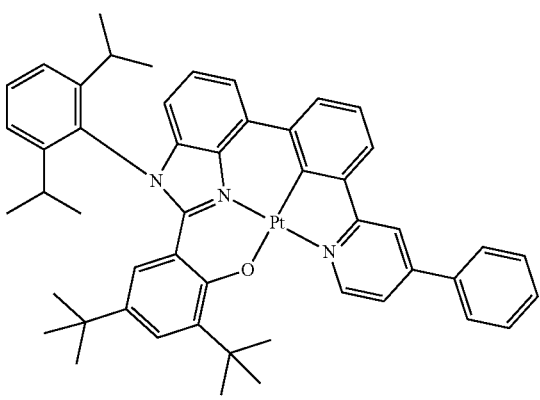
3-493
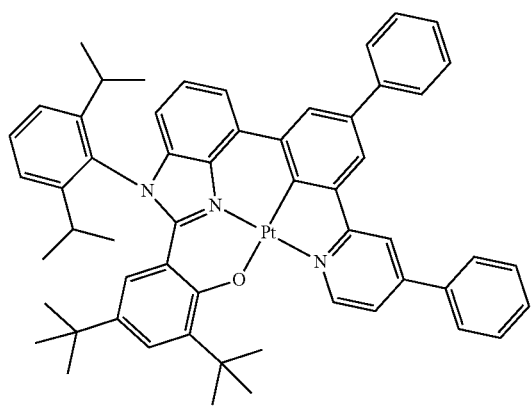
3-494
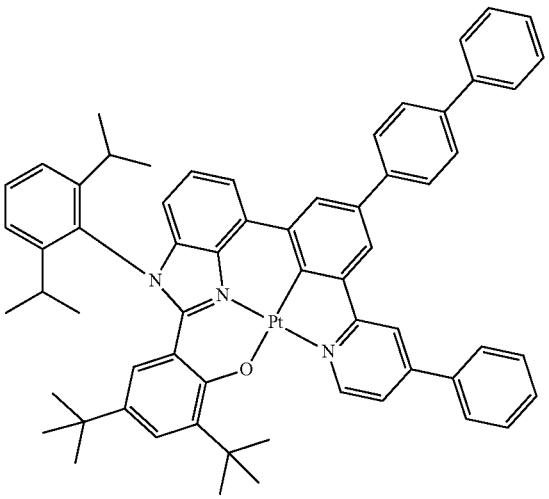
3-495
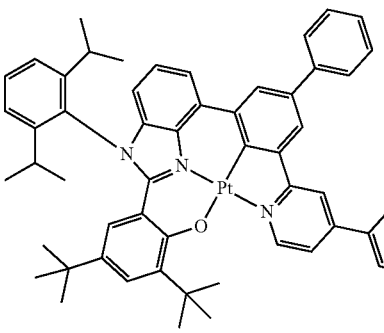
3-496
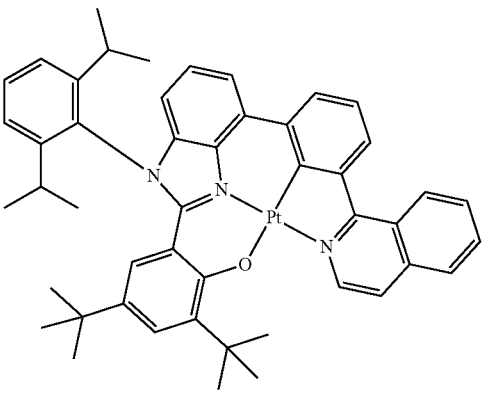
3-497
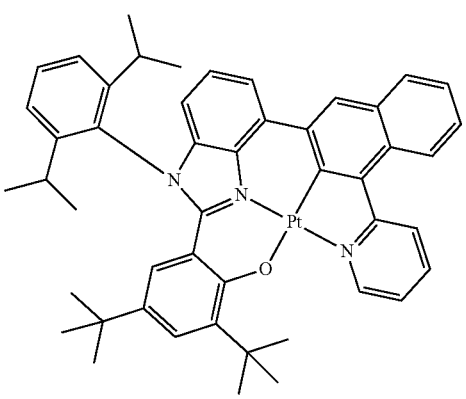

-continued
3-498
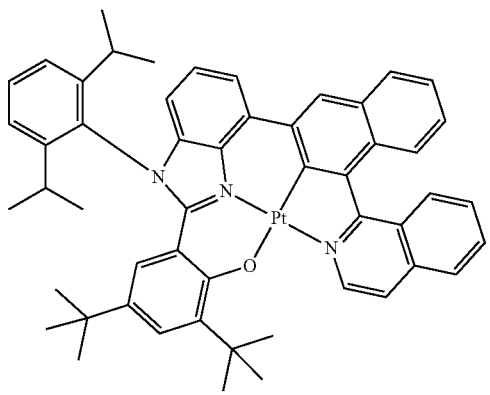
3-499
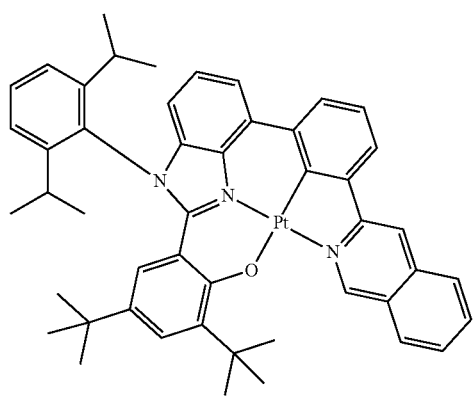
3-500
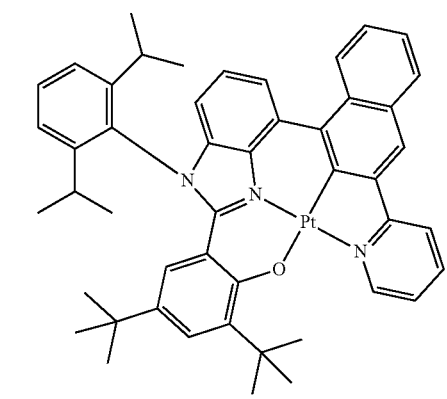
3-501
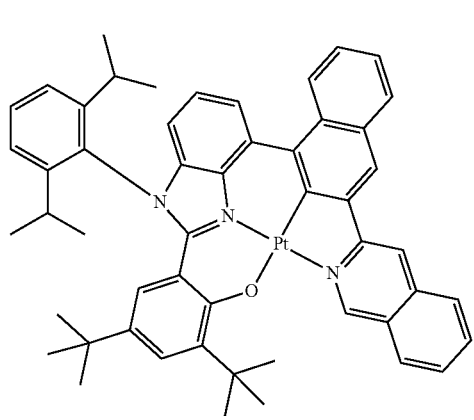
3-502
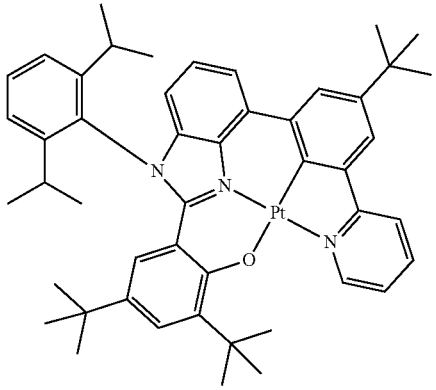
3-503
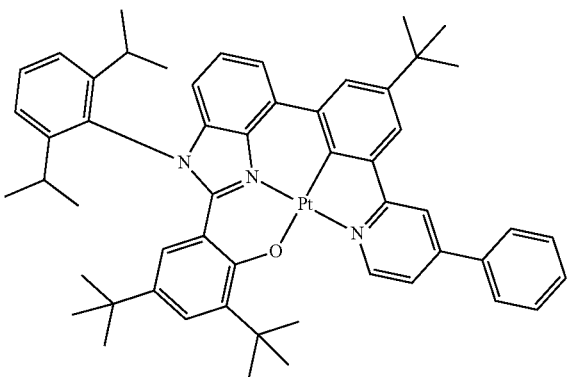
3-504
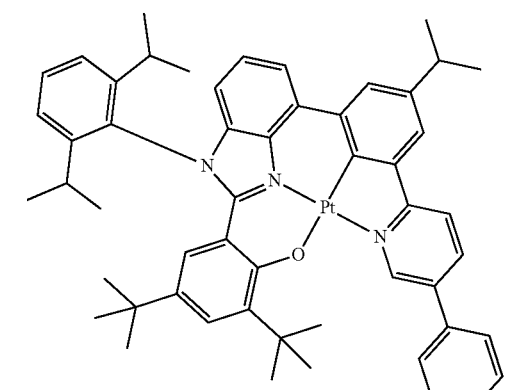
3-505
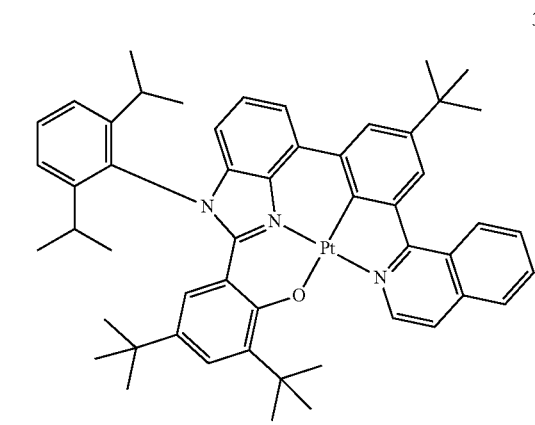

3-506
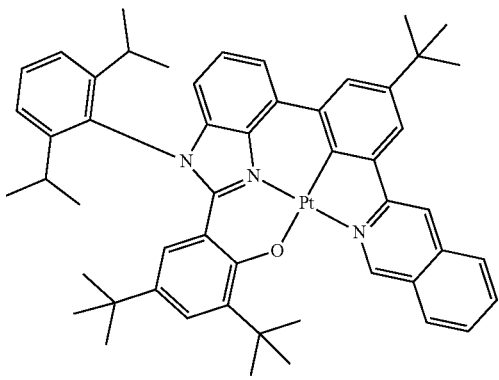
3-510
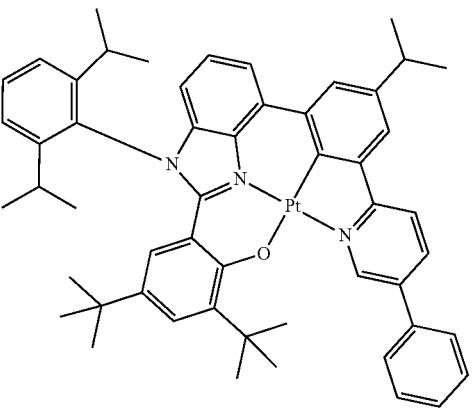
3-507
3-511
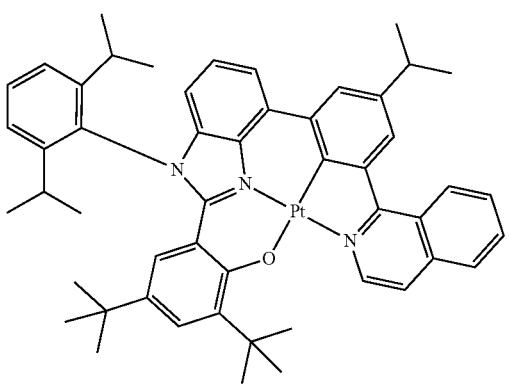
3-508
3-512
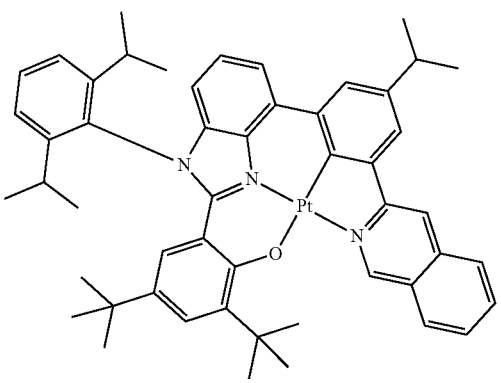
3-509
3-513
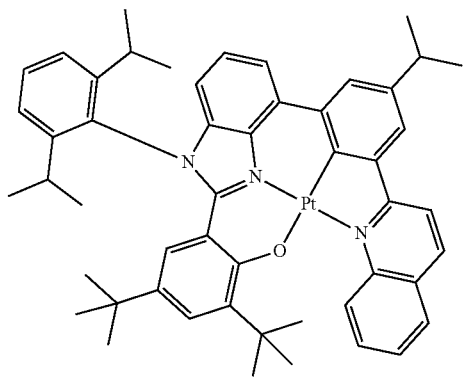

3-514
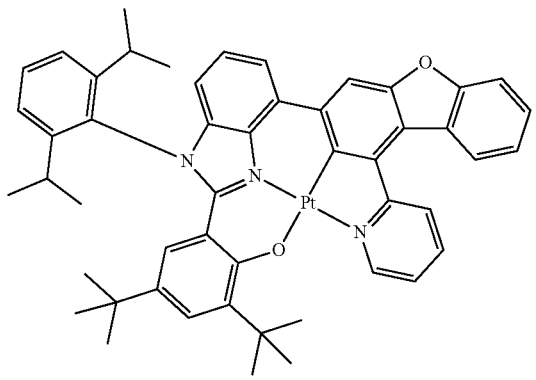
3-515
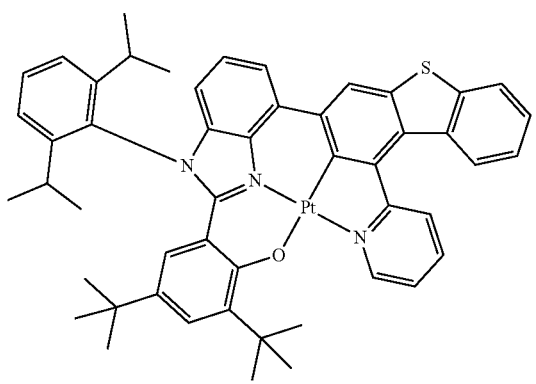
3-516
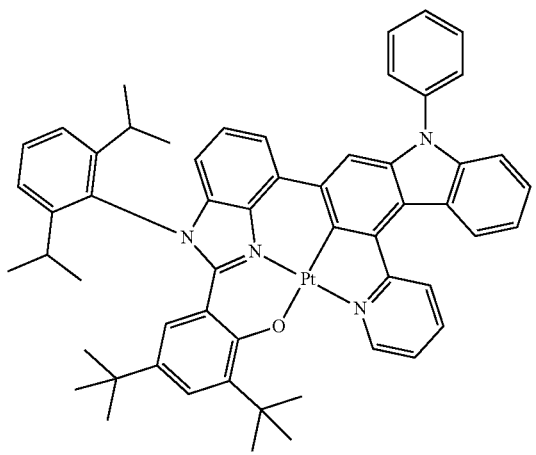
3-517
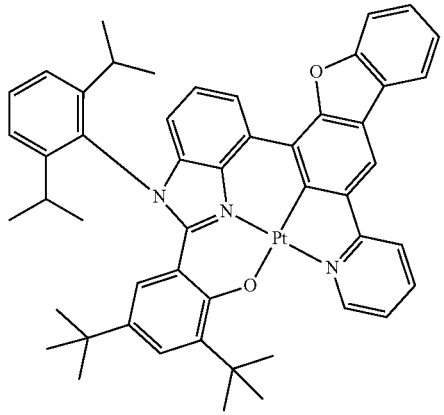
3-518
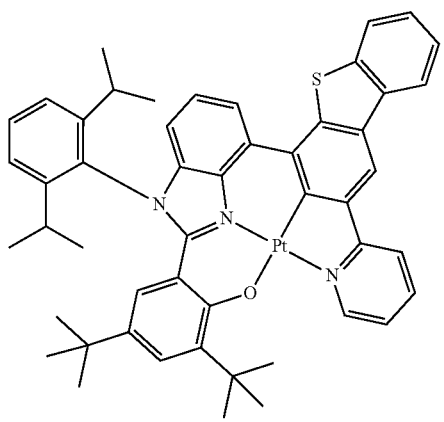
3-519
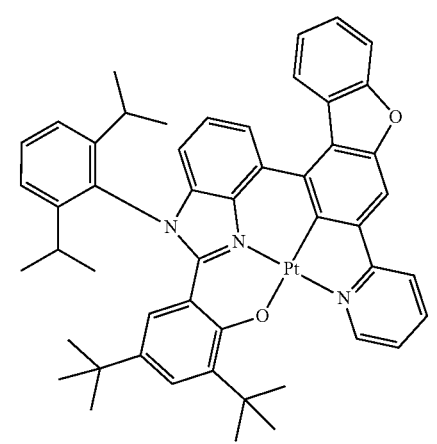

3-520
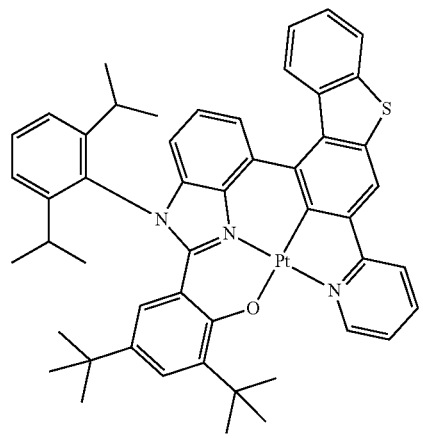
3-521
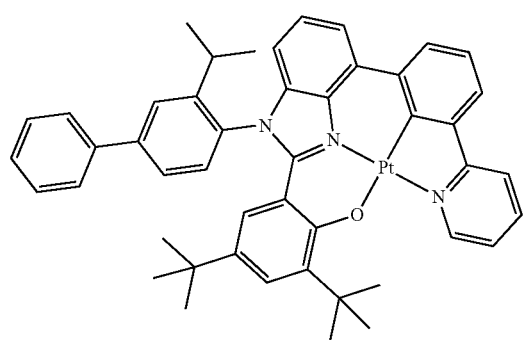
3-522
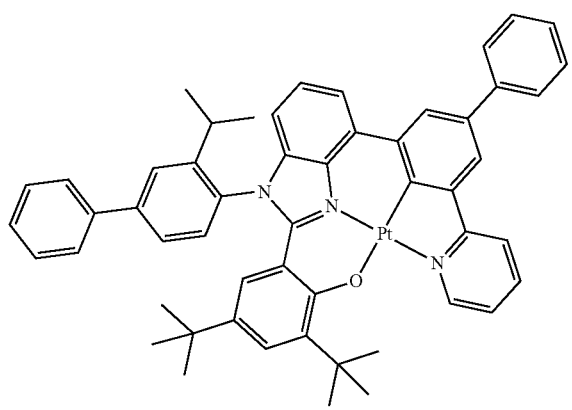
3-523
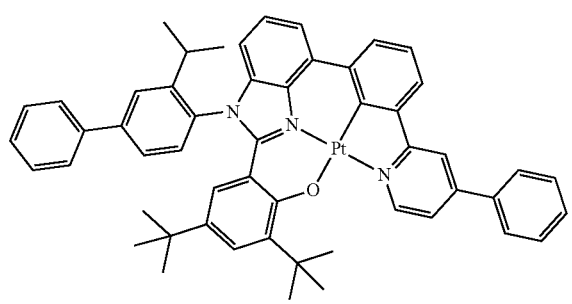
3-524
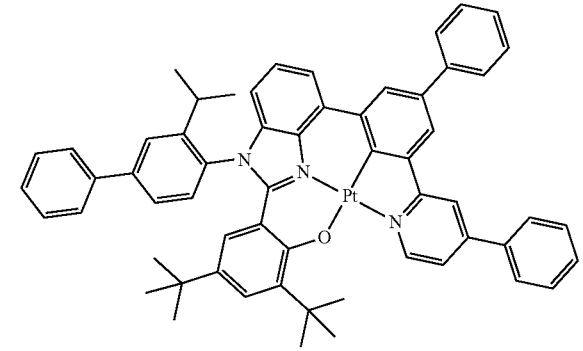
3-525
3-526
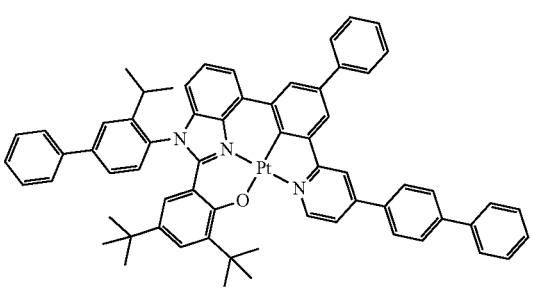
3-527
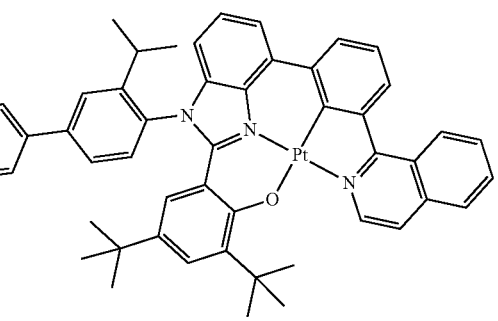

3-528
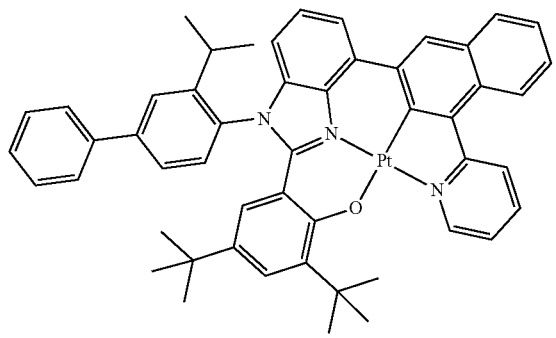
3-532
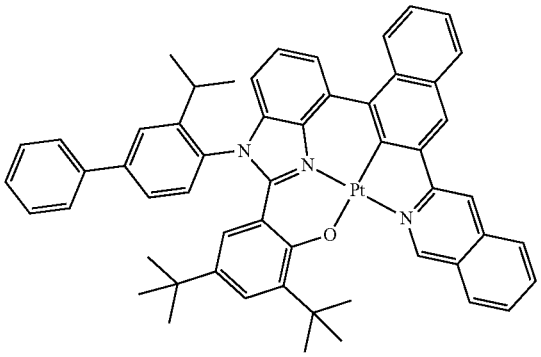
3-529
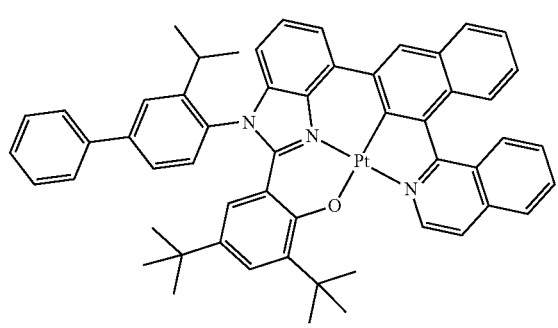
3-533
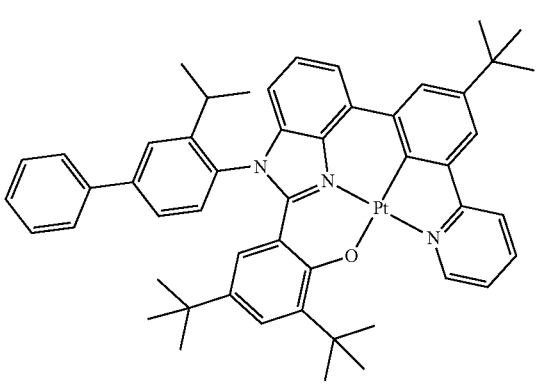
3-530
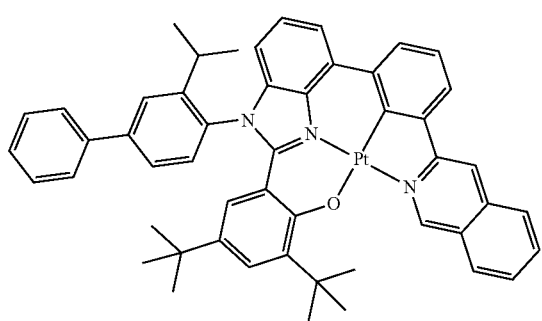
3-534
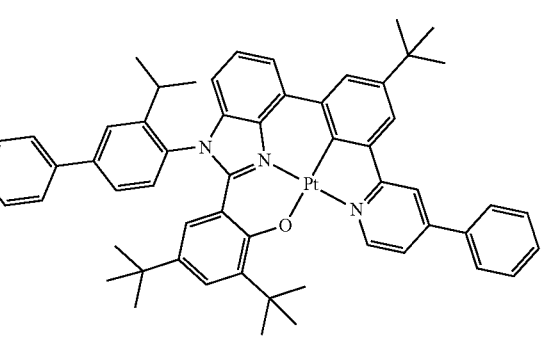
3-531
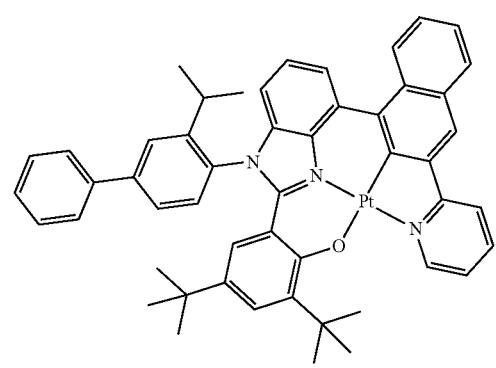
3-535
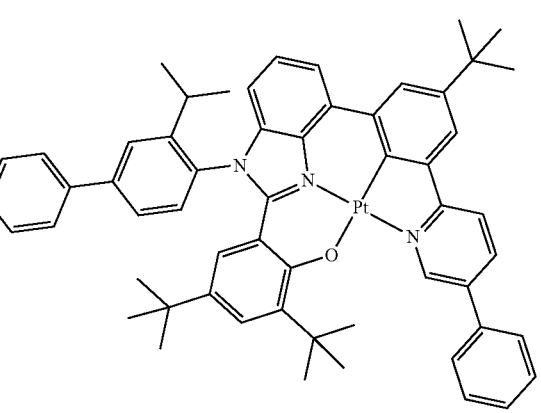

3-536
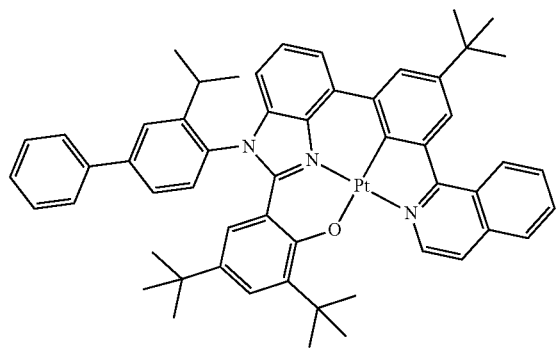
3-537
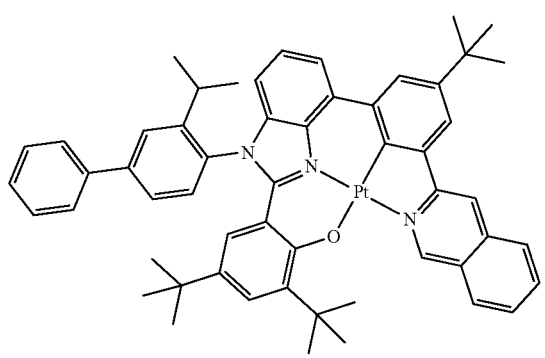
3-538
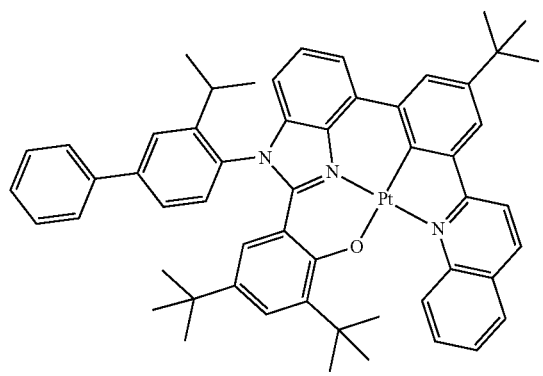
3-539
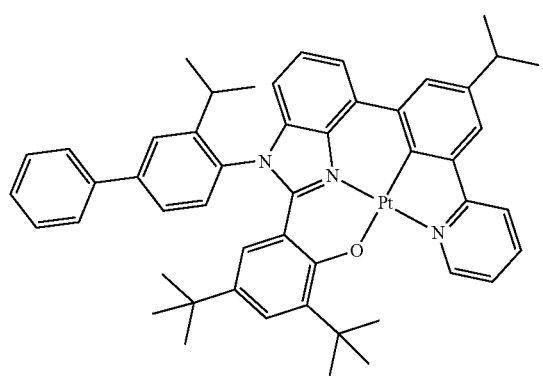
3-540
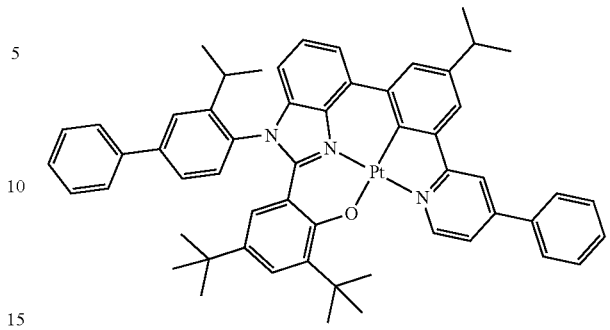
3-541
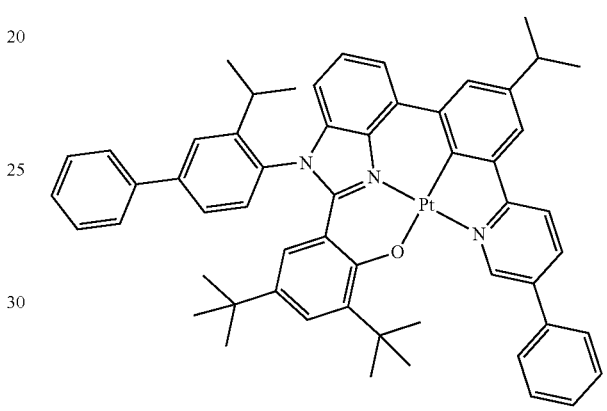
3-542
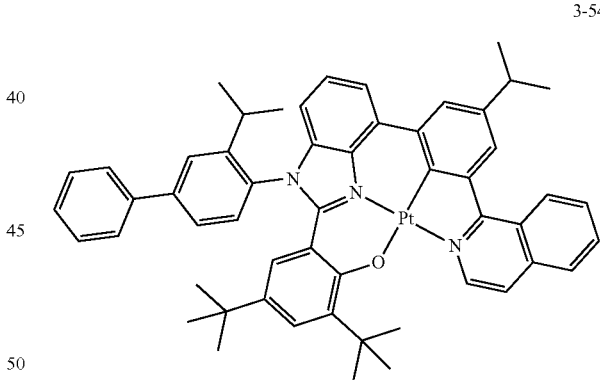
3-543
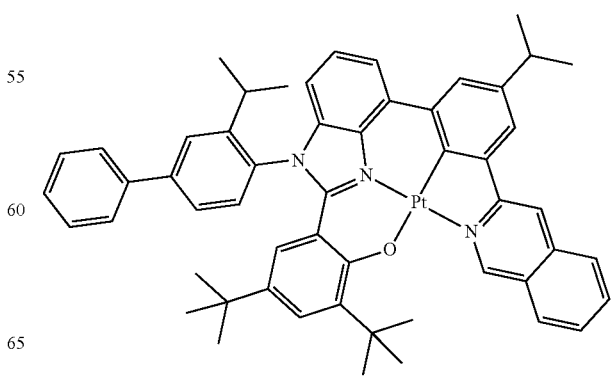

-continued
3-544
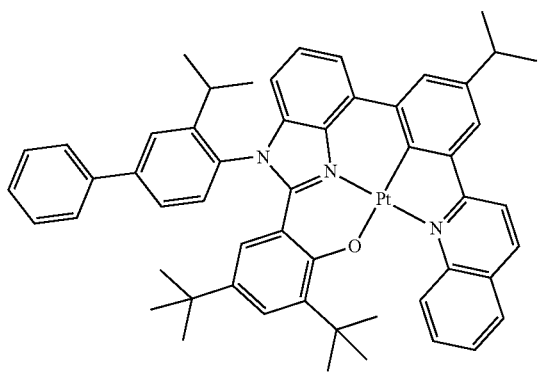
3-545
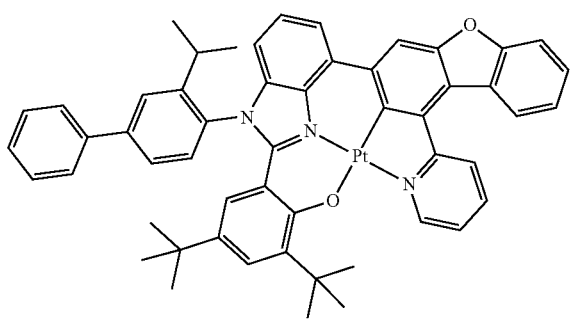
3-546
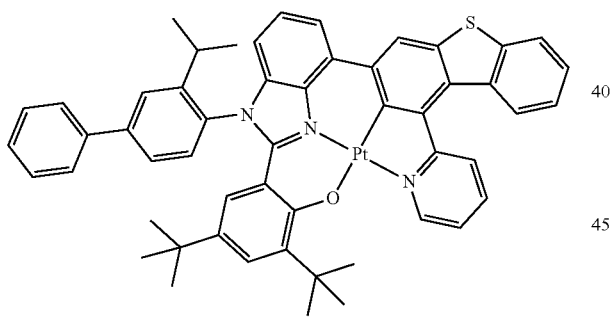
3-547
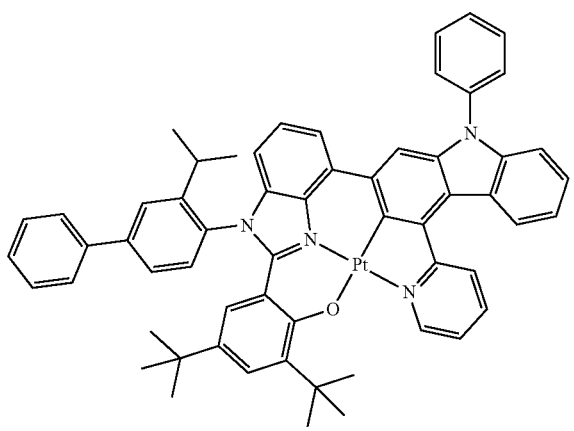
-continued
3-548
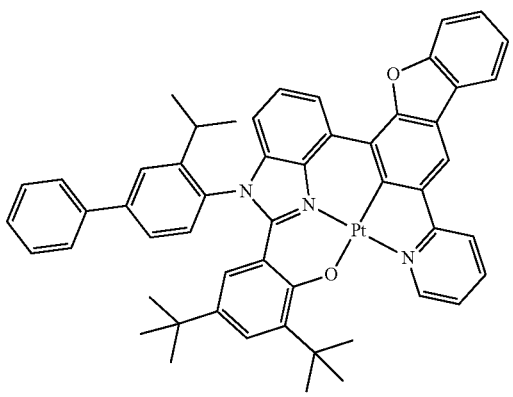
3-549
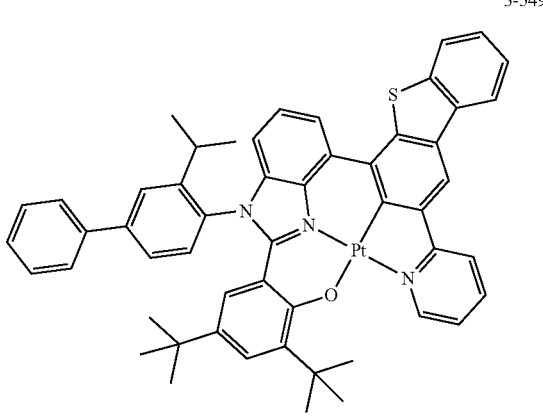
3-550
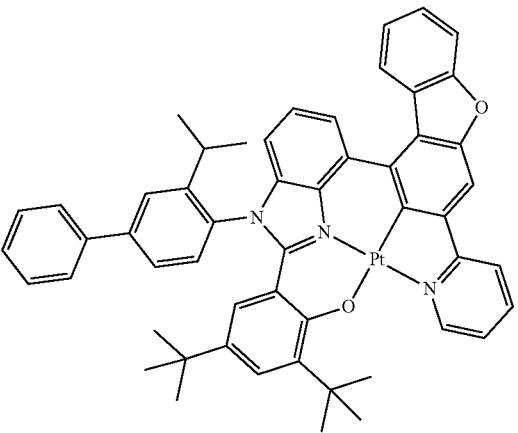

3-551
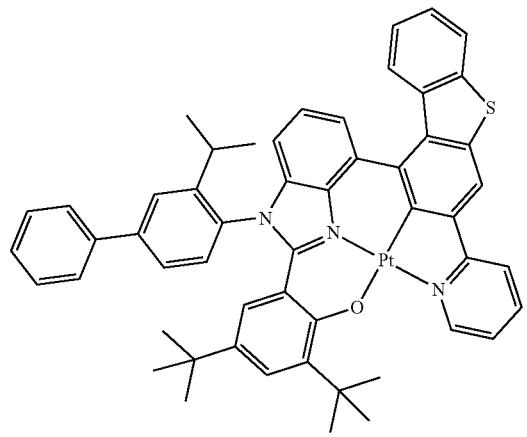
3-552
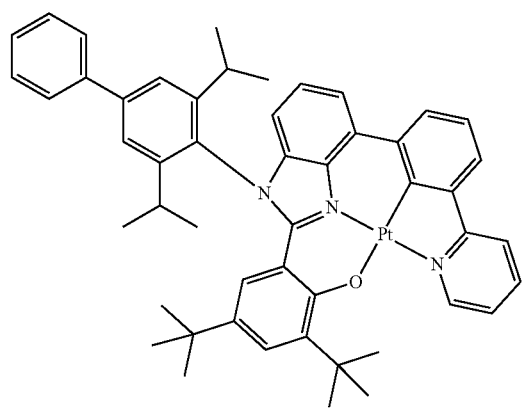
3-553
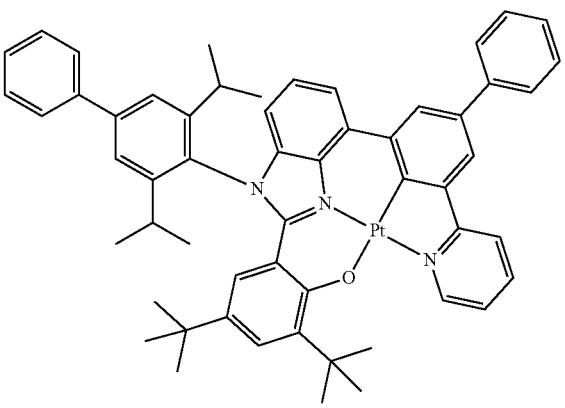
3-554
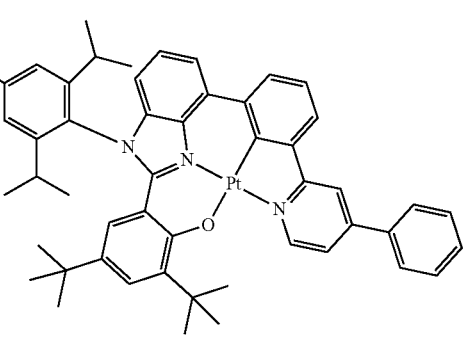
3-555
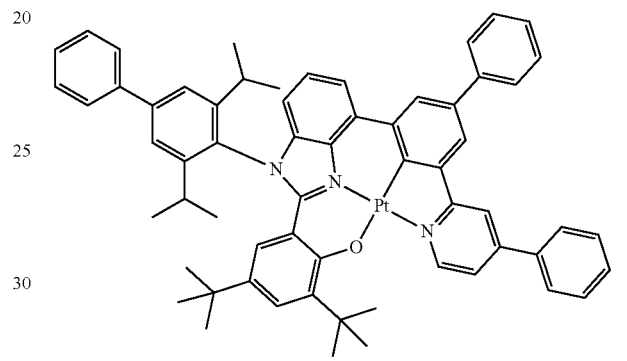
3-556
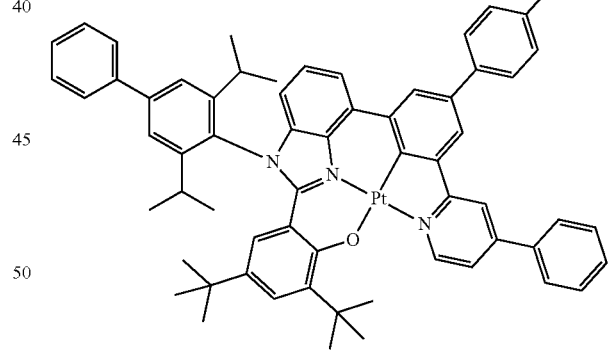
3-557
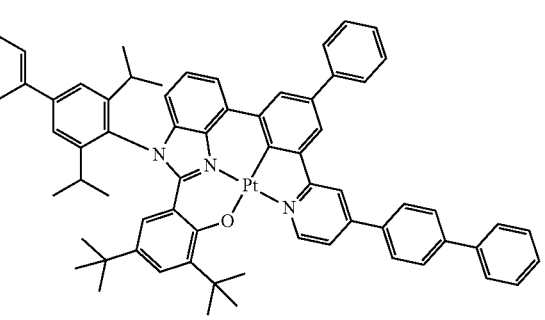

3-558
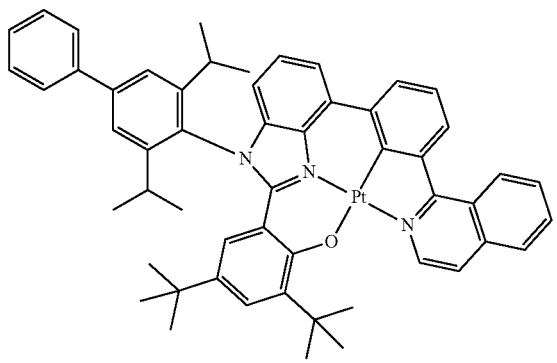
3-562
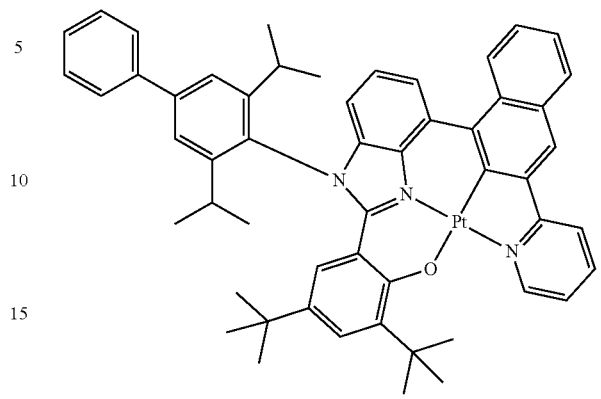
3-559
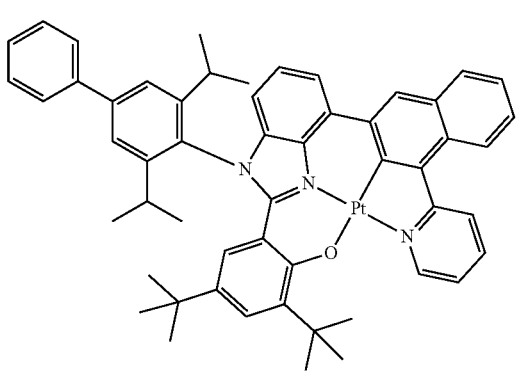
3-563
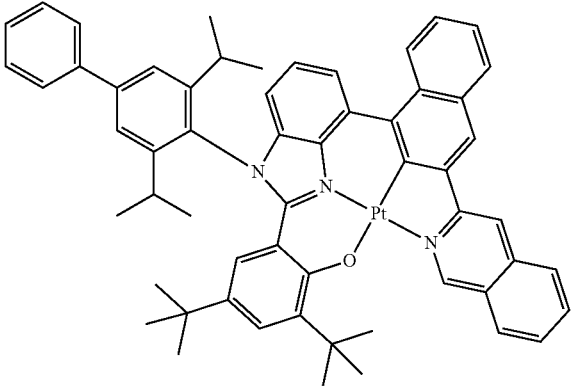
3-560
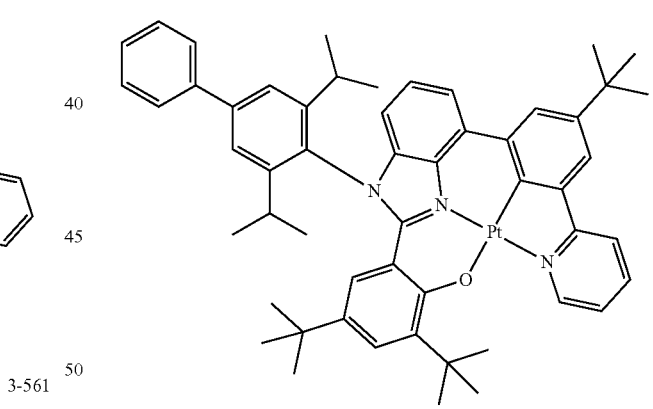
3-564
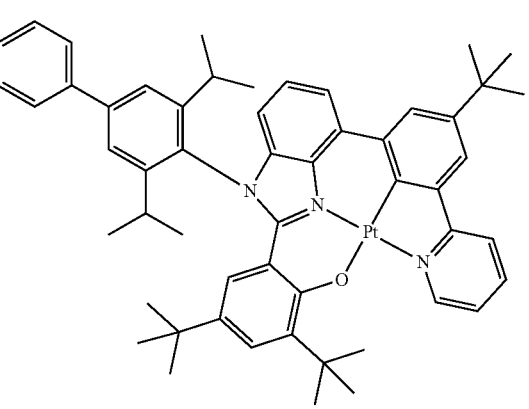
3-561
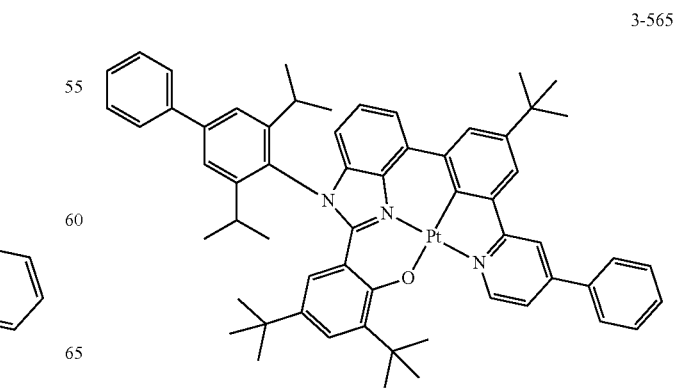
3-565
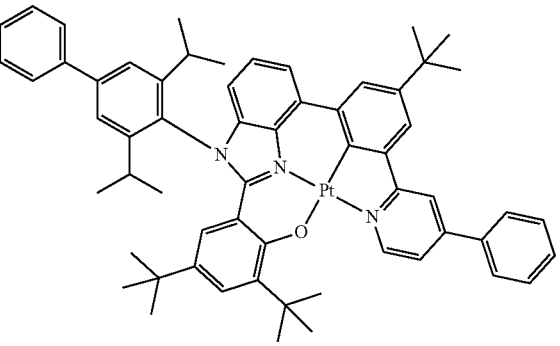

-continued
3-566
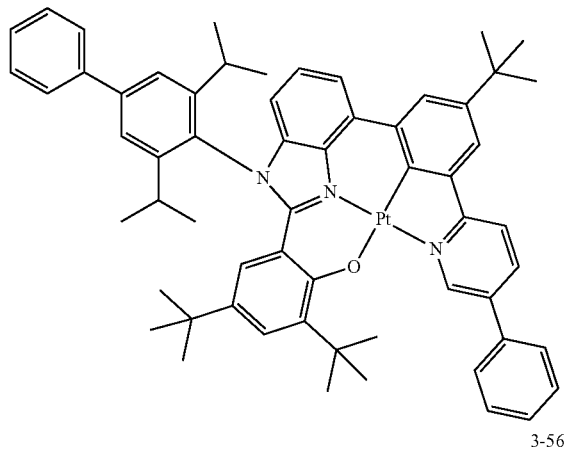
3-567
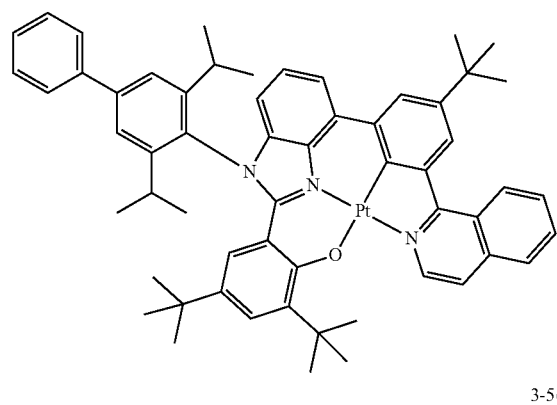
3-568
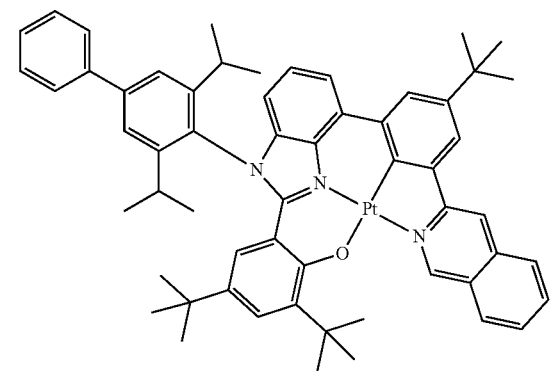
3-569
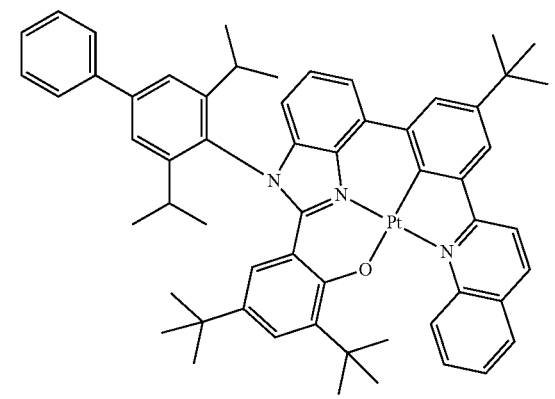
-continued
3-570
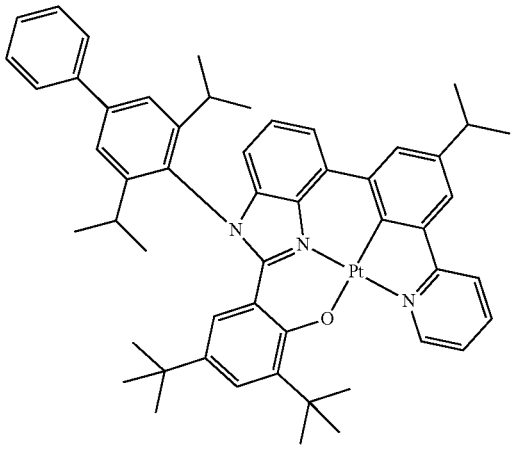
3-571
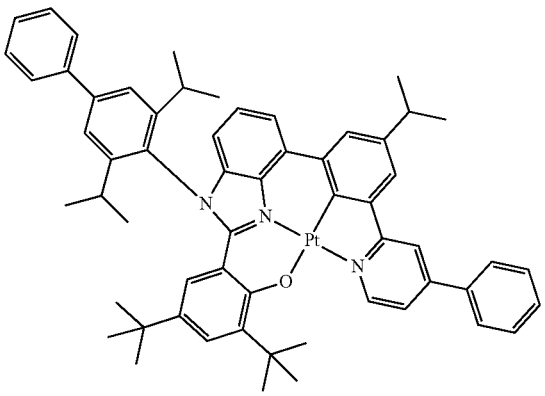
3-572
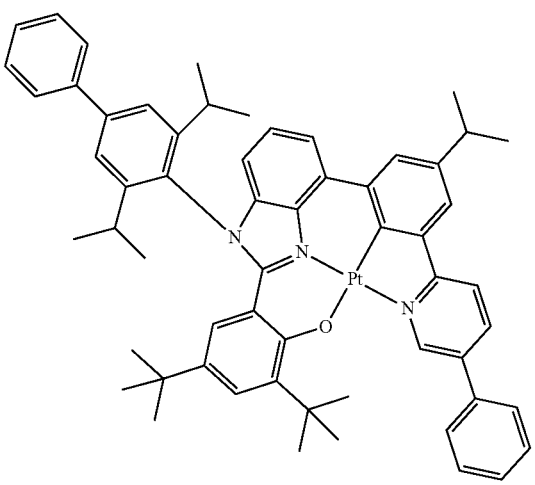

3-573
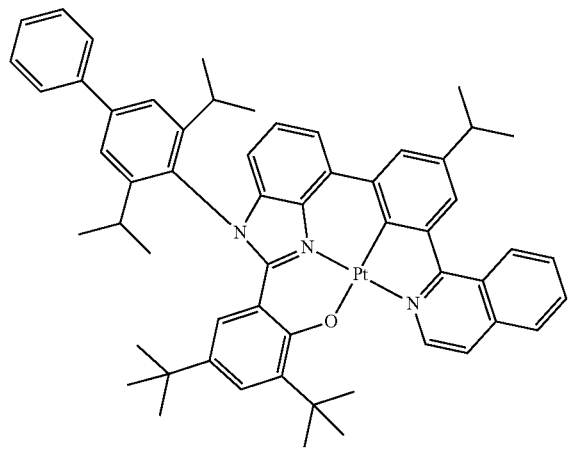
3-576
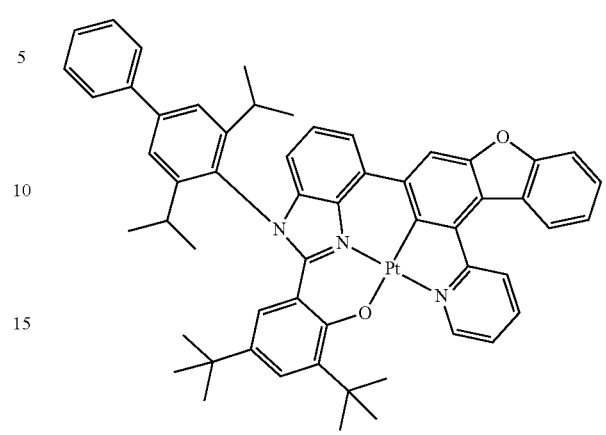
3-574
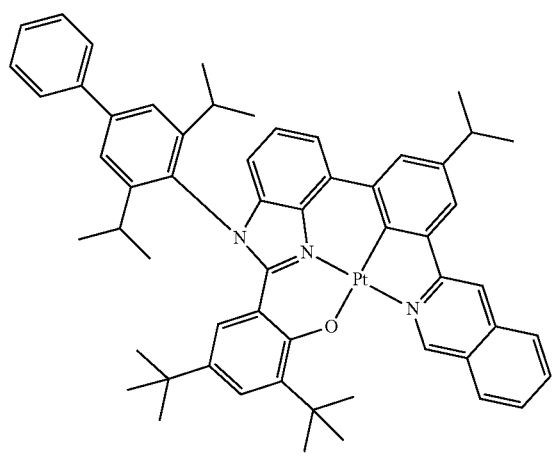
3-577
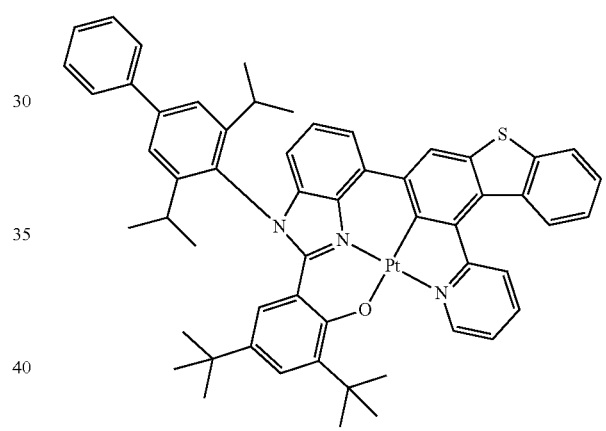
3-575
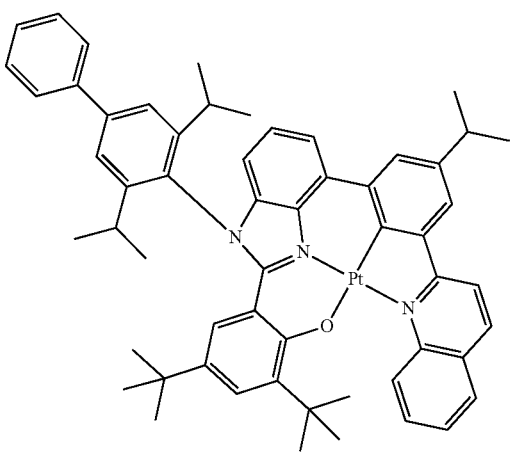
3-578
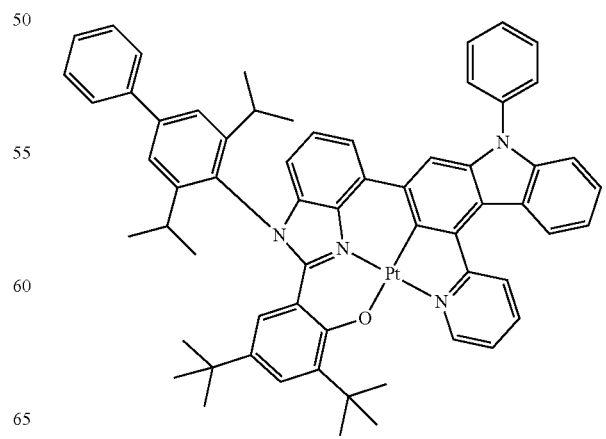

3-579

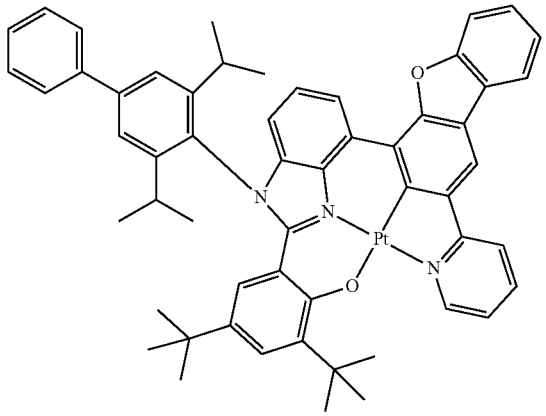

3-580

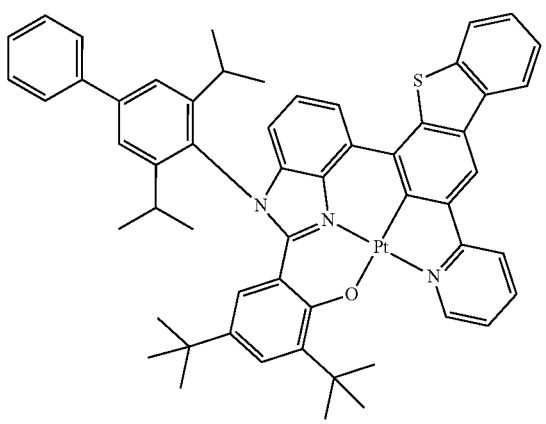

3-581

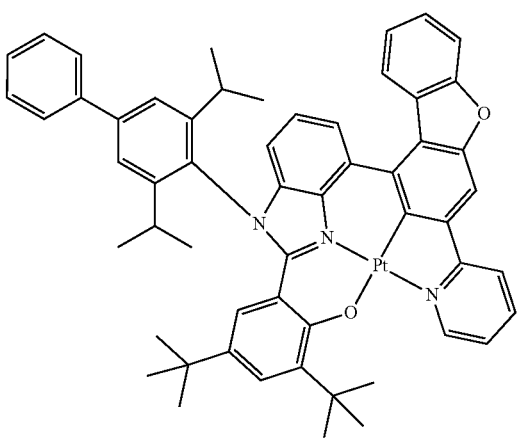

3-582

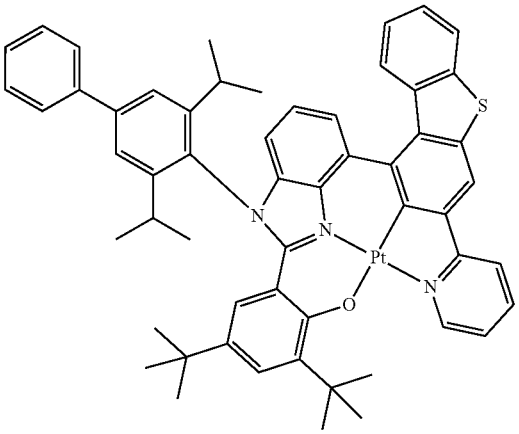

Although the above description mainly discuses an embodiment in which the emission layer of the green light-emitting unit (green OLED) 30 includes a phosphorescent light-emitting material, the present disclosure is not limited thereto. The emission layer of the green light-emitting unit (green OLED) 30 may include a thermally activated delayed fluorescence (TADF) dopant. The TADF dopant may be referred to as the thermally assisted delayed fluorescence dopant. In this case, high efficient delayed fluorescence emission may be possible.

Although the emission layer of the green light-emitting unit (green OLED) 30 may include the above-described phosphorescent light-emitting material, the present disclosure is not limited thereto. The emission layer may include a different phosphorescent material other than the above-described phosphorescent light-emitting material. Furthermore, the emission layer of the green light-emitting unit 30 may include a fluorescent light-emitting material. All green fluorescent materials used for OLEDs according to the related art may be applied to the green emission layer material according to the present disclosure. Since the fluorescent light-emitting material to emit a green light is well-known, a detailed description thereof is omitted.

In the present embodiment, the emission layer of the first and second blue light-emitting units 20 and 40 may include a fluorescent light-emitting material and/or a phosphorescent light-emitting material to emit a blue light. All blue fluorescent/phosphorescent materials used in the OLEDs according to the related art may be used as the blue emission layer material according to the present disclosure. Since the fluorescent light-emitting material and phosphorescent light-emitting material to emit a blue light are well-known, a detailed description thereof is omitted.

Figure 12:
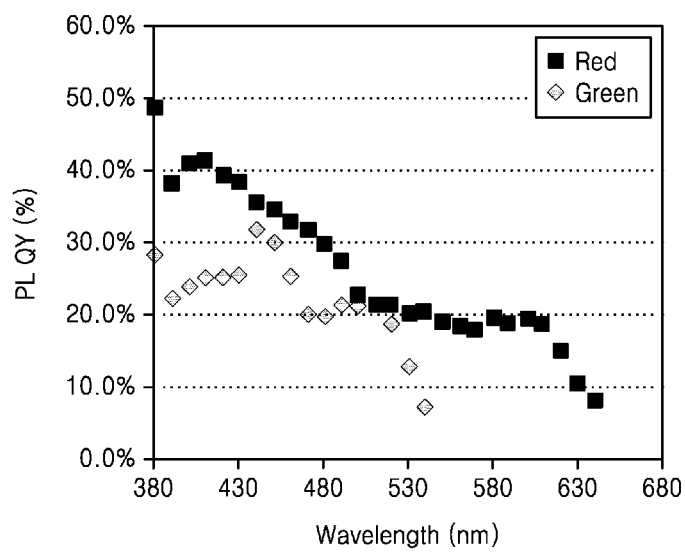
FIG. 12 is a graph of photoluminescence (PL) quantum yield (percent, %) versus wavelength (nanometer, nm) showing a photoluminescence (PL) quantum yield according to wavelengths of a Green-QD containing color converter and a Red-QD containing color converter that are applicable to a display apparatus according to an embodiment.

FIG. 12 is a graph showing a photoluminescence (PL) quantum yield (percent, %) according to the wavelengths of a Green-QD containing color converter and a Red-QD containing color converter that are applicable to a display apparatus according to an embodiment.

Referring to FIG. 12, it may be seen that the Green-QD containing color converter shows a PL quantum yield approximately to the green wavelength range and the Red-QD containing color converter shows a PL quantum yield approximately to the red wavelength range. The Green-QD containing color converter and the Red-QD containing color converter may be applied to the first color control element 70a and the second color control element 70b of FIG. 1, respectively.

Figure 13:
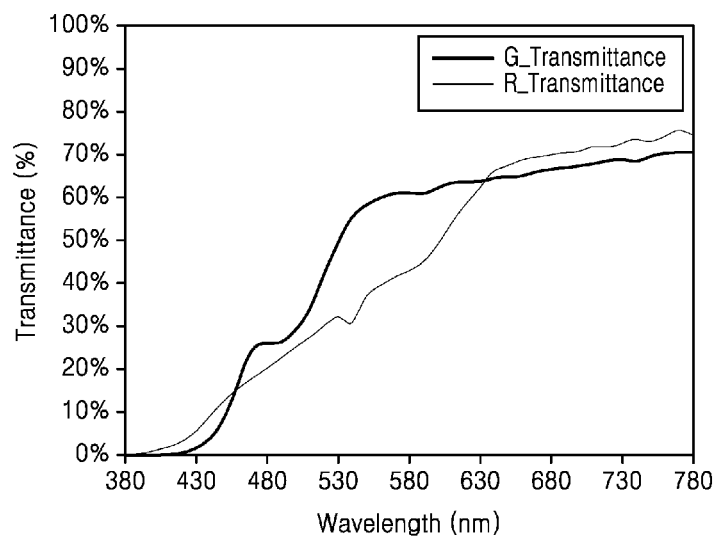
FIG. 13 is a graph of transmittance (percent, %) versus wavelength (nanometer, nm) showing a change in the transmittance according to wavelengths of a Green-QD containing color converter and a Red-QD containing color converter that are applicable to a display apparatus according to an embodiment.

FIG. 13 is a graph showing a change in the transmittance (%) according to the wavelengths of a Green-QD containing color converter and a Red-QD containing color converter that are applicable to a display apparatus according to an embodiment.

Referring to FIG. 13, it may be seen that the Green-QD containing color converter shows a high transmittance from a wavelength approximately corresponding to the green range and the Red-QD containing color converter shows a high transmittance from a wavelength approximately corresponding to the red range.

Figure 14:
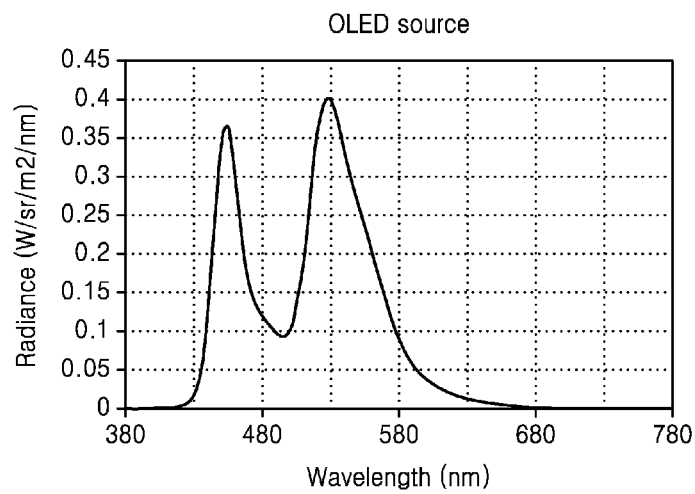
FIG. 14 is a graph of radiance (watt per steradian per square meter per nanometer, W/sr/m$^2$/nm) versus wavelength (nanometer, nm) showing the emission spectrum of an OLED substrate that is applicable to a display apparatus according to an embodiment.

FIG. 14 is a graph showing the emission spectrum of an OLED substrate (light source) that is applicable to a display apparatus according to an embodiment. The OLED substrate (light source) corresponds to the OLED substrate 100 of FIG. 1 or the OLED substrate 101 of FIG. 9, and is configured to emit a mixed light of a blue light and a green light.

Referring to FIG. 14, it may be seen that the OLED substrate (light source) according to an embodiment mainly emits lights in a blue wavelength range and the green wavelength range, and a light corresponding to an intermediate area between the blue wavelength range and the green wavelength range.

Figure 15:
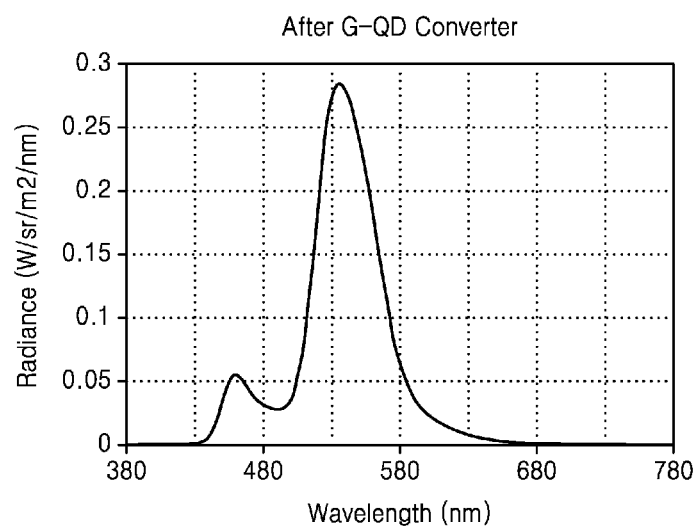
FIG. 15 is a graph of radiance (watt per steradian per square meter per nanometer, W/sr/m$^2$/nm) versus wavelength (nanometer, nm) showing the emission spectrum of a light that is emitted from an OLED substrate (light source) and then passes through a Green-QD containing color converter, according to an embodiment.

FIG. 15 is a graph showing the emission spectrum of a light that is emitted from an OLED substrate (light source) and then passes through a Green-QD containing color converter, according to an embodiment. As illustrated in FIG. 15, it may be seen that, after the light generated from the OLED substrate (light source) passes through the Green-QD containing color converter, the light in the green wavelength range is strengthened. Although the light in blue wavelength range may be partially left, the remaining blue light may be blocked by the first color filter 80a of FIG. 1.

Figure 16:
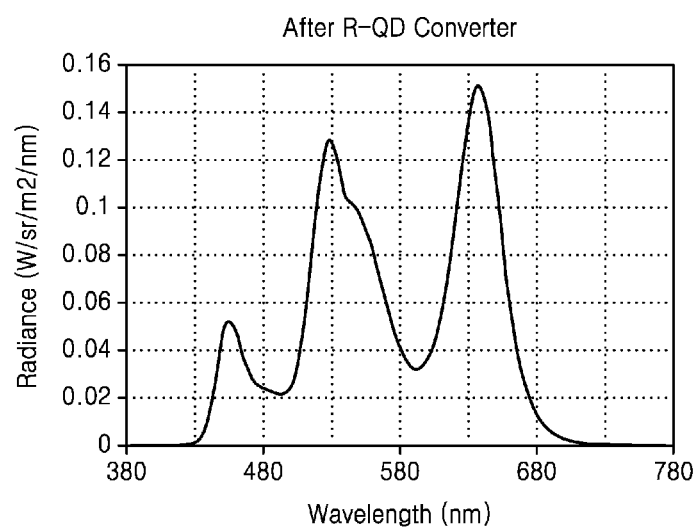
FIG. 16 is a graph of radiance (watt per steradian per square meter per nanometer, W/sr/m$^2$/nm) versus wavelength (nanometer, nm) showing the emission spectrum of a light that is emitted from the OLED substrate (light source) and then passes through a Red-QD containing color converter, according to an embodiment.

FIG. 16 is a graph showing the emission spectrum of a light that is emitted from the OLED substrate (light source) and then passes through a Red-QD containing color converter, according to an embodiment. As illustrated in FIG. 16, it may be seen that, after the light generated from the OLED substrate (light source) passes through the Red-QD containing color converter, the light of the red wavelength range is strengthened. Although the lights in the blue wavelength range and the green wavelength range are partially left, the remaining blue light and green light may be blocked by the second color filter 80b of FIG. 1.

Figure 17:
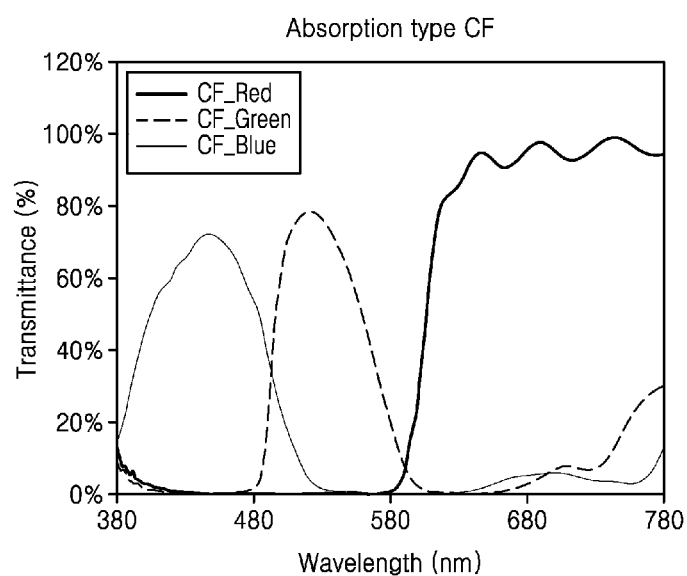
FIG. 17 is a graph of transmittance (percent, %) versus wavelength (nanometer, nm) showing a change in transmittance (%) according to the wavelength of an absorption type color filter that is applicable to a display apparatus according to an embodiment.

FIG. 17 is a graph showing a change in transmittance (%) according to the wavelength of an absorption type color filter that is applicable to a display apparatus according to an embodiment. FIG. 17 includes the result of each of an absorption type Red-color filter, an absorption type Green-color filter, and an absorption type Blue-color filter. The absorption type Green-color filter, the absorption type Red-color filter, and the absorption type Blue-color filter may be applied to, for example, the first color filter 75a, the second color filter 75b, and the third color filter (third color control element) 75c of FIG. 4, respectively.

Figure 18:
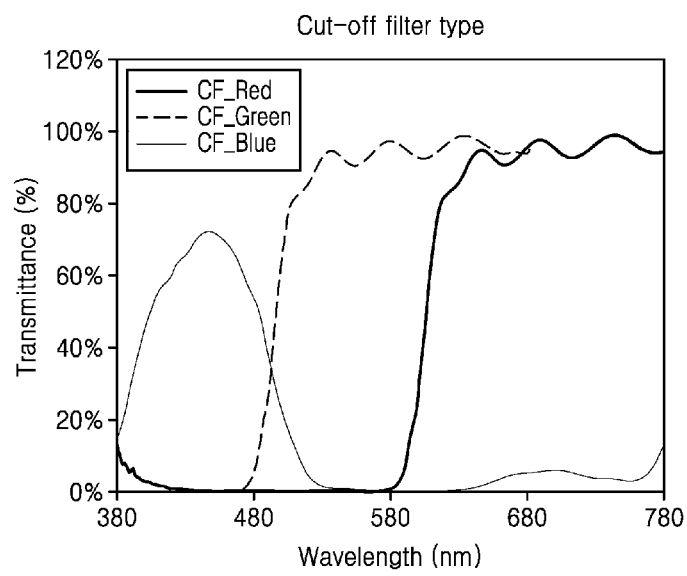
FIG. 18 is a graph of transmittance (percent, %) versus wavelength (nanometer, nm) showing a change in transmittance (%) according to the wavelength of a cut-off type color filter that is applicable to a display apparatus according to an embodiment.

FIG. 18 is a graph showing a change in transmittance (%) according to the wavelength of a cut-off type color filter that is applicable to a display apparatus according to an embodiment. FIG. 18 includes the results of each of a cut-off Red-color filter, a cut-off Green-color filter, and a cut-off Blue-color filter. The cut-off Green-color filter, the cut-off Red-color filter, and the cut-off Blue-color filter may be applied to, for example, the first color filter 80a, the second color filter 80b, and the third color filter 80c of FIG. 3, respectively.

Figure 19:
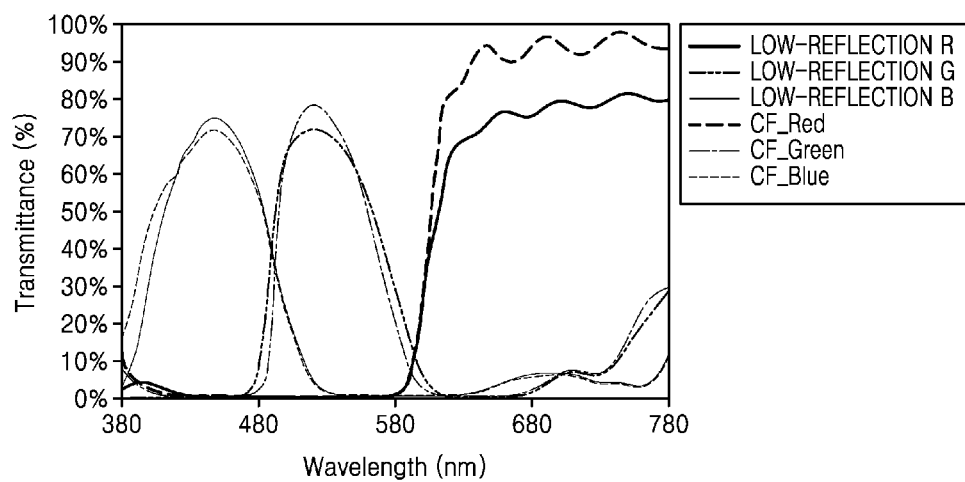
FIG. 19 is a graph of transmittance (percent, %) versus wavelength (nanometer, nm) showing a change in transmittance (%) according to the wavelength of an absorption type color filter that is applicable to a display apparatus according to an embodiment.

FIG. 19 is a graph showing a change in transmittance (%) according to the wavelength of an absorption type color filter that is applicable to a display apparatus according to an embodiment. FIG. 19 illustrates the results of each of an absorption type Red-color filter (CF-Red), an absorption type Green-color filter (CF-Green), and an absorption type Blue-color filter (CF-Blue). Furthermore, FIG. 19 includes the results of each of an absorption type low-reflection Red-color filter (low-reflection R), an absorption type low-reflection Green-color filter (low-reflection G), and an absorption type low-reflection Blue-color filter (low-reflection B). In the absorption type low-reflection Red-color filter, the expression "low-reflection" means that the reflectance of the absorption type low-reflection Red-color filter is relatively lower than that of the absorption type Red-color filter. This applied to the absorption type low-reflection Green-color filter and the absorption type low-reflection Blue-color filter. The reflectance and transmittance thereof may be appropriately adjusted by controlling the configuration of a color filter. The above-described absorption type low-reflection Green-color filter, absorption type low-reflection Red-color filter, and absorption type low-reflection Blue-color filter may also be applied to the first color filter 75a, the second color filter 75b, and the third color filter (third color control element) 75c of FIG. 4, respectively. Since reflectivity of a panel may be reduced by using an absorption type low-reflection color filter, a contrast ratio may be increased without a circular polarizer.

Figure 20:
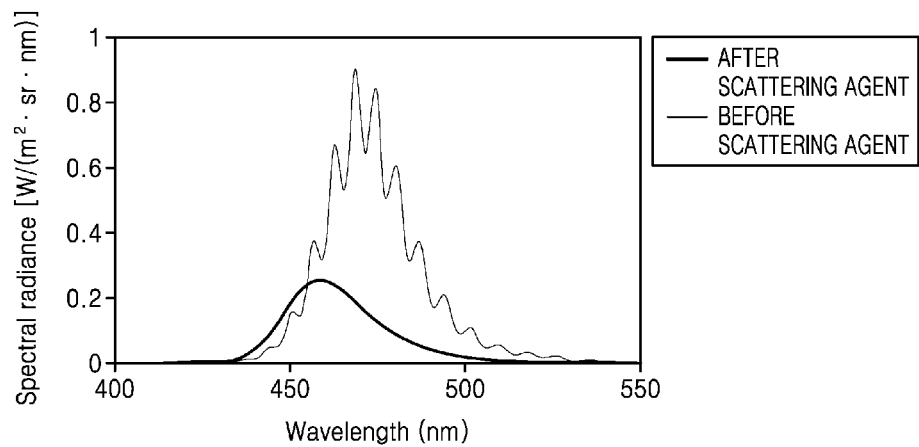
FIG. 20 is a graph of spectral radiance (watt per square meter steradian nanometer, W/m$^2$×sr×nm) versus wavelength (nanometer, nm) showing a difference in spectral radiance between an embodiment in which a light scattering agent is used with respect to blue light and an embodiment in which the light scattering agent is not used with respect to the blue light.

FIG. 20 is a graph showing a difference in the spectral radiance between an embodiment in which the light scattering agent is used with respect to a blue light and an embodiment in which the light scattering agent is not used with respect to the blue light.

Referring to FIG. 20, it may be seen that, when the light scattering agent is not used (Before scattering agent), light is not dispersed well and thus a lot of peaks are generated. When the light scattering agent is used (After scattering agent), it may be seen that light is dispersed well, and thus one peak having a relatively smooth curve is generated.

Figure 21:
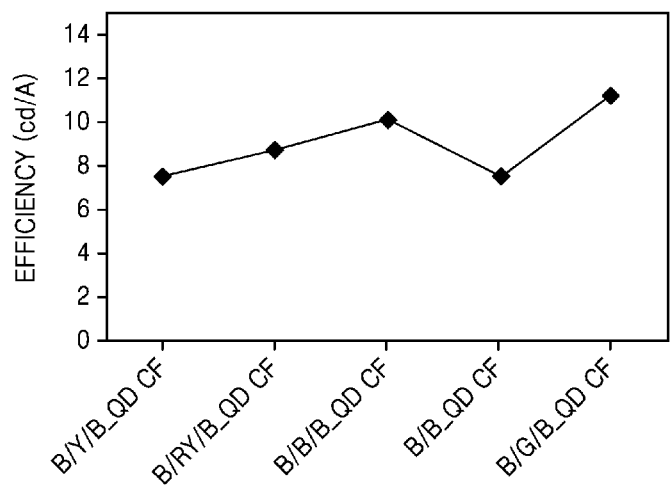
FIG. 21 is a graph showing a change in current efficiency (candelas per ampere, cd/A) according to various conditions regarding a display apparatus.

FIG. 21 is a graph showing a change in current efficiency (candelas per Ampere, cd/A) according to various conditions with regard to a display apparatus.

Referring to FIG. 21, the last one of various conditions on an X-axis is a "B/G/B_QD CF" condition corresponding to the present embodiment. This is an embodiment in which the display apparatus includes a plurality of color filters (color controllers) formed of QDs and the OLED light source of a B/G/B tandem structure. Among the conditions on the X-axis, "B/Y/B_QD CF" and "B/RY/B_QD CF" are cases of using a white OLED light source, and "B/B/B_QD CF" and "B/B_QD CF" are cases of using a blue OLED light source.

It may be seen from the result of FIG. 21 that, when a display apparatus is configured based on the "B/G/B_QD CF" condition corresponding to the present embodiment, the highest current efficiency can be obtained. For the "B/G/B_QD CF" condition, the current efficiency appears to be higher than 11 cd/A, and for "B/B/B_QD CF" condition, the current efficiency is about 10 cd/A. A difference in the efficiency therebetween may be 10% or more. In particular, since in the "B/B_QD CF" condition the current efficiency is about 7.5 cd/A, the current efficiency of the "B/G/B_QD CF" condition may have a value that is 1.5 times greater than the value of the "B/B_QD CF" condition. Accordingly, when a display apparatus is formed based on the condition according to an embodiment, a high current efficiency may be obtained.

Figure 22:
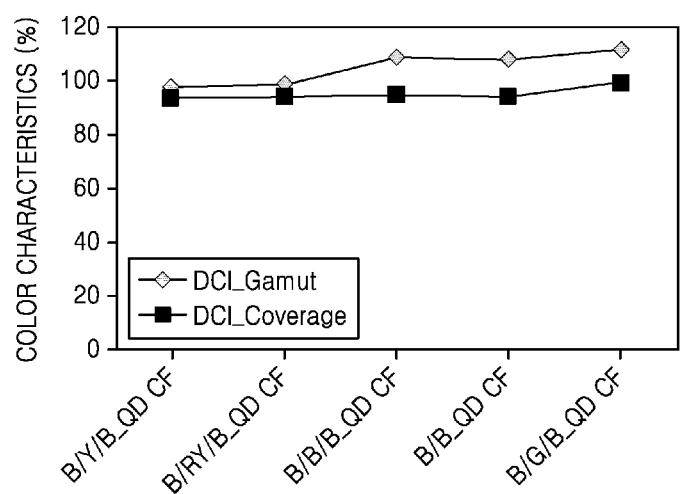
FIG. 22 is a graph showing a change in color characteristics (percent, %) according to various conditions regarding a display apparatus.

FIG. 22 is a graph showing a change in color characteristics (%) according to various conditions with regard to a display apparatus. The conditions corresponding to an X-axis of FIG. 22 may be the same as or similar to the conditions described with reference to FIG. 21. FIG. 22 includes a value measured based on the DCI_Gamut and a value measured based on the DCI_Coverage.

Referring to FIG. 22, color characteristics (%) values based on the DCI_Coverage under the conditions of "B/Y/B_QD CF", "B/RY/B_QD CF", "B/B/B_QD CF", and "B/B_QD CF" according to comparative examples are almost the same. However, the color characteristics value based on the "B/G/B_QD CF" condition according to an embodiment may be higher than the values according to the comparative examples. Furthermore, the color characteristics (%) based on DCI_Gamut may have the highest color characteristics value under "B/G/B_QD CF" condition according to an embodiment. Accordingly, when a display apparatus is formed based on the condition according to an embodiment, excellent color characteristics and color gamut may be obtained.

The display apparatuses according to the above-described embodiments may be applied to a variety of electronic apparatuses. For example, the display apparatuses according to the above-described embodiments may be applied to small electronic apparatuses such as portable apparatuses or wearable apparatuses and to medium- and large-sized electronic apparatuses such as home appliances.

It should be understood that embodiments described herein should be considered in a descriptive sense only and not for purposes of limitation. Descriptions of features or aspects within each embodiment should typically be considered as available for other similar features or aspects in other embodiments. Those skilled in the art will appreciate that the configuration of and the connection between the OLED substrates, the color controllers, and the display apparatus including the same described with reference to FIGS. 1 to 11 can be modified in a variety of ways. While one or more embodiments have been described with reference to the figures, it will be understood by those of ordinary skill in the art that various changes in form and details may be made therein without departing from the spirit and scope of the present description as defined by the following claims.

What is claimed is:

1. A display apparatus comprising:
an OLED (organic light-emitting device) substrate comprising a first blue light-emitting unit, a green light-emitting unit, and a second blue light-emitting unit which are stacked; and
a color controller provided on the OLED substrate to adjust color of a light generated from the OLED substrate, wherein the OLED substrate generates a mixed light of only a blue light and a green light.

2. The display apparatus of claim 1, wherein the OLED substrate has a tandem structure.

3. The display apparatus of claim 1, wherein
the first blue light-emitting unit, the green light-emitting unit, and the second blue light-emitting unit which are sequentially stacked.

4. The display apparatus of claim 1, further comprising:
a first charge generation layer provided between the first blue light-emitting unit and the green light-emitting unit; and
a second charge generation layer provided between the green light-emitting unit and the second blue light-emitting unit.

5. The display apparatus of claim 1, wherein
the green light-emitting unit comprises a green emission layer comprising an organic material, and
the green emission layer comprises at least one of a thermally activated delayed fluorescence (TADF) dopant and a phosphorescent dopant.

6. The display apparatus of claim 5, wherein the phosphorescent dopant is an organic metal compound containing at least one of iridium Or), platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au).

7. The display apparatus of claim 6, wherein the organic metal compound has a square-planar coordination structure.

8. The display apparatus of claim 6, wherein
the organic metal compound comprises a metal M and an organic ligand, and
the metal M and the organic ligand form one, two, or three cyclometallated rings.

9. The display apparatus of claim 6, wherein
the organic metal compound comprises a metal M and a four-coordinate organic ligand that forms three or four cyclometallated rings,
the metal M comprises platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), palladium (Pd), silver (Ag), or gold (Au), and
the four-coordinate organic ligand comprises a benzimidazole group or a pyridine group.

10. The display apparatus of claim 1, wherein the color controller comprises:
a first color control element comprising a plurality of first quantum dots for green conversion;
a second color control element comprising a plurality of second quantum dots for red conversion; and
a third color control element for presenting a blue color.

11. The display apparatus of claim 10, wherein the color controller further comprises:
a first color filter provided on the first color control element; and
a second color filter provided on the second color control element.

12. The display apparatus of claim 10, wherein
the third color control element comprises a blue color filter.

13. The display apparatus of claim 12, wherein the display apparatus further comprises a light scattering element provided between the blue color filter and the OLED substrate.

14. The display apparatus of claim 10, wherein
the third color control element comprises a color converter comprising a plurality of third quantum dots for blue conversion.

15. The display apparatus of claim 14, wherein
the display apparatus further comprises a blue color filter provided on the third color control element.

16. The display apparatus of claim 10, wherein
the first color control element corresponds to a first sub-pixel area, the second color control element corresponds to a second sub-pixel area, and the third color control element corresponds to a third sub-pixel area, and the display apparatus further comprises a fourth sub-pixel area, wherein the fourth sub-pixel area produces a color other than colors of the first to third sub-pixel areas.

17. The display apparatus of claim 16, wherein the fourth sub-pixel area is a blank area on the OLED substrate without a color control element, or the display apparatus comprises a light scattering element provided on the OLED substrate.

18. The display apparatus of claim 1, wherein the blue light-emitting unit emits a blue light having a peak wavelength range of about 440 nanometers (nm) to about 500 nm, and the green light-emitting unit emits a green light having a peak wavelength range of about 500 nm to about 550 nm.

19. The display apparatus of claim 1, wherein the OLED substrate further comprises at least one third blue light-emitting unit.

20. An electronic apparatus comprising the display apparatus of claim 1.

21. A display apparatus comprising:
an OLED (organic light-emitting device) substrate comprising at least one blue light-emitting unit and at least one green light-emitting unit,
a first color control element comprising a plurality of first quantum dots for green conversion;
a second color control element comprising a plurality of second quantum dots for red conversion; and
a third color control element for presenting a blue color, wherein the OLED substrate generates a mixed light of only a blue light and a green light.

22. The display apparatus of claim 21, wherein the OLED substrate has a tandem structure.

23. The display apparatus of claim 21, wherein the third color control element comprises a blue color filter.

24. The display apparatus of claim 23, wherein the display apparatus further comprises a light scattering element provided between the blue color filter and the OLED substrate.

25. The display apparatus of claim 21, wherein the third color control element comprises a color converter comprising a plurality of third quantum dots for blue conversion.

26. The display apparatus of claim 25, wherein the display apparatus further comprises a blue color filter provided on the third color control element.

27. A display apparatus comprising:
an OLED (organic light-emitting device) substrate which is configured to emit a mixed light of only a blue light and a green light; and
a color controller provided on the OLED substrate to adjust color of a light generated from the OLED substrate;
wherein, the OLED substrate comprises at least one of a blue fluorescent material and a blue phosphorescent material and at least one of a green phosphorescent material or a green fluorescent material.

28. The display apparatus of claim 27, wherein the OLED substrate emits a blue light having a peak wavelength range of about 440 nanometers (nm) to about 500 nm, and a green light having a peak wavelength range of about 500 nm to about 550 nm.

29. The display apparatus of claim 27, wherein the green phosphorescent material is a phosphorescent dopant of Formula 1A:

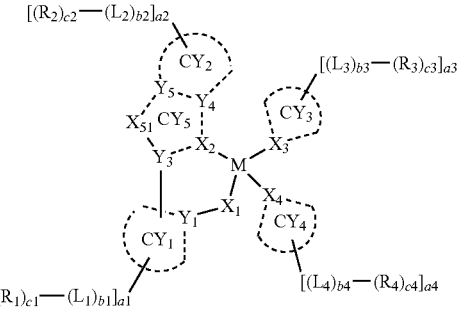

Formula 1A wherein in Formula 1A,

M is a metal including platinum (Pt), osmium (Os), copper (Cu), palladium (pd), silver (Ag), or gold (Au), $X_1$ is O or S, $X_2$, $X_3$, and $X_4$ are each independently C or N, wherein at least one bond selected from a bond between $X_2$, and M, a bond between $X_3$ and M, or a bond between $X_4$ and M is a covalent bond, and the remaining bonds between $X_2$, $X_3$, or $X_4$ are coordinate bonds, $Y_1$, $Y_3$, $Y_4$, and $Y_5$ are each independently C or N, wherein a bond between $X_2$ and $Y_3$, a bond between $X_2$ and $Y_4$, a bond between $Y_4$ and $Y_5$ a bond between $Y_5$ and $X_{51}$, and a bond between $X_{51}$ and $Y_3$ are each be a chemical bond, $CY_1$ to $CY_5$ are independently a $C_5$-$C_{30}$ carbocyclic group or a $C_1$-$C_{30}$ heterocyclic group, and $CY_4$ is not a benzimidazole group, wherein a cyclometalated ring formed by $CY_5$, $CY_2$, $CY_3$, and M is a 6-membered ring, $X_{51}$ is O, S, N-[$(L_7)_{b7}$-$(R_7)_{c7}$], $C(R_7)(R_8)$, $Si(R_7)(R_8)$, $Ge(R_7)(R_8)$, $C(=O)$, N, $C(R_7)$, $Si(R_7)$, and $Ge(R_7)$, wherein $R_7$ and $R_8$ may optionally be linked via a first linking group to form a substitured or unsubstituted $C_5$-$C_{30}$ carbocyclic group or a substitured or unsubstituted $C_3$-$C_{30}$, heterocyclic group, $L_1$ to $L_4$ and $L_7$ are independently a substitured or unsubstituted $C_5$-$C_{30}$ carbocyclic group or a substituted or unsubstituted $C_1$-$C_{30}$ heterocyclic group, b1 to b4 and b7 are each independently be an integer from 0 to 5, $R_1$ to $R_4$, $R_7$, and $R_8$ are each independently hydrogen, deuterium, —F, —Cl, —Br, —I, —SF$_3$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ aryl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), c1 to c4 are each independently an integer from 1 to 5, a1 to a4 are each independently 0, 1, 2, 3, 4, or 5, wherein two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, or two or more groups selected from $R_1$ to $R_4$ are optionally linked to form a substituted or unsubstituted $C_5$-$C_{30}$ carbocyclic group or a substituted or unsubstituted $C_1$-$C_{30}$ heterocyclic group.

* * * * *